(12) United States Patent
Cheng et al.

(10) Patent No.: US 12,237,399 B2
(45) Date of Patent: Feb. 25, 2025

(54) NANO-FET TRANSISTOR WITH ALTERNATING NANOSTRUCTURES AND METHOD OF FORMING THEREOF

(71) Applicant: Taiwan Semiconductor Manufacturing Co., Ltd., Hsinchu (TW)

(72) Inventors: Te-En Cheng, Taoyuan (TW); Yung-Cheng Lu, Hsinchu (TW); Chi On Chui, Hsinchu (TW); Wei-Yang Lee, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 390 days.

(21) Appl. No.: 17/458,672

(22) Filed: Aug. 27, 2021

(65) Prior Publication Data
US 2023/0064457 A1    Mar. 2, 2023

(51) Int. Cl.
| H01L 29/66 | (2006.01) |
| H01L 21/02 | (2006.01) |
| H01L 21/8238 | (2006.01) |
| H01L 27/092 | (2006.01) |
| H01L 29/06 | (2006.01) |
| H01L 29/423 | (2006.01) |
| H01L 29/786 | (2006.01) |

(52) U.S. Cl.
CPC .. *H01L 29/66742* (2013.01); *H01L 21/02532* (2013.01); *H01L 21/0259* (2013.01); *H01L 21/823807* (2013.01); *H01L 21/823814* (2013.01); *H01L 21/823864* (2013.01); *H01L 21/823871* (2013.01); *H01L 27/092* (2013.01); *H01L 29/0665* (2013.01); *H01L 29/42392* (2013.01); *H01L 29/66545* (2013.01); *H01L 29/66553* (2013.01); *H01L 29/78618* (2013.01); *H01L 29/78696* (2013.01)

(58) Field of Classification Search
CPC ....... H01L 21/823807; H01L 29/78696; H01L 21/823814; H01L 29/78618; H01L 21/823864; H01L 29/66553; H01L 29/66545; H01L 21/02532
See application file for complete search history.

(56) References Cited

U.S. PATENT DOCUMENTS

| 9,209,247 | B2 | 12/2015 | Colinge et al. |
| 9,236,267 | B2 | 1/2016 | De et al. |
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |

(Continued)

*Primary Examiner* — William B Partridge
*Assistant Examiner* — David Paul Sedorook
(74) *Attorney, Agent, or Firm* — Slater Matsil, LLP

(57) ABSTRACT

A method of forming a semiconductor device includes forming a sacrificial layer over a first stack of nanostructures and an isolation region. A dummy gate structure is formed over the first stack of nanostructures, and a first portion of the sacrificial layer. A second portion of the sacrificial layer is removed to expose a sidewall of the first stack of nanostructures adjacent the dummy gate structure. A spacer layer is formed over the dummy gate structure. A first portion of the spacer layer physically contacts the first stack of nanostructures.

20 Claims, 130 Drawing Sheets

(56) References Cited

U.S. PATENT DOCUMENTS

| | | | |
|---|---|---|---|
| 9,536,738 B2 | 1/2017 | Huang et al. | |
| 9,576,814 B2 | 2/2017 | Wu et al. | |
| 9,608,116 B2 | 3/2017 | Ching et al. | |
| 9,620,590 B1* | 4/2017 | Bergendahl | H01L 29/0653 |
| 2018/0294165 A1* | 10/2018 | Bilodeau | H01L 29/66439 |
| 2019/0103304 A1* | 4/2019 | Lin | H01L 29/66545 |
| 2019/0305104 A1* | 10/2019 | Xie | H01L 29/4908 |
| 2020/0058561 A1* | 2/2020 | Liao | H01L 29/66795 |
| 2020/0083327 A1* | 3/2020 | Cheng | H01L 21/823807 |
| 2020/0105620 A1* | 4/2020 | Tan | H01L 21/02532 |
| 2020/0126868 A1* | 4/2020 | Wang | H01L 29/785 |
| 2020/0381305 A1* | 12/2020 | Ando | H01L 21/823468 |
| 2021/0043728 A1* | 2/2021 | Greene | H01L 29/16 |
| 2021/0057525 A1* | 2/2021 | Chiang | H01L 29/66545 |
| 2021/0098605 A1* | 4/2021 | Wang | H01L 29/0673 |
| 2021/0134721 A1* | 5/2021 | Chiang | H01L 29/42392 |
| 2021/0226066 A1 | 7/2021 | Young et al. | |
| 2021/0257480 A1 | 8/2021 | Jhan et al. | |
| 2021/0265508 A1 | 8/2021 | Chiang et al. | |
| 2021/0273098 A1* | 9/2021 | Chang | H01L 29/66553 |

\* cited by examiner

Plan View

Plan View

Cross section D-D'

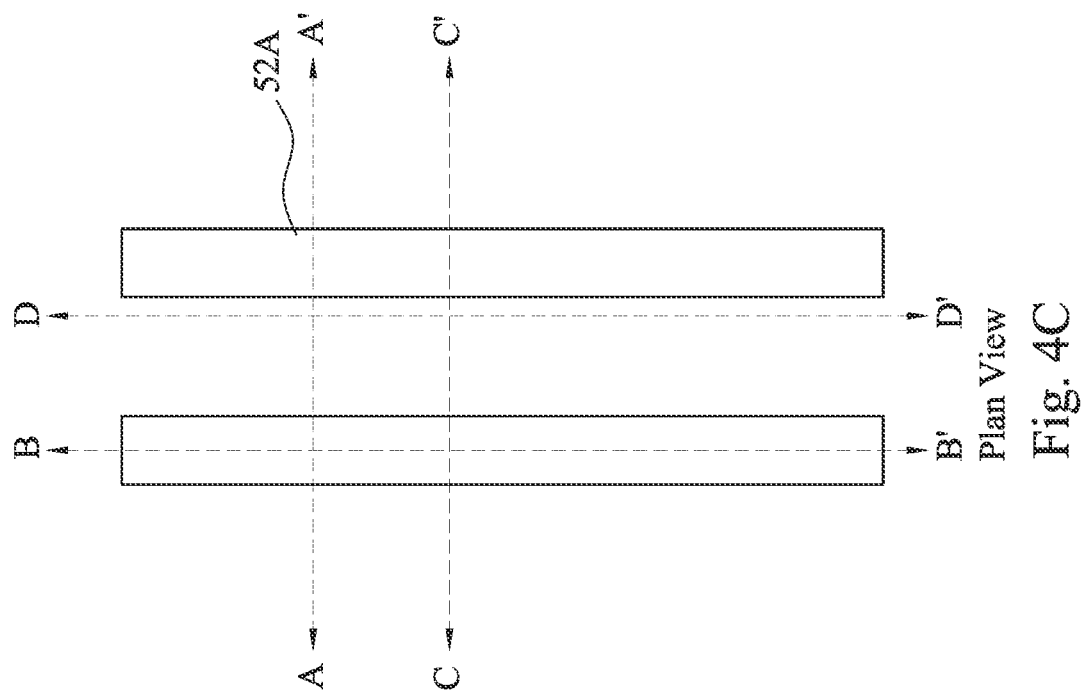

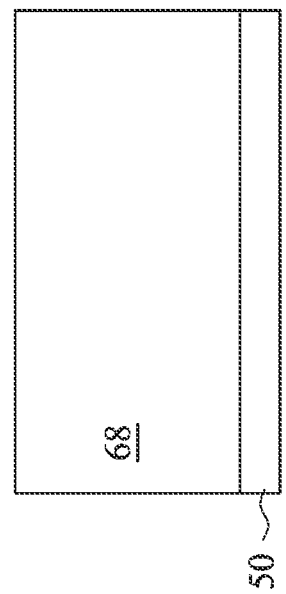

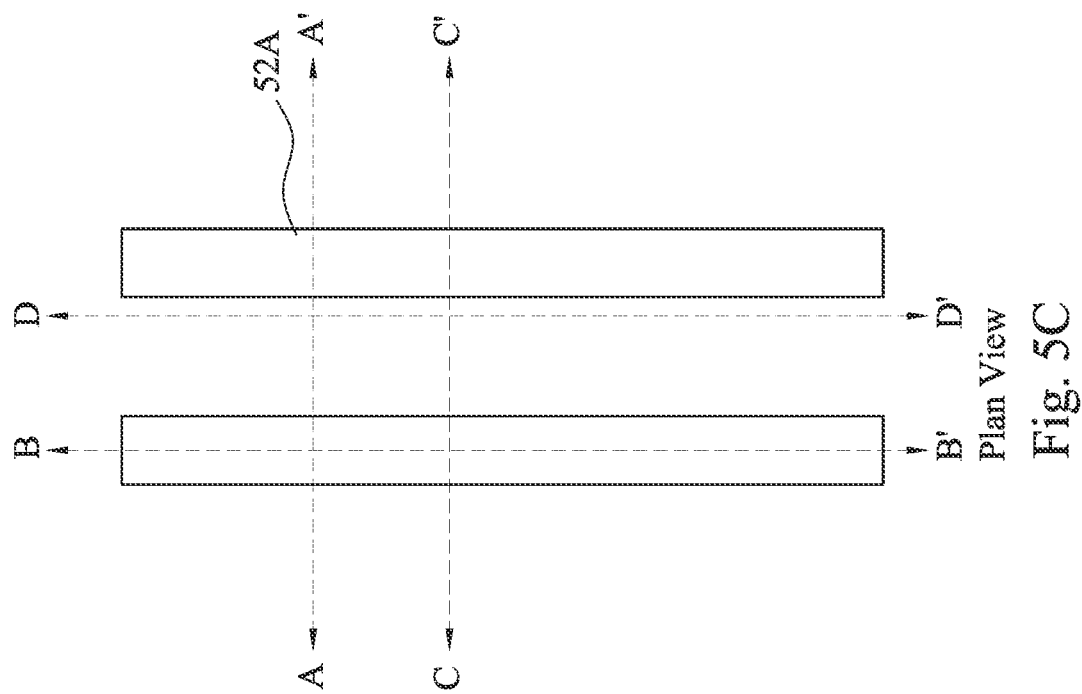

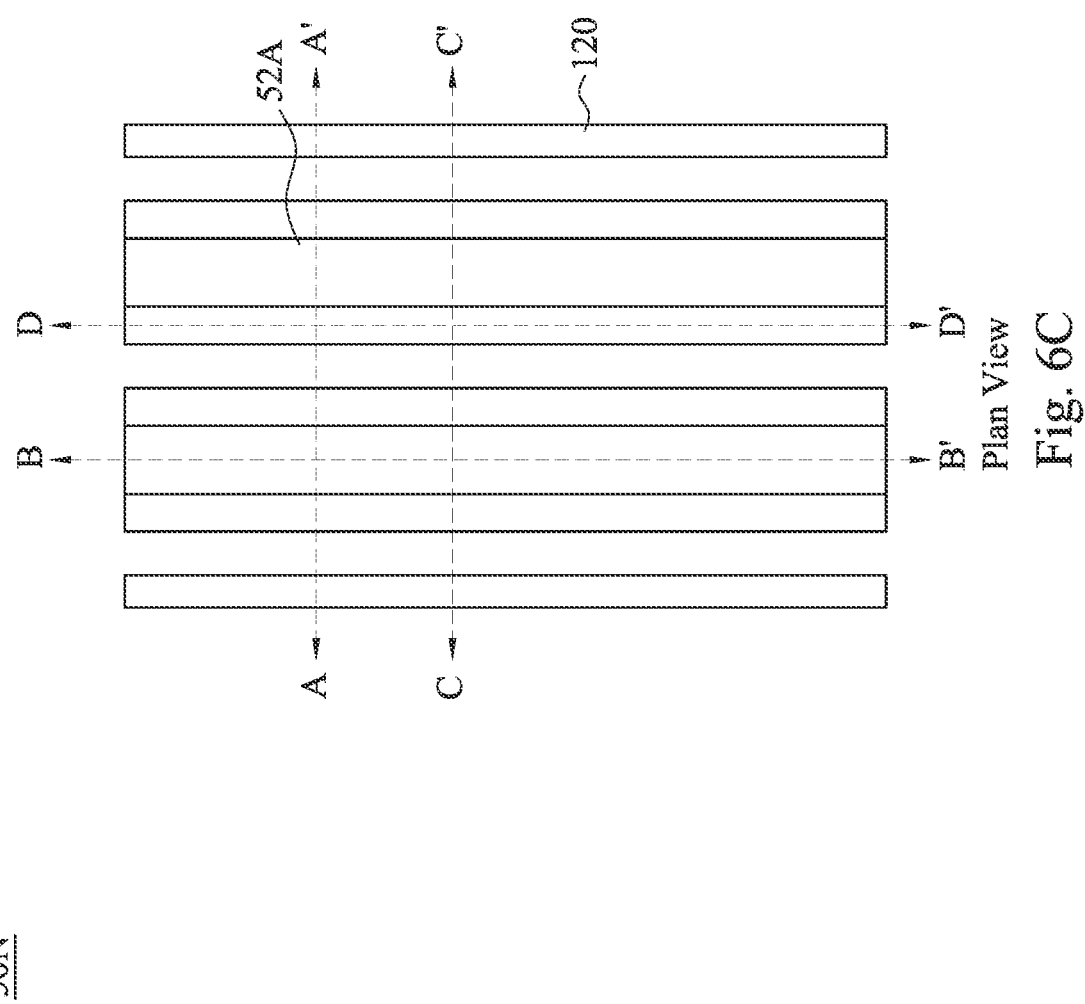

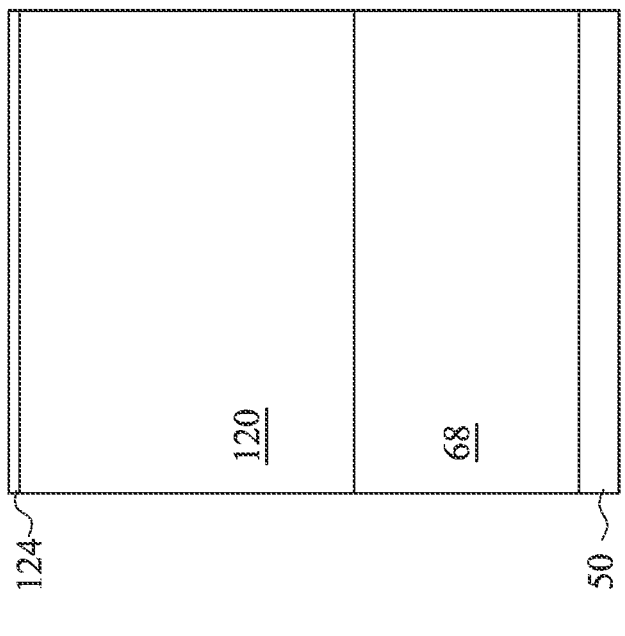

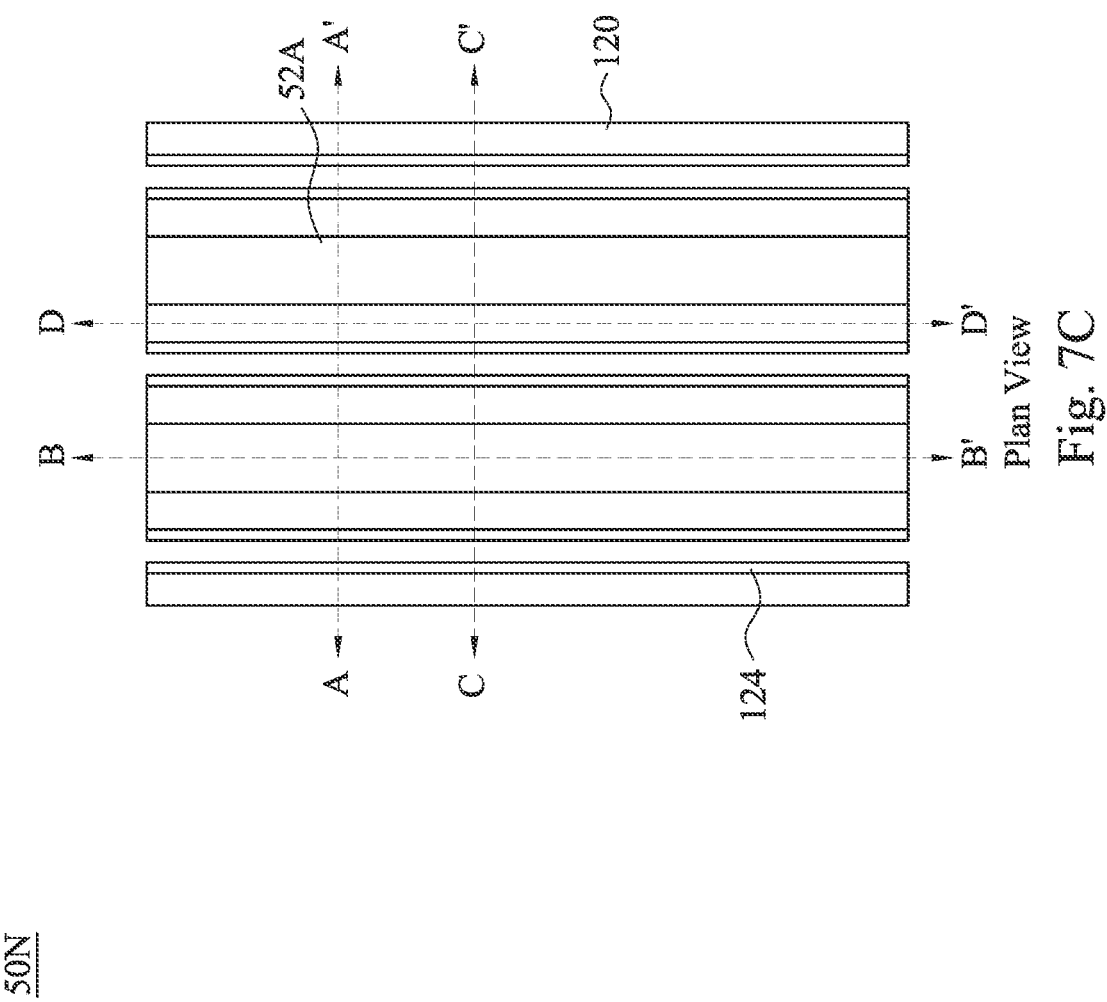

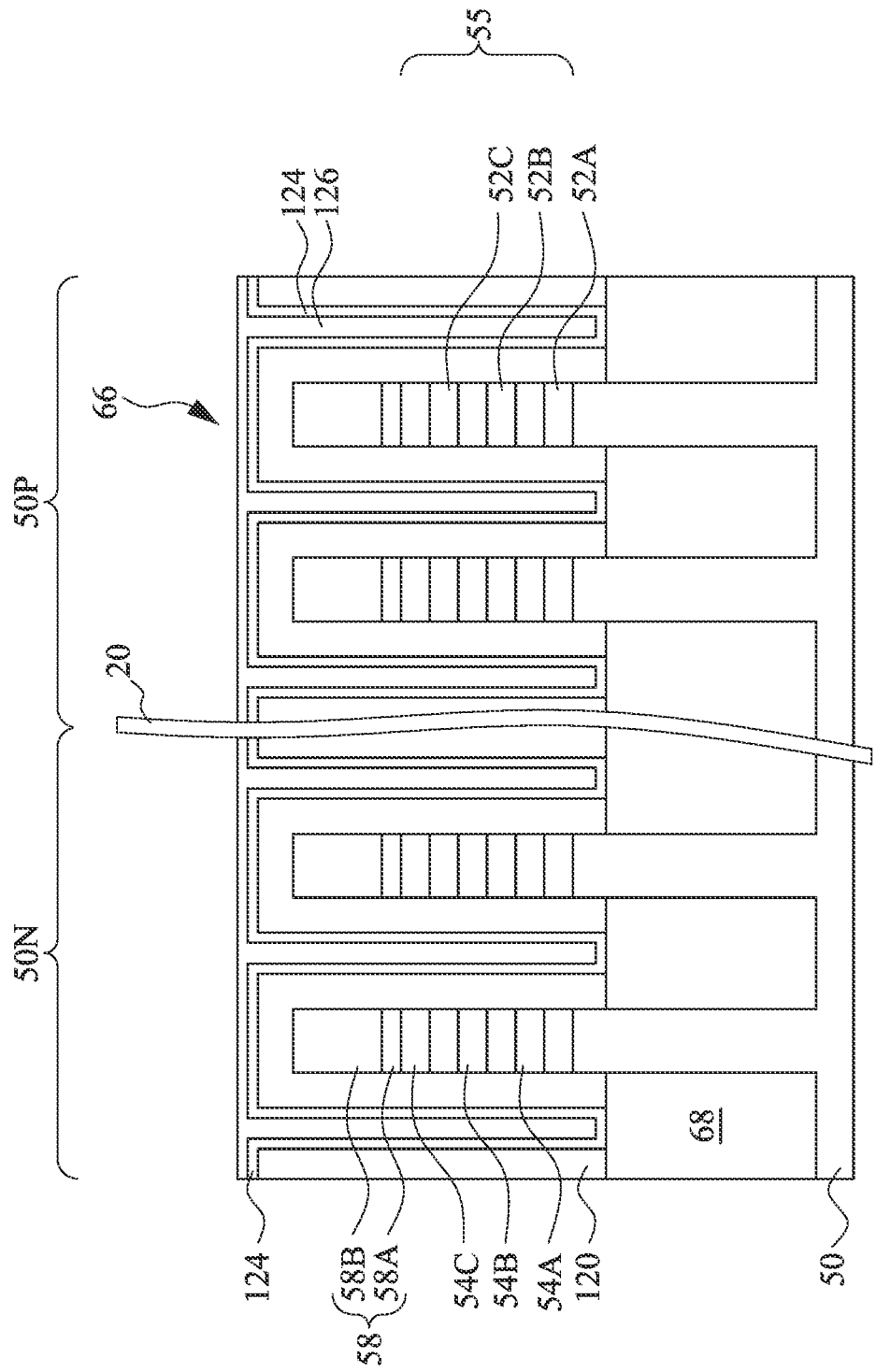

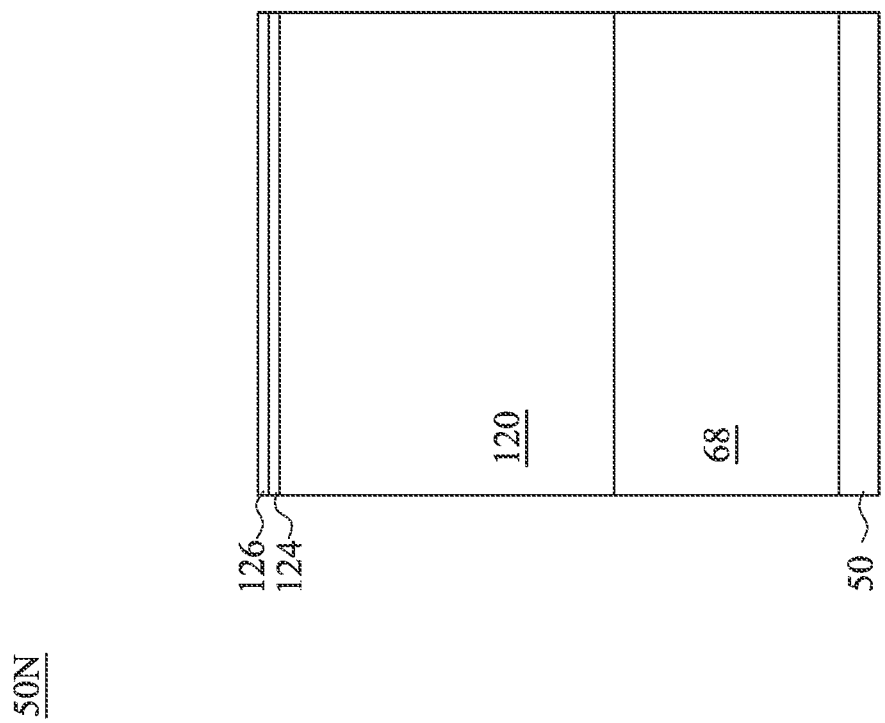

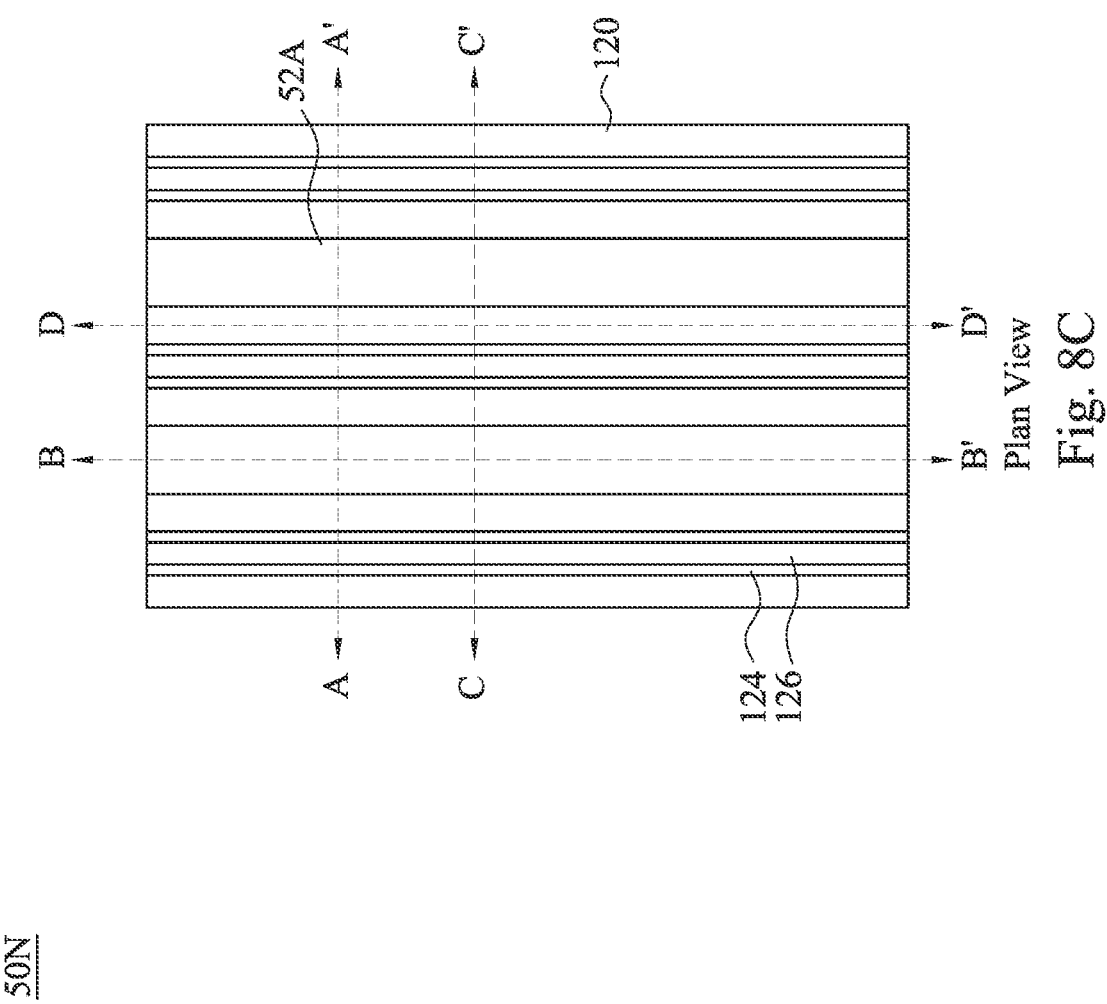

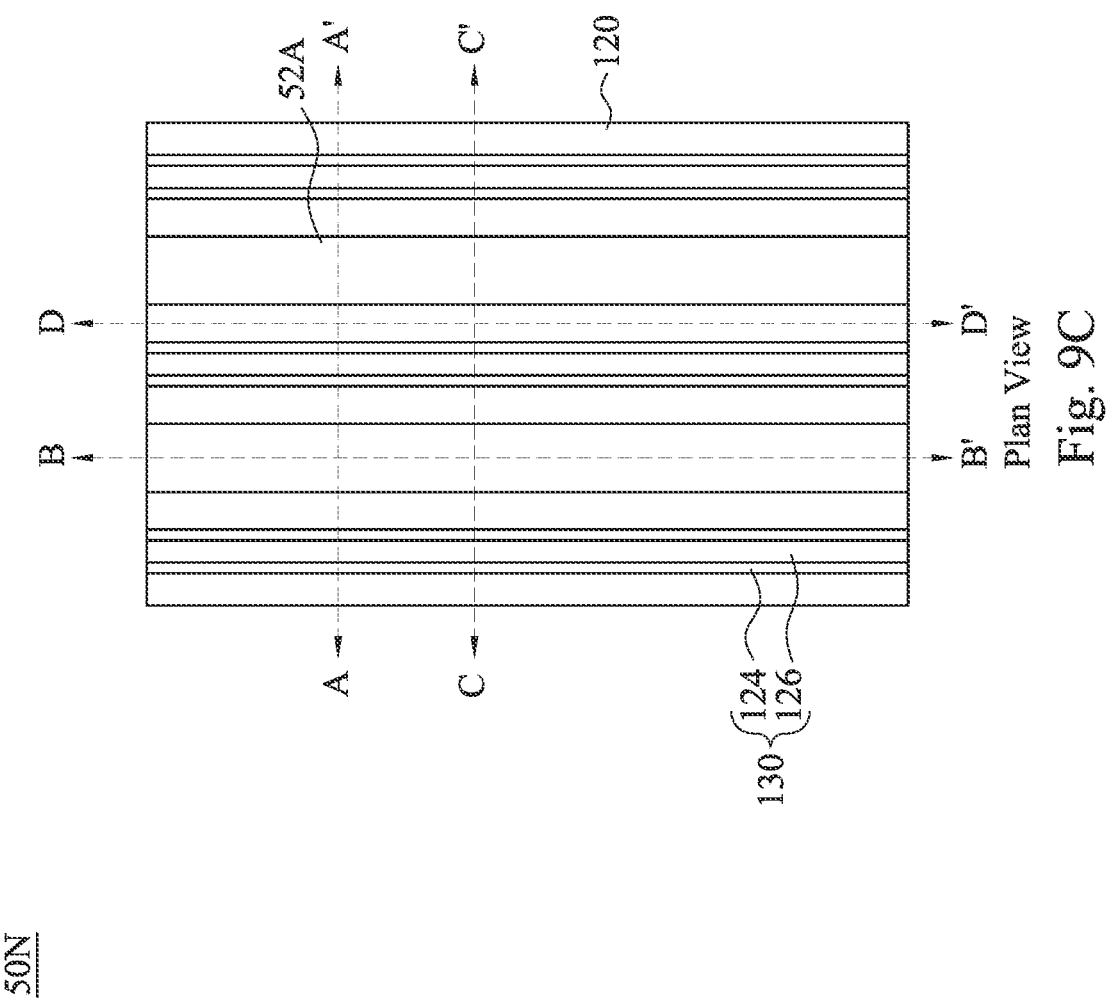

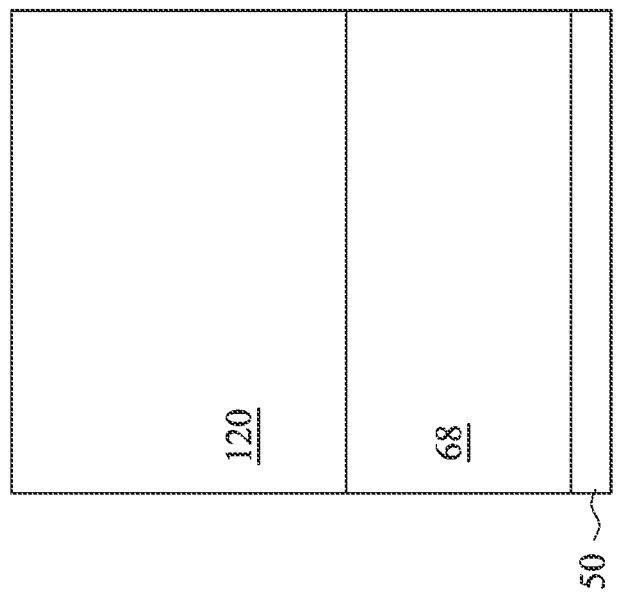

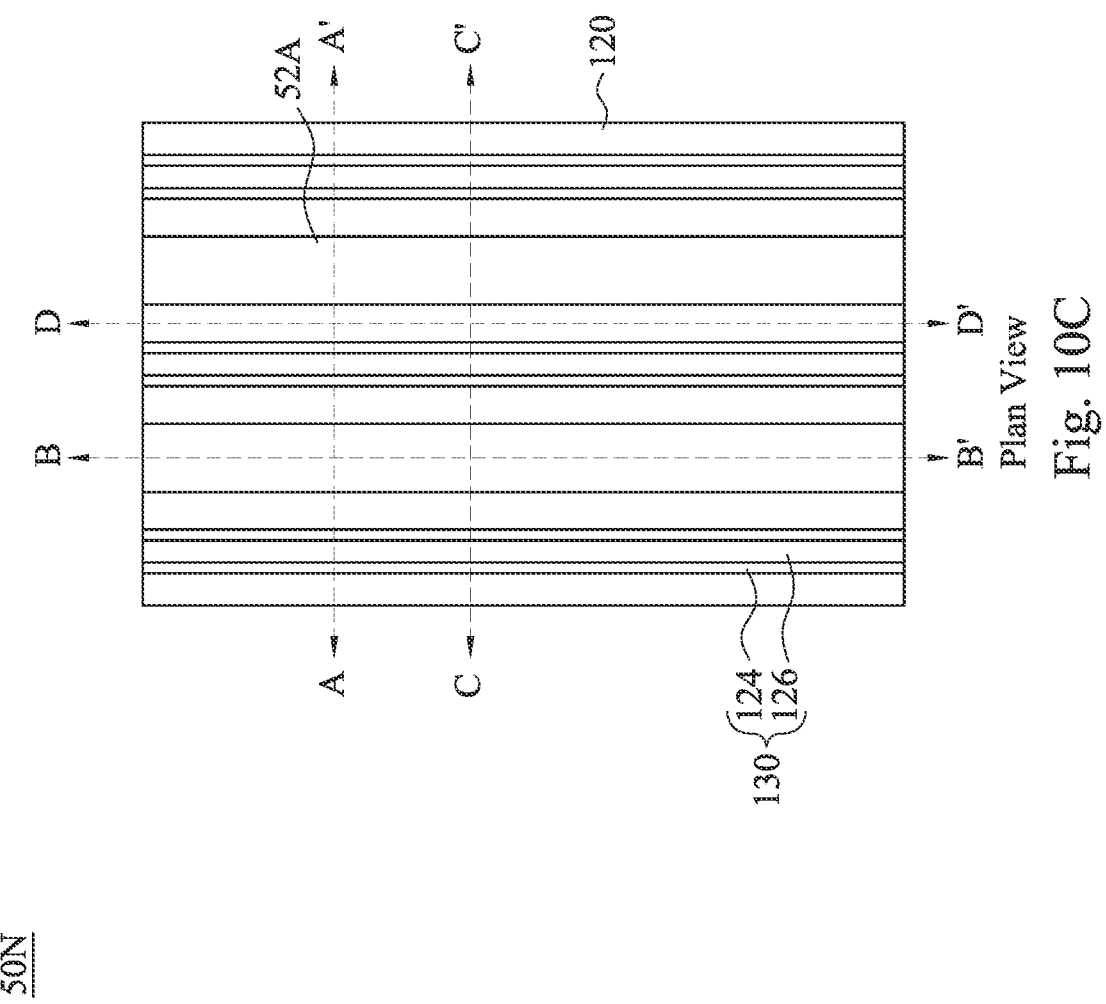

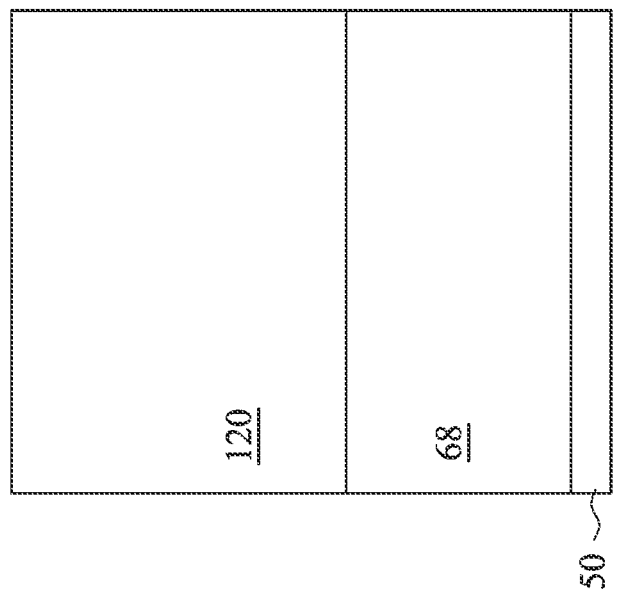

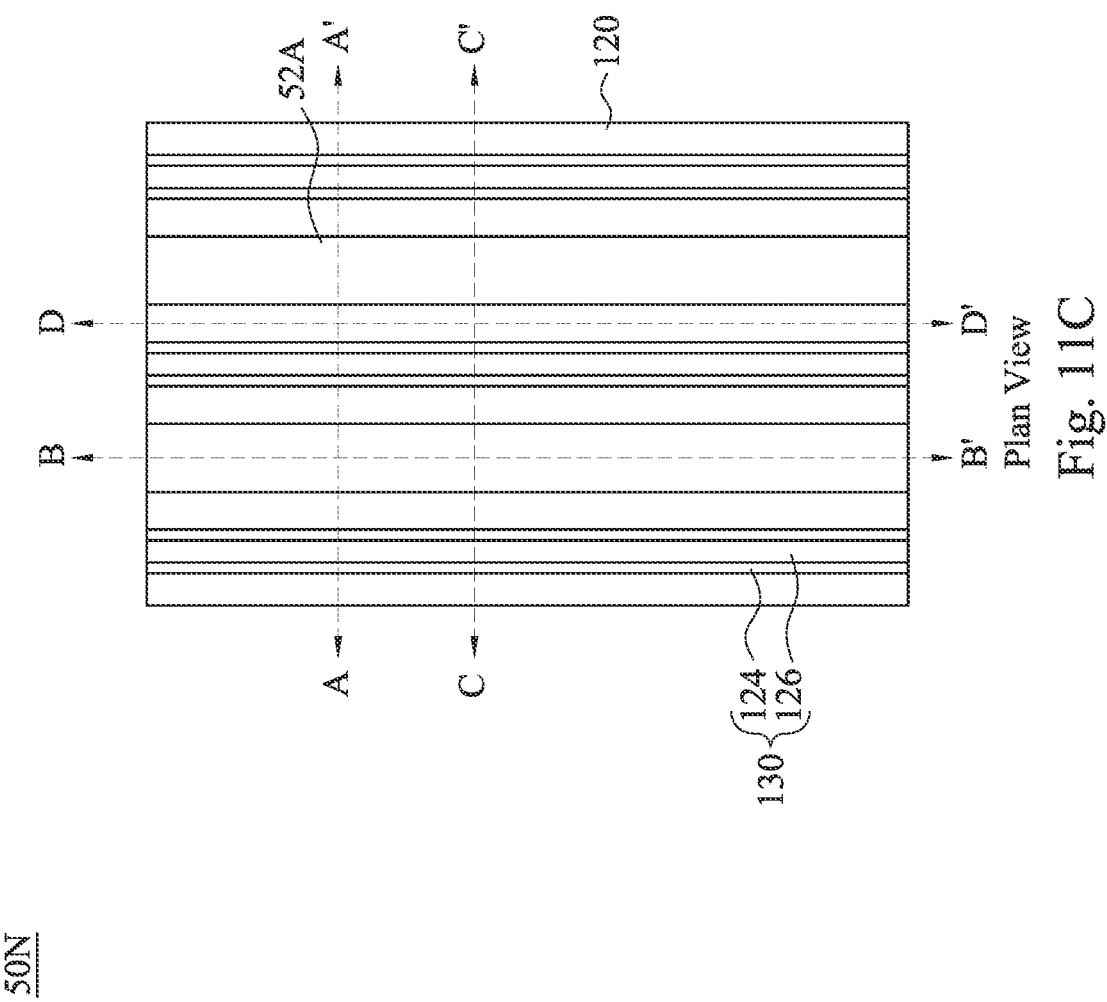

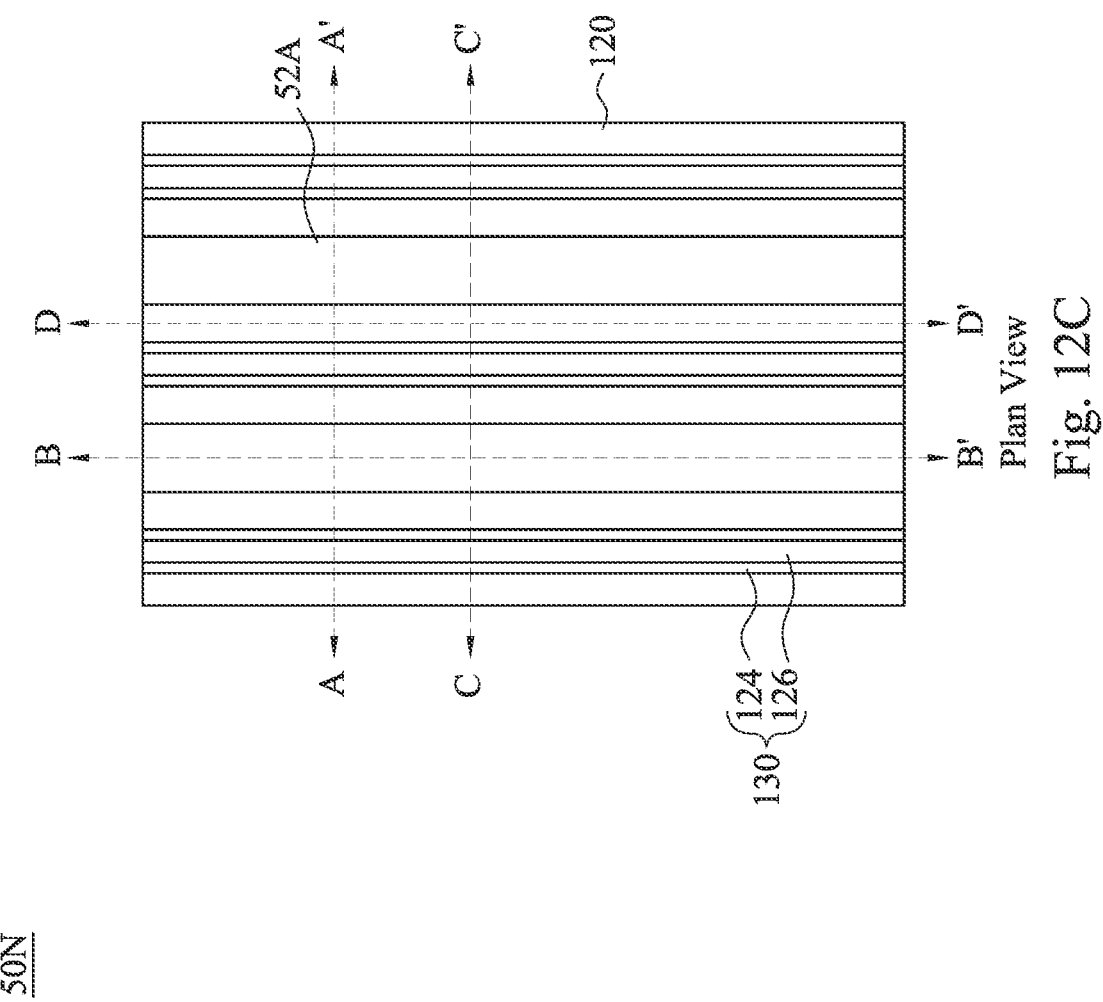

Cross section B-B'

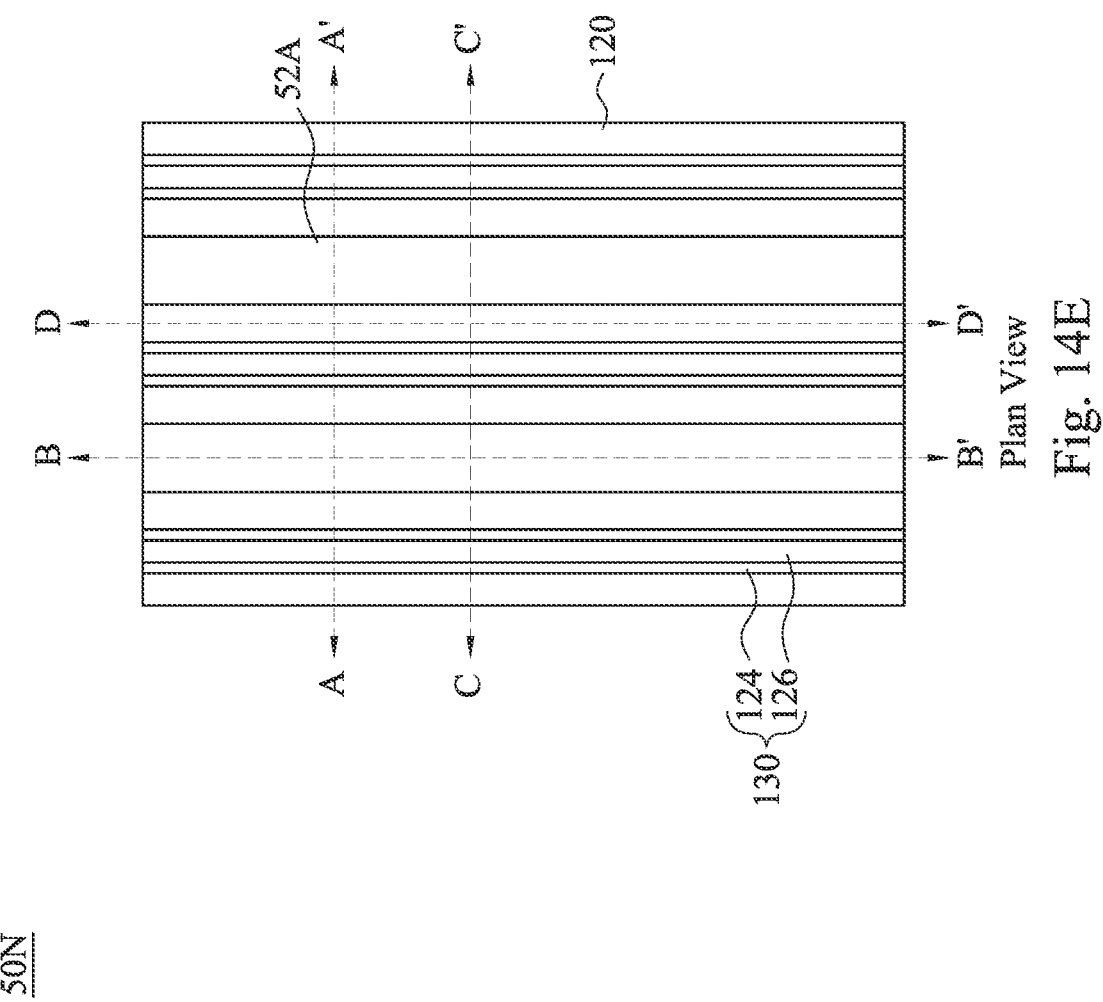

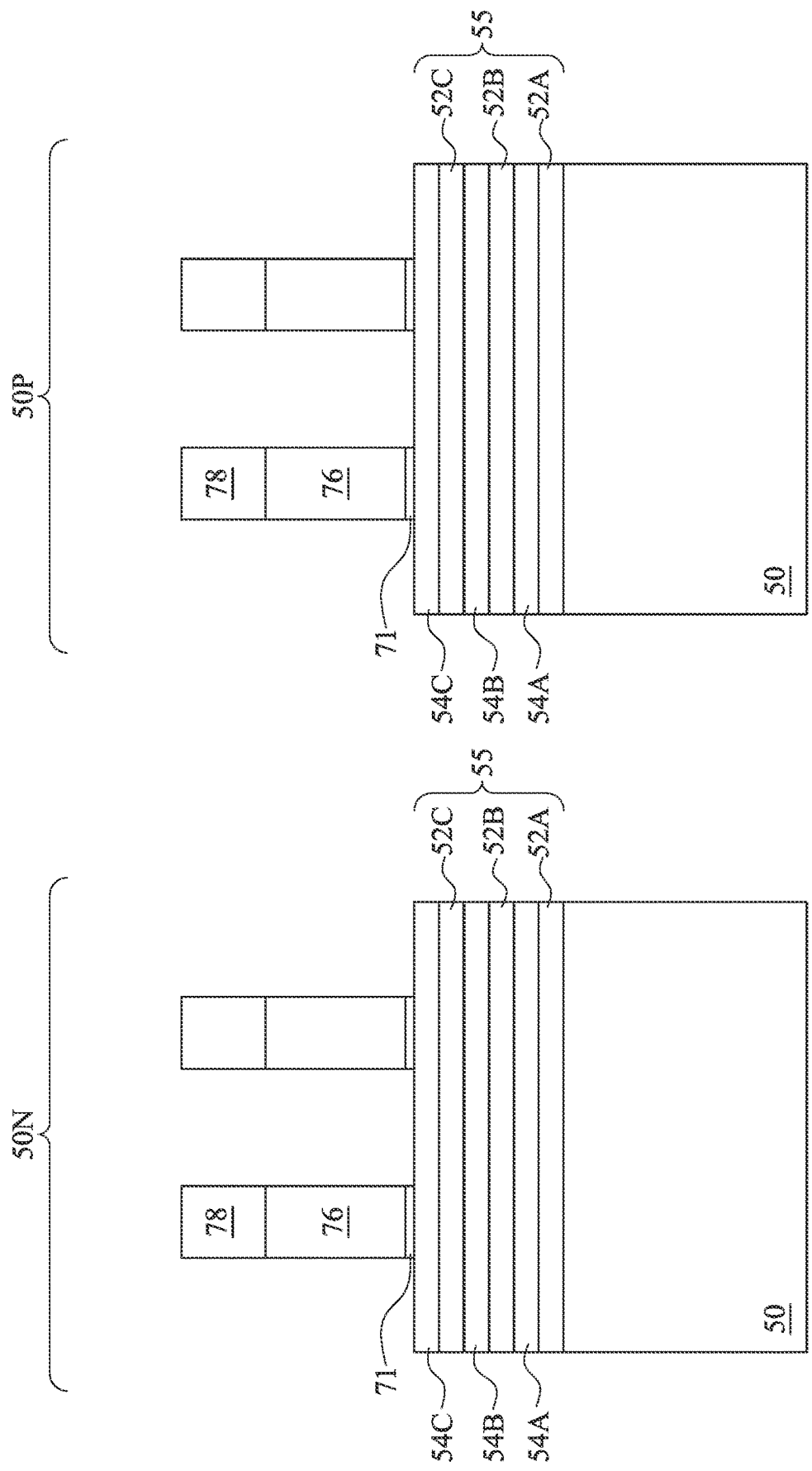

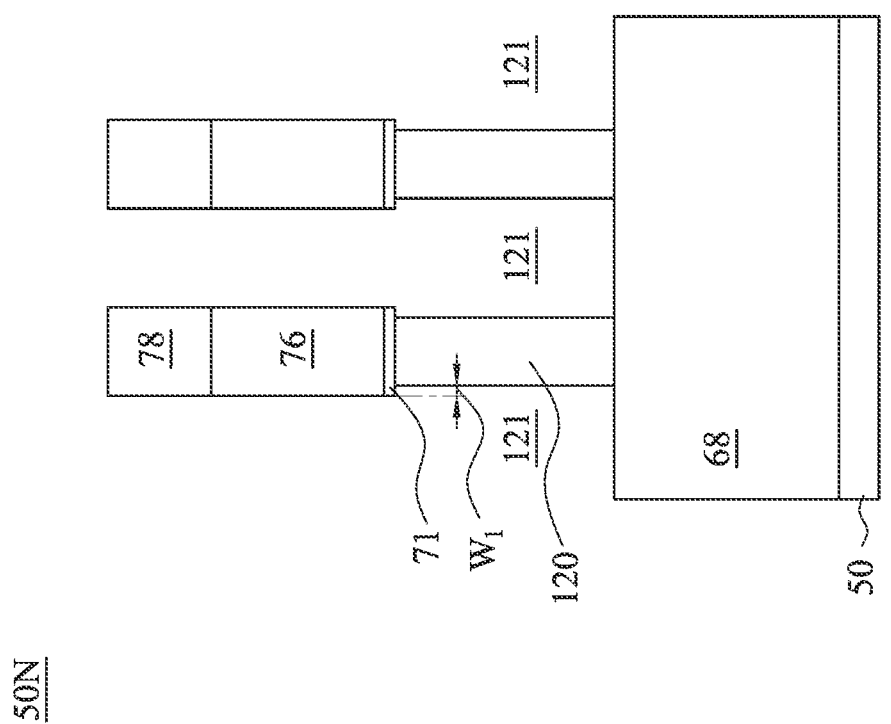

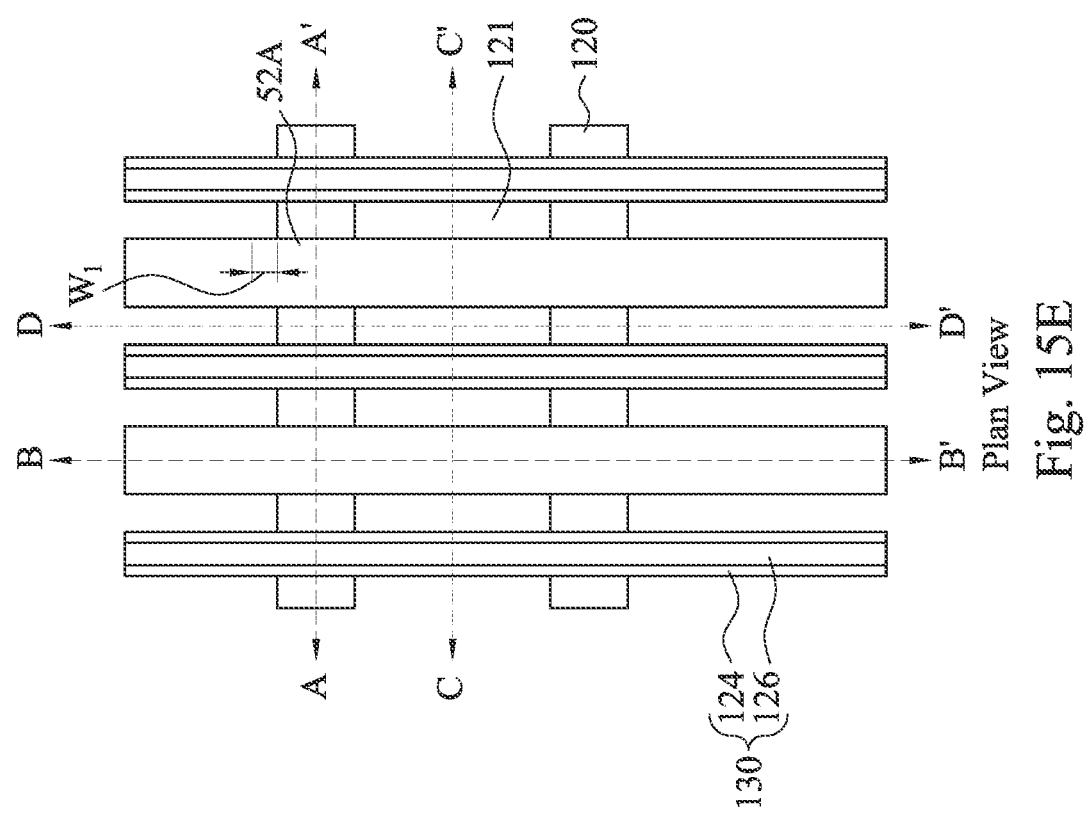

Cross section B-B'

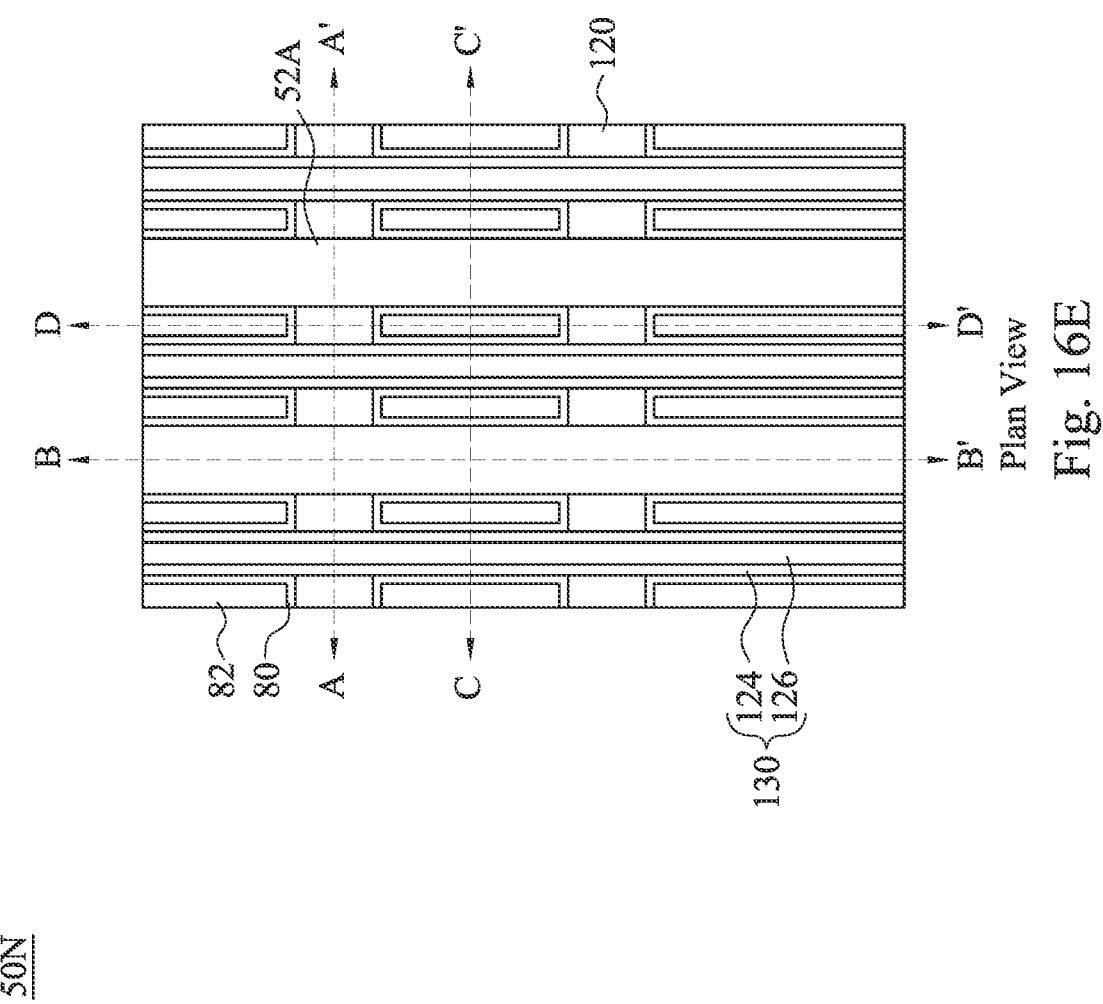

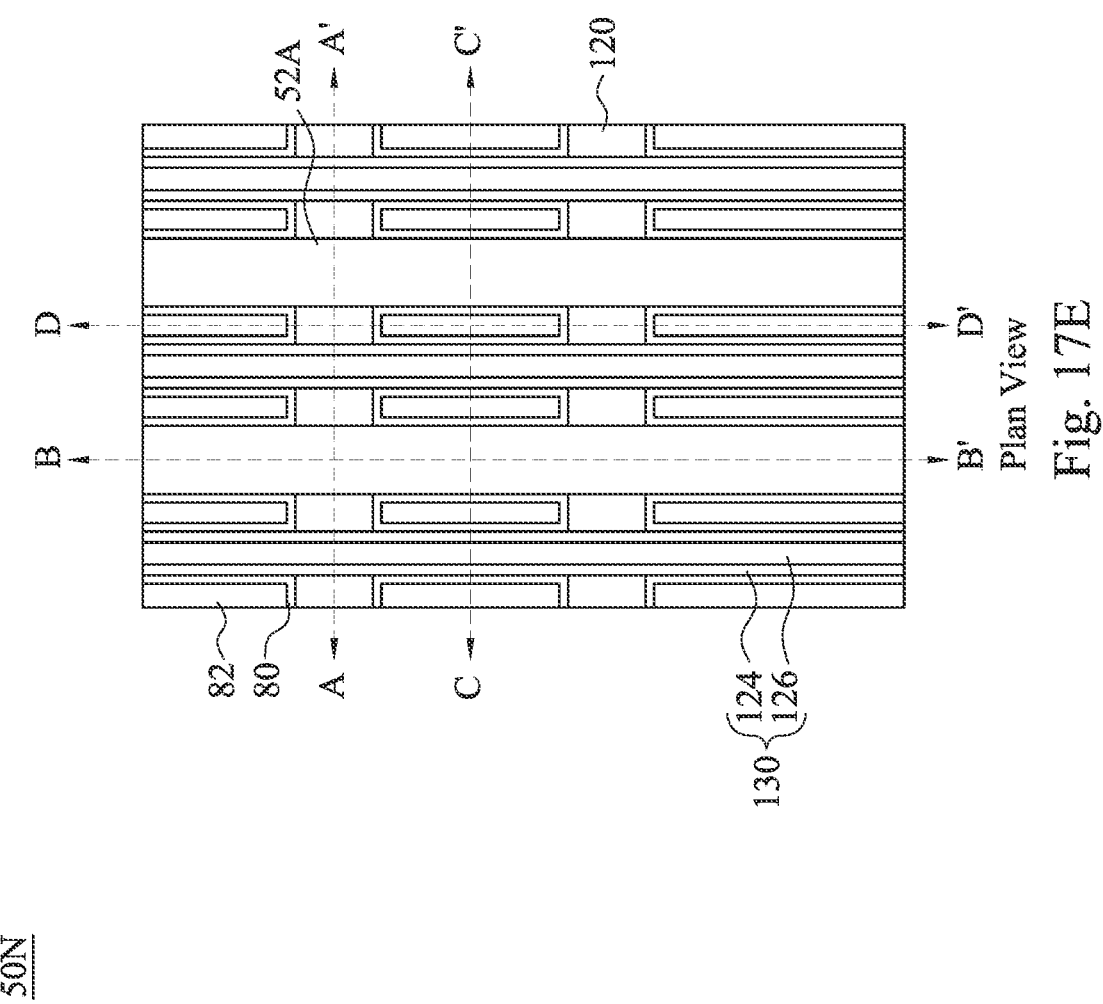
Fig. 17E Plan View

Cross section B-B'

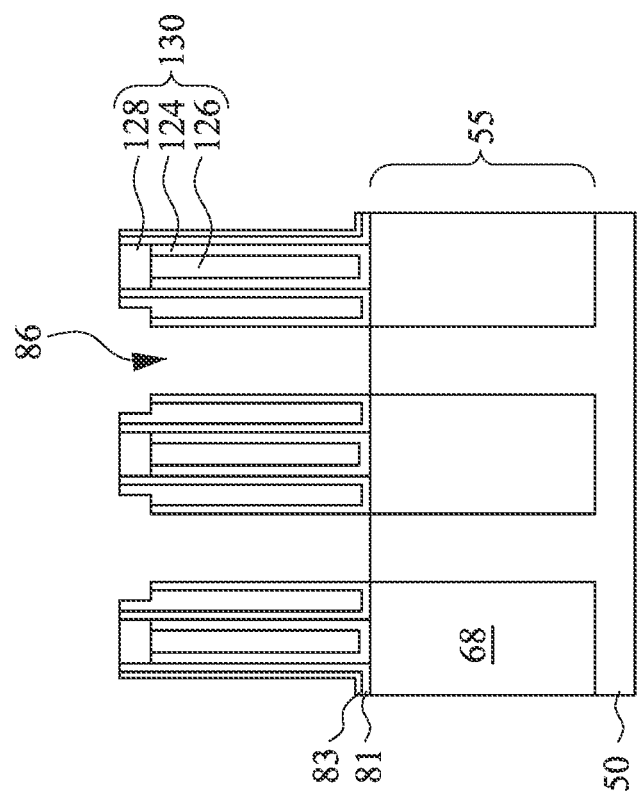

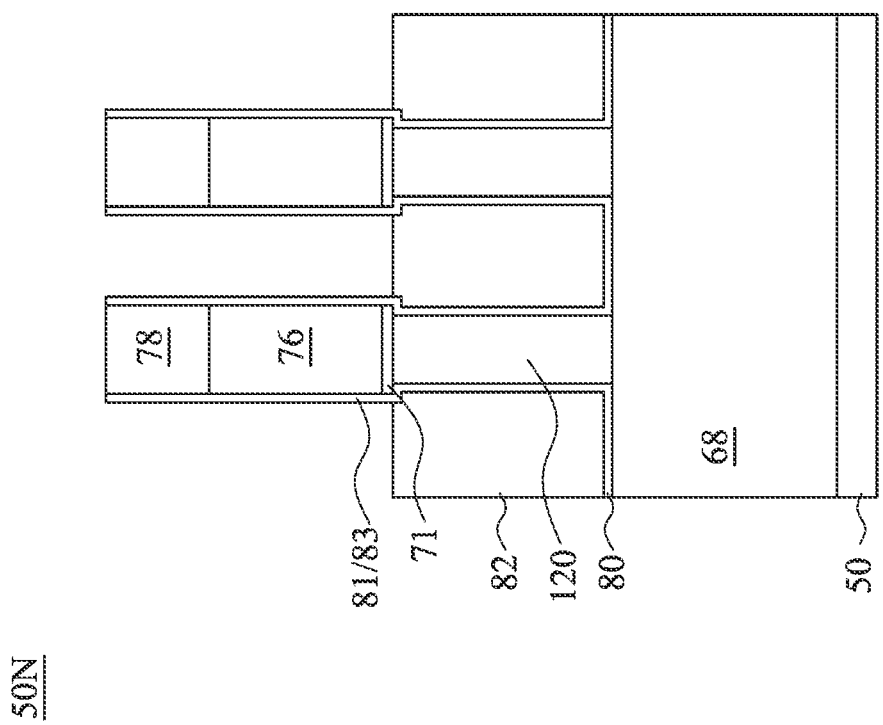
Fig. 18D Cross section D-D'

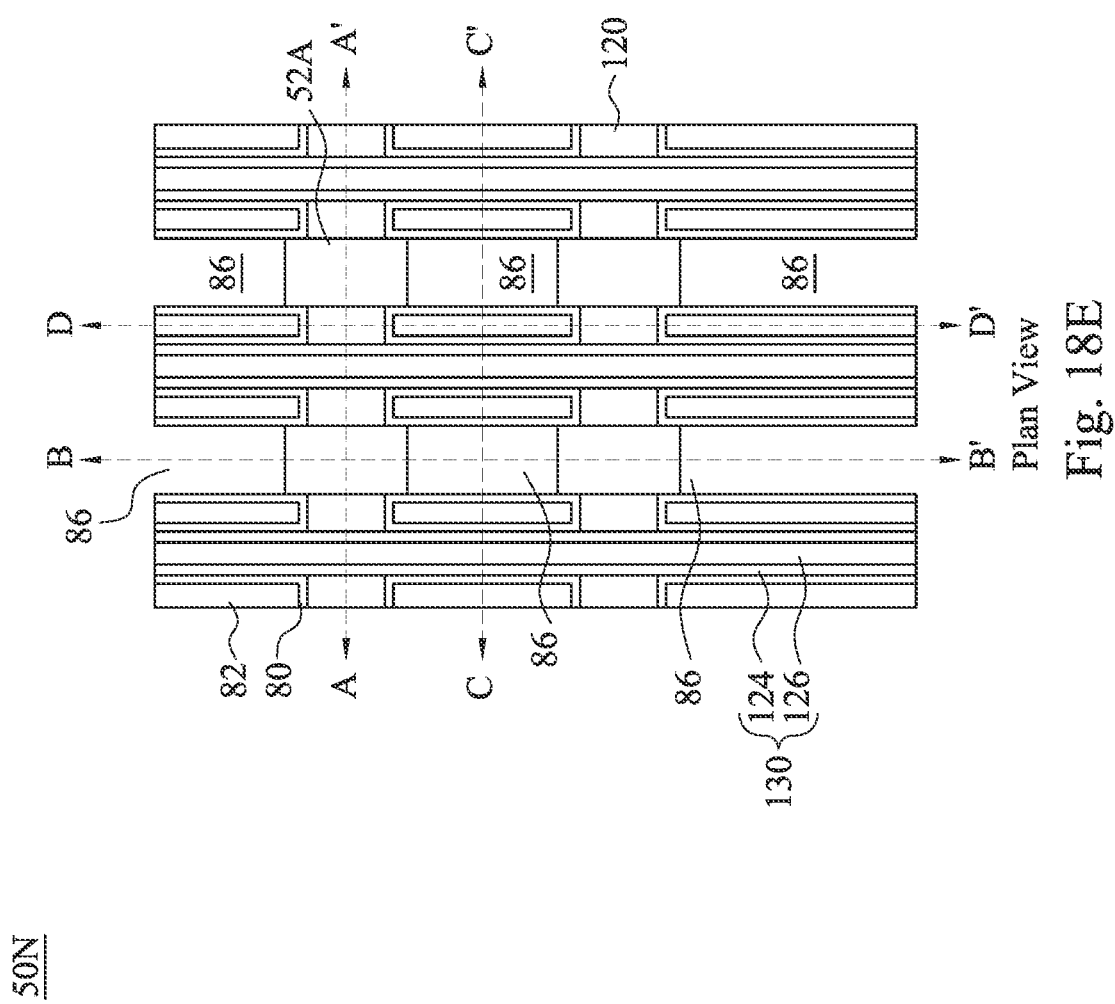

Cross section B-B'

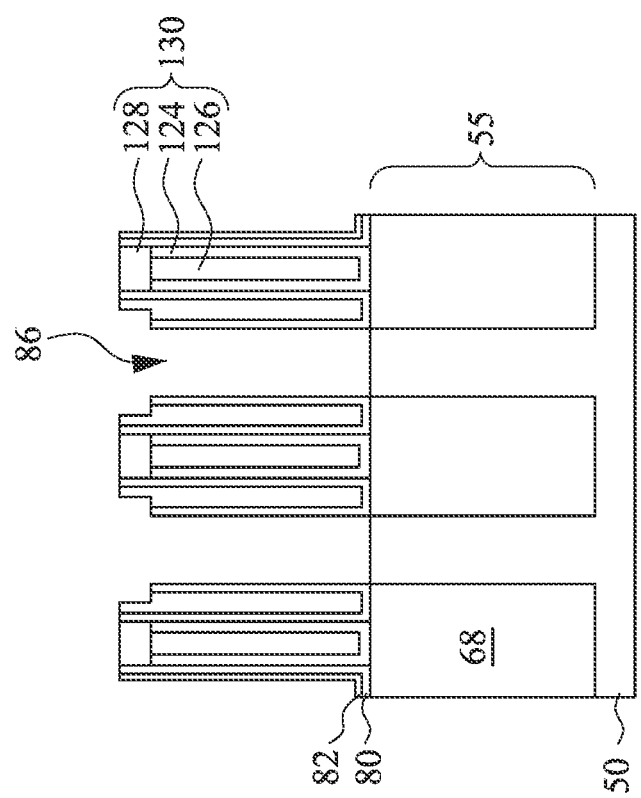

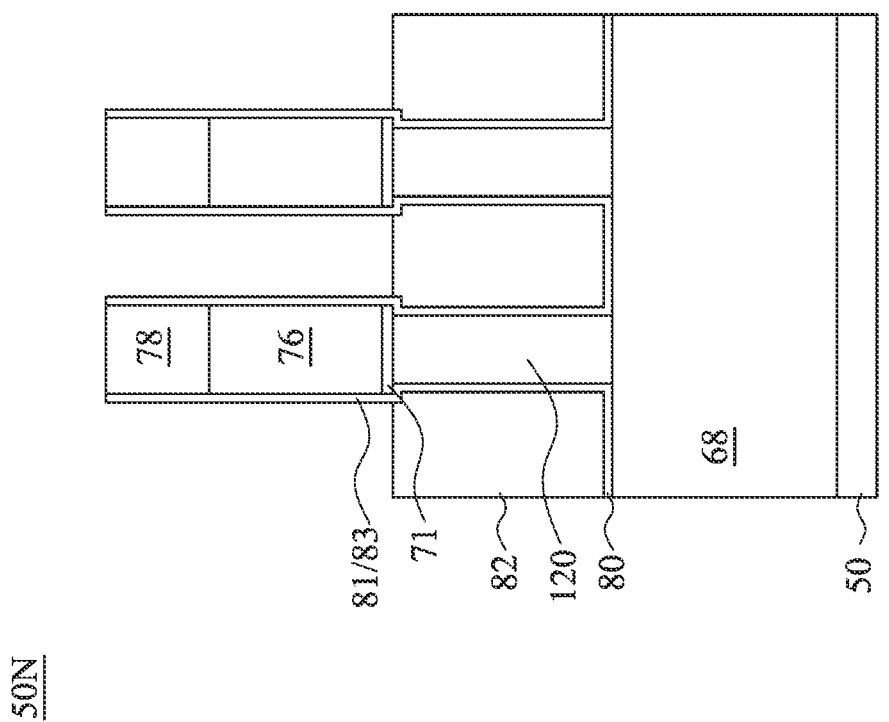

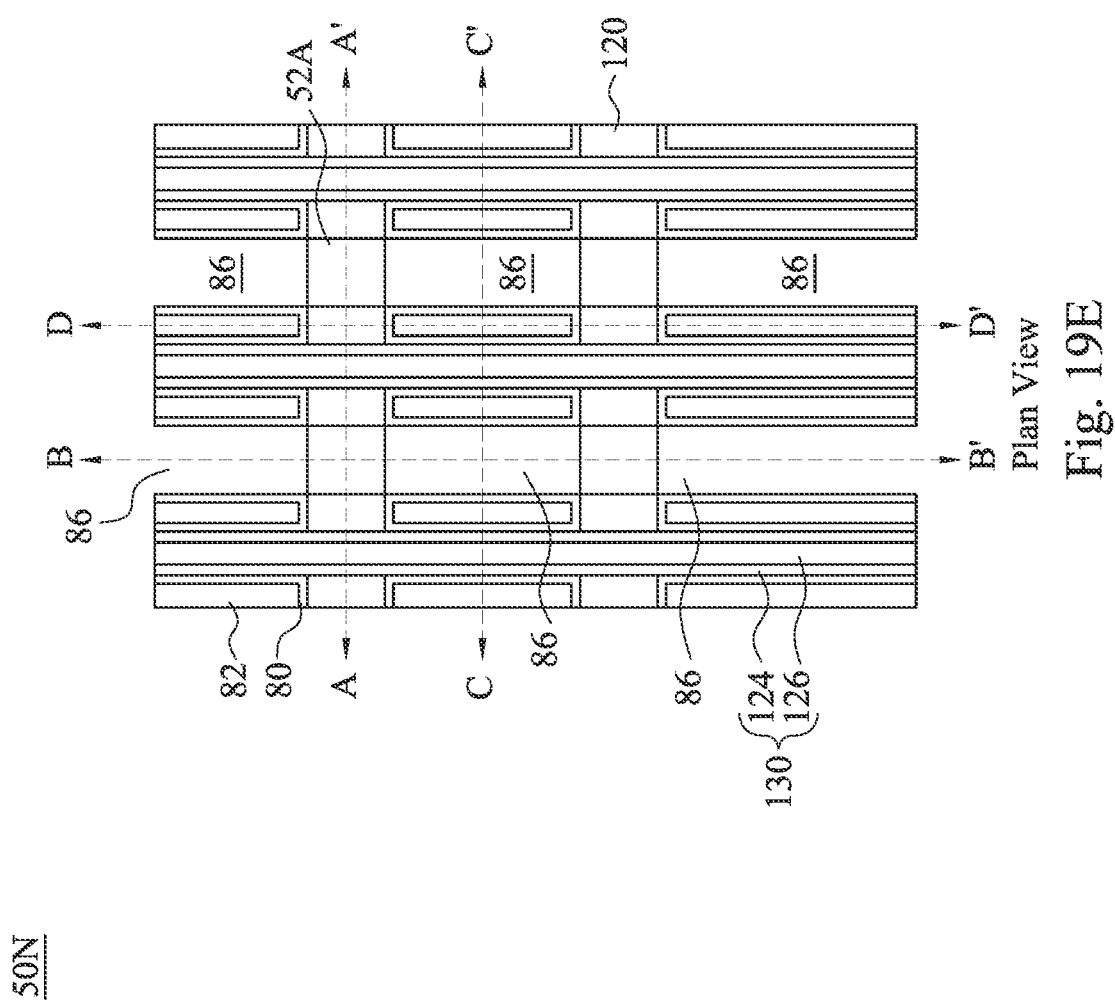

Cross section B-B'

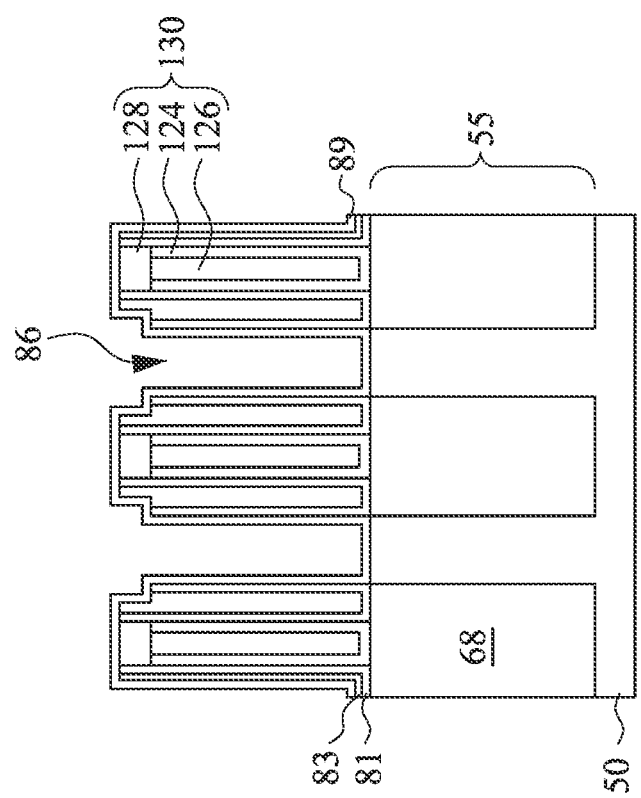

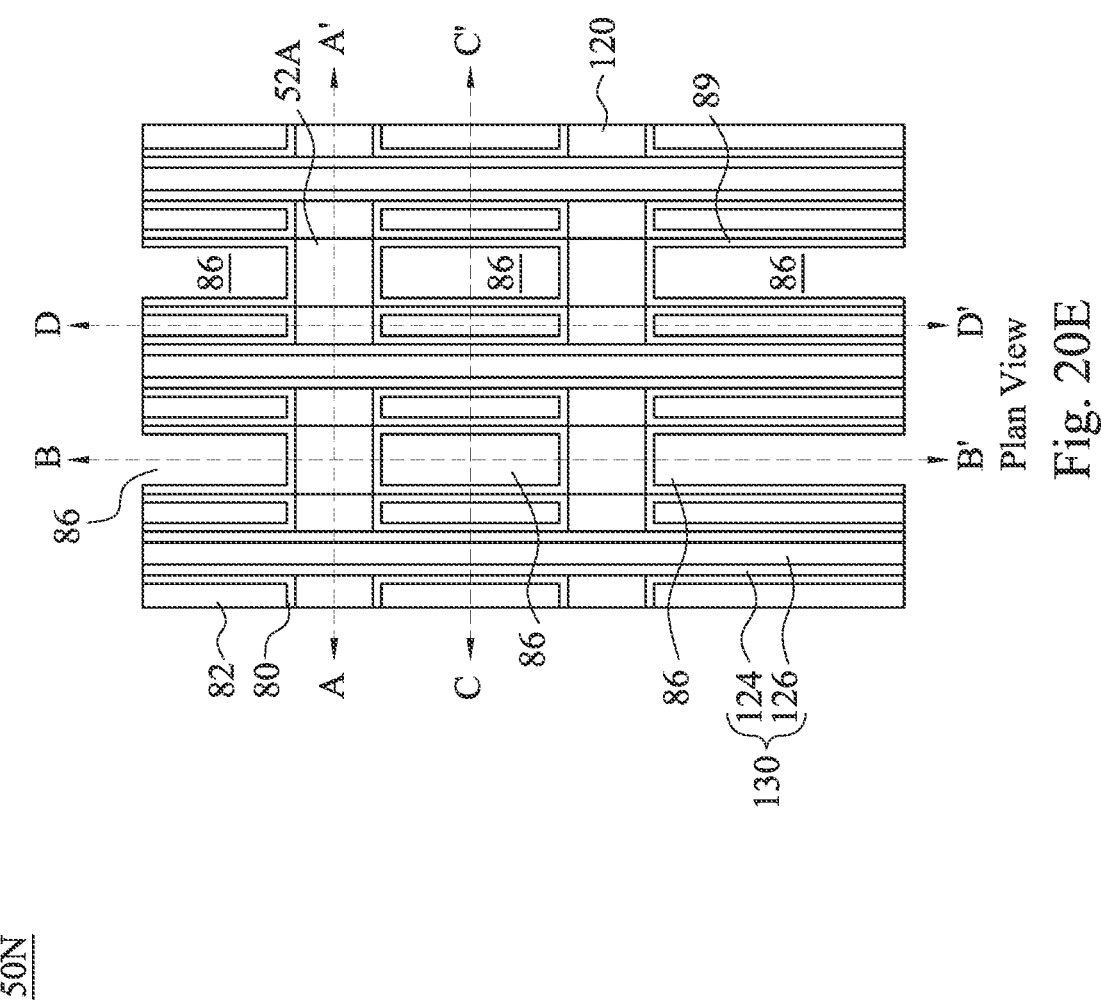

Cross section B-B'

Cross section B-B'

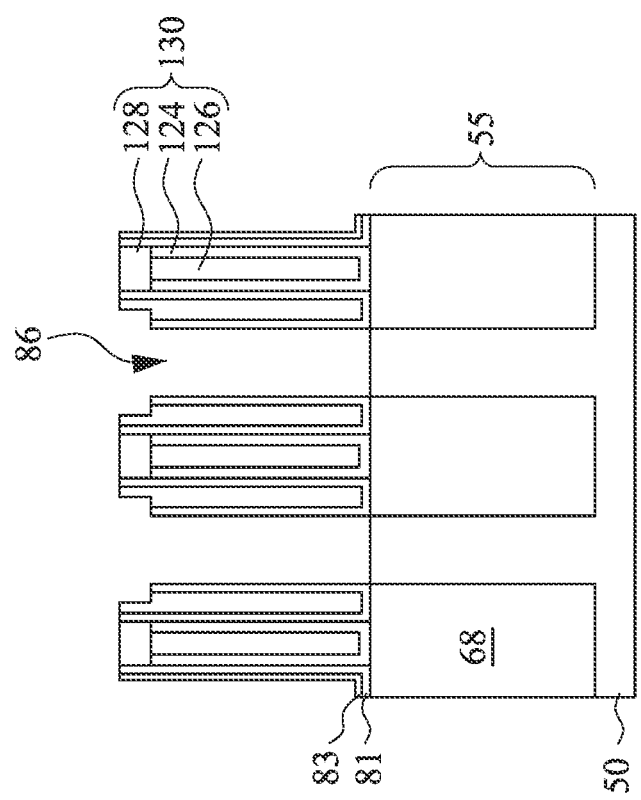

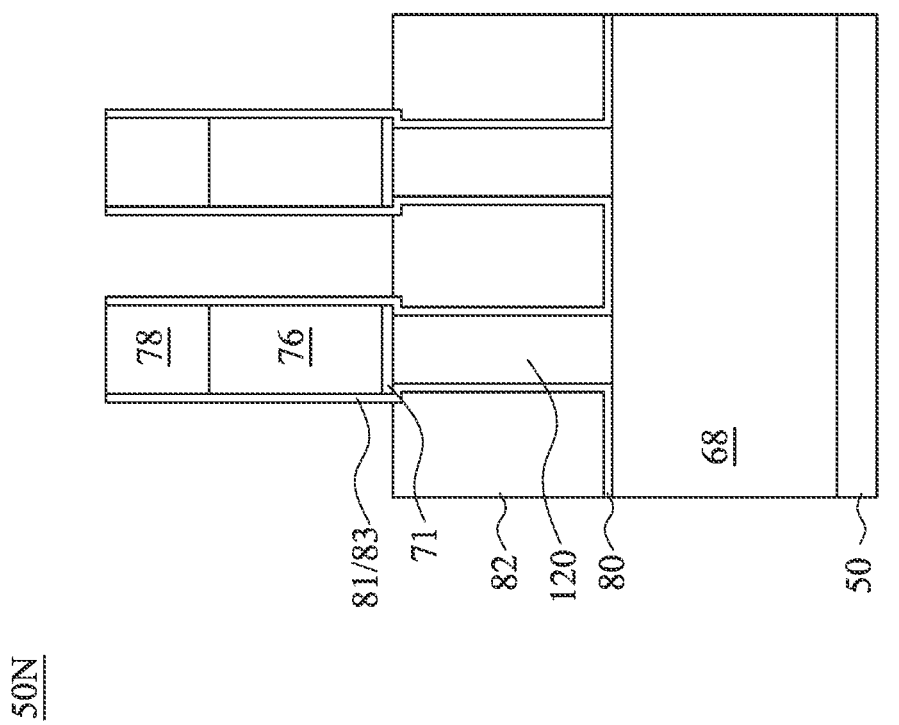

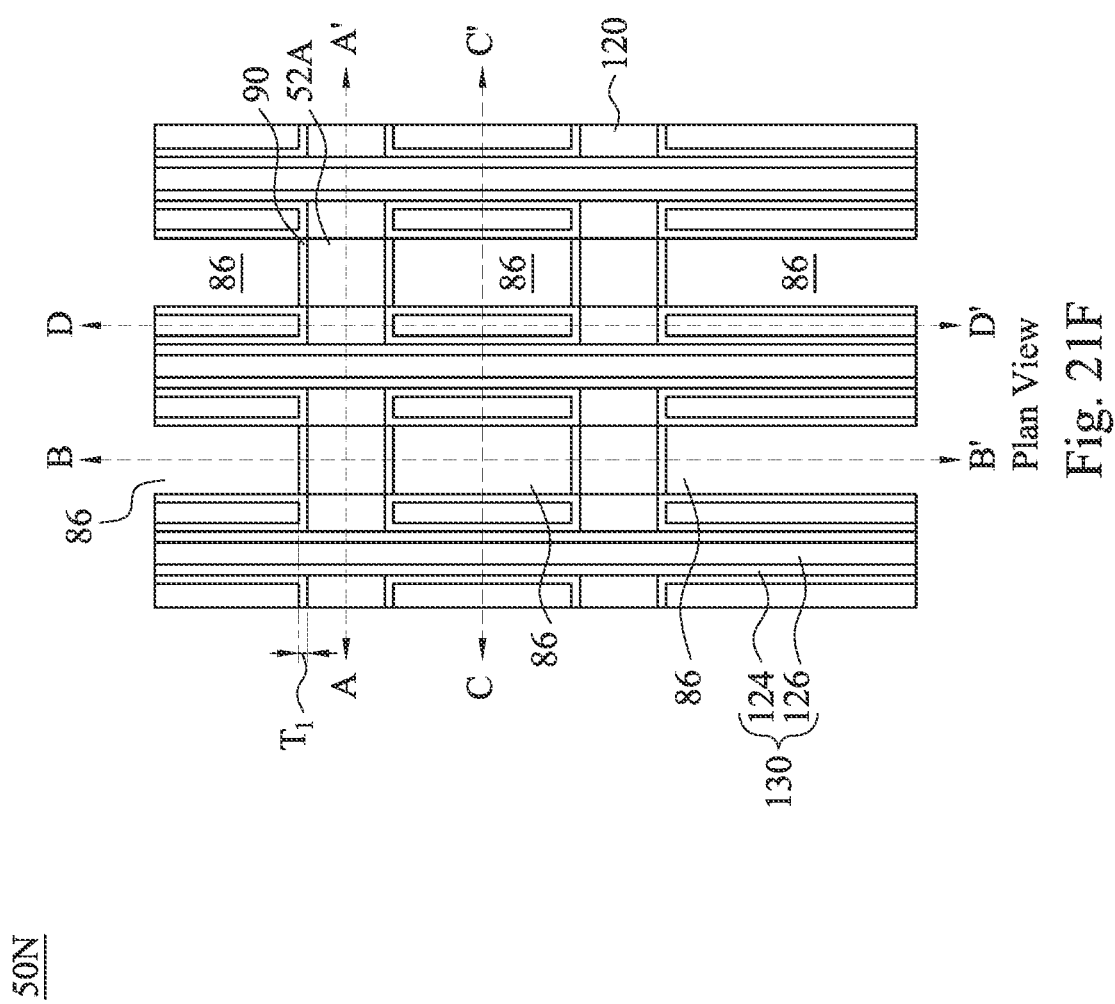

Cross section B-B'

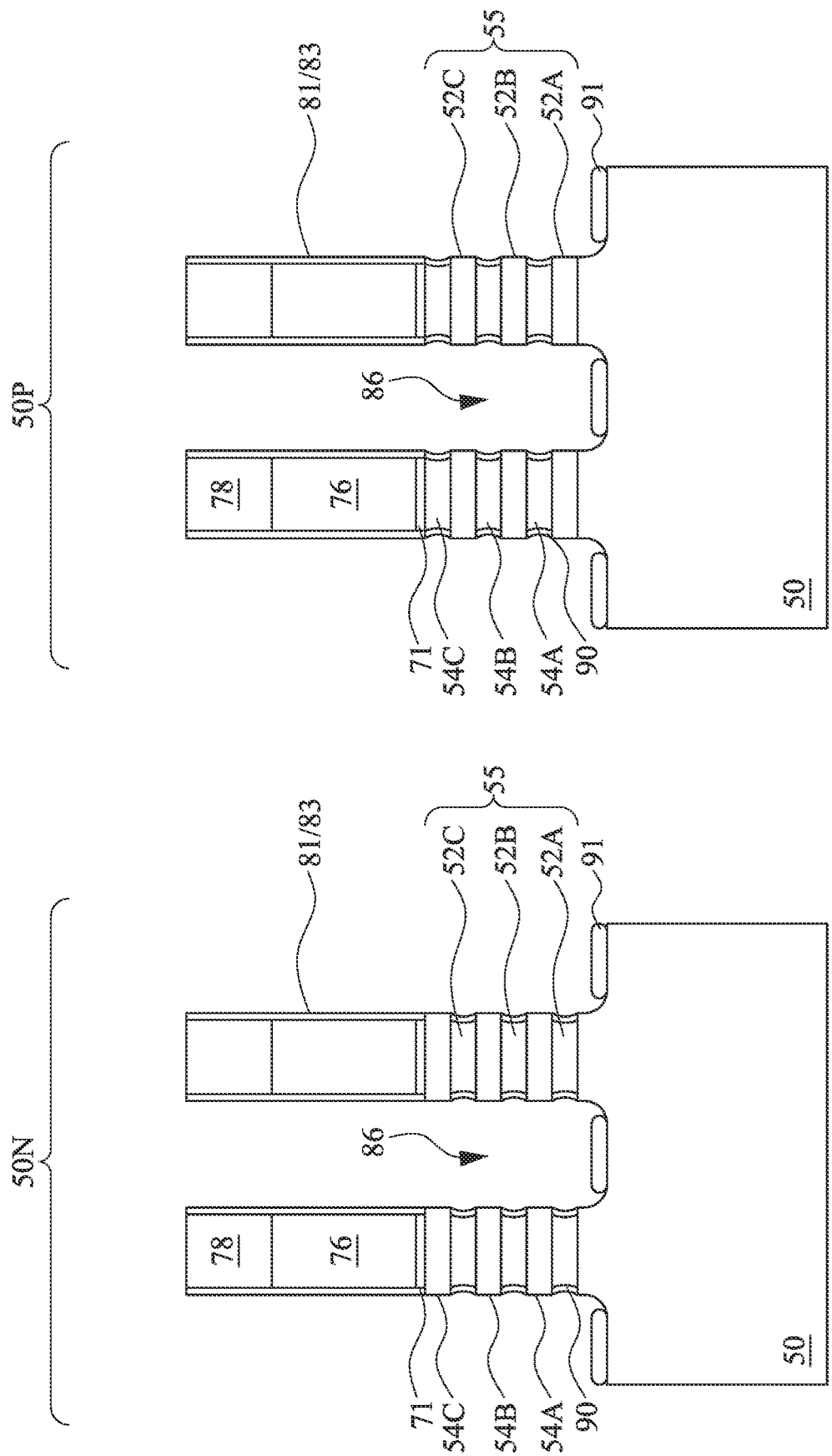
Fig. 22C Cross section B-B'

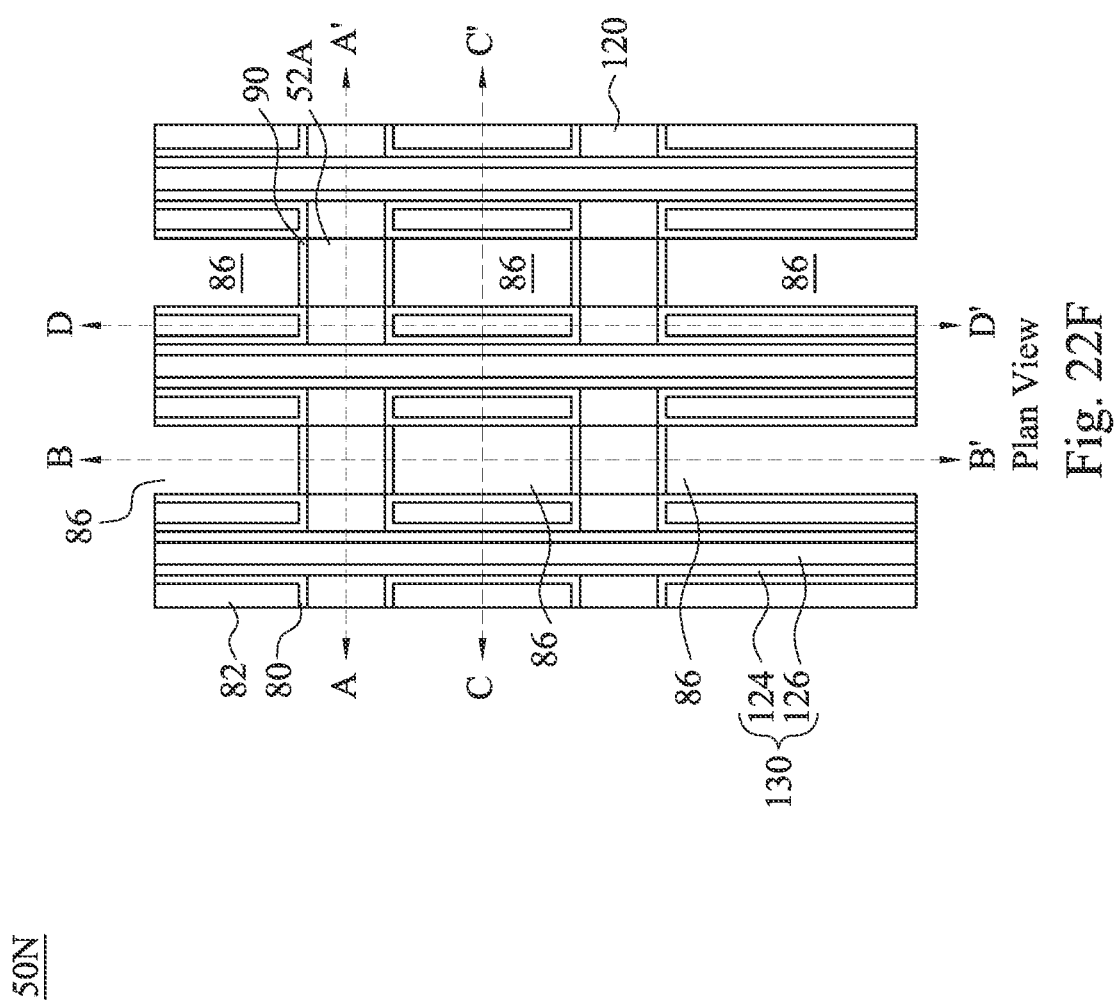

Cross section B-B'

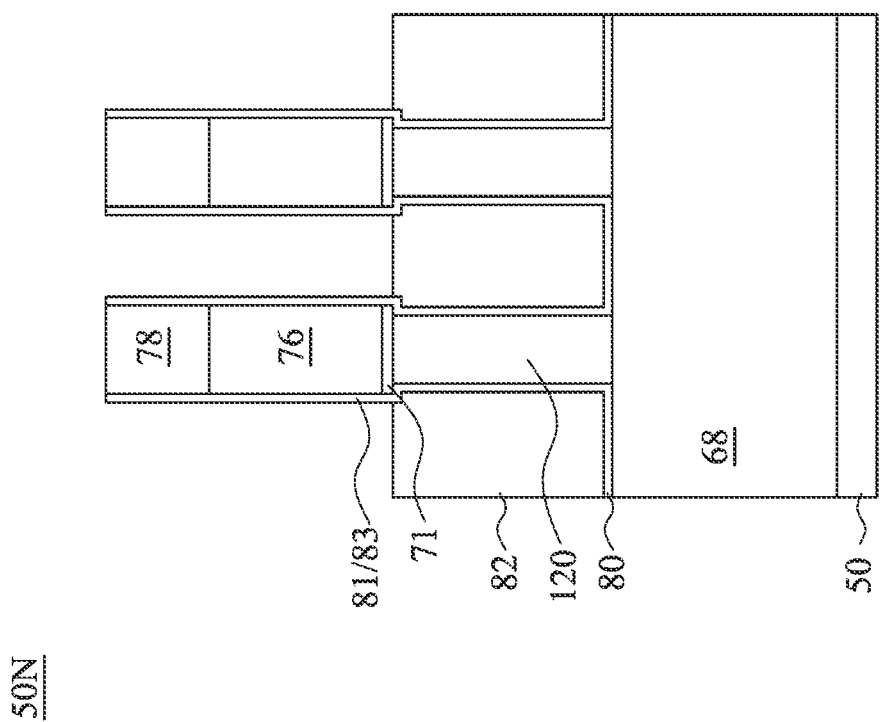

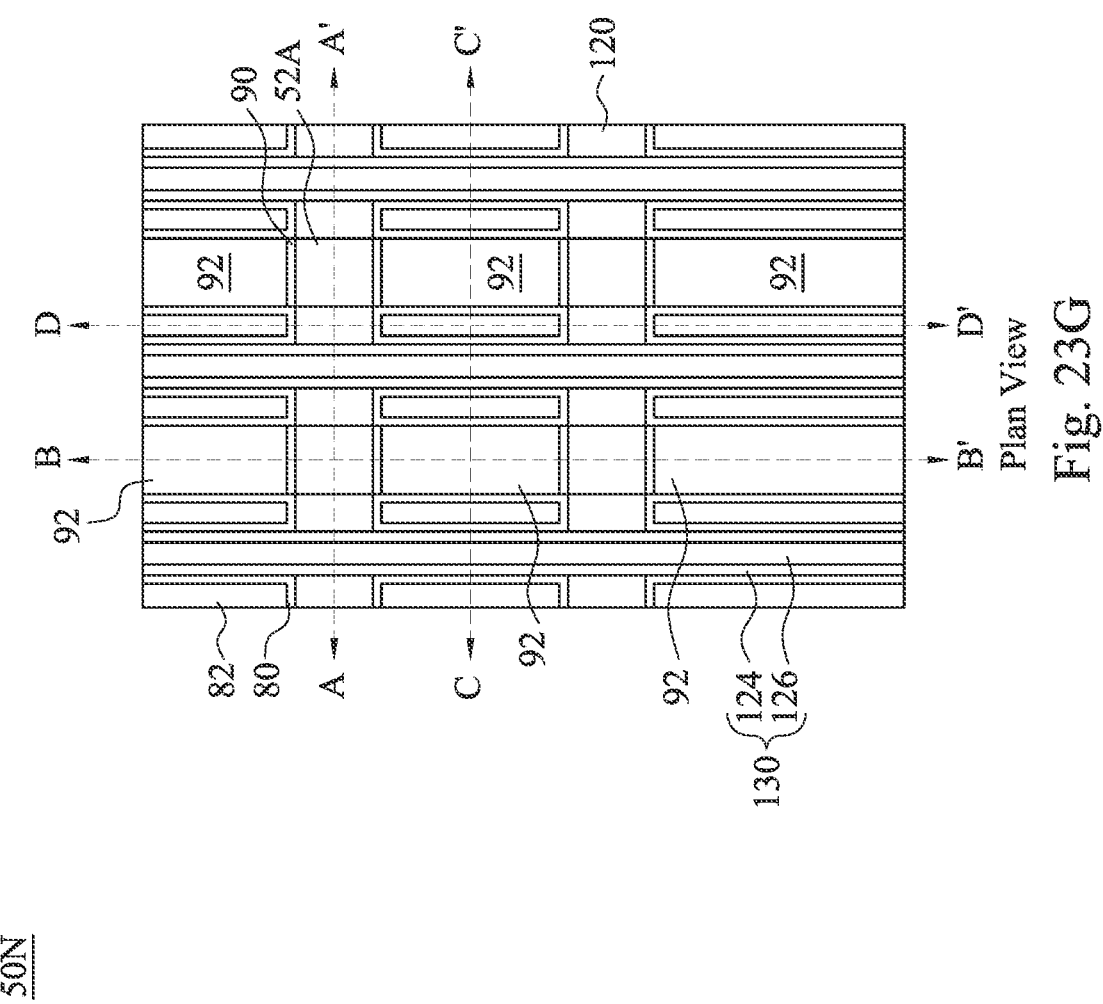
Fig. 23G Plan View

Cross section A-A'

Cross section B-B'

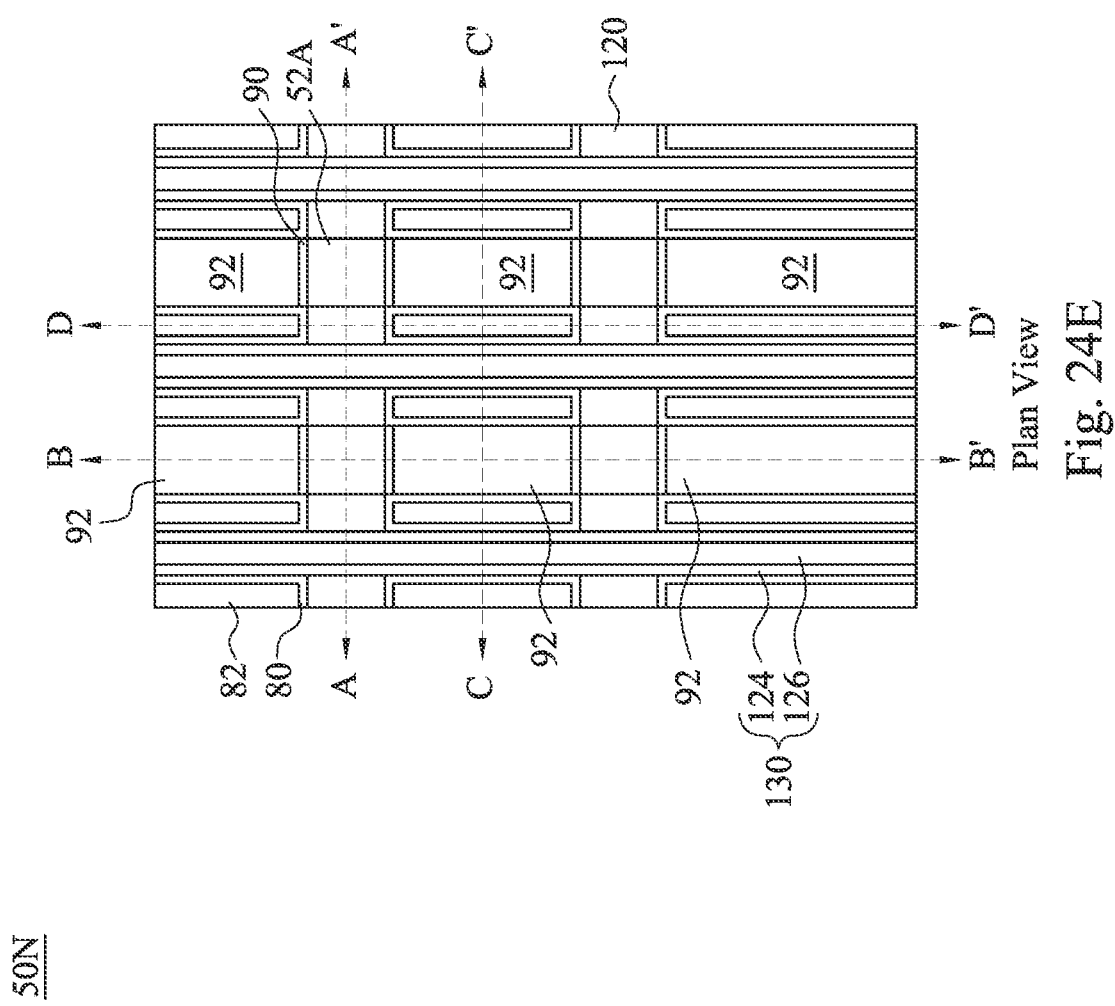

Cross section A-A'

Cross section B-B'

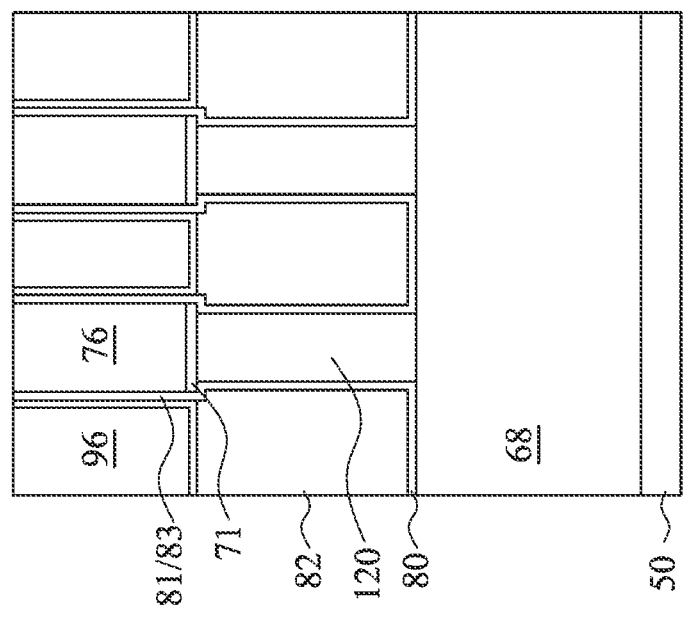

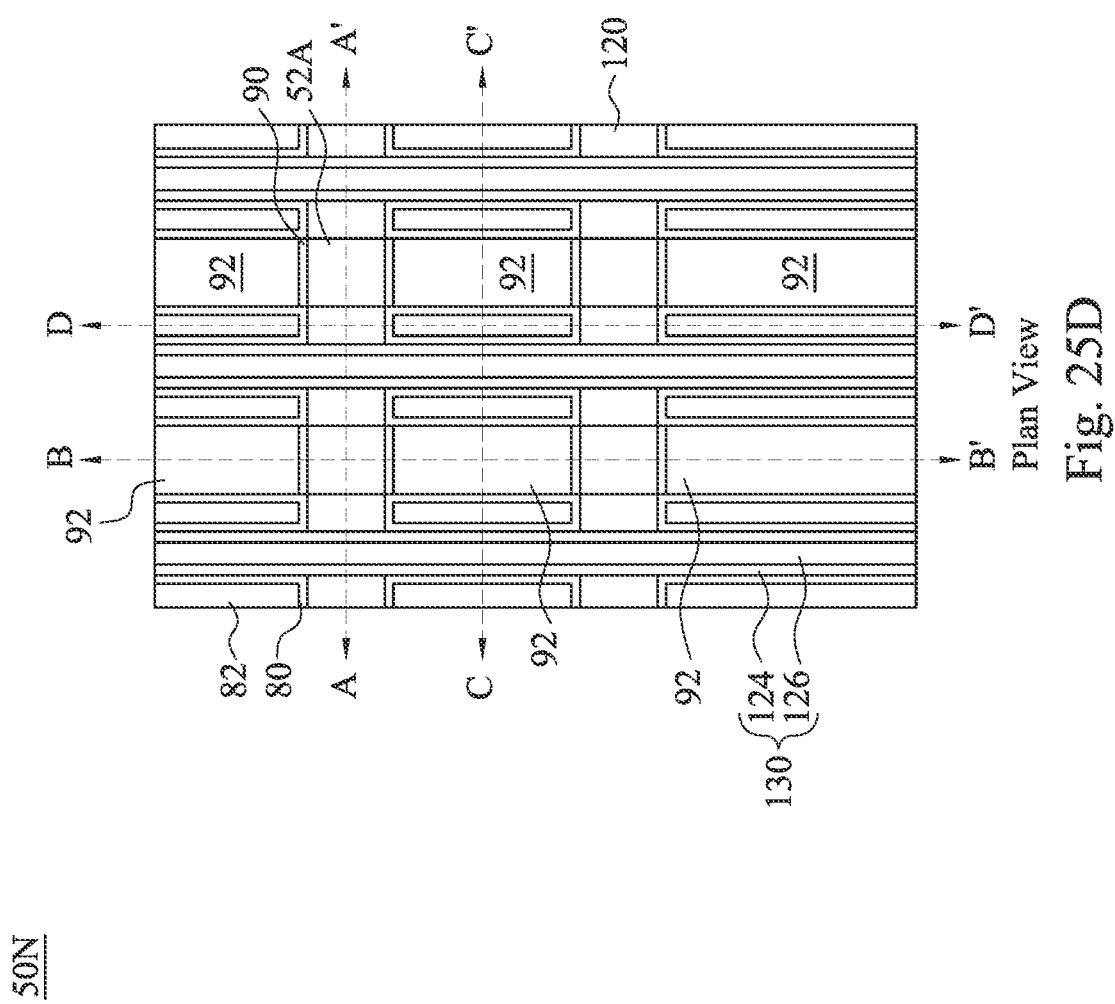

Cross section A-A'

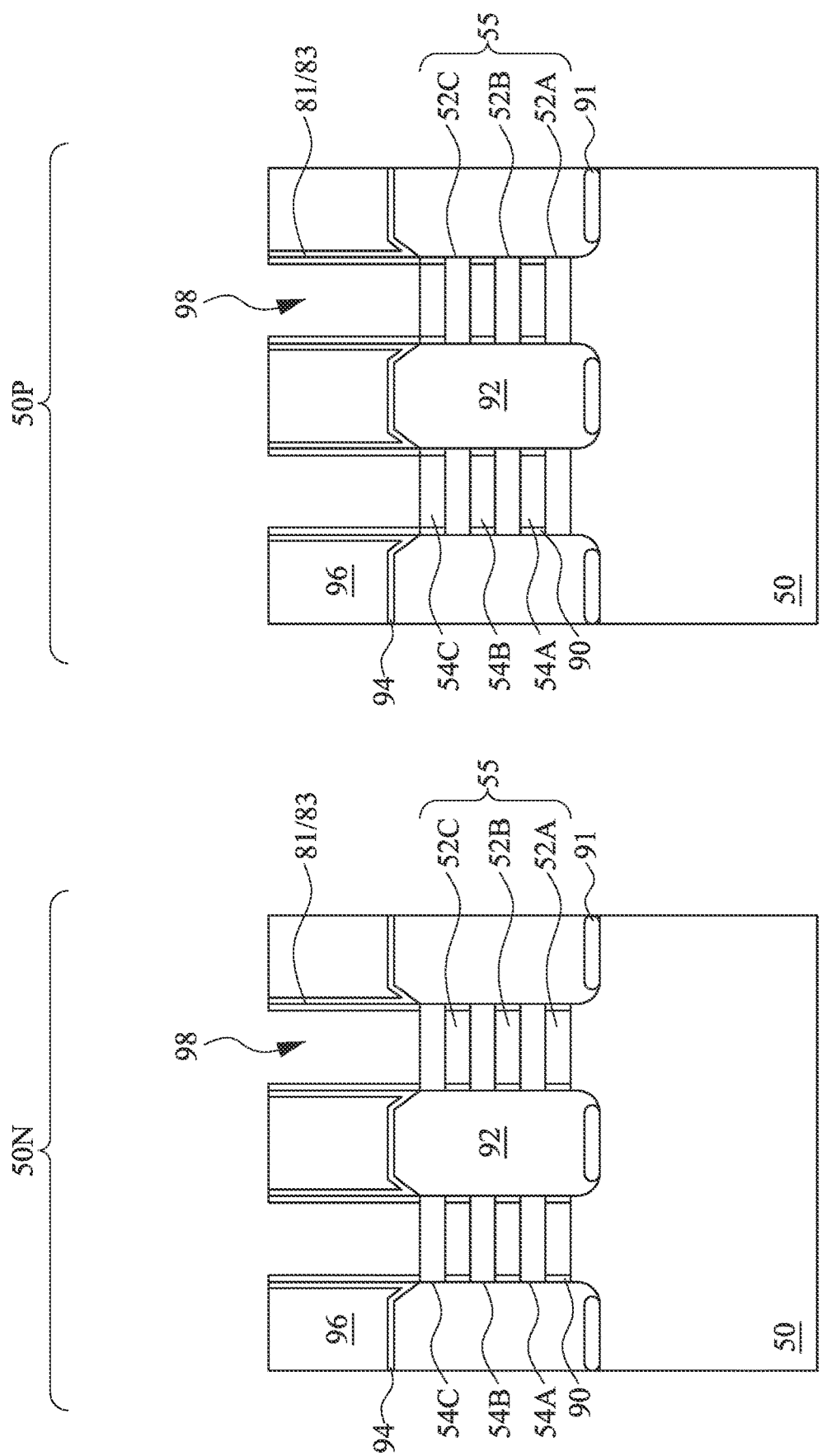
Fig. 26B Cross section B-B'

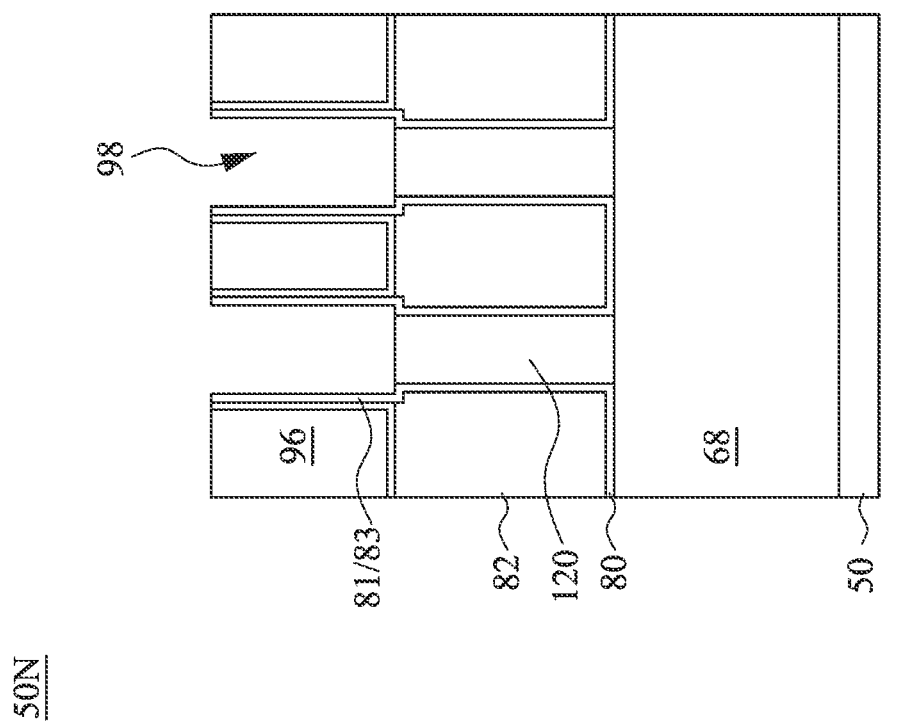

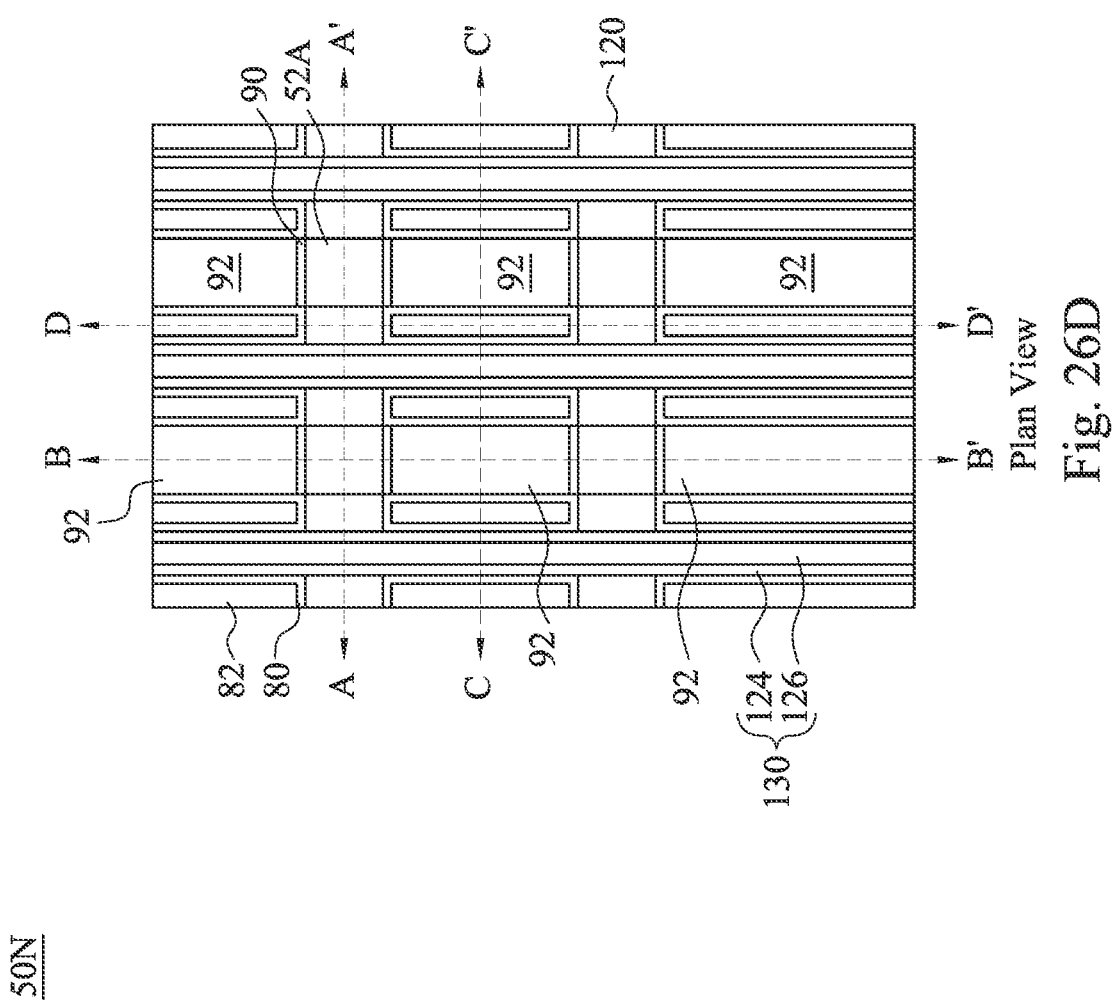

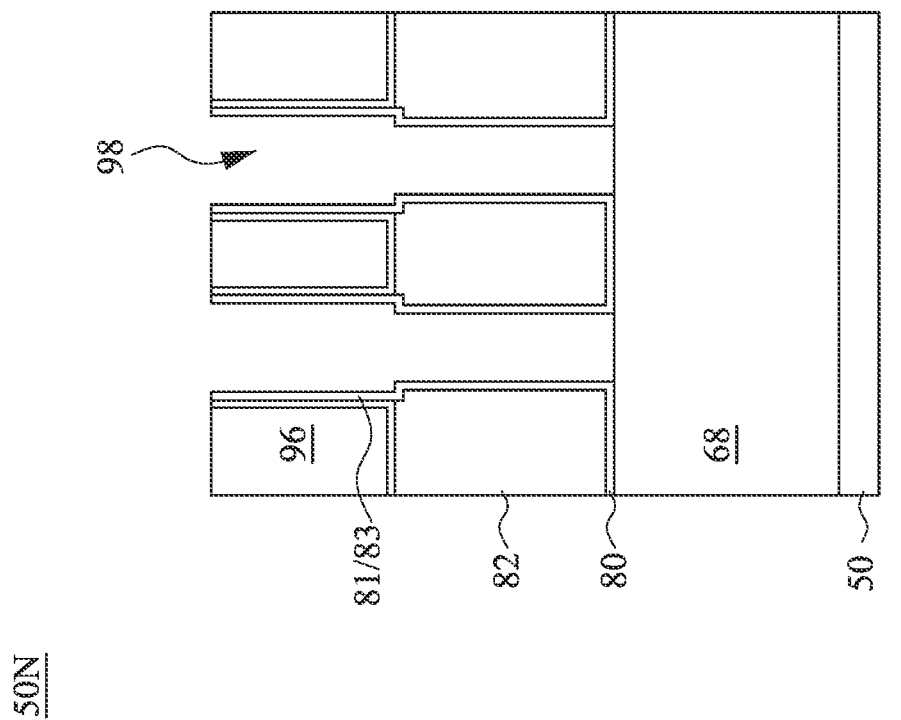
Fig. 27C Cross section D-D'

Plan View

Cross section A-A'

Cross section B-B'

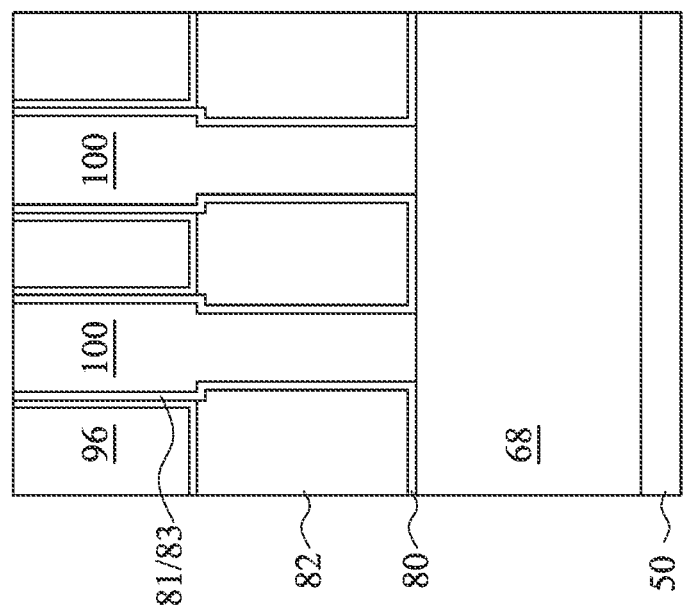

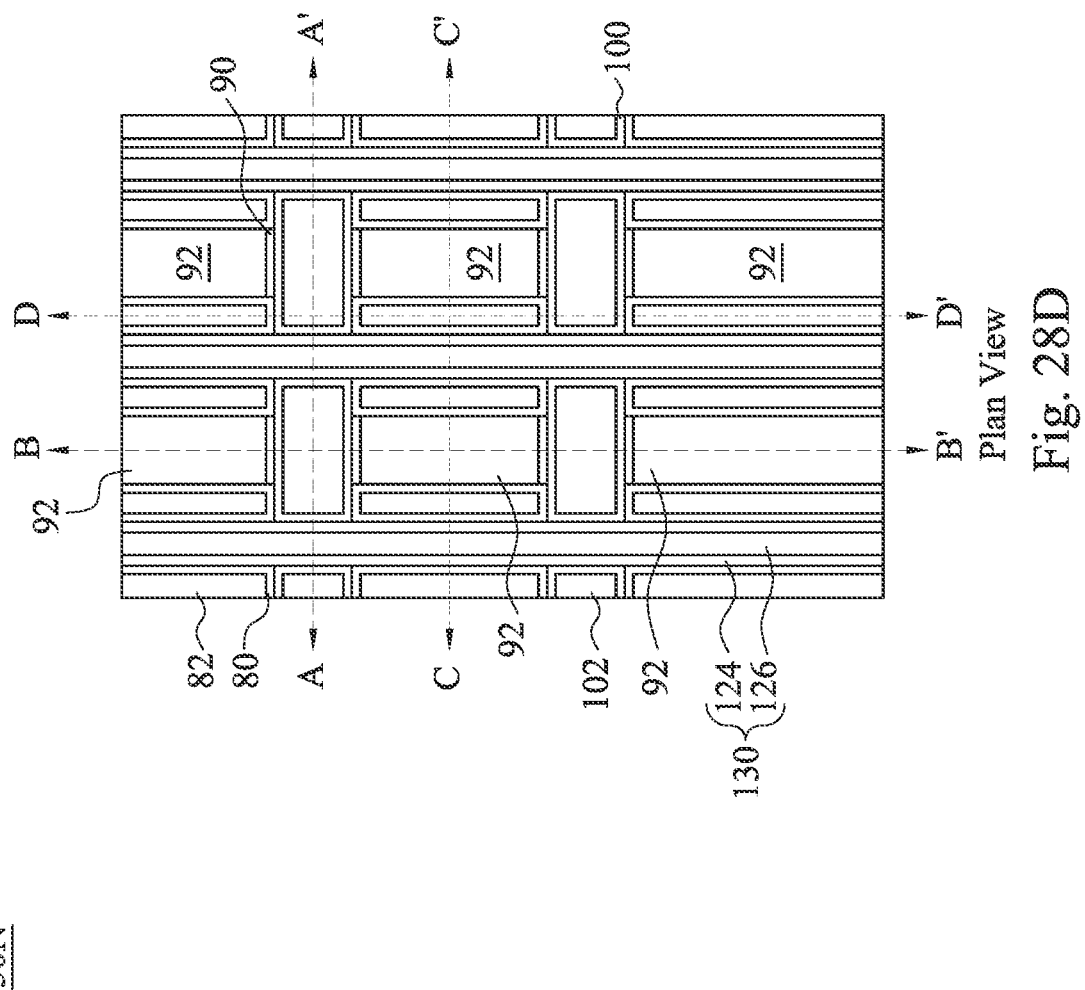
Fig. 28D Plan View

Cross section A-A'

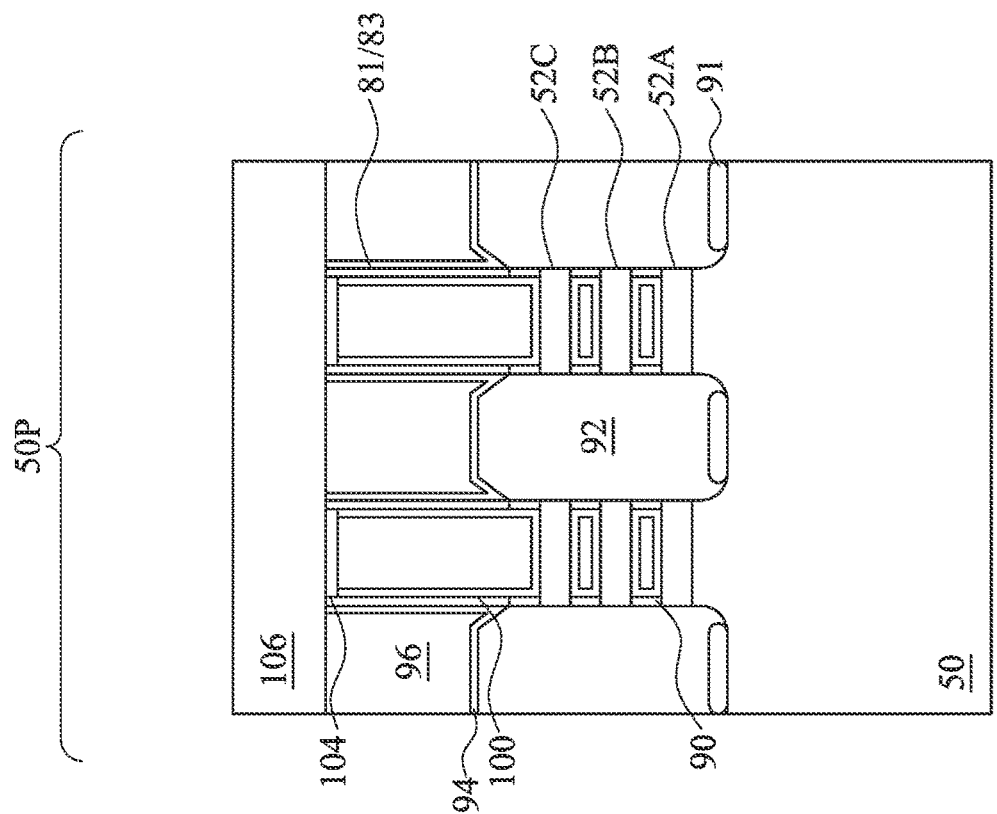
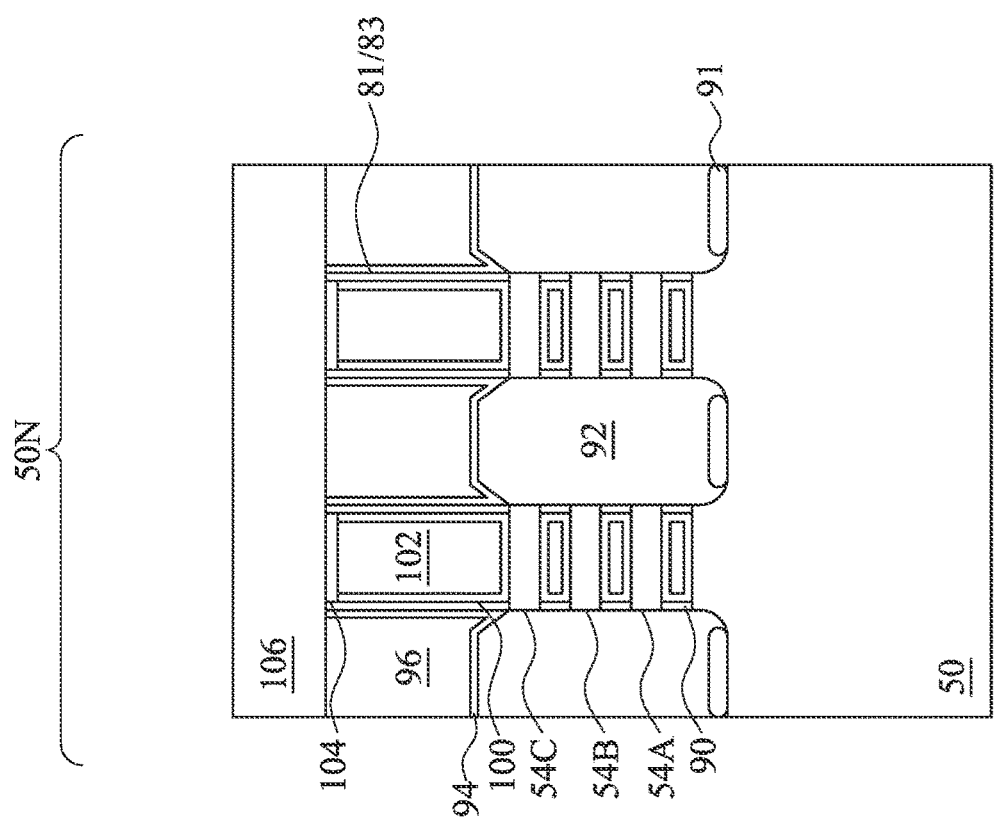
Cross section B-B'
Fig. 29B

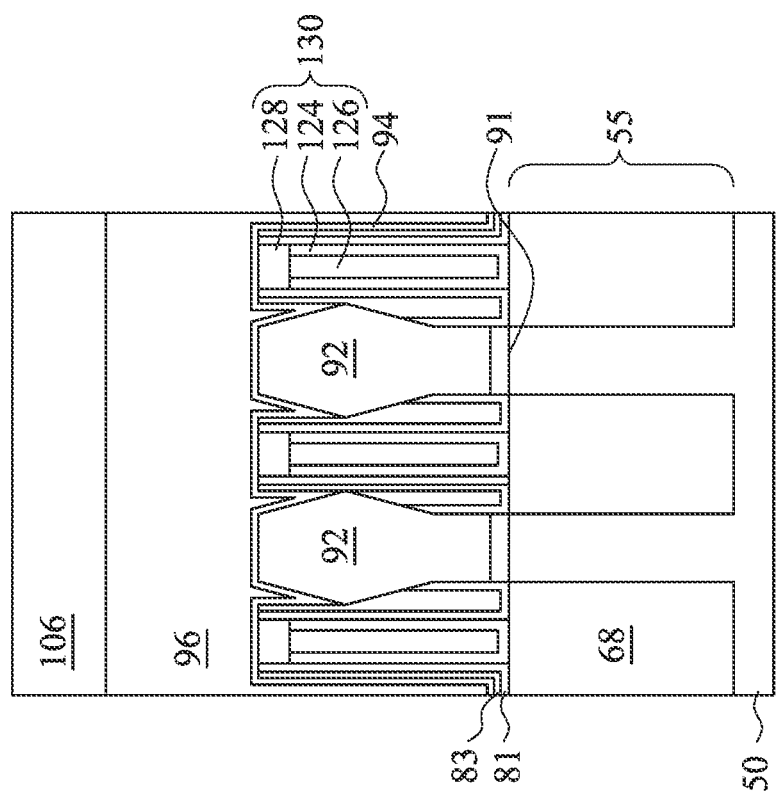
Fig. 29C Cross section C-C'

Cross section D-D'

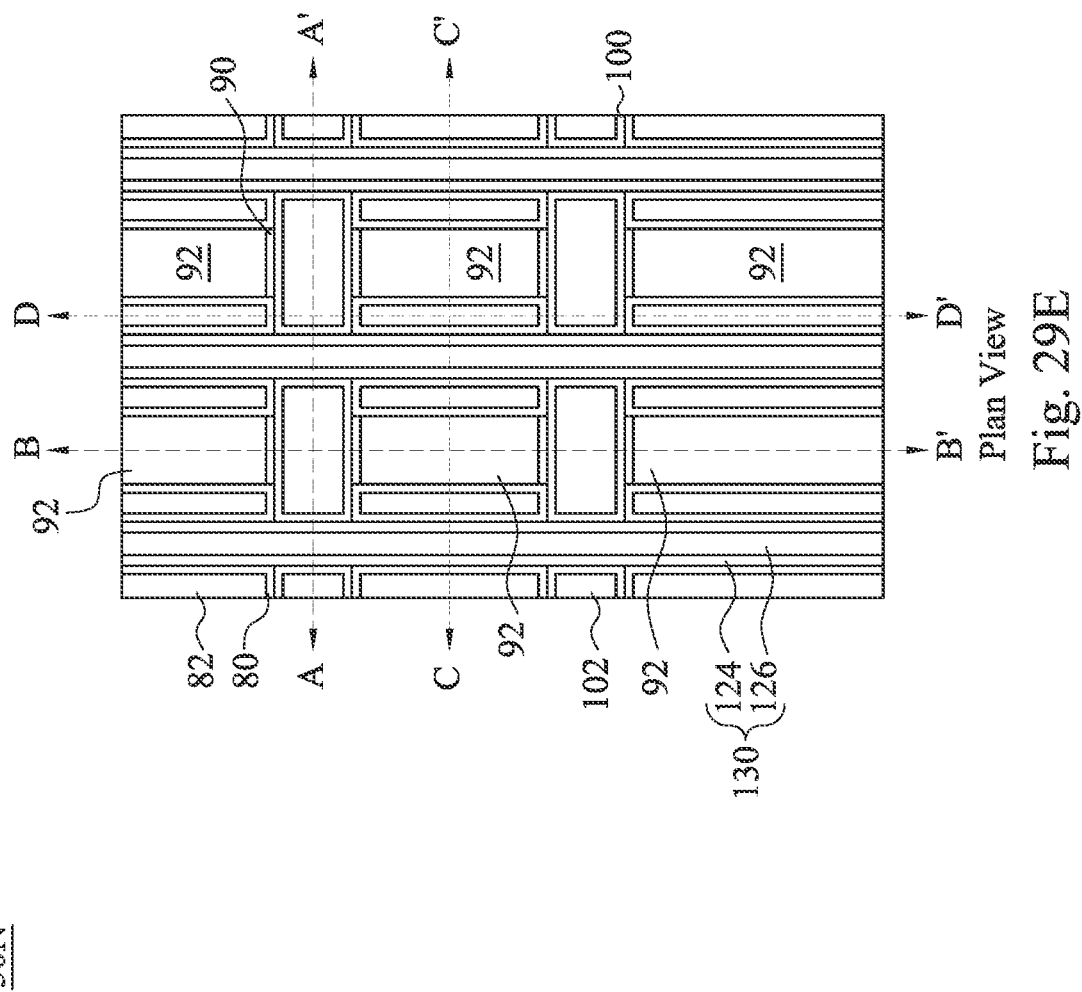
Fig. 29E Plan View

Cross section A-A'

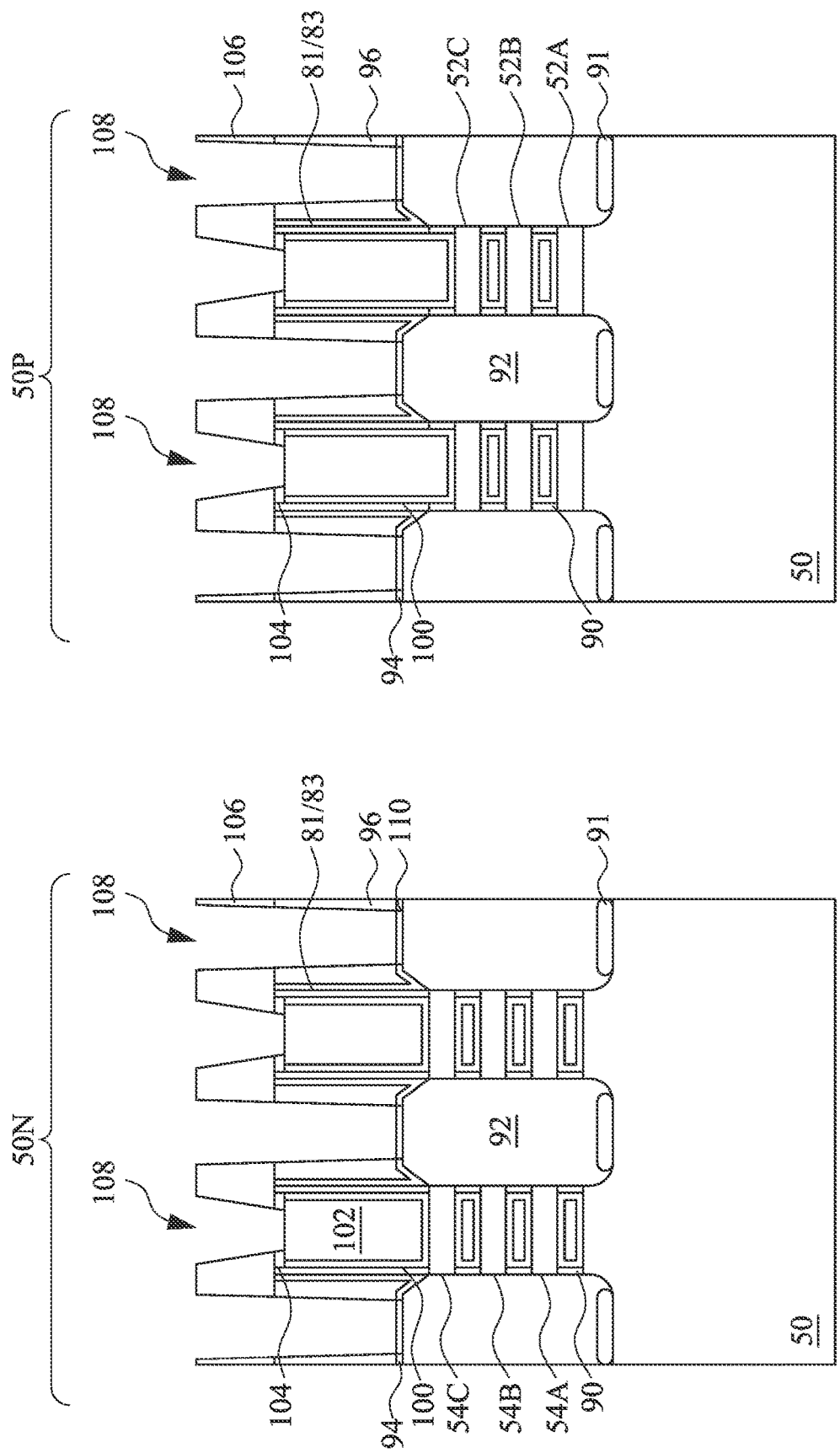
Fig. 30B Cross section B-B'

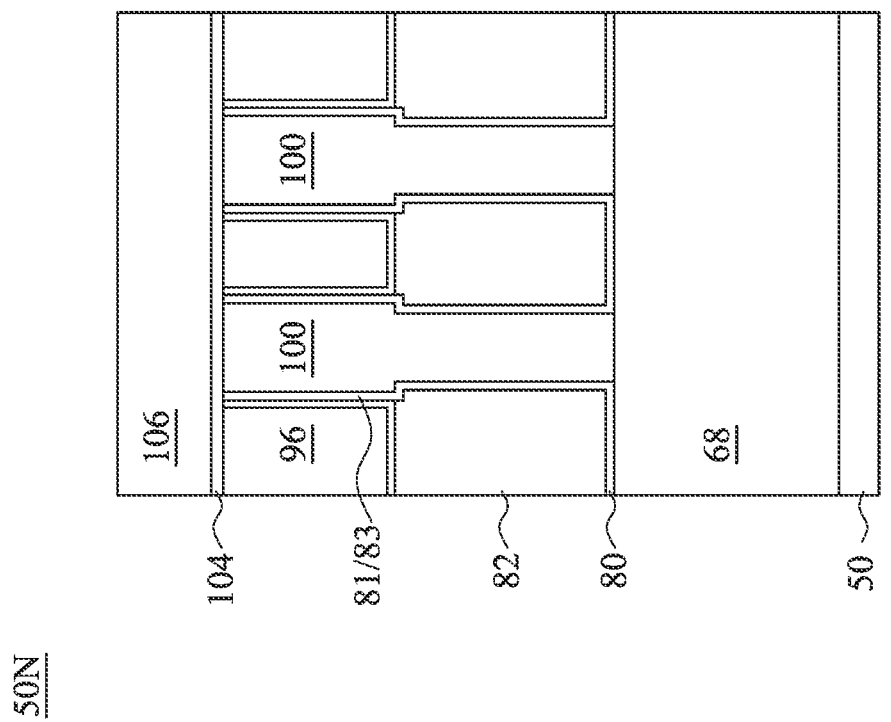
Fig. 30D Cross section D-D'

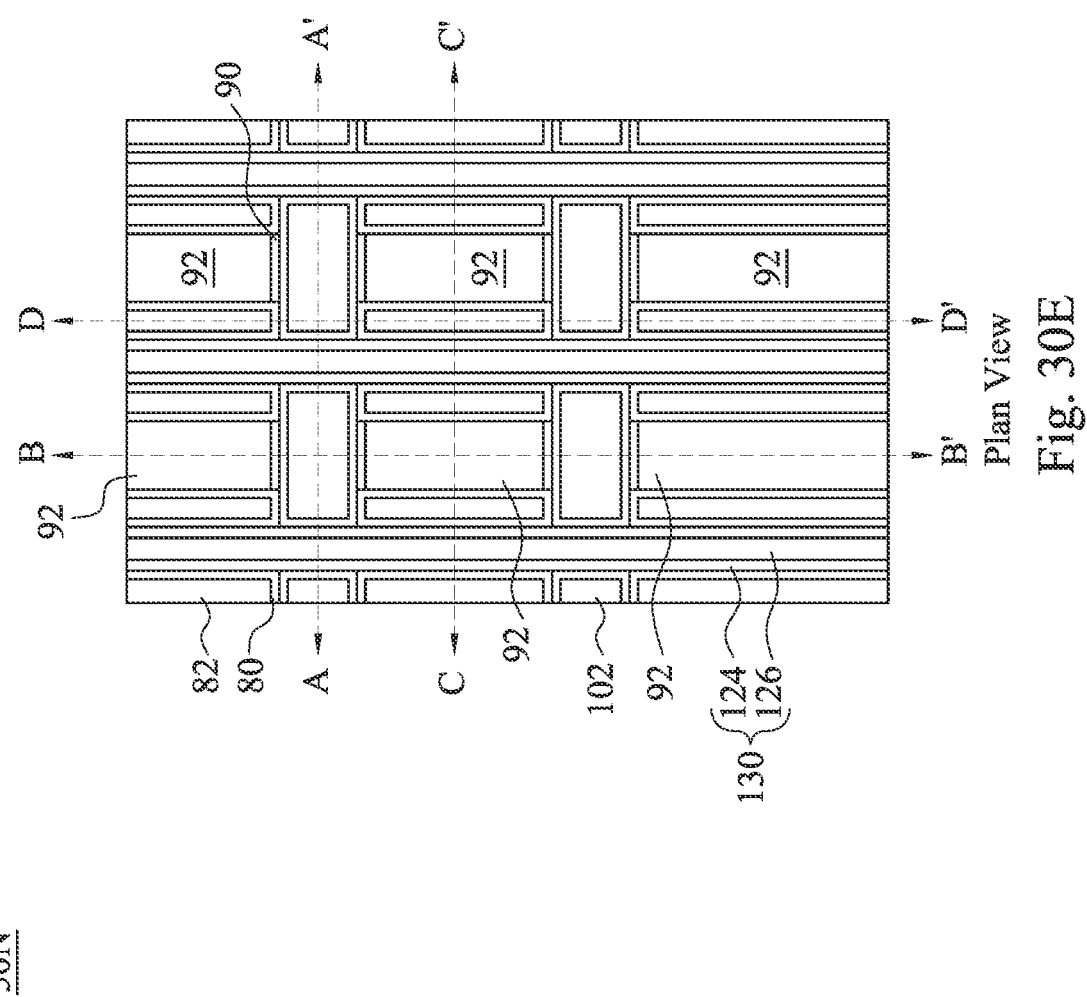

Cross section A-A'

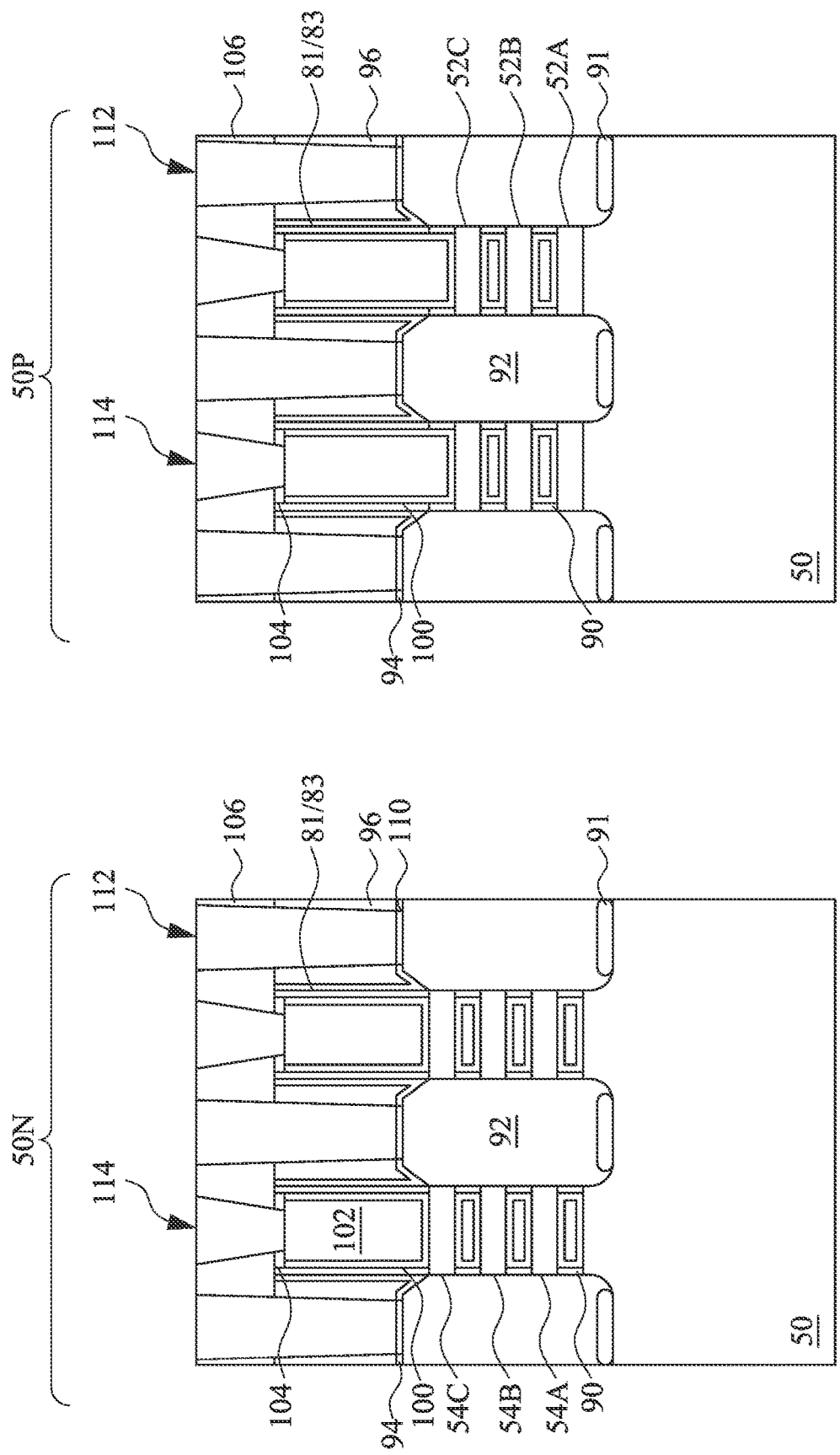
Fig. 31B Cross section B-B'

Cross section C-C'

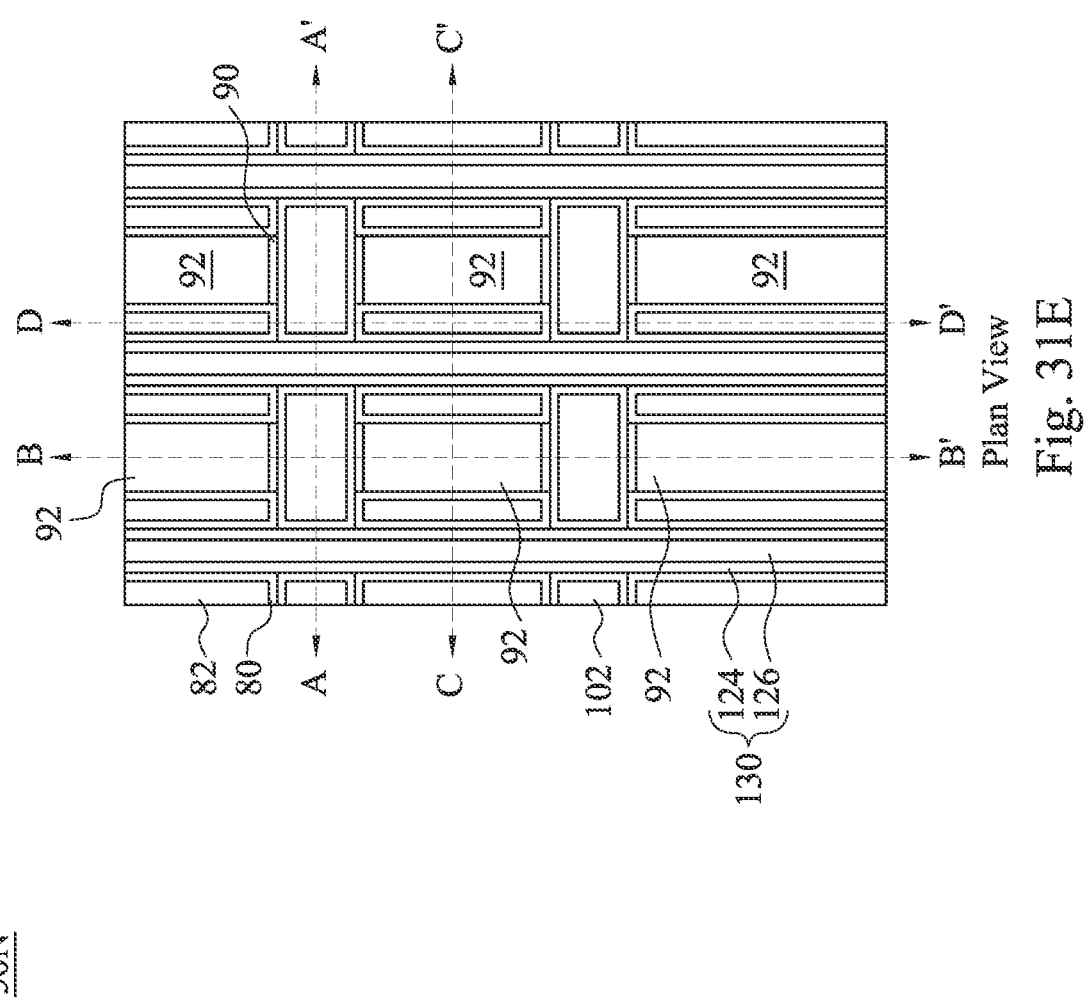
Fig. 31E Plan View

Cross section A-A'

Cross section B-B'

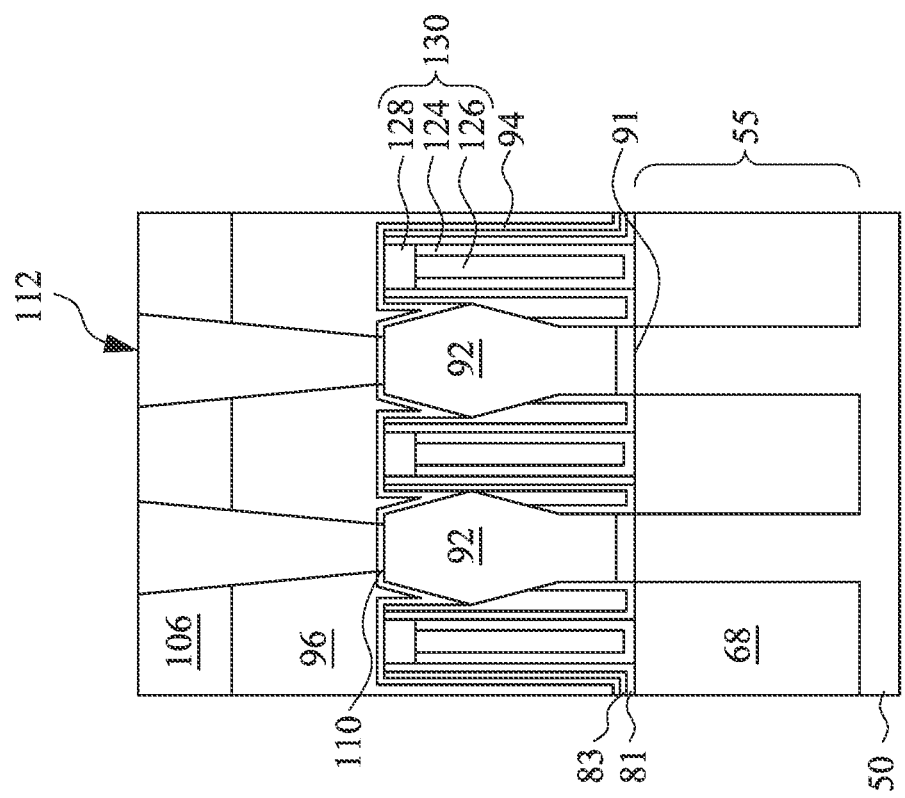

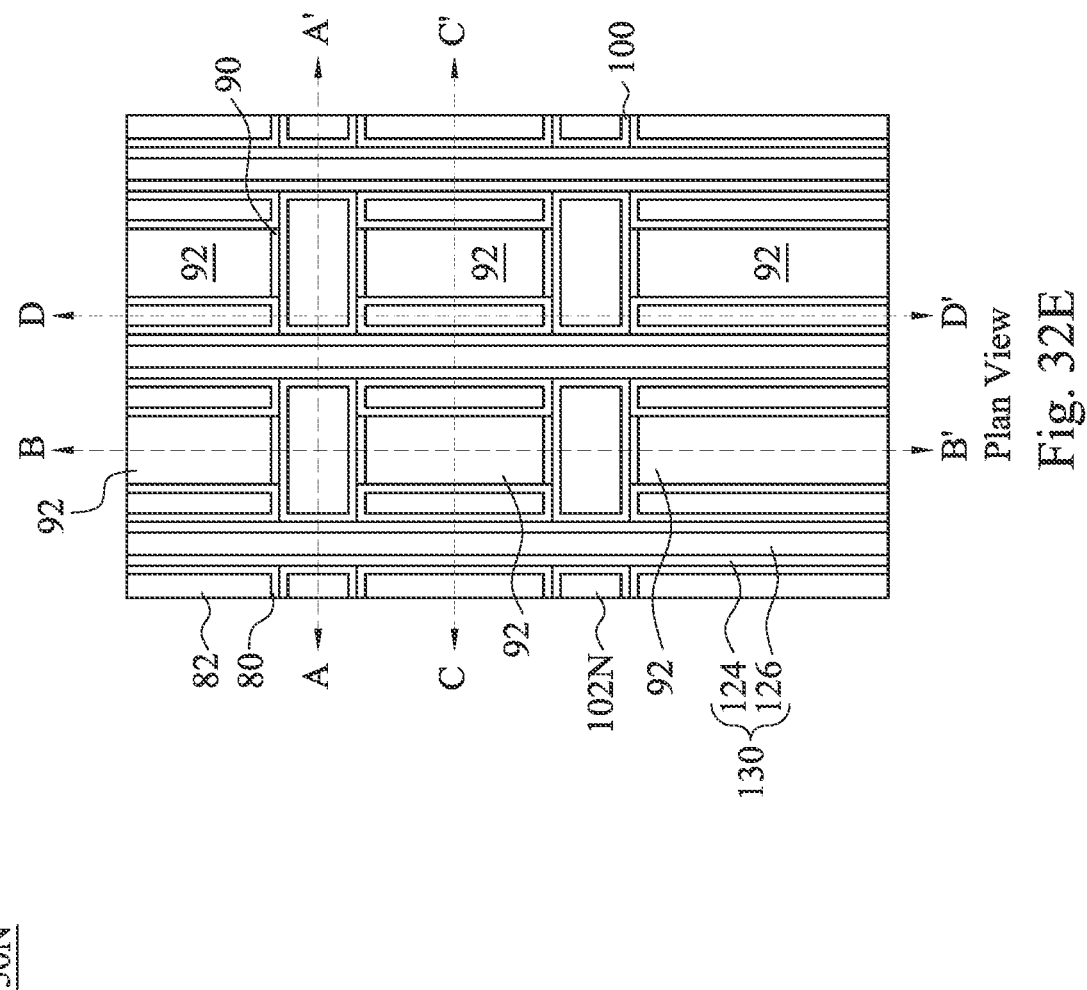
Fig. 32E Plan View

NANO-FET TRANSISTOR WITH ALTERNATING NANOSTRUCTURES AND METHOD OF FORMING THEREOF

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A through 31E are cross-sectional and plan views of intermediate stages in the manufacturing of nano-FETs, in accordance with some embodiments.

FIGS. 32A, 32B, 32C, 32D, and 32E are cross-sectional and plan views of a nano-FET, in accordance with some embodiments.

DETAILED DESCRIPTION

Figure 1:
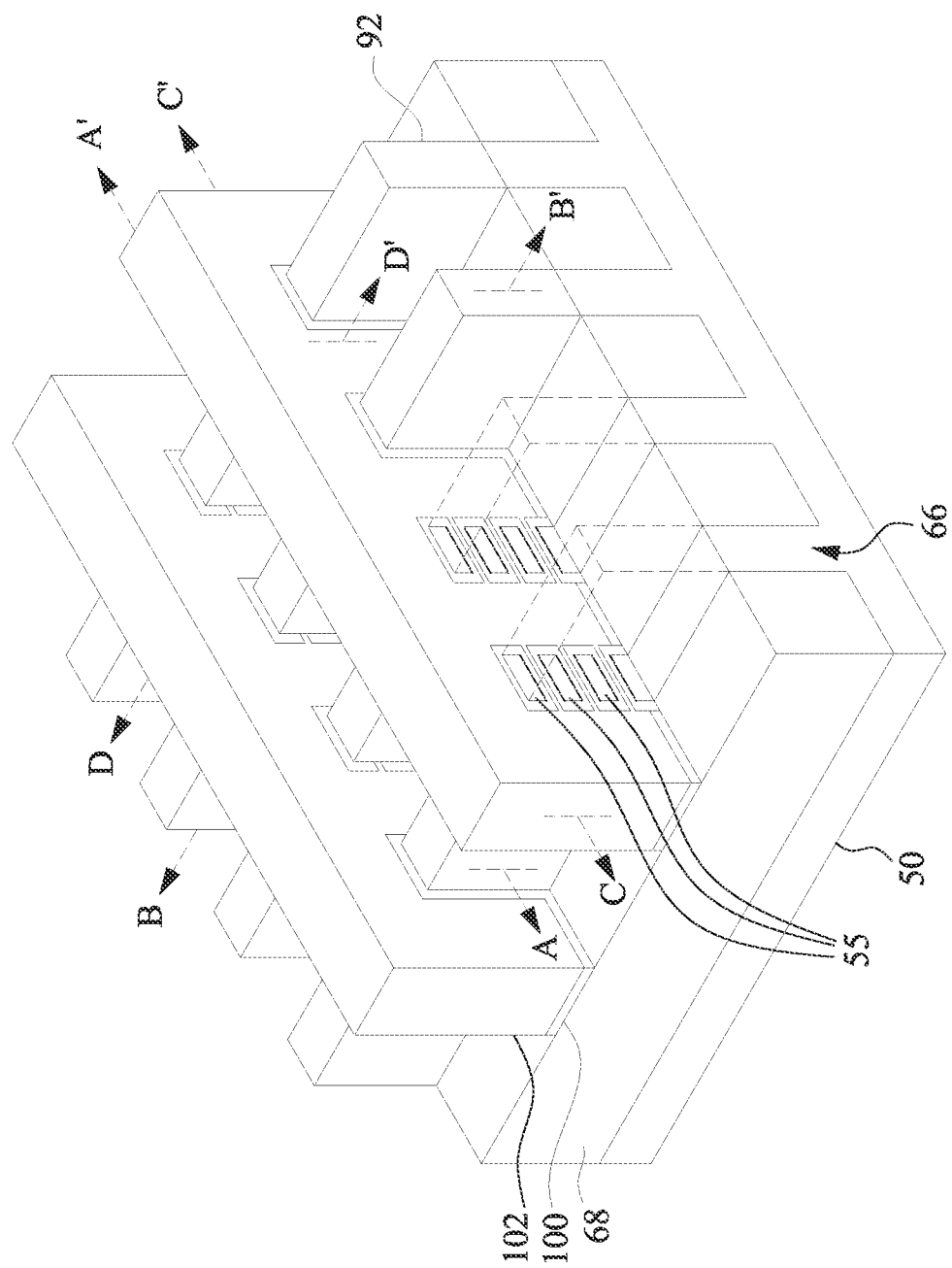
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a sacrificial layer is utilized. For example, in some embodiments, a sacrificial layer is formed along sidewalls of a stack of nanostructures. Subsequently, insulating structures may be formed between adjacent stacks of nanostructures. The material of the sacrificial layer, e.g., a semiconductor material, is selected such that the sacrificial layer may be removed and replaced with a dielectric material during formation of the gate spacers. The material of the gate spacers provides greater insulation between the source/drain regions and the gate electrode, thereby increasing performance.

Embodiments are described below in a particular context, a die comprising nano-FETs. Various embodiments may be applied, however, to dies comprising other types of transistors (e.g., fin field effect transistors (FinFETs), planar transistors, or the like) in lieu of or in combination with the nano-FETs.

FIG. 1 illustrates an example of nano-FETs (e.g., nanowire FETs, nanosheet FETs, or the like) in a three-dimensional view, in accordance with some embodiments. The nano-FETs comprise nano-structures 55 (e.g., nanosheets, nanowire, or the like) over fins 66 on a substrate 50 (e.g., a semiconductor substrate), wherein the nano-structures 55 act as channel regions for the nano-FETs. The nanostructure 55 may include p-type nanostructures, n-type nanostructures, or a combination thereof. Isolation regions 68 are disposed between adjacent fins 66, which may protrude above and from between neighboring isolation regions 68. Although the isolation regions 68 are described/illustrated as being separate from the substrate 50, as used herein, the term "substrate" may refer to the semiconductor substrate alone or a combination of the semiconductor substrate and the isolation regions. Additionally, although a bottom portion of the fins 66 are illustrated as being single, continuous materials with the substrate 50, the bottom portion of the fins 66 and/or the substrate 50 may comprise a single material or a plurality of materials. In this context, the fins 66 refer to the portion extending between the neighboring isolation regions 68.

Gate dielectric layers 100 are over top surfaces of the fins 66 and along top surfaces, sidewalls, and bottom surfaces of the nano-structures 55. Gate electrodes 102 are over the gate dielectric layers 100. Epitaxial source/drain regions 92 are disposed on the fins 66 on opposing sides of the gate dielectric layers 100 and the gate electrodes 102.

FIG. 1 further illustrates reference cross-sections that are used in later figures. Cross-section A-A' is along a longitudinal axis of a gate electrode 102 and in a direction, for example, perpendicular to the direction of current flow between the epitaxial source/drain regions 92 of a nano-FET. Cross-section B-B' is perpendicular to cross-section A-A' and is parallel to a longitudinal axis of a fin 66 of the nano-FET and in a direction of, for example, a current flow between the epitaxial source/drain regions 92 of the nano-FET. Cross-section C-C' is parallel to cross-section A-A' and extends through epitaxial source/drain regions of the nano-FETs. Cross-section D-D' is parallel to cross-section B-B' and extends through spacers and gate dielectrics of the nano-FETs. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs or in fin field-effect transistors (FinFETs).

Figure 2A:
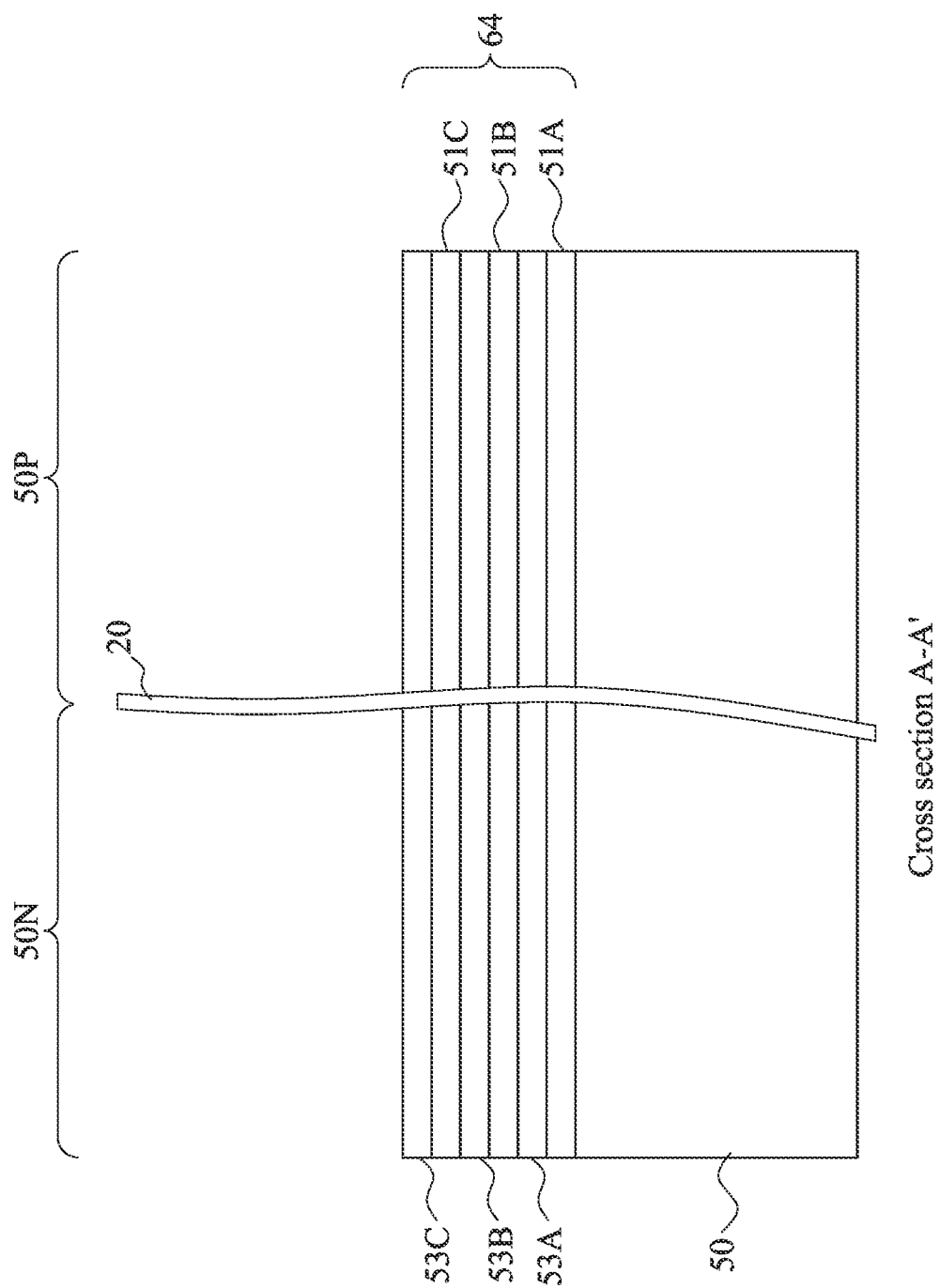

FIGS. 2 through 32D are cross-sectional and plan views of intermediate stages in the manufacturing of nano-FETs, in accordance with some embodiments. FIGS. 2A, 3A, 4A, 5A, 6A, 7A, 8A, 9A, 10A, 11A, 12A, 13A, 14A, 15A, 16A, 17A, 18A, 19A, 20A, 21A, 22A, 23A, 24A, 25A, 26A, 27A, 28A, 29A, 30A, 31A, and 32A illustrate reference cross-section A-A' illustrated in FIG. 1. FIGS. 2B, 3B, 4C, 5C, 6C, 7C, 8C, 9C, 10C, 11C, 12C, 13C, 14E, 15E, 16E, 17E, 18E, 19E, 20E, 21F, 22F, 23G, 24E, 25D, 26D, 27D, 28D, 29E, 30E, 31E, and 32E illustrate plan views in the n-type region 50N at the level of the first semiconductor layer 51A as illustrated in FIG. 2A. FIGS. 14B, 15B, 16B, 17B, 18B, 19B, 20B, 21B, 21C, 22B, 22C, 23B, 23E, 24B, 24C, 25B, 26B, 27B, 28B, 29B, 30B, 31B, and 32B illustrate reference cross-section B-B' illustrated in FIG. 1. FIGS. 14C, 15C, 16C, 17C, 18C, 19C, 20C, 21D, 22C, 23C, 23D, 24C, 25C, 29C, 30C, 31C, and 32C illustrate reference cross-section C-C' illustrated in FIG. 1. FIGS. 4B, 5B, 6B, 7B, 8B, 9B, 10B, 11B, 12B, 13B, 15D, 16D, 17D, 18D, 19D, 20D, 21E, 22E, 23F, 24D, 25C, 26C, 27C, 28C, 30D, 31D, and 32D illustrate reference cross-section D-D' illustrated in FIG. 1.

In FIG. 2A, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (as illustrated by divider 20), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

Further in FIG. 2A, a multi-layer stack 64 is formed over the substrate 50. The multi-layer stack 64 includes alternating layers of first semiconductor layers 51A-C(collectively referred to as first semiconductor layers 51) and second semiconductor layers 53A-C (collectively referred to as second semiconductor layers 53). For purposes of illustration and as discussed in greater detail below, the second semiconductor layers 53 will be removed and the first semiconductor layers 51 will be patterned to form channel regions of nano-FETs in the p-type region 50P. Also, the first semiconductor layers 51 will be removed and the second semiconductor layers 53 will be patterned to form channel regions of nano-FETs in the n-type regions 50N. Nevertheless, in some embodiments the first semiconductor layers 51 may be removed and the second semiconductor layers 53 may be patterned to form channel regions of nano-FETs in the p-type region 50P, and the second semiconductor layers 53 may be removed and the first semiconductor layers 51 may be patterned to form channel regions of nano-FETs in the n-type regions 50N.

In still other embodiments, the first semiconductor layers 51 may be removed and the second semiconductor layers 53 may be patterned to form channel regions of nano-FETS in both the n-type region 50N and the p-type region 50P. In other embodiments, the second semiconductor layers 53 may be removed and the first semiconductor layers 51 may be patterned to form channel regions of non-FETs in both the n-type region 50N and the p-type region 50P. In such embodiments, the channel regions in both the n-type region 50N and the p-type region 50P may have a same material composition (e.g., silicon, or the another semiconductor material) and be formed simultaneously. FIGS. 32A, 32B, 32C, 32D and 32E illustrate a structure resulting from such embodiments where the channel regions in both the p-type region 50P and the n-type region 50N comprise silicon, for example.

The multi-layer stack 64 is illustrated as including three layers of each of the first semiconductor layers 51 and the second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. In various embodiments, the first semiconductor layers 51 may be formed of a first semiconductor material suitable for p-type nano-FETs, such as silicon germanium or the like, and the second semiconductor layers 53 may be formed of a second semiconductor material suitable for n-type nano-FETs, such as silicon, silicon carbon, or the like. The multi-layer stack 64 is illustrated as having a bottommost semiconductor layer 64 suitable for p-type nano-FETs for illustrative purposes. In some embodiments, multi-layer stack 64 may be formed such that the bottommost layer is a semiconductor layer suitable for n-type nano-FETs.

The first semiconductor materials and the second semiconductor materials may be materials having a high-etch selectivity to one another. As such, the first semiconductor layers 51 of the first semiconductor material may be removed without significantly removing the second semiconductor layers 53 of the second semiconductor material in the n-type region 50N, thereby allowing the second semiconductor layers 53 to be patterned to form channel regions of n-type NSFETS. Similarly, the second semiconductor layers 53 of the second semiconductor material may be removed without significantly removing the first semiconductor layers 51 of the first semiconductor material in the p-type region 50P, thereby allowing the first semiconductor layers 51 to be patterned to form channel regions of p-type NSFETS.

Figure 2B:
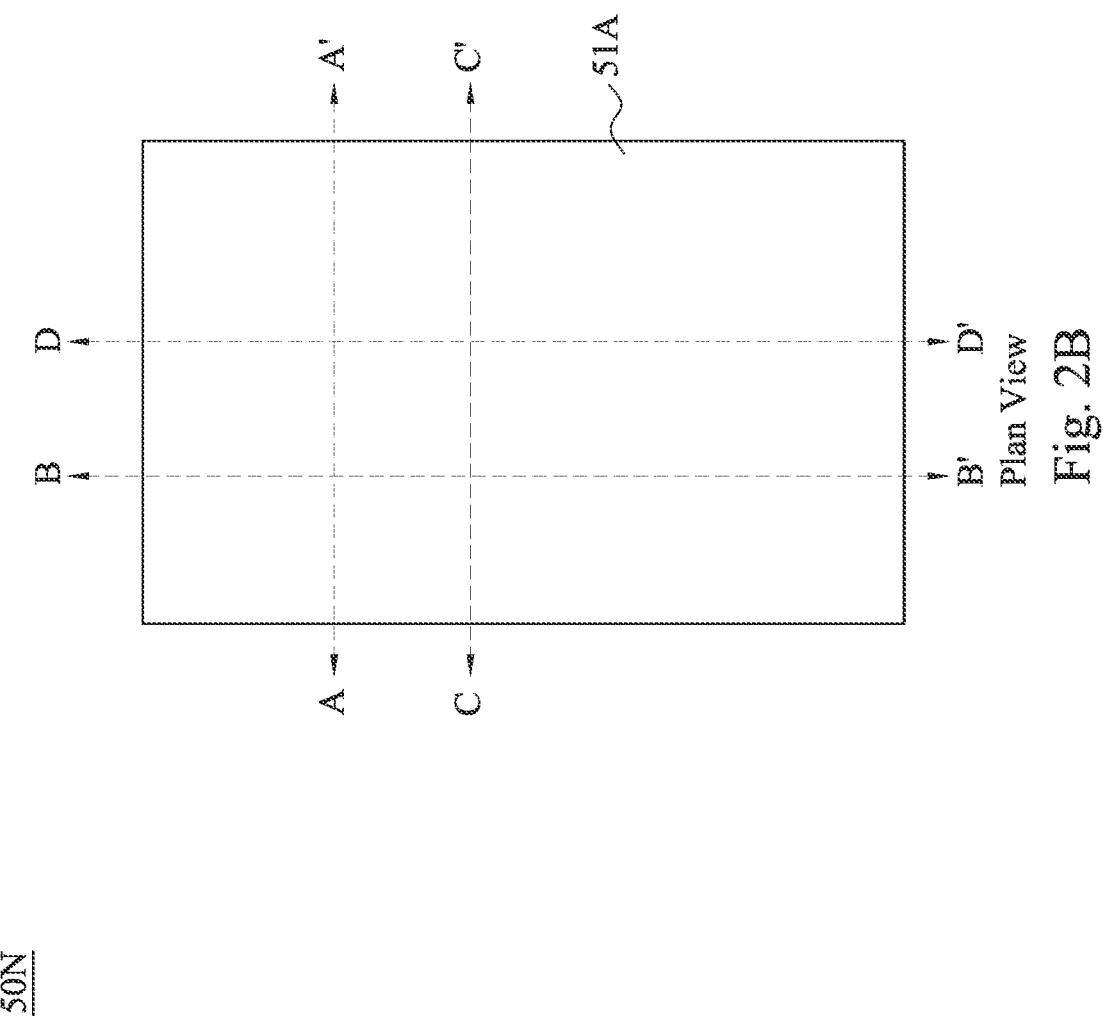

FIG. 2B illustrates a plan view of the structure in the n-type region 50N at the level of the first semiconductor layer 51A. Subsequent figures following from FIG. 2B will illustrate plan views of the structure at the same level.

Figure 3A:
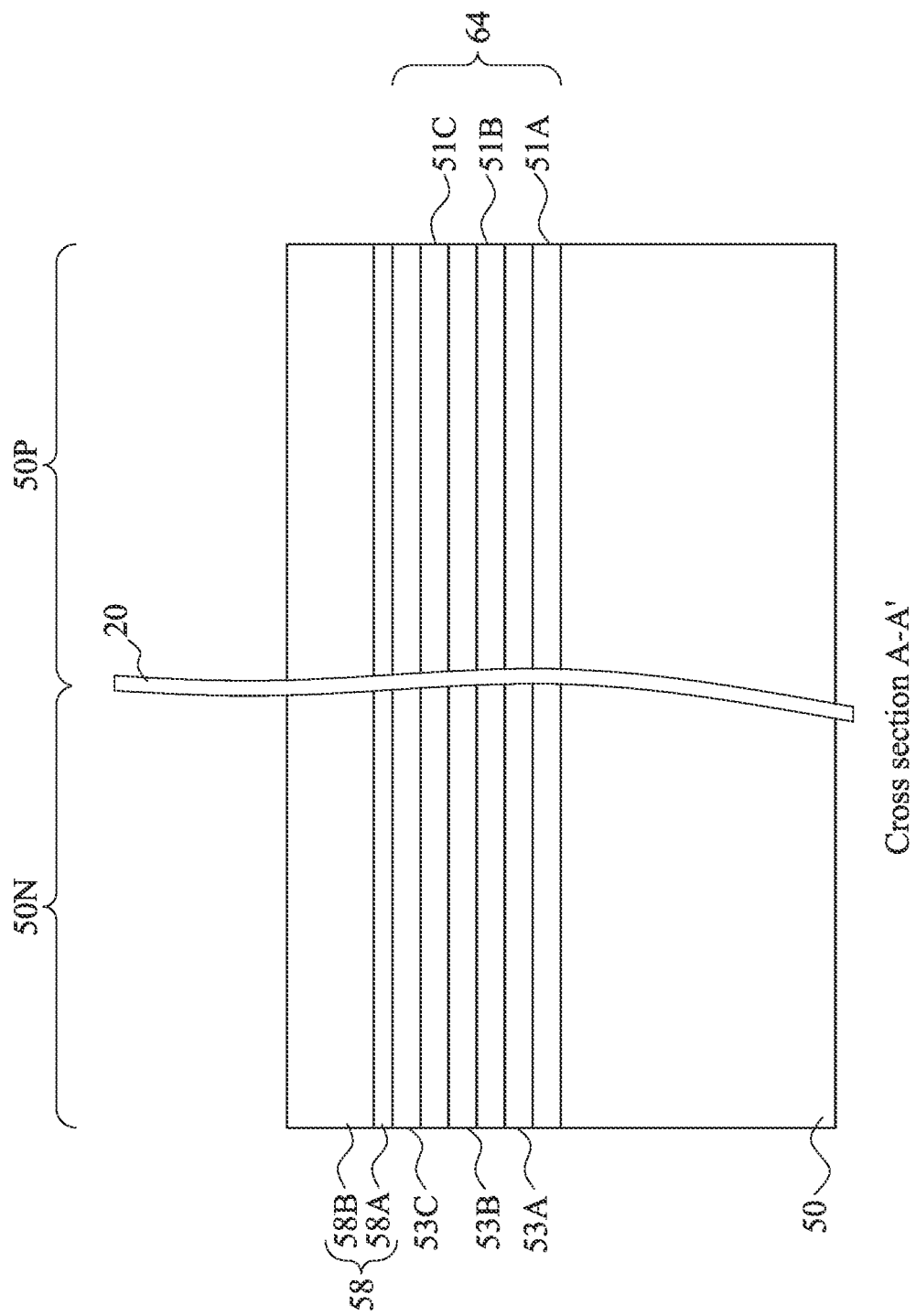
Figure 3B:
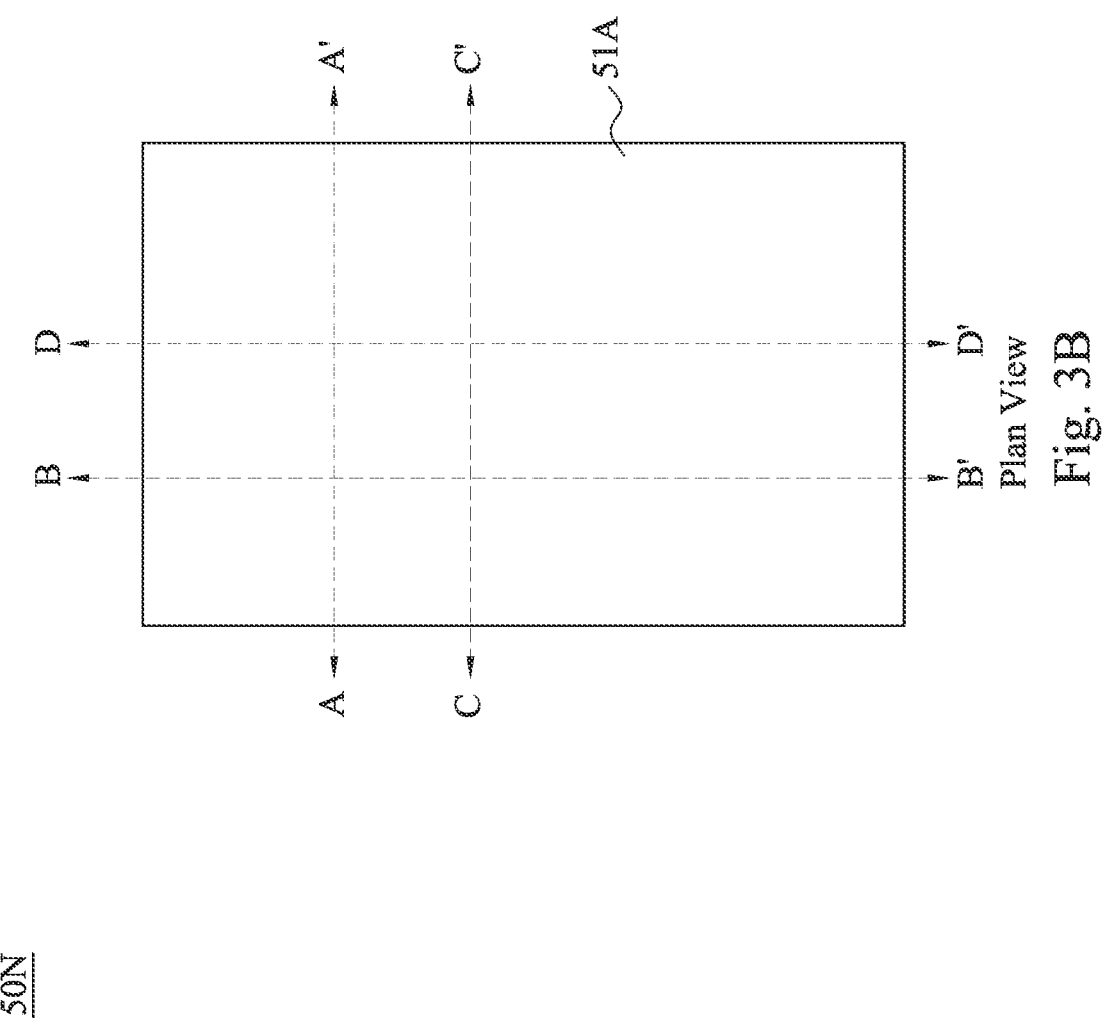

FIG. 3A follows from FIG. 2A and illustrates embodiments in which the multi-layer stack 64 of the desired height and/or number of layers are subject to a deposition of masks 58. FIG. 3B follows from FIG. 2B and illustrates a plan view of the structure in the n-type region 50N at the level of the first semiconductor layer 51A. The masks 58 may be used in a subsequent patterning of the multi-layer stack 64 (see below, FIGS. 4A-4B). The masks 58 may be deposited over the topmost surface of the multi-layer stack 64, as shown in FIG. 3A. The masks 58 may be single layered masks, or may be multi-layered masks, such as a first mask layer 58A and a second mask layer 58B on the first mask layer 58A as illustrated in FIG. 3A. The first mask layer 58A and the second mask layer 58B may each be formed from a dielectric material such as silicon oxide, silicon nitride, a combination thereof, or the like, and may be deposited or thermally grown according to acceptable techniques. The material of the first mask layer 58A may have a high etching selectivity from the etching of the material of the second mask layer 58B. For example, the first mask layer 58A may be formed of silicon oxide, and the second mask layer 58B may be formed of silicon nitride.

Figure 4A:
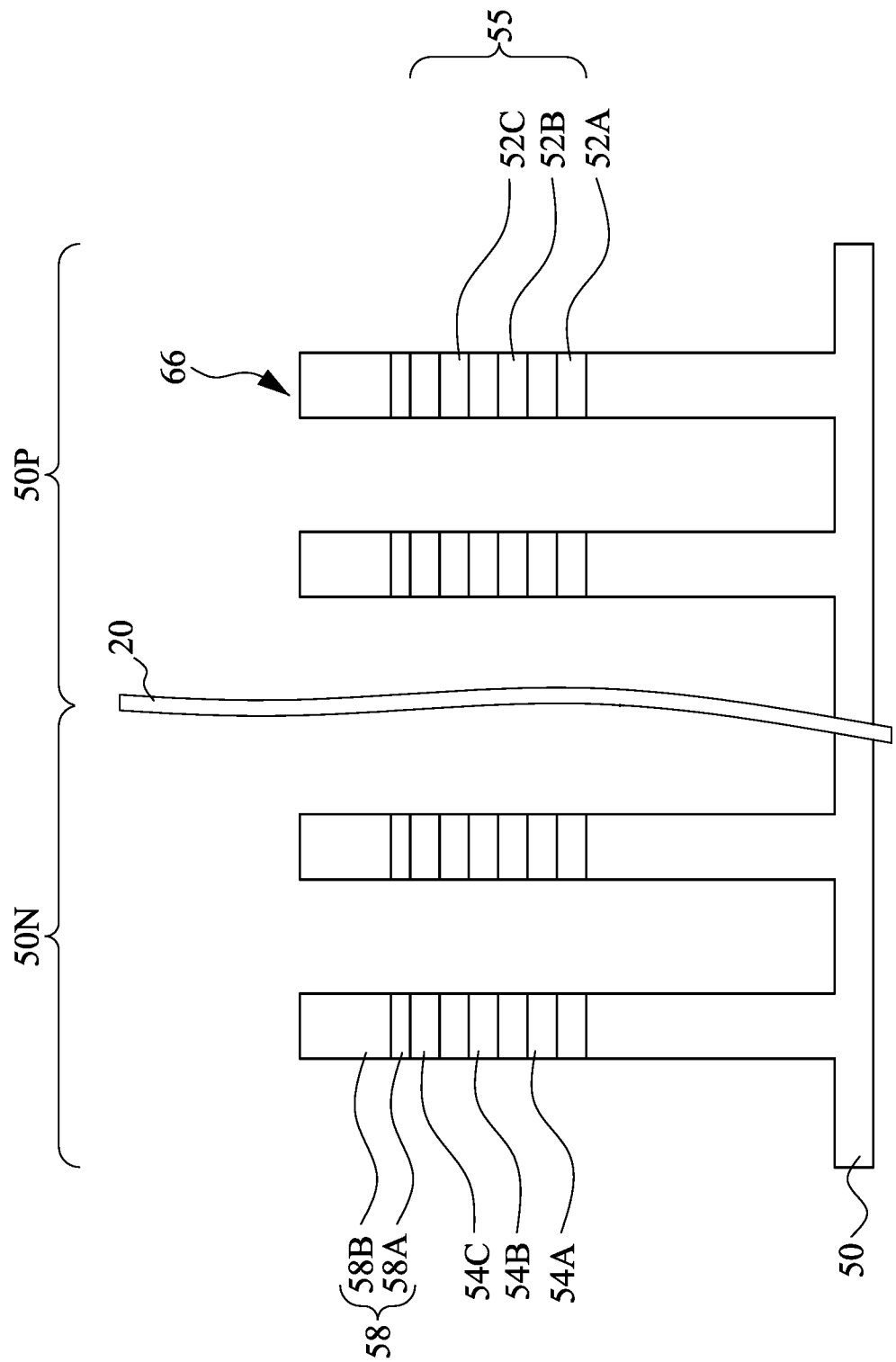
Figure 4B:

Referring now to FIGS. 4A, 4B, and 4C, fins 66 are formed in the substrate 50 and nanostructures 55 are formed in the multi-layer stack 64, in accordance with some embodiments. Portions of the masks 58 may remain on top surfaces of the nanostructures 55. In some embodiments, the nanostructures 55 and the fins 66 may be formed in the multi-layer stack 64 and the substrate 50, respectively, by etching trenches in the multi-layer stack 64 and the substrate 50. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may further define first nanostructures 52A-C (collectively referred to as the first nanostructures 52) from the first semiconductor layers 51 and define second nanostructures 54A-C (collectively referred to as the second nanostructures 54) from the second semiconductor layers 53. FIG. 4C illustrates a plan view of the structure in the n-type region 50N through the first nanostructures 52A. The first nanostructures 52 and the second nanostructures 54 may further be collectively referred to as nanostructures 55.

The fins 66 and the nanostructures 55 may be patterned by any suitable method using masks 58 as an etch mask. For example, the masks 58, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66. The patterning may comprise one or more etching processes, such as a reactive ion etch (RIE), neutral beam etch (NBE), the like, or a combination thereof. The etching may be anisotropic. In some embodiments, the masks 58 (or other layer) may remain on the fins 66 and the nanostructures 55.

FIG. 4A illustrates the fins 66 in the n-type region 50N and the p-type region 50P as having substantially equal widths for illustrative purposes. In some embodiments, widths of the fins 66 in the n-type region 50N may be greater or thinner than the fins 66 in the p-type region 50P. Further, while each of the fins 66 and the nanostructures 55 are illustrated as having a consistent width throughout, in other embodiments, the fins 66 and/or the nanostructures 55 may have tapered sidewalls such that a width of each of the fins 66 and/or the nanostructures 55 continuously increases in a direction towards the substrate 50. In such embodiments, each of the nanostructures 55 may have a different width and be trapezoidal in shape.

Figure 5A:
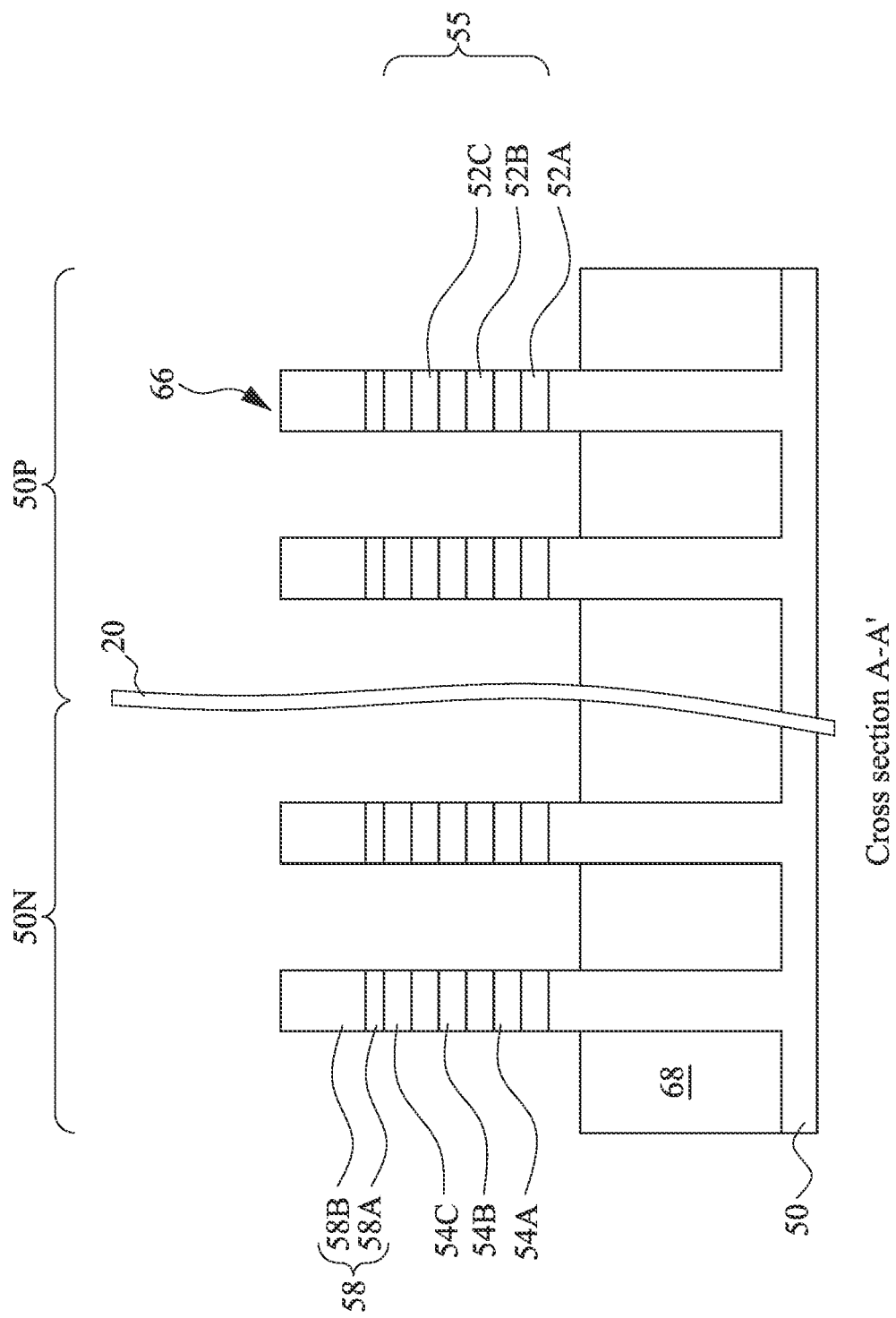

In FIGS. 5A, 5B, and 5C, shallow trench isolation (STI) regions 68 are formed adjacent the fins 66. The STI regions 68 may be formed by depositing an insulation material over the substrate 50, the fins 66, and nanostructures 55, and between adjacent fins 66. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 55. Although the insulation material is illustrated as a single layer, some embodiments may utilize multiple layers. For example, in some embodiments a liner (not separately illustrated) may first be formed along a surface of the substrate 50, the fins 66, and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55 such that top surfaces of the nanostructures 55 and the insulation material are level after the planarization process is complete.

The insulation material is then recessed to form the STI regions 68. The insulation material is recessed such that upper portions of fins 66 in the regions 50N and the region 50P protrude from between neighboring STI regions 68. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66 and the nanostructures 55). For example, an oxide removal using, for example, dilute hydrofluoric (dHF) acid may be used.

The process described above with respect to FIGS. 2A through 5C is just one example of how the fins 66 and the nanostructures 55 may be formed. In some embodiments, the fins 66 and/or the nanostructures 55 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers 51 (and resulting nanostructures 52) and the second semiconductor layers 53 (and resulting nanostructures 54) are illustrated and discussed herein as comprising the same materials in the p-type region 50P and the n-type region 50N for illustrative purposes only. As such, in some embodiments one or both of the first semiconductor layers 51 and the second semiconductor layers 53 may be different materials or formed in a different order in the p-type region 50P and the n-type region 50N.

Further in FIGS. 5A, 5B, and 5C, appropriate wells (not separately illustrated) may be formed in the fins 66, the nanostructures 55, and/or the STI regions 68. In embodiments with different well types, different implant steps for the n-type region 50N and the p-type region 50P may be achieved using a photoresist or other masks (not separately illustrated). For example, a photoresist may be formed over the fins 66 and the STI regions 68 in the n-type region 50N and the p-type region 50P. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in a range from about $10^{13}$ atoms/cm$^3$ to about $10^{14}$ atoms/cm$^3$. After the implant, the photoresist is removed, such as by an acceptable ashing process.

Following or prior to the implanting of the p-type region 50P, a photoresist or other masks (not separately illustrated) is formed over the fins 66, the nanostructures 55, and the STI regions 68 in the p-type region 50P and the n-type region 50N. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in a range from about $10^{13}$ atoms/cm$^3$ to about $10^{14}$ atoms/cm$^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 6A:
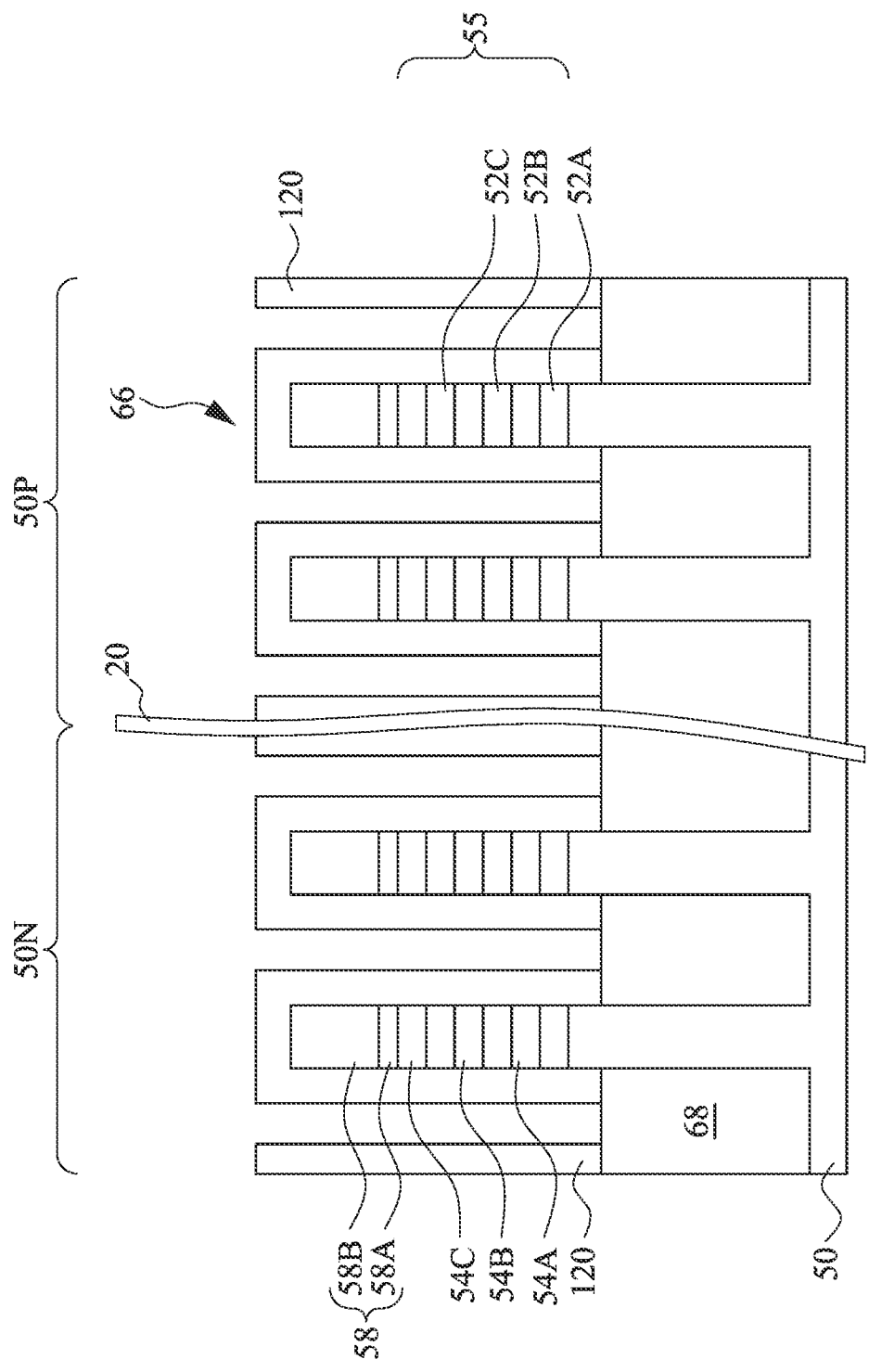
Figure 6B:
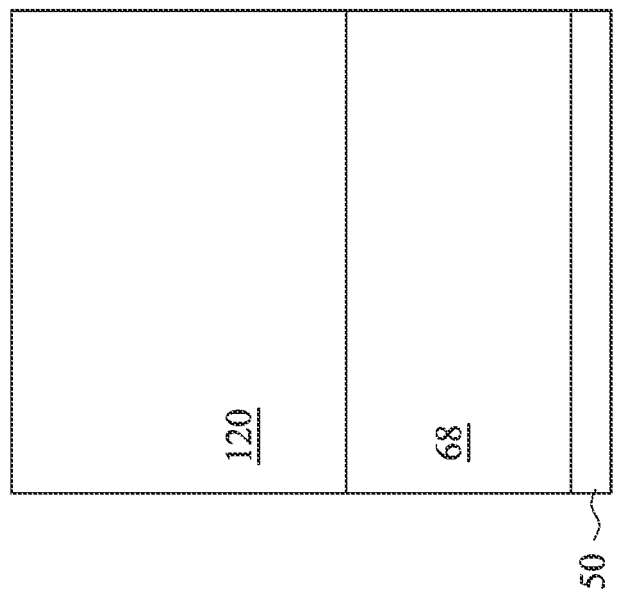

In FIGS. 6A, 6B and 6C, a sacrificial layer 120 is formed over and around the fins 66 and nanostructures 55. The sacrificial layer 120 may also be formed over remaining portions of the masks 58, if present. In some embodiments, the sacrificial layer 120 is formed by epitaxial growth, which may include growing a thin seed layer on the fins 66 and nanostructures 55 and then growing the material of the sacrificial layer 120 from the seed layer. The seed layer may be grown after the fins 66 and nanostructures 55 are formed (see above, FIG. 4A). Portions of the seed layer may subsequently be covered by the STI regions 68 (see above, FIG. 5A) and the remaining exposed portions of the seed layer may be used to epitaxially grow the sacrificial layer 120 so that top surfaces of the STI regions 68 remain exposed. The sacrificial layer 120 may be formed of a semiconductor material (such as, e.g., SiGe or another semiconductor material), which may be grown by a process such as vapor phase epitaxy (VPE) or molecular beam epitaxy (MBE), deposited by a process such as chemical vapor deposition (CVD) or atomic layer deposition (ALD), or the like. The sacrificial layer 120 will be used as temporary spacers during processing, and will subsequently be removed to expose the portions of the nanostructures 55 that will act as channel regions for the nano-FETs. Specifically, in the illustrated embodiment, in the n-type region 50N the sacrificial layer 120 and the first nanostructures 52 will be subsequently removed and replaced with gate structures that are formed around the second nanostructures 54, and in the p-type region 50P the sacrificial layer 120 and the second nanostructures 54 will be subsequently removed and replaced with gate structures that are formed around the first nanostructures 52 (see below, FIGS. 27A-28C). The sacrificial layer 120 may be formed of the same semiconductor material as the first nanostructures 52 or the second nanostructures 54, or may be formed of a different material. In some embodiments, the sacrificial layer 120 is formed of a material that has a high etching selectivity from the etching of the material of the second nanostructures 54, a material that has a high etching selectivity from the etching of the material of the first nanostructures 52, or a of a material that has a high etching selectivity from the etching of the material of the first nanostructures 52 and the second nanostructures 54.

Figure 7A:
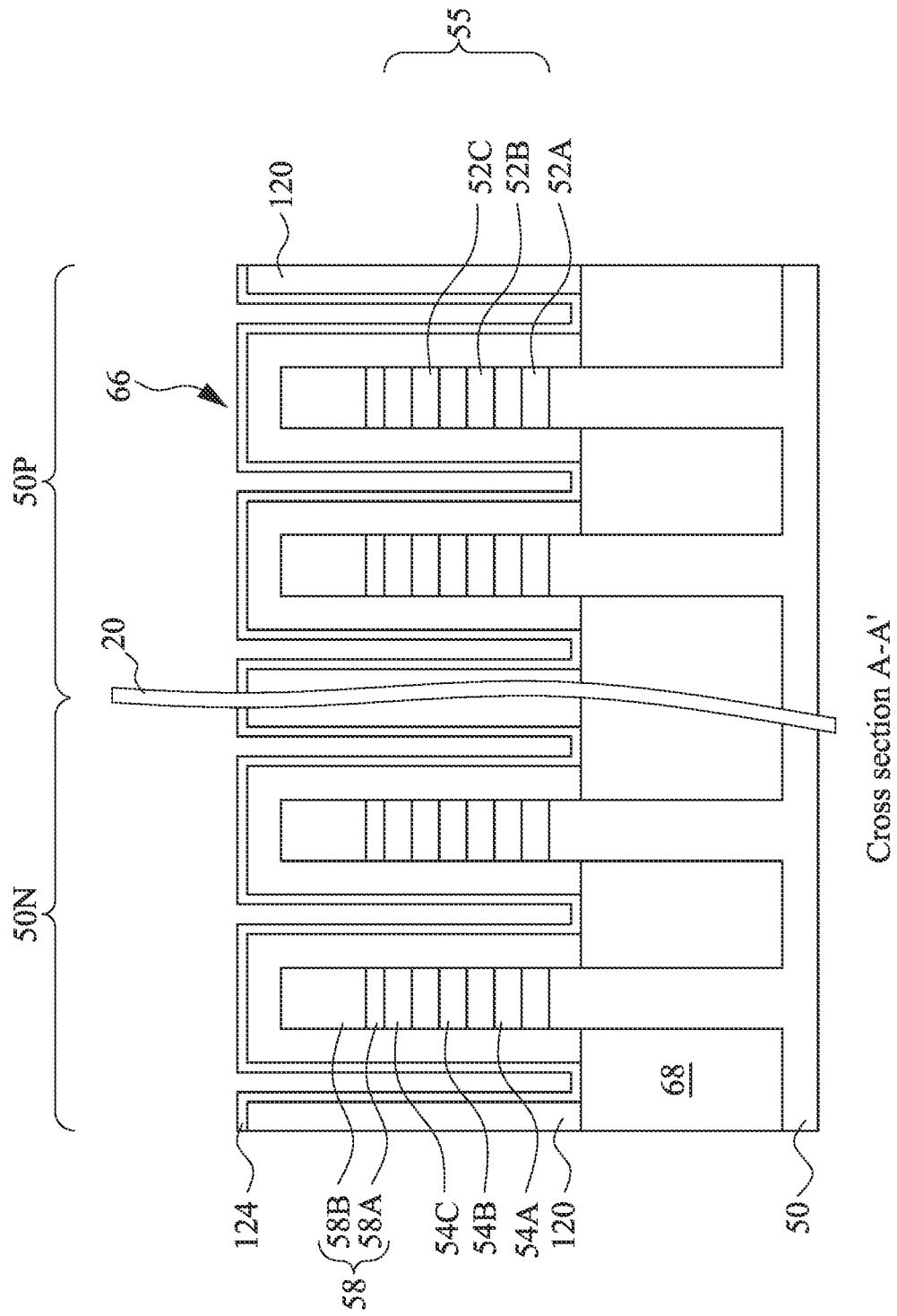

In FIGS. 7A through 11C, insulating fins 130 (also referred to as dielectric fins 130 or hybrid fins 130) are formed between the remaining portions of the sacrificial layer 120 on the fins 66 and nanostructures 55. The insulating fins 130 may insulate subsequently formed source/drain regions (see below, FIGS. 24B-F) from each other. In FIGS. 7A, 7B, and 7C, a liner 124 is conformally deposited over the structure by an acceptable deposition process such as atomic layer deposition (ALD), chemical vapor deposition (CVD), molecular-beam deposition (MBD), physical vapor deposition (PVD), or the like. The liner 124 may be formed of a nitride such as silicon nitride, silicon carbonitride, silicon oxycarbonitride, or the like. The liner 124 may reduce oxidation of the sacrificial layer 120 during a subsequent formation of a fill material 126 (see below, FIGS. 9A and 9B), which may be useful for a subsequent removal of the sacrificial layer 120.

In FIGS. 8A, 8B, and 8C, a fill material 126 is formed over the liner 124, filling remaining spaces between adjacent fins 66 and nanostructures 55. The fill material 126 may form the bulk of the lower portions of the insulating fins 130 (see FIG. 9A) to insulate subsequently formed source/drain regions (see below, FIGS. 24B-F) from each other. The fill material 126 may be formed by an acceptable deposition process such as atomic layer deposition (ALD), chemical vapor deposition (CVD), molecular-beam deposition (MBD), physical vapor deposition (PVD), or the like. The fill material 126 may be a suitable dielectric material e.g. an oxide such as silicon oxide, silicon oxycarbonitride, or the like; or a high-k dielectric material (e.g., those having a k-value of greater than about 7) such as hafnium oxide, zirconium oxide, zirconium aluminum oxide, hafnium aluminum oxide, hafnium silicon oxide, aluminum oxide, or the like; or combinations thereof.

Figure 9A:
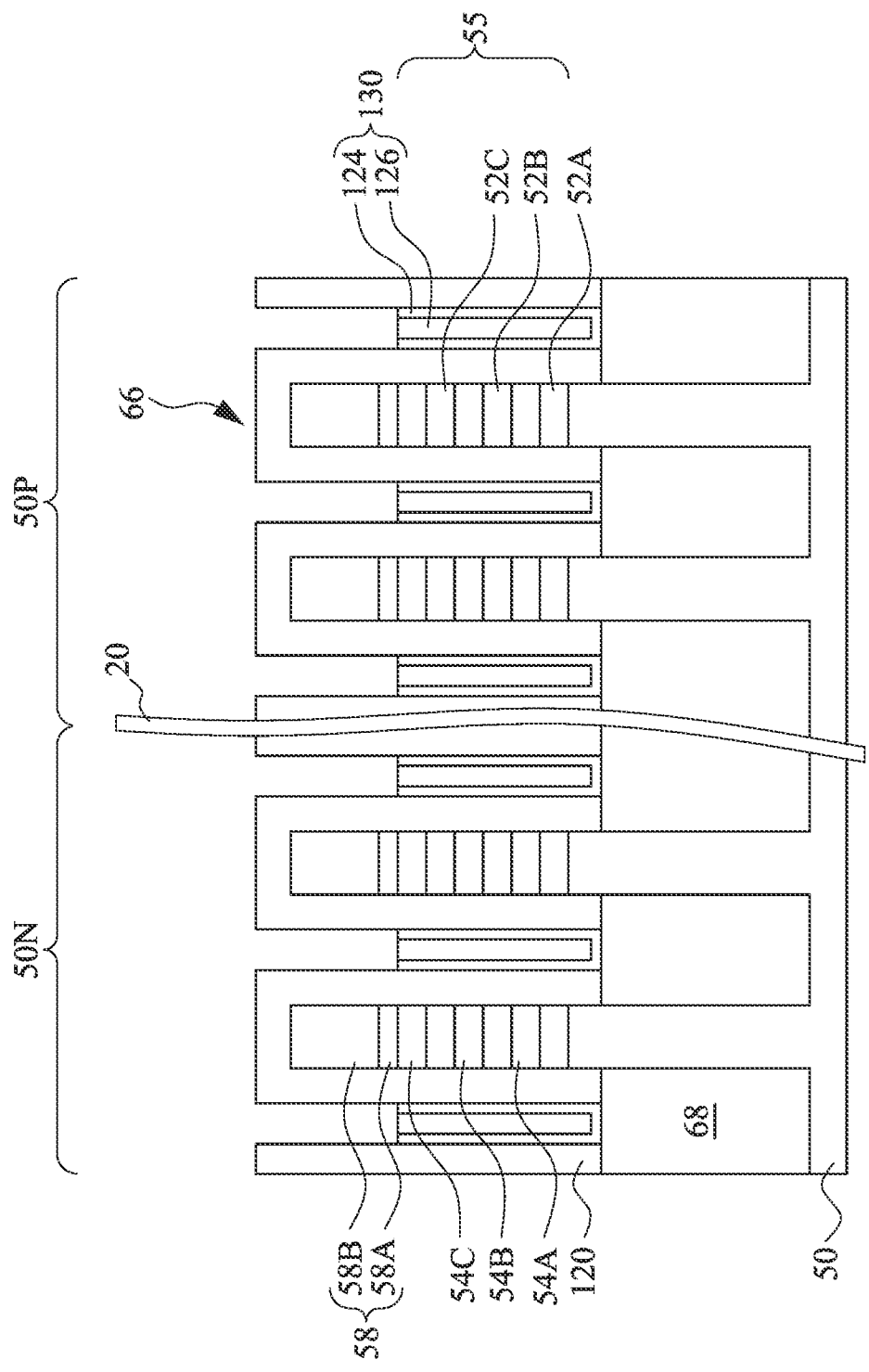
Figure 9B:
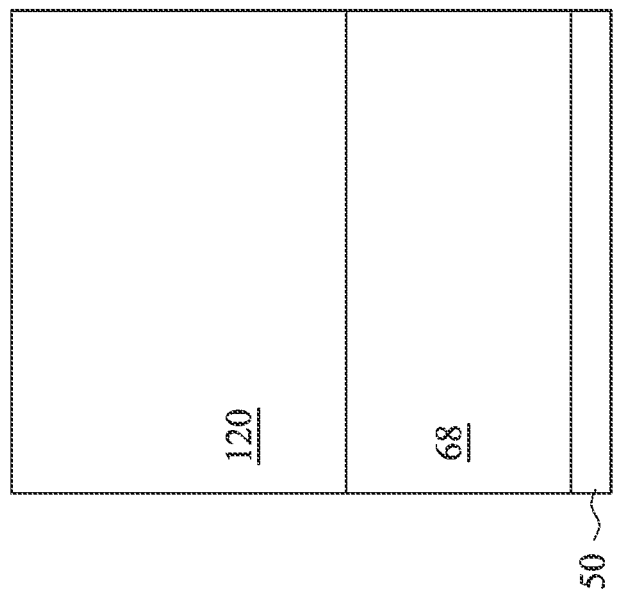

In FIGS. 9A, 9B, and 9C, upper portions of the liner 124 and the fill material 126 above top surfaces of the masks 58 may be removed using one or more acceptable etching processes, such as one that is selective to the insulating fins 130 (e.g., selectively etches the material(s) of the liner 124 and the fill material 126 at a faster rate than the material(s) of the sacrificial layer 120). Excess portions of the liner 124 and the fill material 126 may be removed using a planarization process, such as a chemical mechanical polish. The liner 124 and the fill material 126 may be further recessed by the one or more etching processes. The upper portions of the liner 124 and the fill material 126 may be removed to allow for a subsequent removal of the masks 58 (see below, FIGS. 12A, 12B, and 12C), and the further recession of the liner 124 and the fill material 126 may allow the formation of upper dielectric layers between upper portions of the fins 66 and nanostructures 55 (see below, FIGS. 10A-C).

Figure 10A:
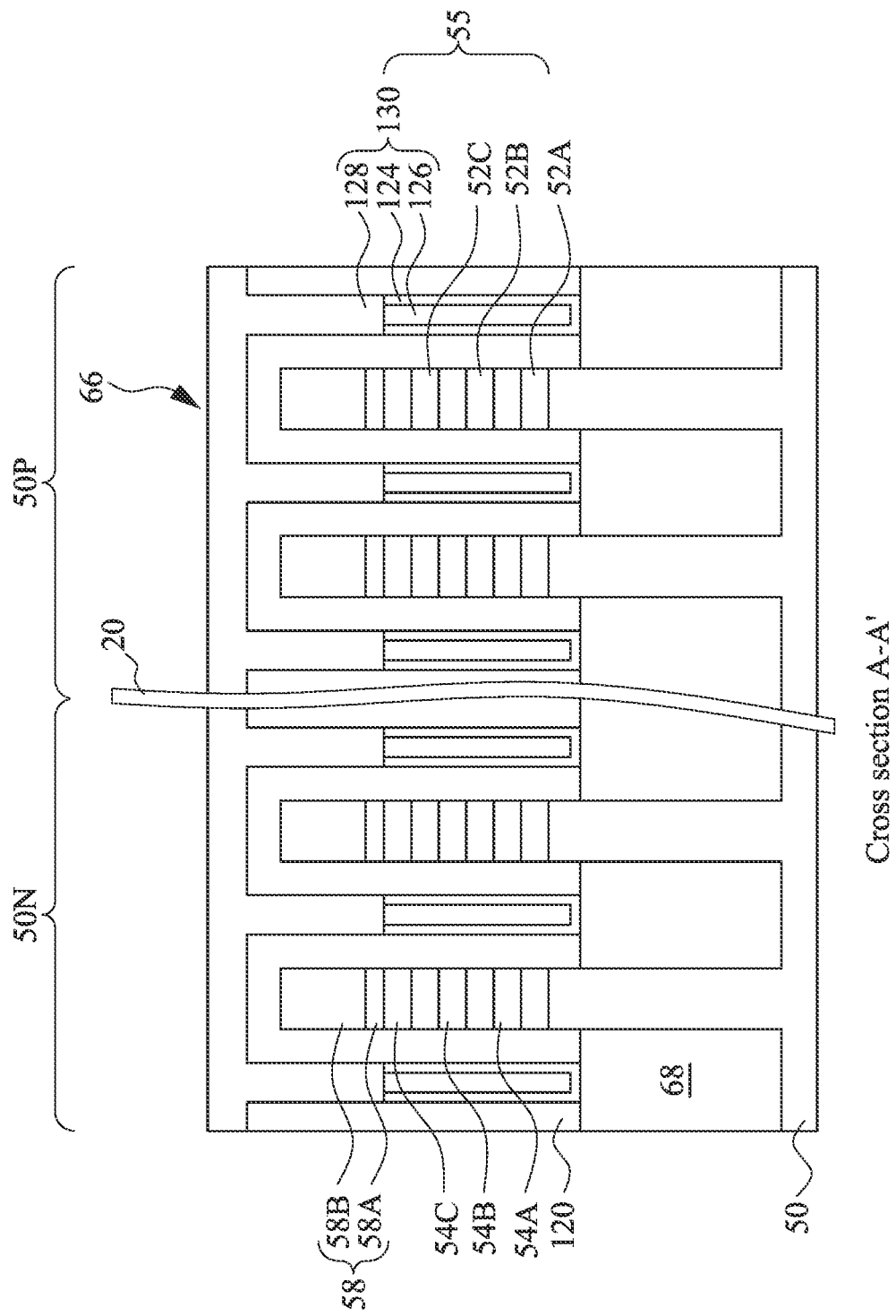

In FIGS. 10A, 10B, and 10C, an upper dielectric layer or layers 128 for the insulating fins 130 may be formed on the liner 124 and the fill material 126. The upper dielectric layers 128 may be formed of a high-k dielectric material (e.g., those having a k-value of greater than about 7) such as hafnium oxide, zirconium oxide, zirconium aluminum oxide, hafnium aluminum oxide, hafnium silicon oxide, aluminum oxide, or the like; or combinations thereof, which may be deposited by a conformal deposition process (such as one selected from the candidate methods of forming the fill material 126). In some embodiments, the liner 124 and the fill material 126 are formed of the same material as the first mask layer 58A and the second mask layer 58B, so the material of the upper dielectric layers 128 is chosen to have an etching selectivity with the material of the liner 124 and the fill material 126. This may protect the liner 124 and the fill material 126 from a subsequent process to remove the masks 58 (see below, FIG. 12A).

Figure 11A:
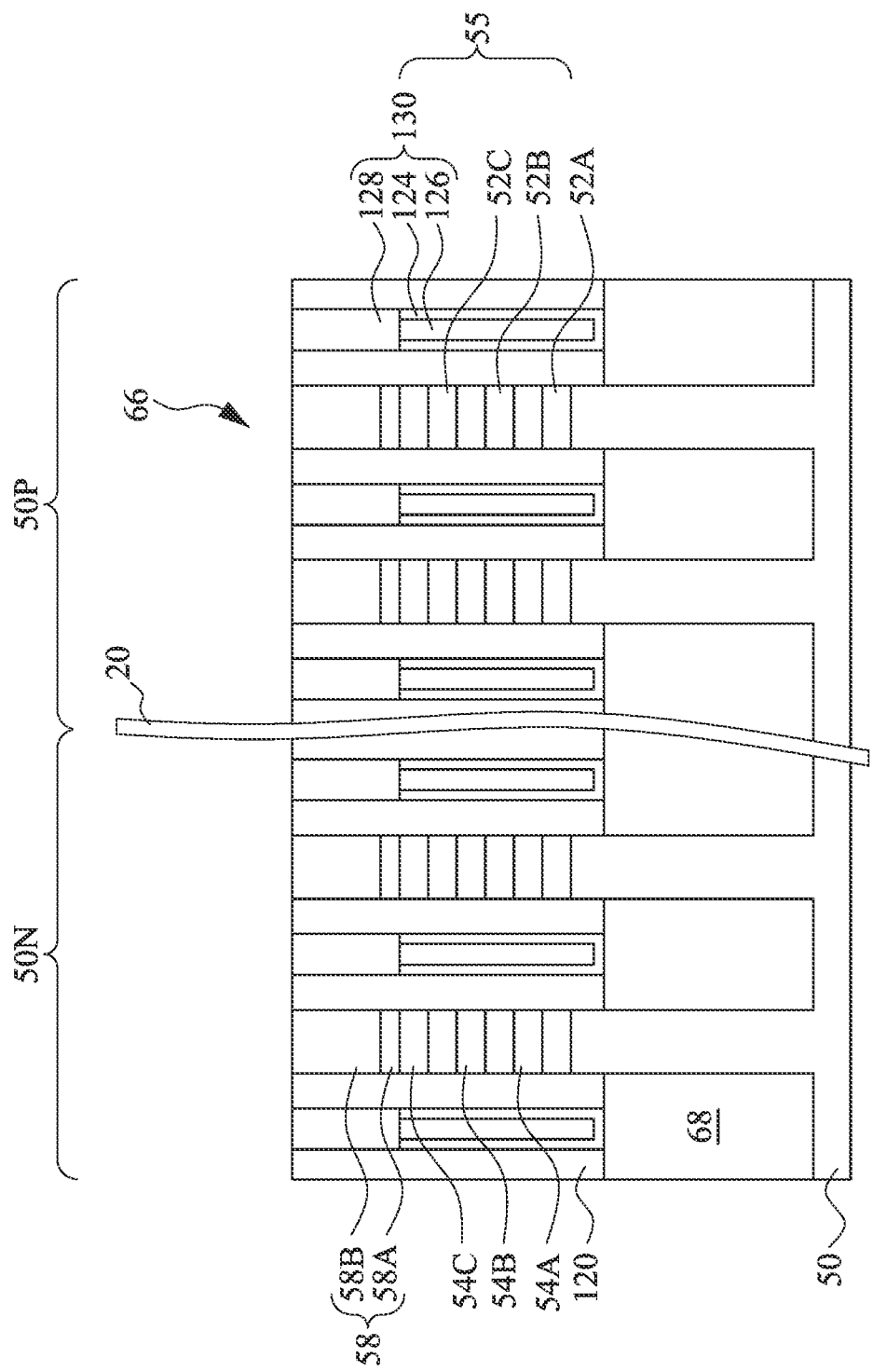

In FIGS. 11A, 11B, and 11C, a removal process is applied to remove excess material(s) of the upper dielectric layers 128 and the sacrificial layer 120 over the masks 58 (if present) or the nanostructures 55. In some embodiments, a planarization process such as a chemical mechanical polish (CMP), an etch-back process, combinations thereof, or the like may be utilized. The planarization process exposes the masks 58 or the nanostructures 55 such that top surfaces of, respectively, the masks 58 or the nanostructures 55, the sacrificial layer 120, and the upper dielectric layers 128 are coplanar (within process variations) after the planarization process is complete. In the illustrated embodiment, the masks 58 remain after the planarization process. In another embodiment, portions of or the entirety of the masks 58 may also be removed by the planarization process.

Figure 12A:
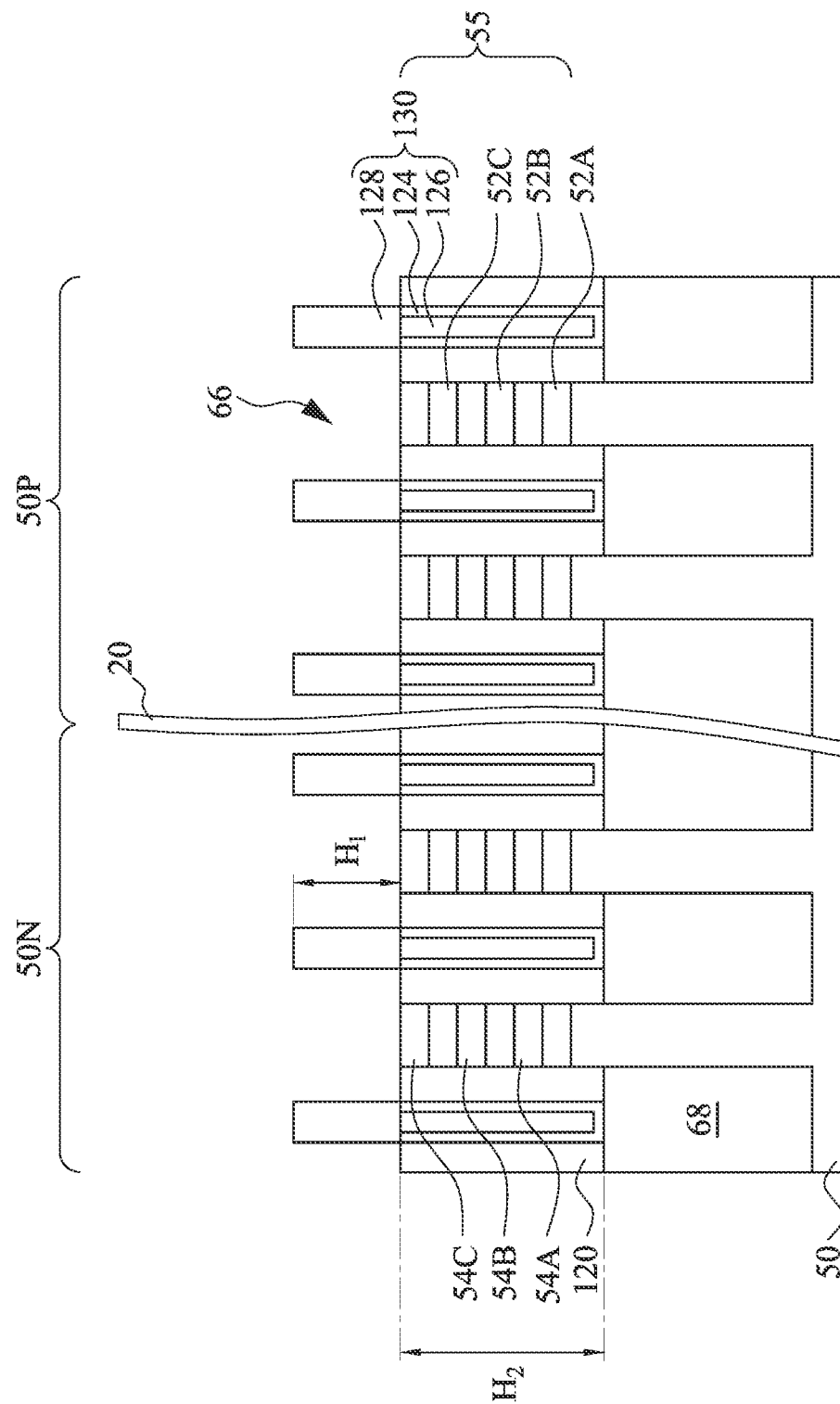
Figure 12B:
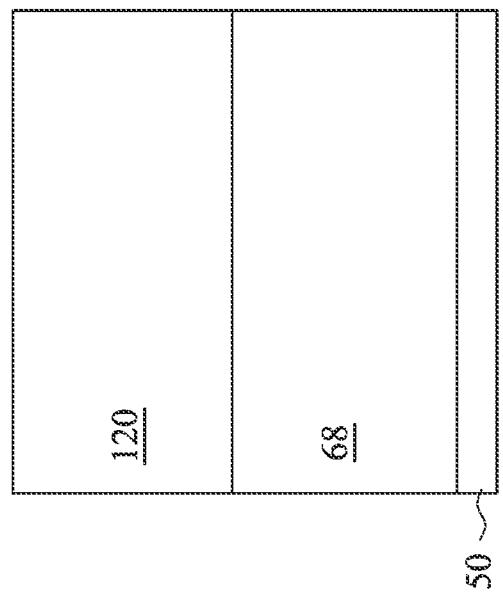

In FIGS. 12A, 12B, and 12C, masks 58 are removed and the sacrificial layer 120 is recessed so that the insulating fins 130 protrude above neighboring portions of the sacrificial layer 120. In embodiments in which the masks 58 are not present, portions of one of the nanostructures 55 may be recessed. The recessing may be performed using one or more etching process(es). For example, the masks 58 may be removed using an acceptable etching process, such as one that is selective to the masks 58 (e.g., selectively etches the material(s) of the masks 58 at a faster rate than the material (s) of the sacrificial layer 120 and the upper dielectric layers 128 of the insulating fins 130). The sacrificial layer 120 may optionally be recessed using an acceptable etching process, such as one that is selective to the sacrificial layer 120 (e.g., selectively etches the material(s) of the sacrificial layer 120 at a faster rate than the material(s) of the nanostructures 55 and the insulating fins 130). The recessing may remove some of the nanostructures 55. A bottom of the upper dielectric layers 128 is illustrated as being level with an upper surface of the nanostructures 55 for illustrative purposes, and the bottom of the upper dielectric layers 128 may be above or below the upper surface of the nanostructures 55.

In the illustrated embodiment, the insulating fins 130 have lower portions (including the liner 124 and the fill material 126) formed of low-k dielectric materials and upper portions (including the upper dielectric layers 128) formed of high-k dielectric materials. It should be appreciated that other types of insulating fins 130 may be formed, such as insulating fins 130 with more or fewer layers. In various embodiments, the insulating fins 130 can include lower and upper portions of low-k dielectric materials; lower and upper portions of high-k dielectric materials; lower portions of high-k dielectric materials and upper portions of low-k dielectric materials; single-layered lower and/or upper portions; multi-layered lower and/or upper portions; or the like. The upper portions (including the upper dielectric layers 128) of the insulating fins 130 can have a height $H_1$ in a range of about 20 nm to about 30 nm, the lower portions (including the liner 124 and the fill material 126) of the insulating fins 130 can have a height $H_2$ in a range of about 55 nm to about 60 nm, and the insulating fins 130 can have an overall height in a range of about 75 nm to about 90 nm.

Figure 13A:
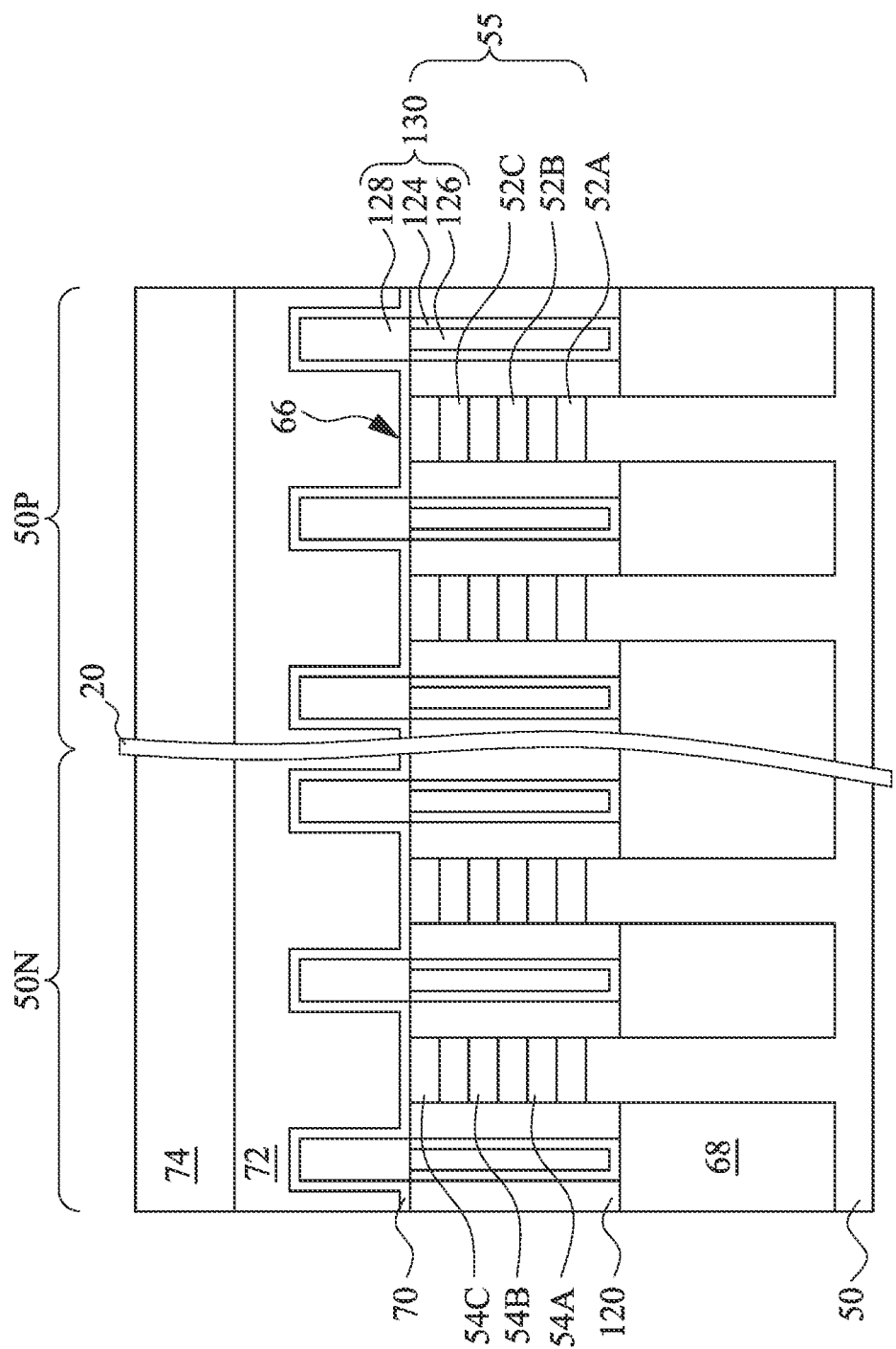
Figure 13B:
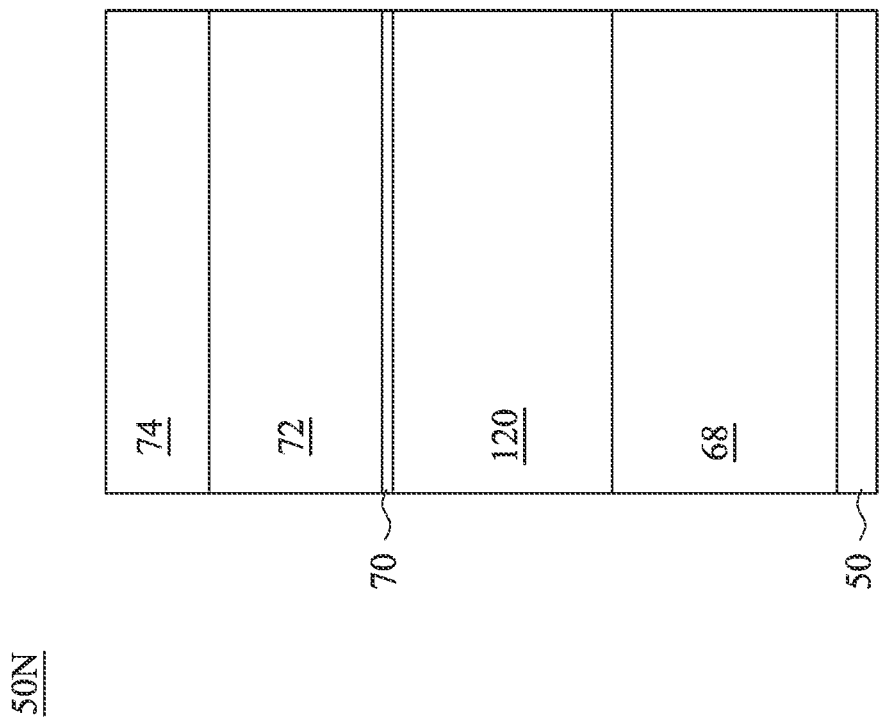
Figure 13C:
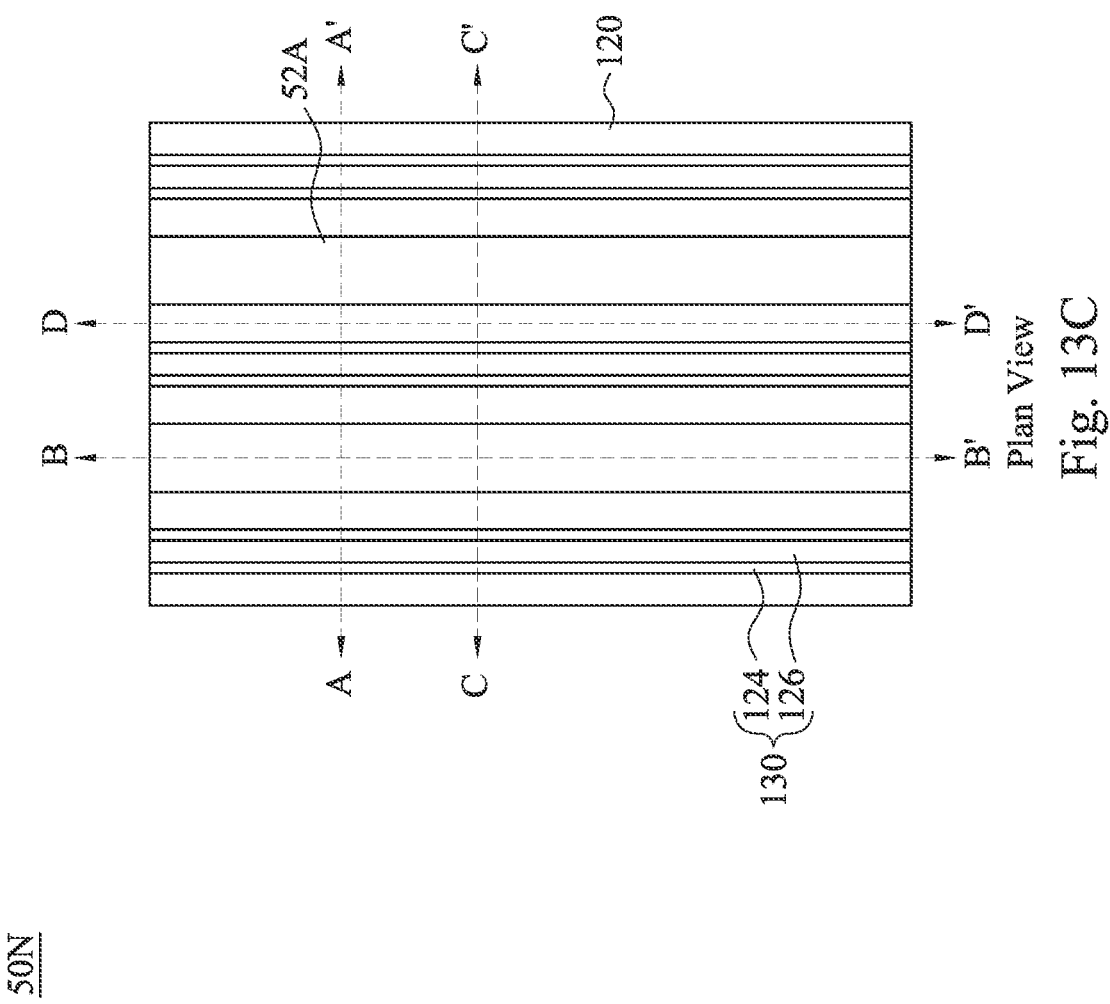
Figure 14A:
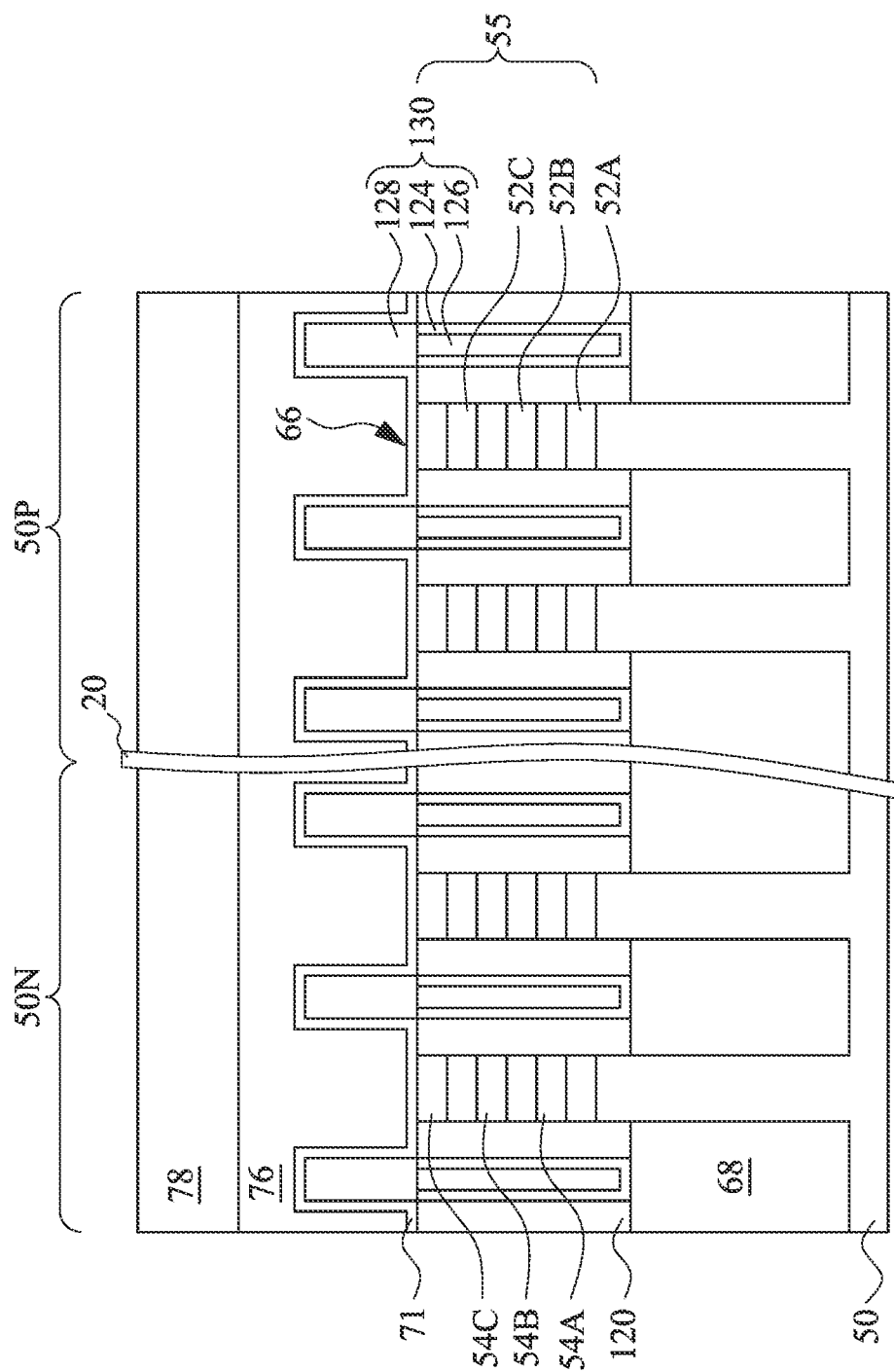
Figure 14B:
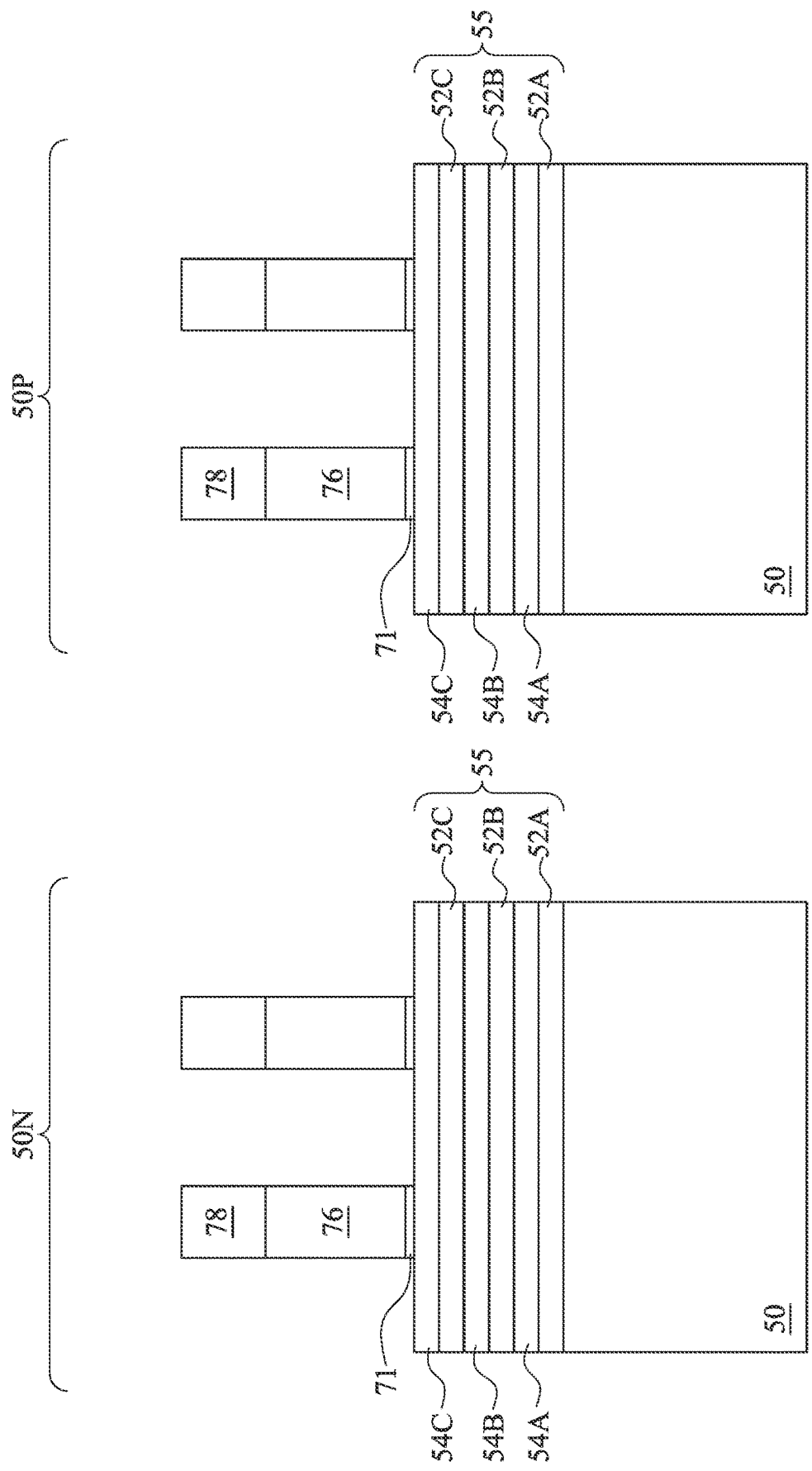
Figure 14C:
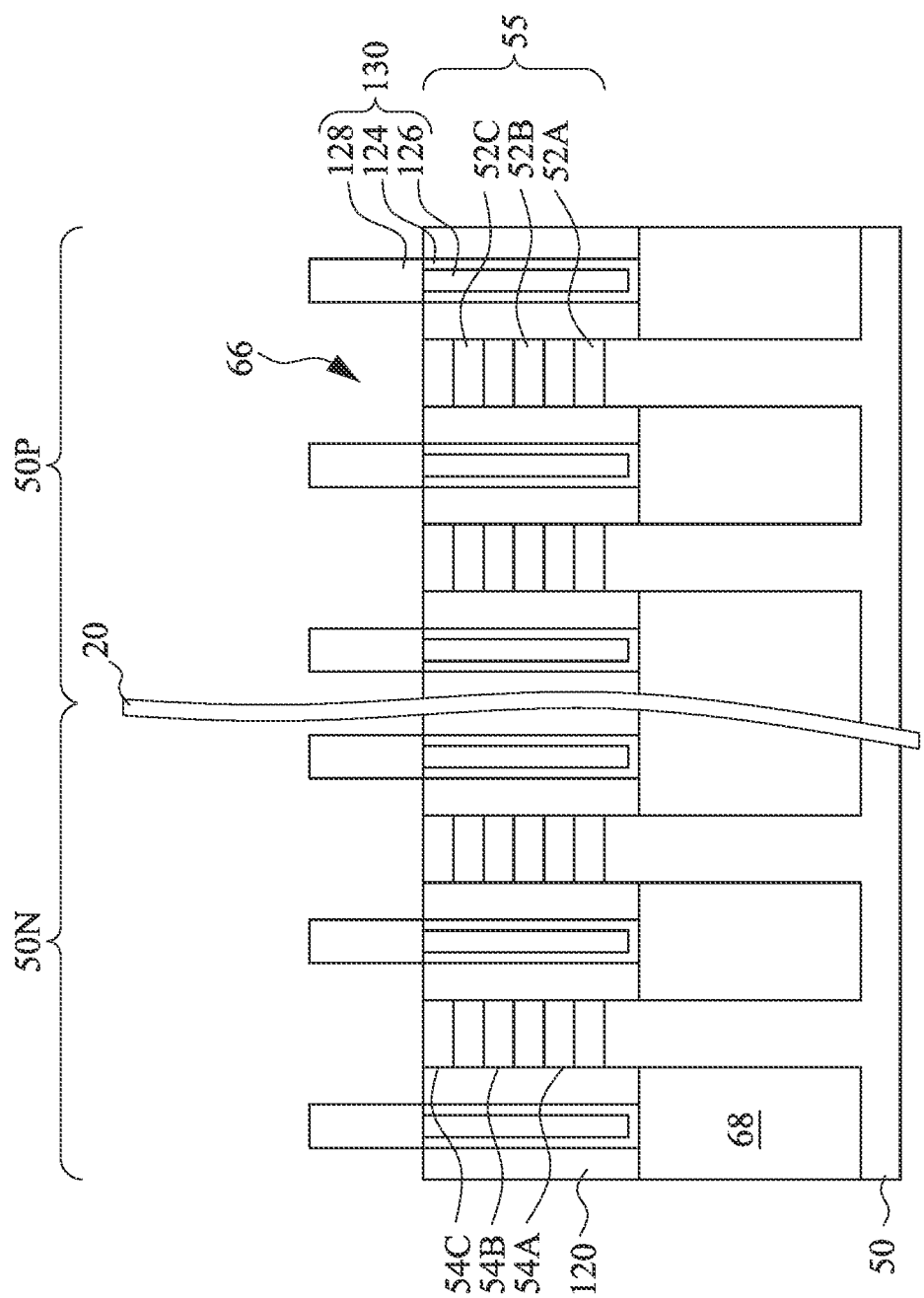
Figure 14D:
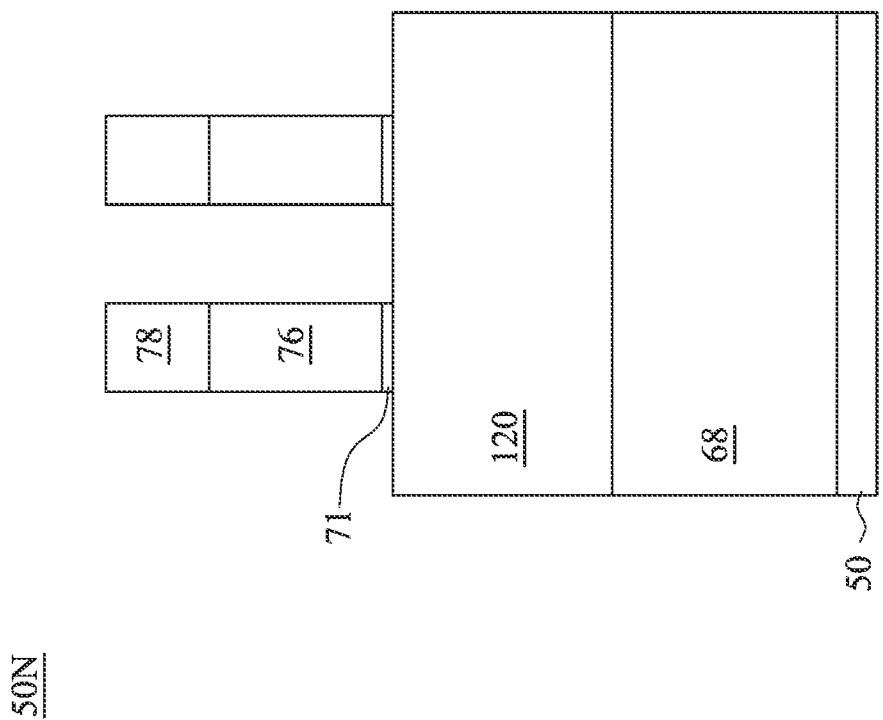

In FIGS. 13A, 13B, and 13C, a dummy dielectric layer 70 is formed on the fins 66 and/or the nanostructures 55, the sacrificial layer 120, and the insulating fins 130. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (polysilicon), poly-crystal-line silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions. The mask layer 74 may include, for example, silicon nitride, silicon oxynitride, or the like. In this example, a single dummy gate layer 72 and a single mask layer 74 are formed across the n-type region 50N and the p-type region 50P.

In FIGS. 14A through 14E, the mask layer 74 (see FIG. 13A) may be patterned using acceptable photolithography and etching techniques to form masks 78. The pattern of the masks 78 then may be transferred to the dummy gate layer 72 and to the dummy dielectric layer 70 to form dummy gates 76 and dummy gate dielectrics 71, respectively. The dummy gates 76 cover respective channel regions of the fins 66. The pattern of the masks 78 may be used to physically separate each of the dummy gates 76 from adjacent dummy gates 76. The dummy gates 76 may also have a lengthwise direction substantially perpendicular to the lengthwise direction of respective fins 66.

Figure 15A:
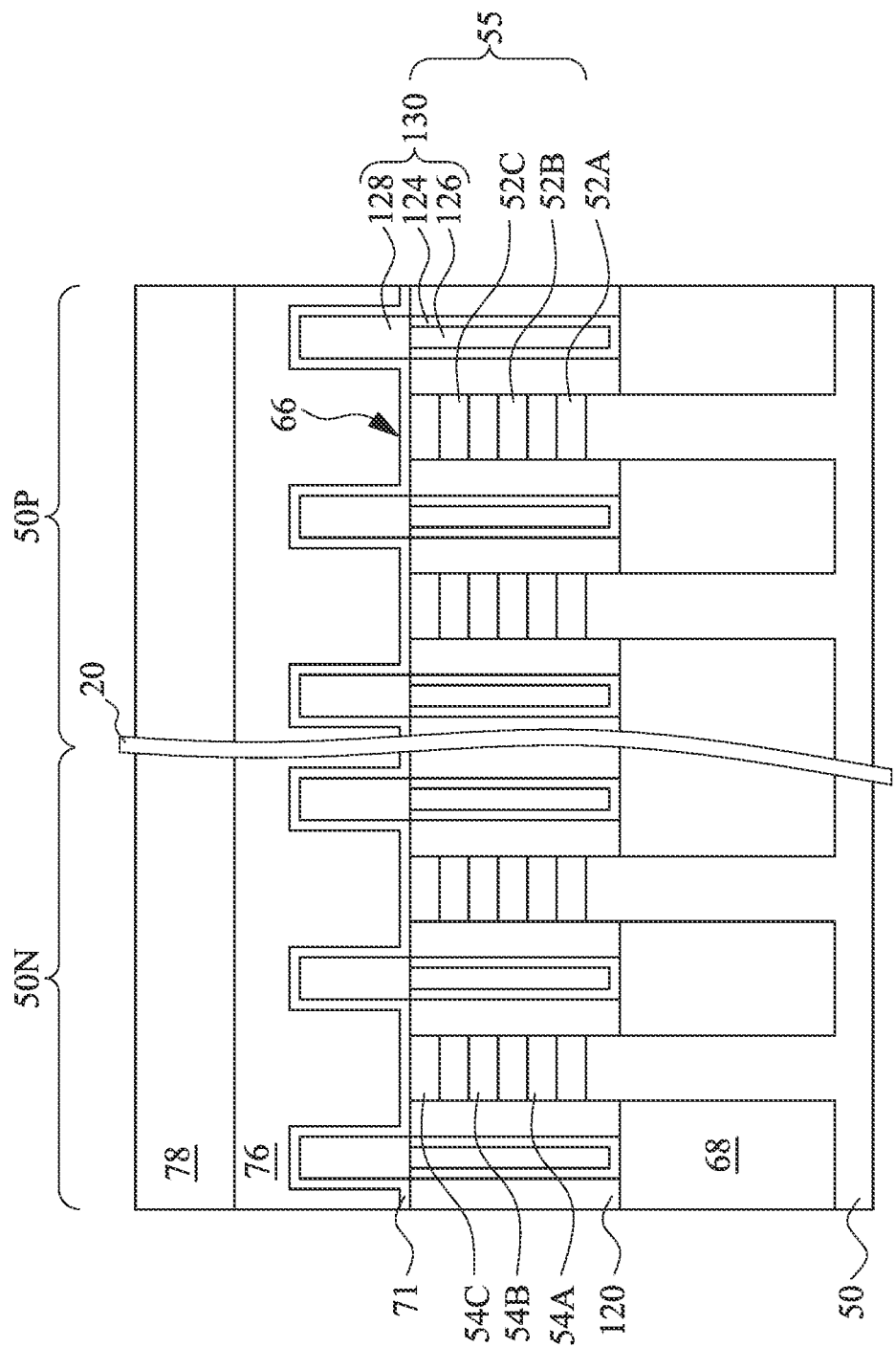
Figure 15C:
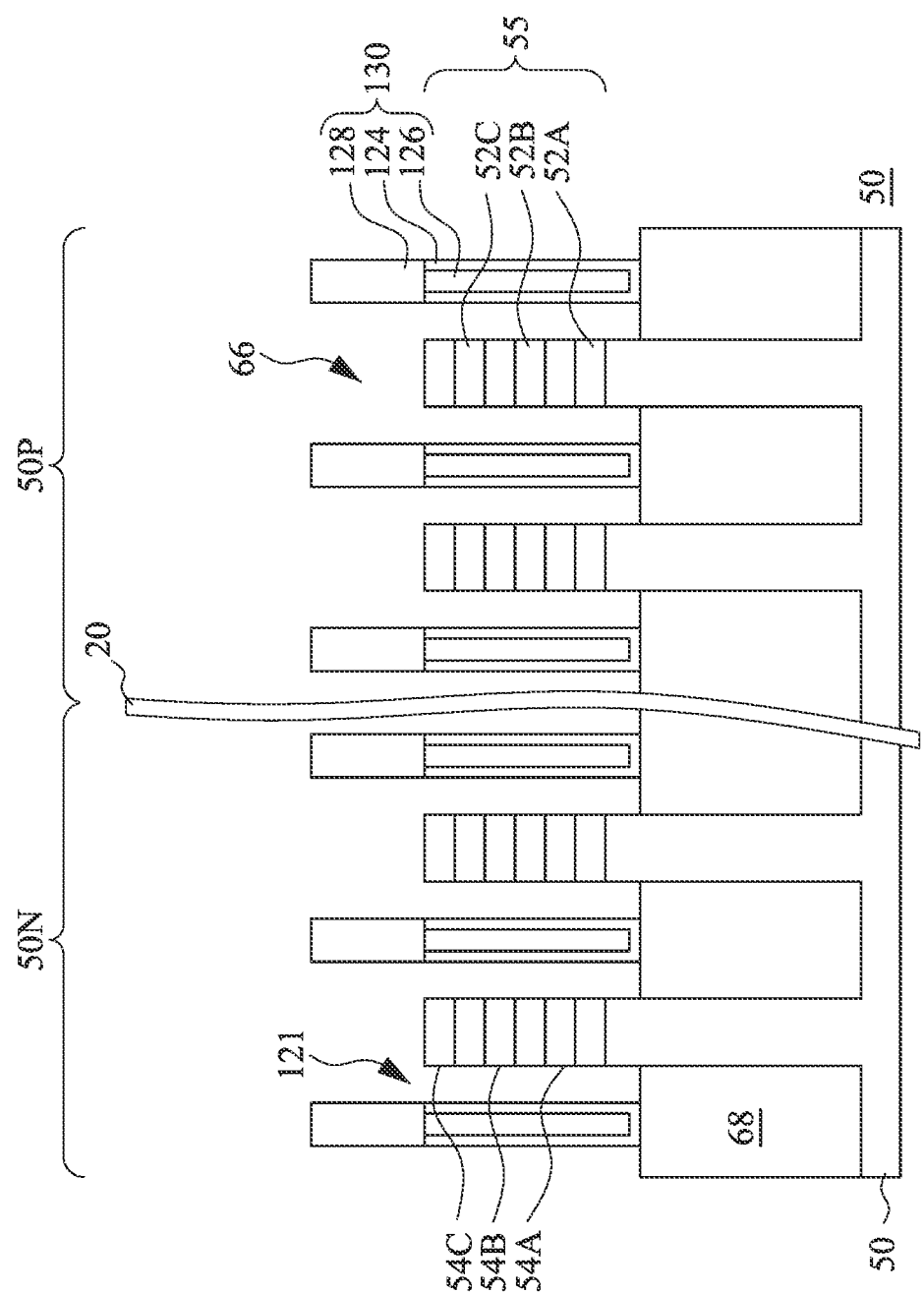

In FIGS. 15A through 15E, portions of the sacrificial layer 120 not covered by the dummy gate dielectrics 71 are removed to form first recesses 121 between the nanostructures 55 and the insulating fins 130. In subsequent steps, the first recesses 121 may be filled with spacer layers (see below, FIGS. 16A-D), which may reduce the formation of electrical shorts between subsequently formed source/drain regions and gate electrodes and lead to improved device function. The first recesses 121 may be formed by an anisotropic etch. In some embodiments in which the sacrificial layer 120 comprises silicon germanium, an anisotropic dry etch performed with an etchant such as $NF_3$, $CF_4$, $CHF_3$, $SF_6$, $O_2$, HBr, $CH_3F$, He, $CH_4$, $NH_3$, HF, the like, or a combination thereof may be used. The duration of the etching time may be in a range of about 300 seconds to about 400 seconds. The power source of the etch may provide a power in a range of about 400 W to about 500 W and the bias power of the etch may be in a range of about 200 W to about 300 W. In some embodiments, the sacrificial layer 120 may be horizontally over-etched under the dummy gates and the dummy gate dielectric 71 so that the dummy gate dielectric 71 extends over the first recesses 121 by a width W1 in a range of about 1 nm to about 2 nm, as illustrated in FIG. 15D. This may be useful during subsequent formation of the spacer layer to form a thicker barrier between subsequently formed source/drain regions and gate electrodes, which may reduce electrical shorts.

In FIGS. 16A through 16E, one or more spacer layers, such as a first spacer layer 80 and a second spacer layer 82, are formed over the structures illustrated in FIGS. 15A through 15D, respectively. The first spacer layer 80 and the second spacer layer 82 will be subsequently patterned to act as spacers for forming self-aligned source/drain regions and to protect sidewalls of the fins 66 and/or nanostructure 55 during subsequent processing and to form a thicker barrier between subsequently formed source/drain regions and gate electrodes, which may reduce electrical shorts. In FIGS. 16A through 16D, the first spacer layer 80 is formed on top surfaces of the STI regions 68; top surfaces and sidewalls of the fins 66, the nanostructures 55, the insulating fins 130, and the masks 78; and sidewalls of the dummy gates 76 and the dummy gate dielectric 71. The second spacer layer 82 is deposited over the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like.

Figure 16A:
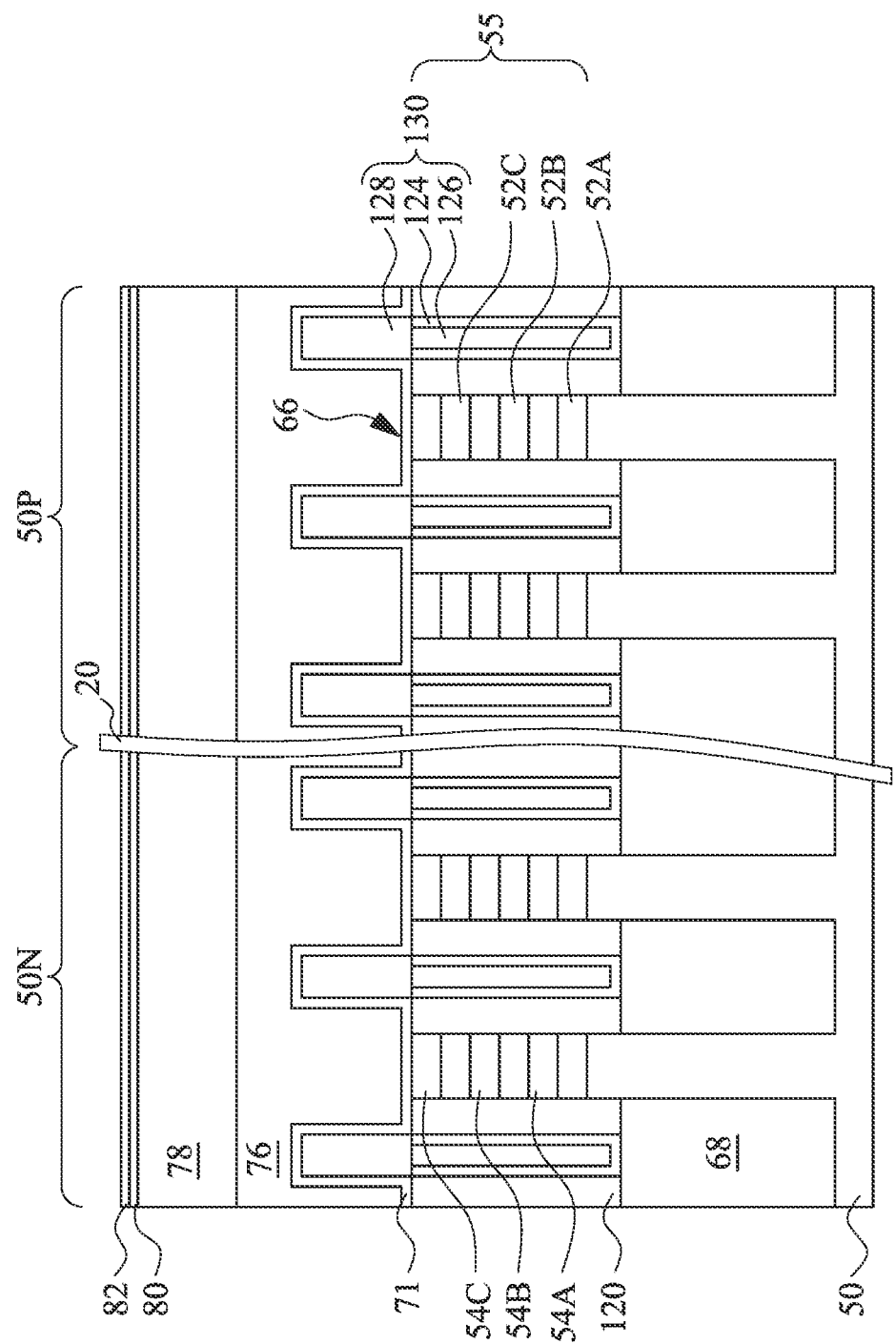
Figure 16B:
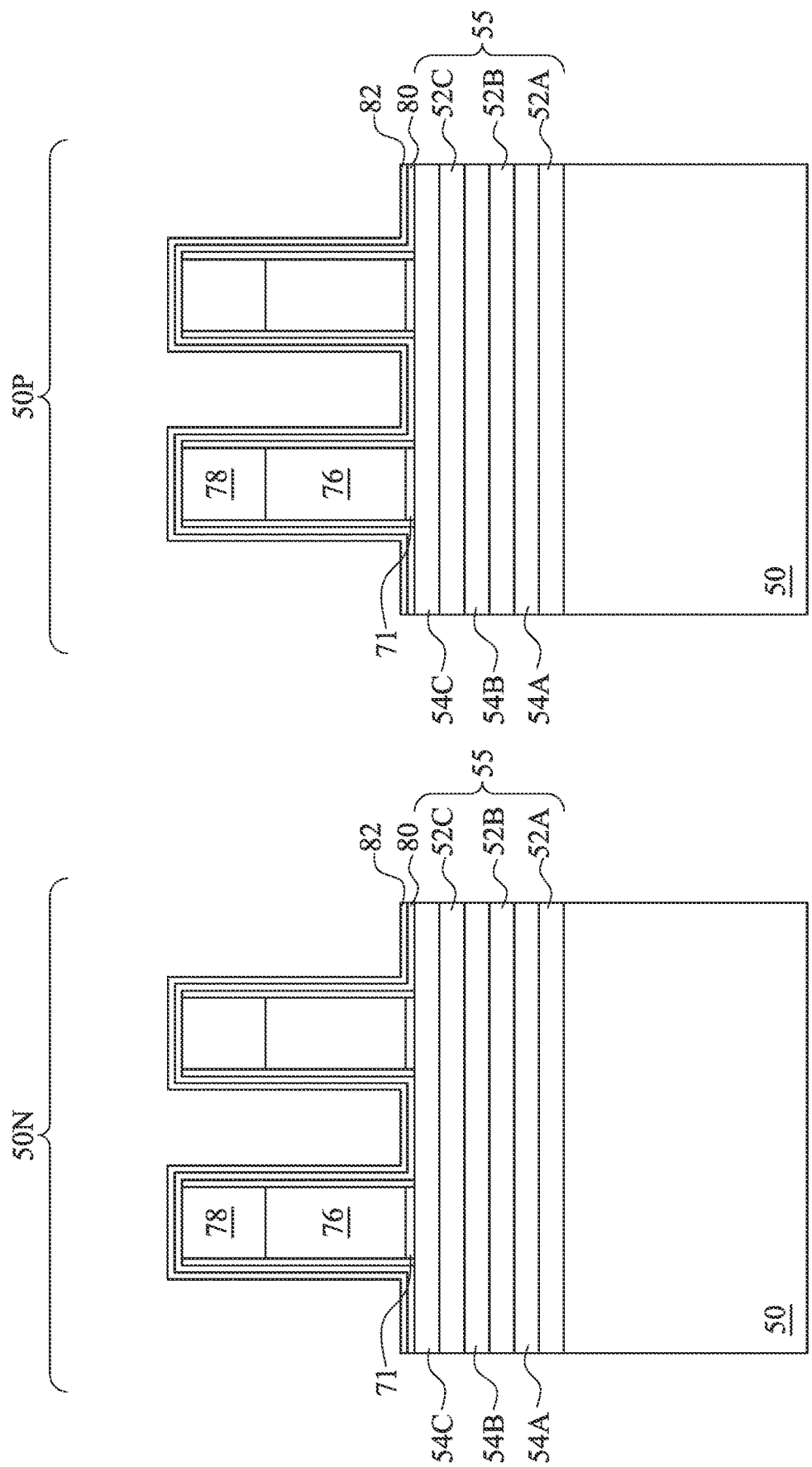
Figure 16C:
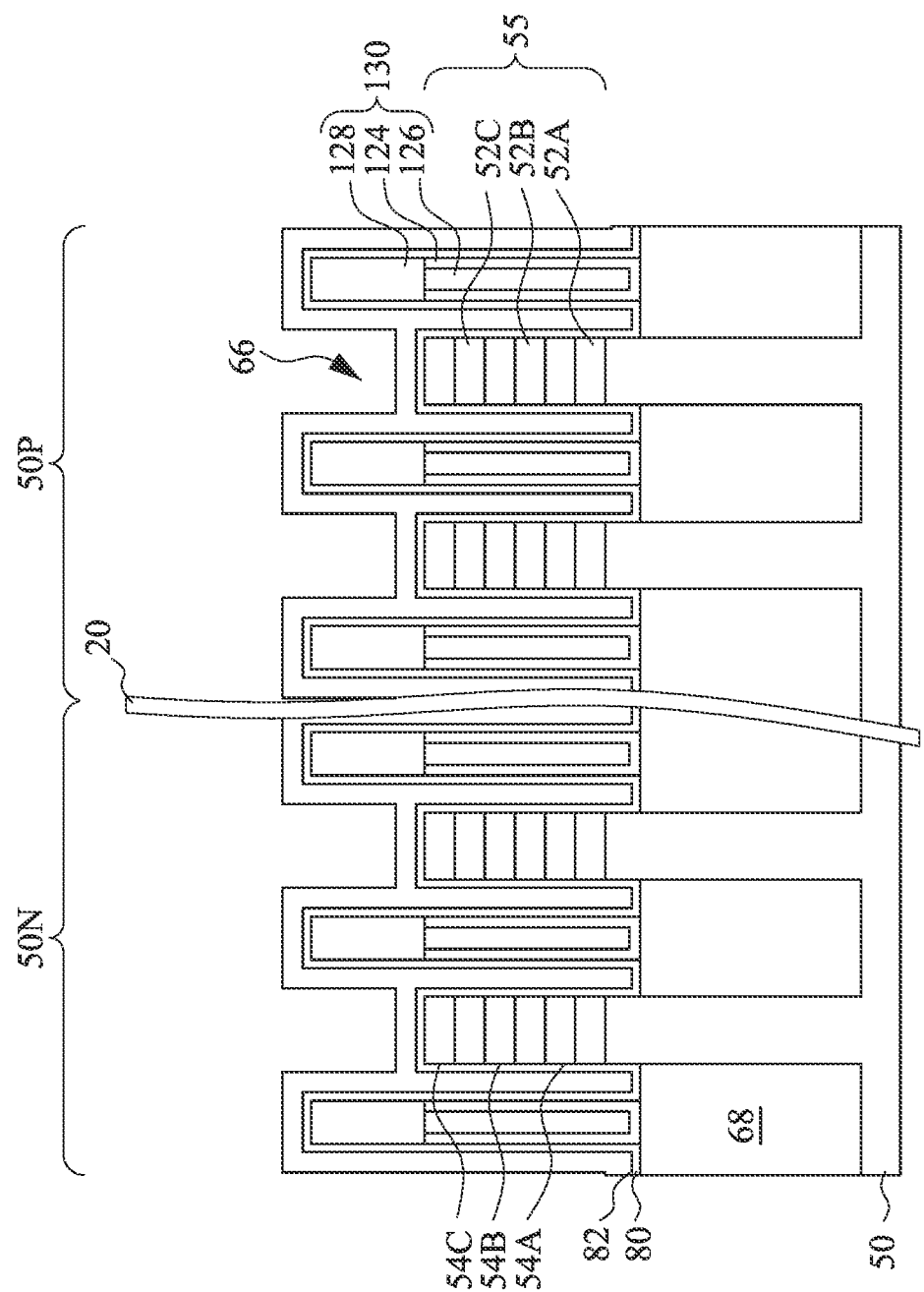
Figure 16D:
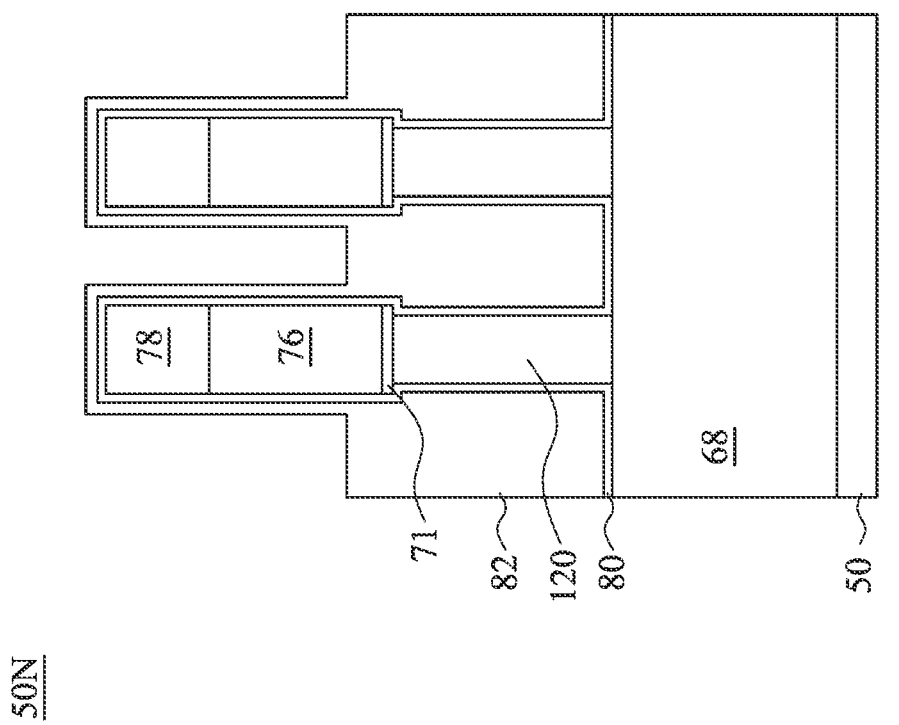

The first spacer layer 80 and the second spacer layer 82 fill the first recesses 121 between the nanostructures 55 and the insulating fins 130, as illustrated in FIGS. 16C and 16D in accordance with some embodiments. This may provide a stronger insulating barrier between subsequently formed source/drain regions and gate electrodes and reduce the formation of electrical shorts between them, which may lead to improved device function.

After the first spacer layer 80 is formed and prior to forming the second spacer layer 82, implants for lightly doped source/drain (LDD) regions (not separately illustrated) may be performed. In embodiments with different device types, similar to the implants discussed above in FIGS. 5A, 5B, and 5C, a mask, such as a photoresist, may be formed over the n-type region 50N, while exposing the p-type region 50P, and appropriate type (e.g., p-type) impurities may be implanted into the exposed fins 66 and nanostructures 55 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 66 and nanostructures 55 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in a range from about $1 \times 10^{15}$ atoms/cm$^3$ to about $1 \times 10^{19}$ atoms/cm$^3$. An anneal may be used to repair implant damage and to activate the implanted impurities.

Figure 17A:
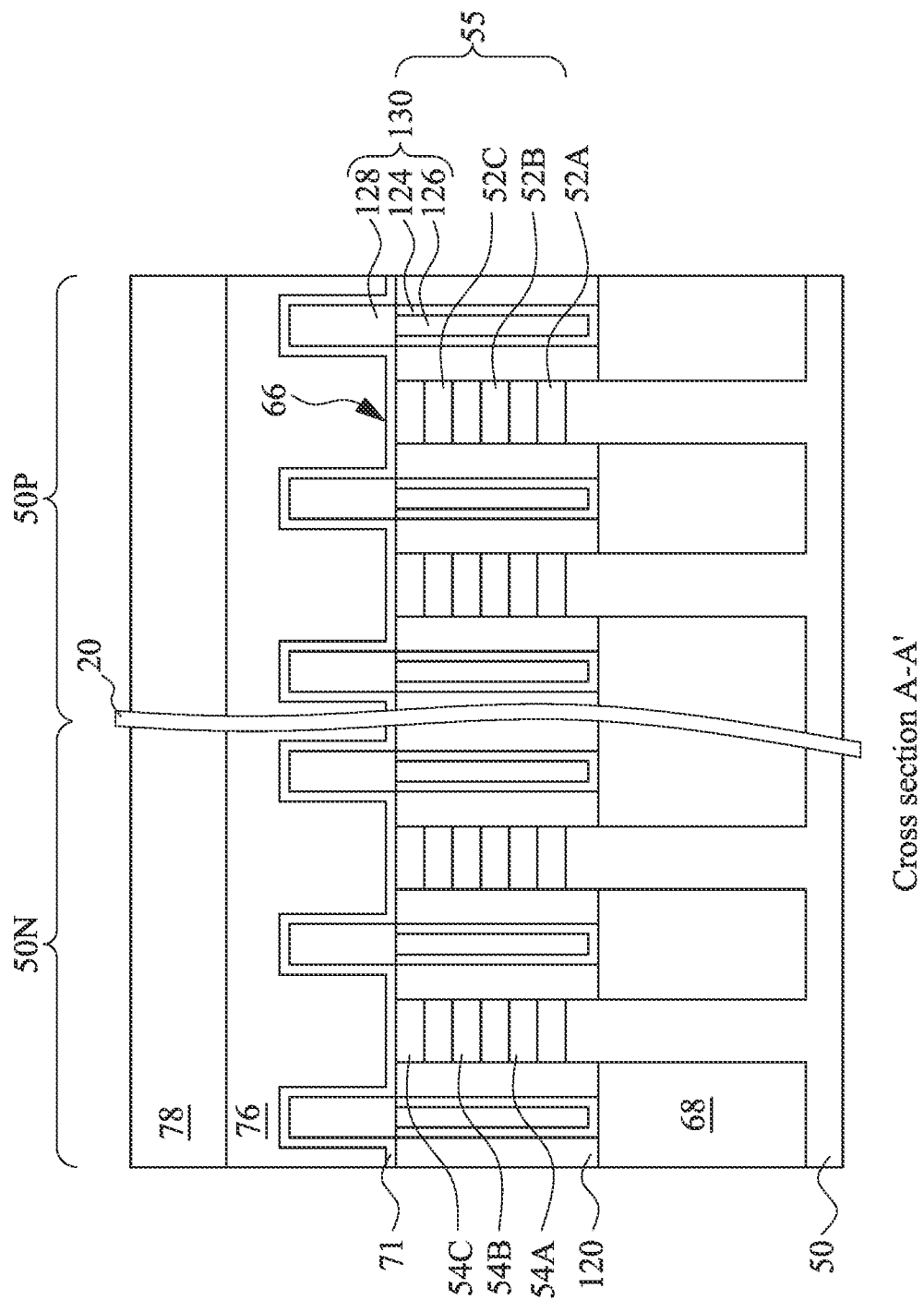
Figure 17B:
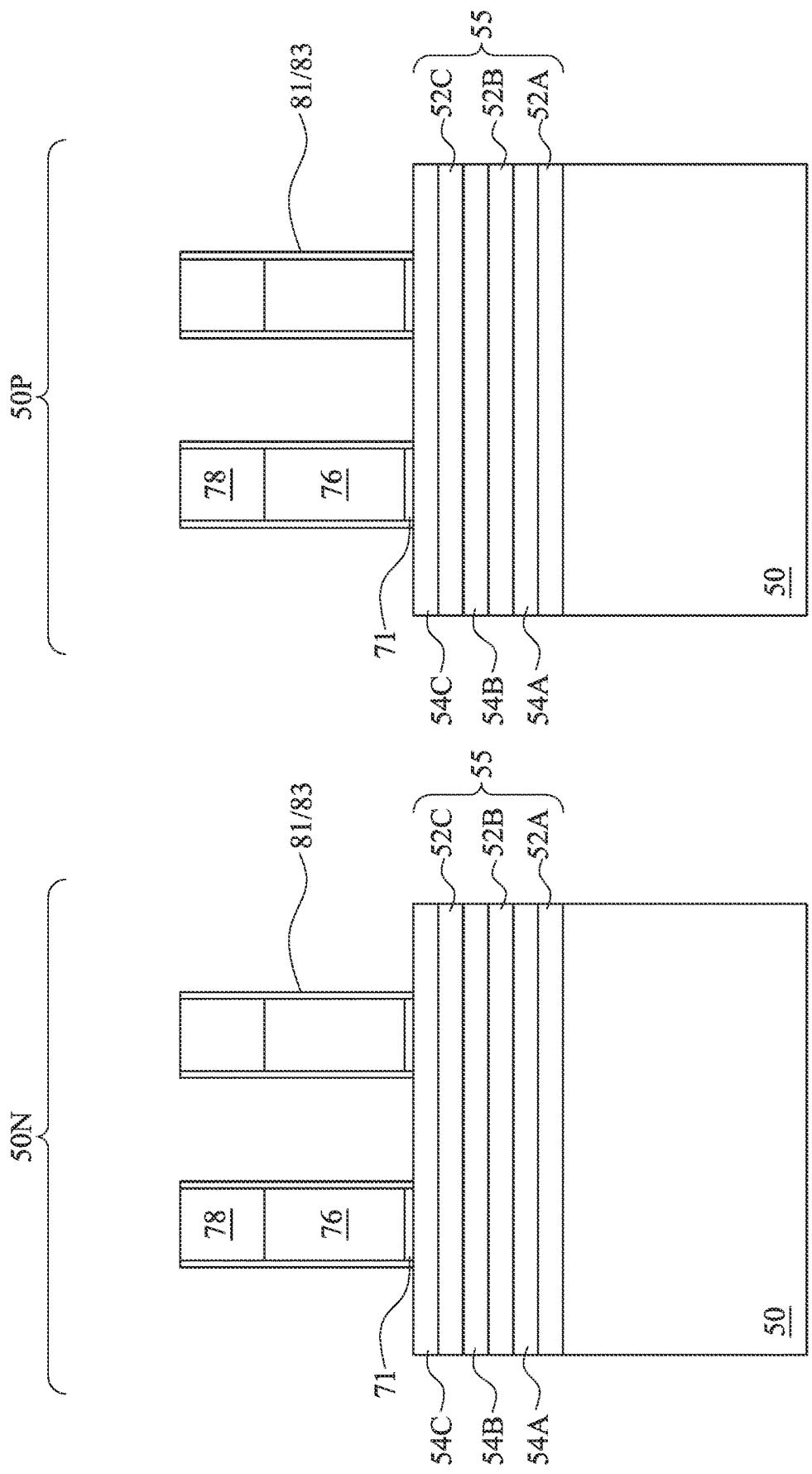

In FIGS. 17A through 17E, the first spacer layer 80 and the second spacer layer 82 are etched to form first spacers 81 and second spacers 83. As will be discussed in greater detail below, the first spacers 81 and the second spacers 83 act to self-align subsequently formed source/drain regions. The first spacer layer 80 and the second spacer layer 82 may be etched using a suitable etching process, such as an isotropic etching process (e.g., a wet etching process), an anisotropic etching process (e.g., a dry etching process), or the like. In some embodiments, the material of the second spacer layer 82 has a different etch rate than the material of the first spacer layer 80, such that the first spacer layer 80 may act as an etch stop layer when patterning the second spacer layer 82 and such that the second spacer layer 82 may act as a mask when patterning the first spacer layer 80. For example, the second spacer layer 82 may be etched using an anisotropic etch process wherein the first spacer layer 80 acts as an etch stop layer, wherein remaining portions of the second spacer layer 82 form second spacers 83 as illustrated in FIG. 17B. Thereafter, the second spacers 83 act as a mask while etching exposed portions of the first spacer layer 80, thereby forming first spacers 81 as illustrated in FIG. 17B. The first spacers 81 and the second spacers 83 are shown as a single element in FIGS. 17B, 17D, and following figures for illustrative purposes.

Figure 17C:
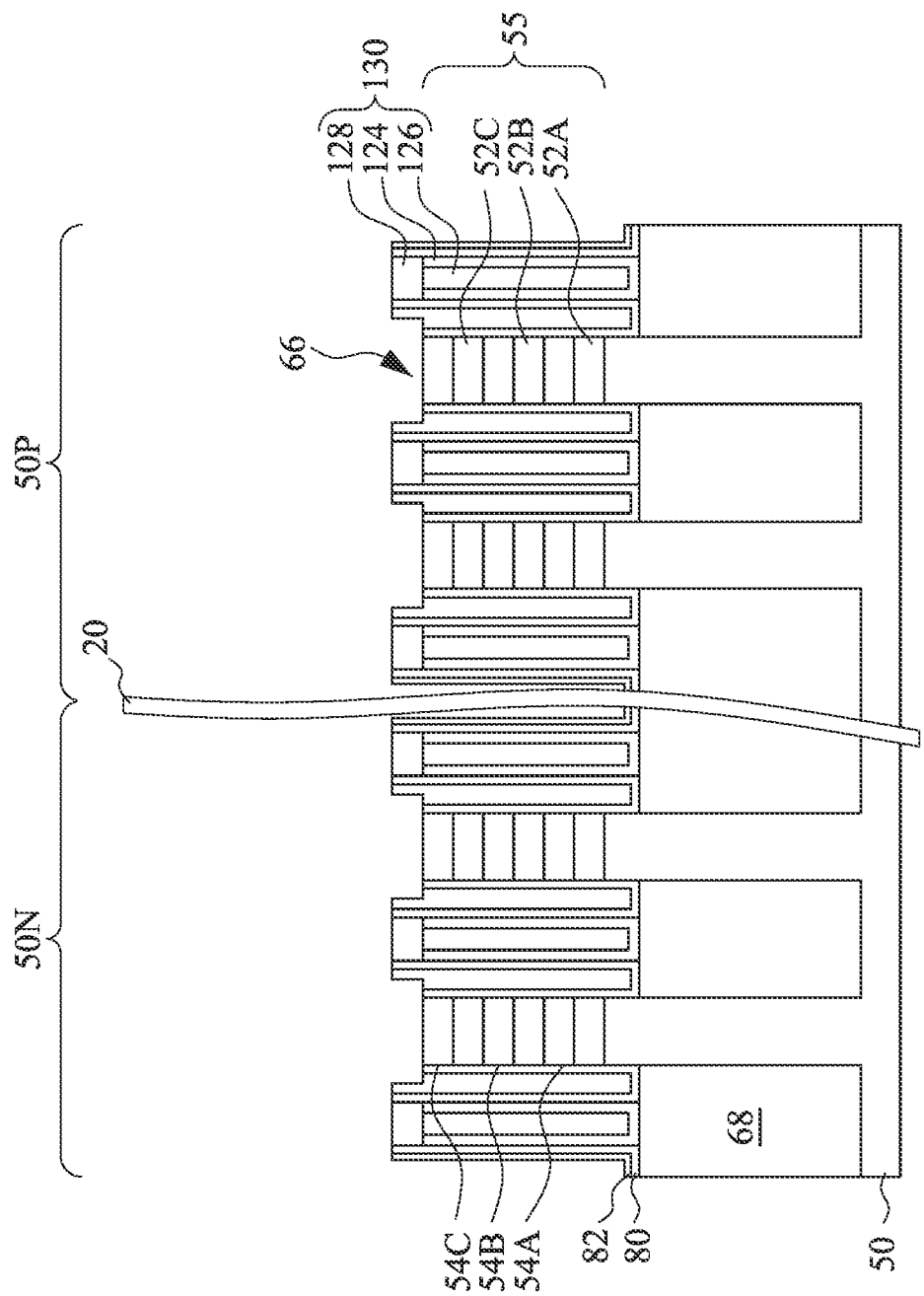
Figure 17D:
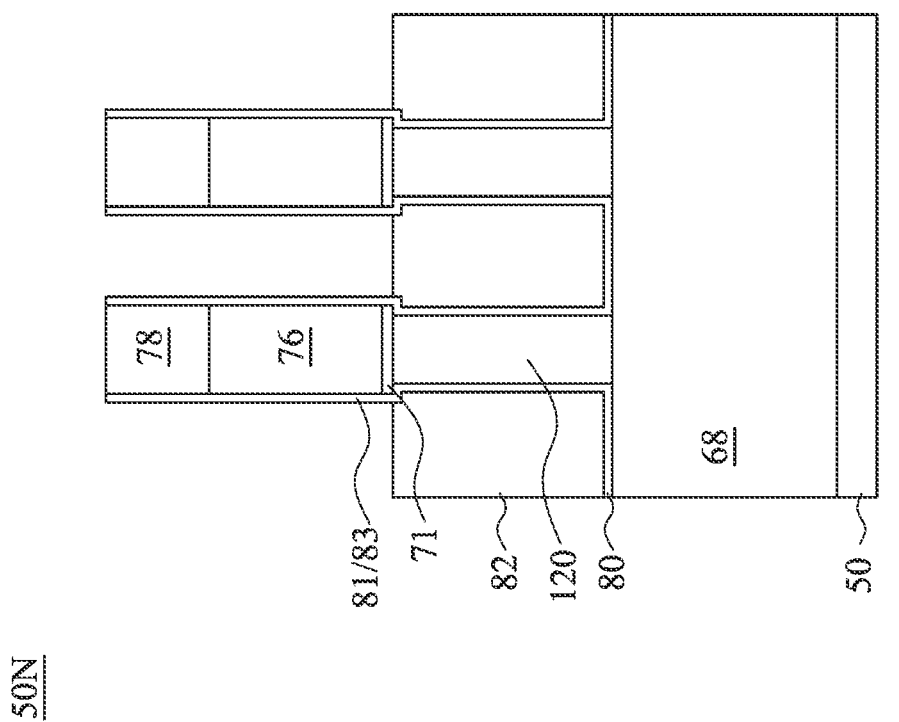

As illustrated in FIGS. 17C-E, remaining portions of the first spacer layers 80 and the second spacer layers 82 are disposed on sidewalls of the fins 66 and/or nanostructures 55 and on sidewalls of the insulating fins 130. As illustrated in FIGS. 17C and 17D, portions of the first spacer layers 80 and the second spacer layers 82 are disposed between the insulating fins 130, the nanostructures 55 (such as the first nanostructures 52A as illustrated in FIG. 17D), and the remaining portions of the sacrificial layer 120 positioned under the dummy gates 76.

It is noted that the above disclosure generally describes a process of forming spacers and LDD regions. Other processes and sequences may be used. For example, fewer or additional spacers may be utilized, different sequence of steps may be utilized (e.g., the first spacers 81 may be patterned prior to depositing the second spacer layer 82), additional spacers may be formed and removed, and/or the like. Furthermore, the n-type and p-type devices may be formed using different structures and steps.

Figure 18A:
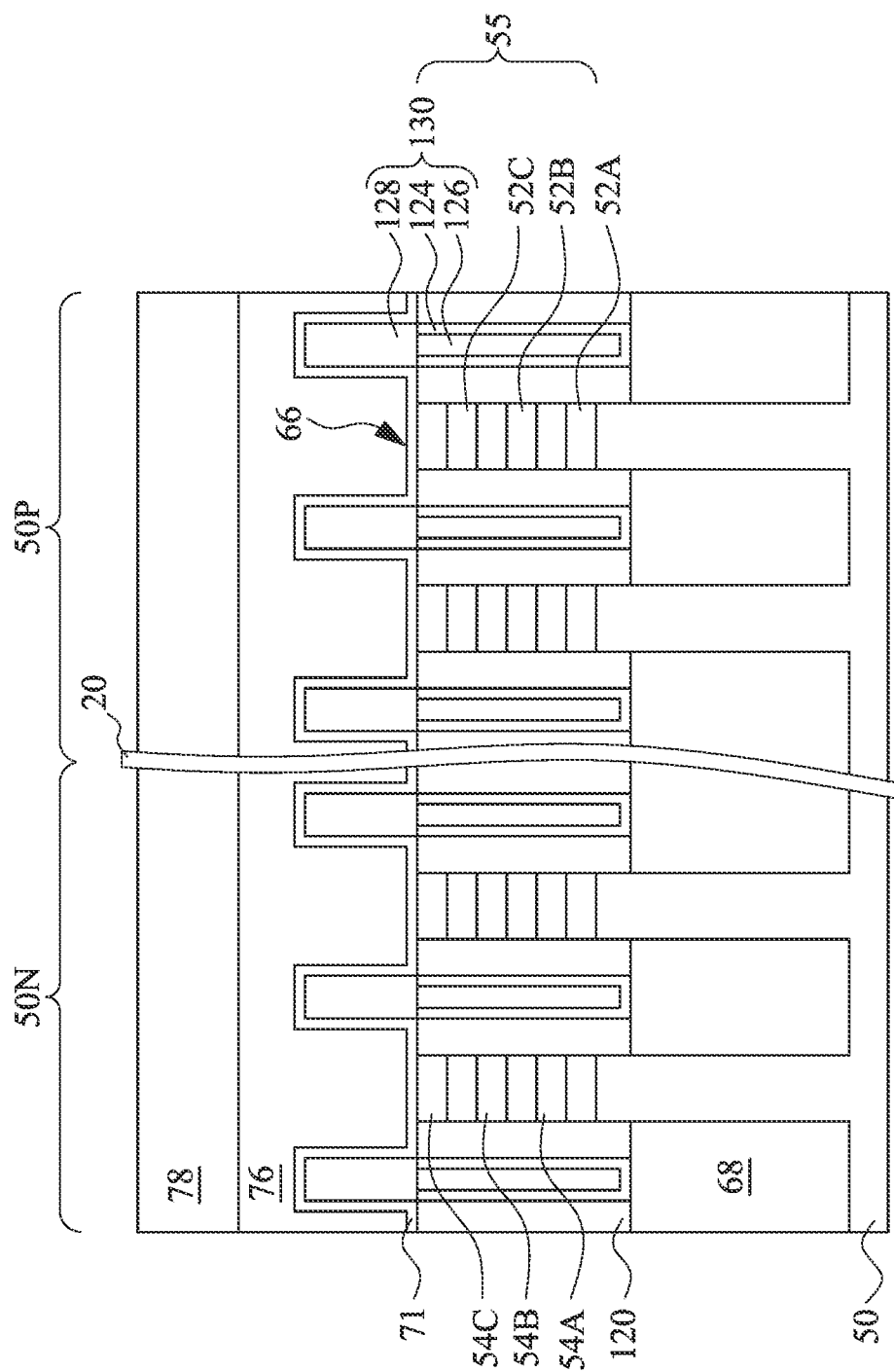
Figure 18B:
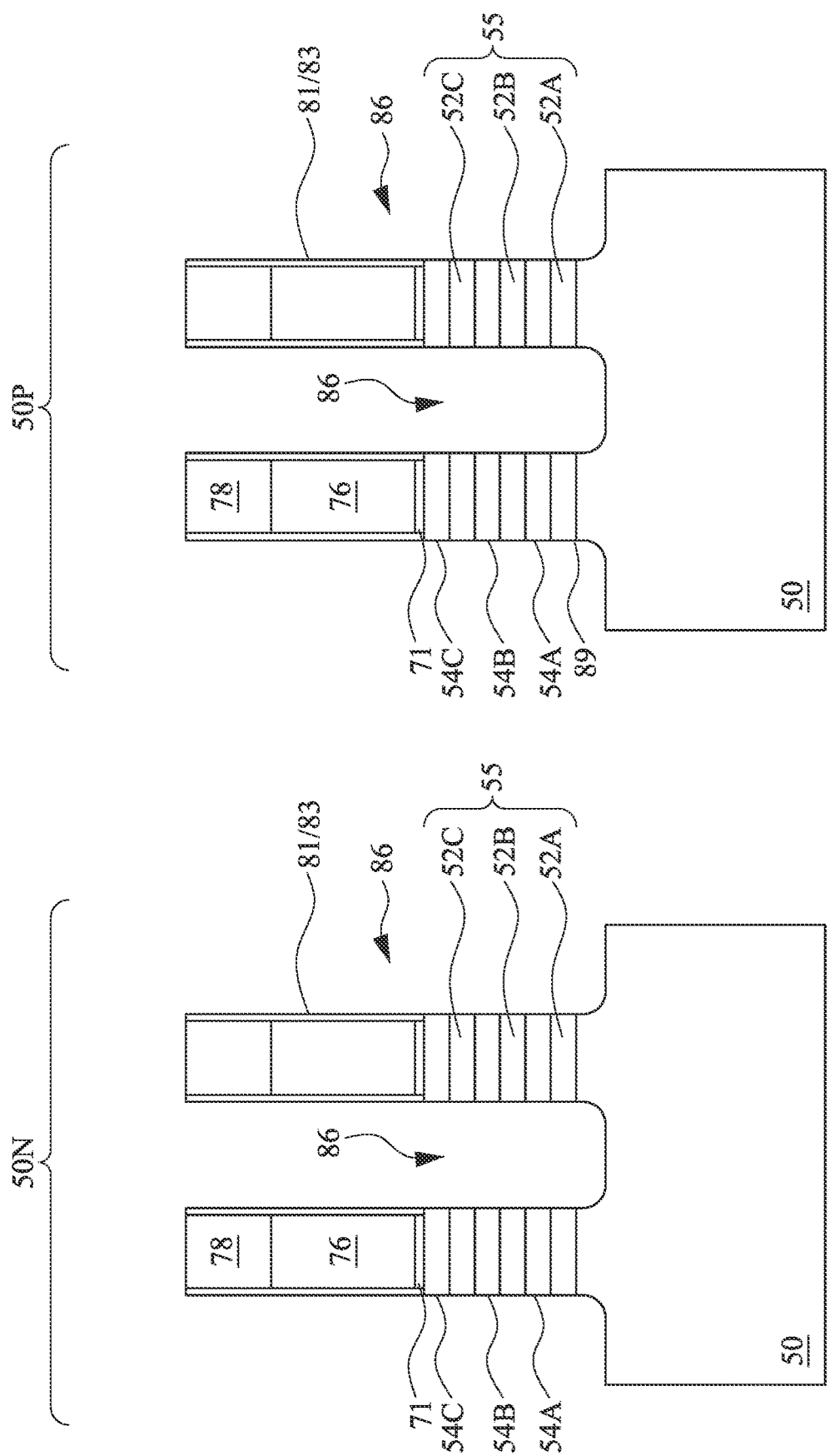
Figure 19A:
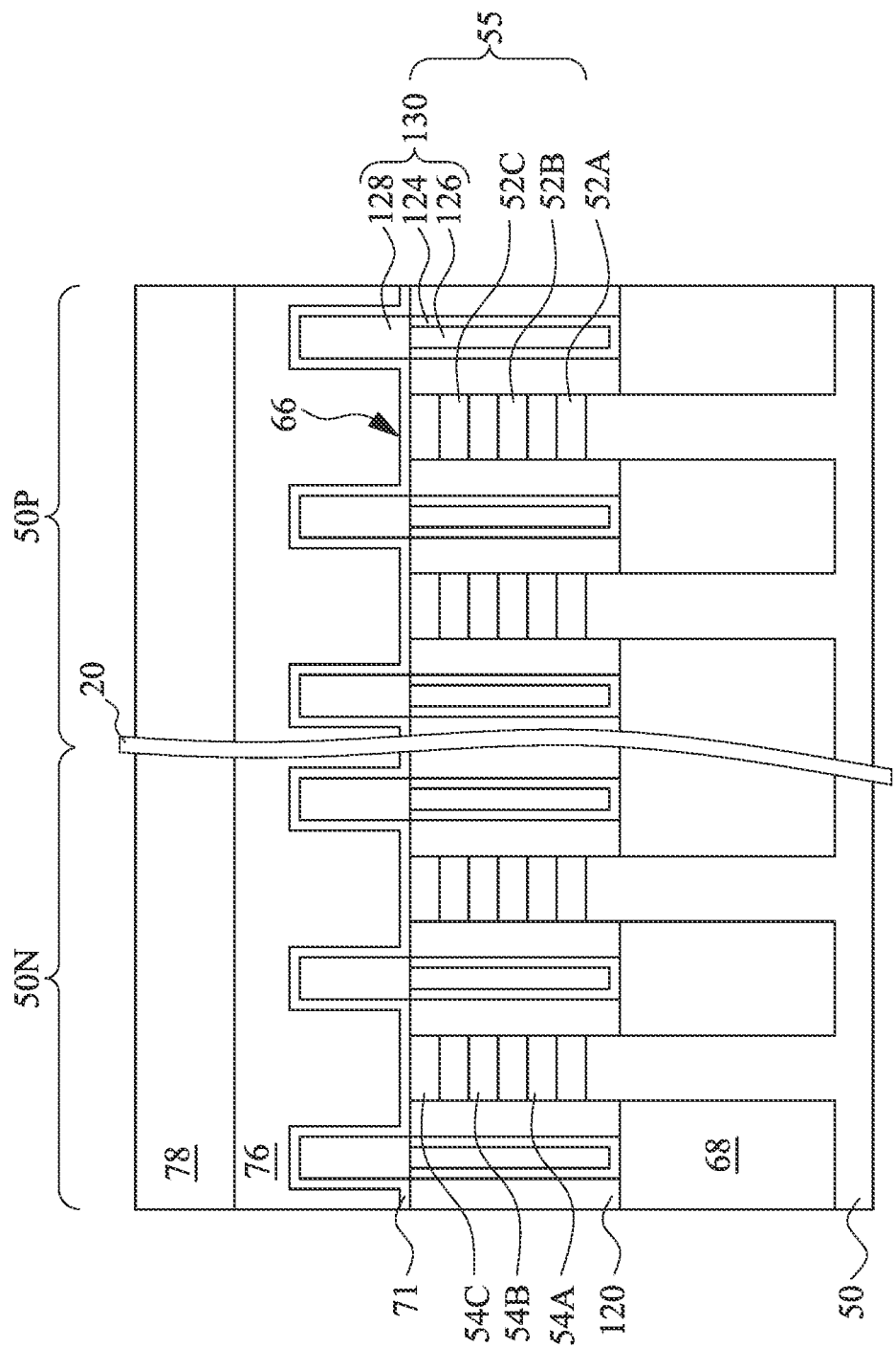
Figure 19B:
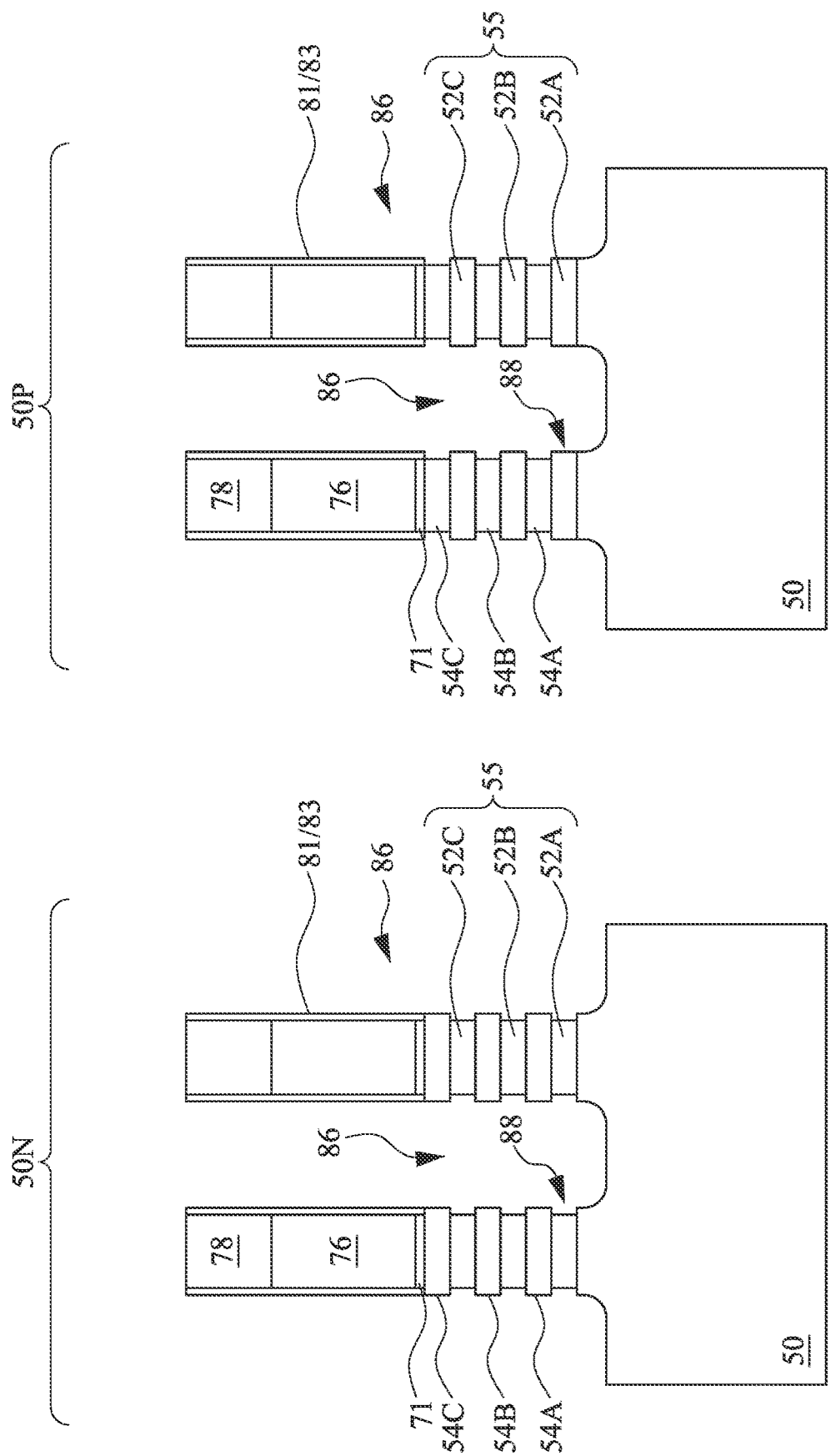
Figure 20A:
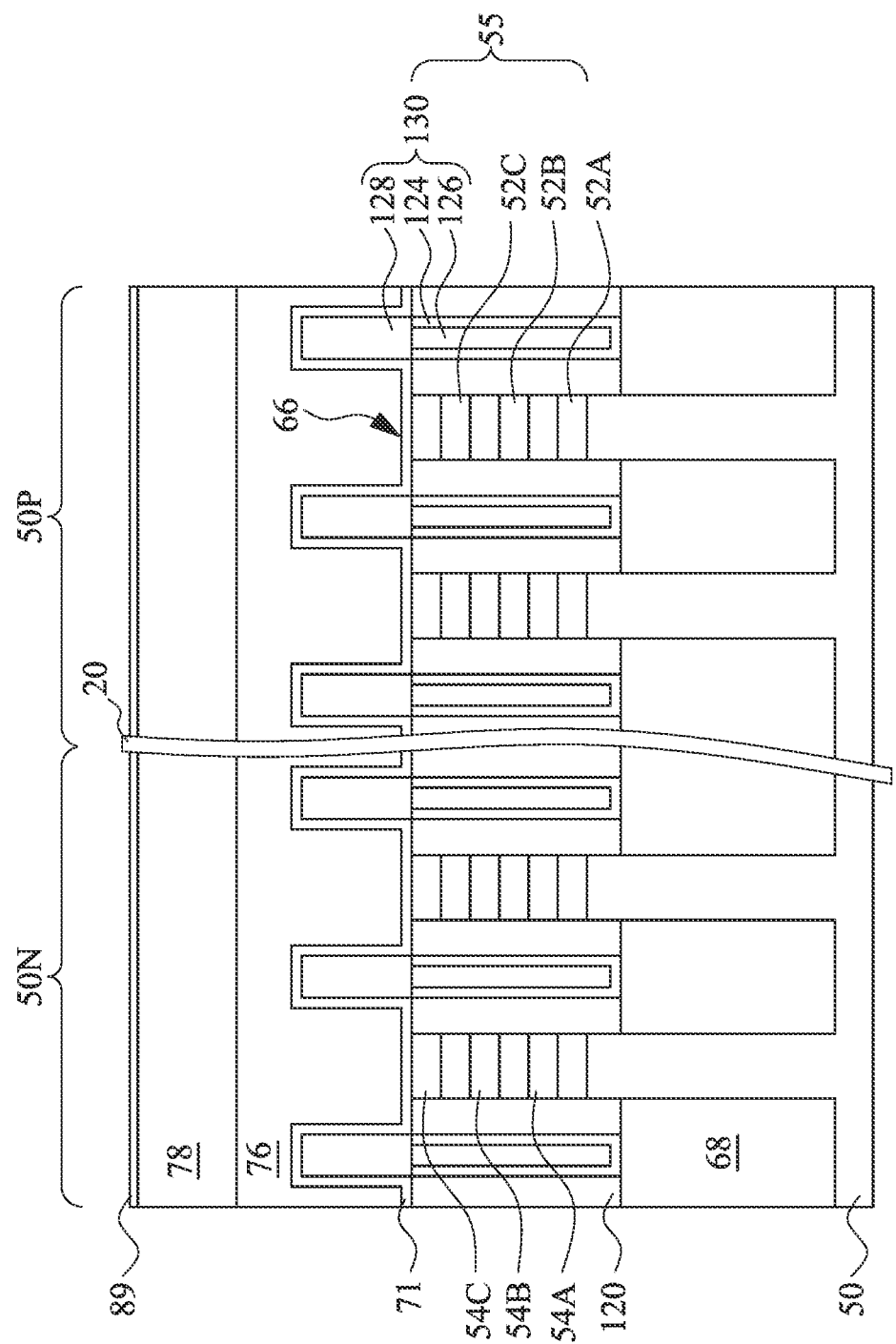
Figure 20B:
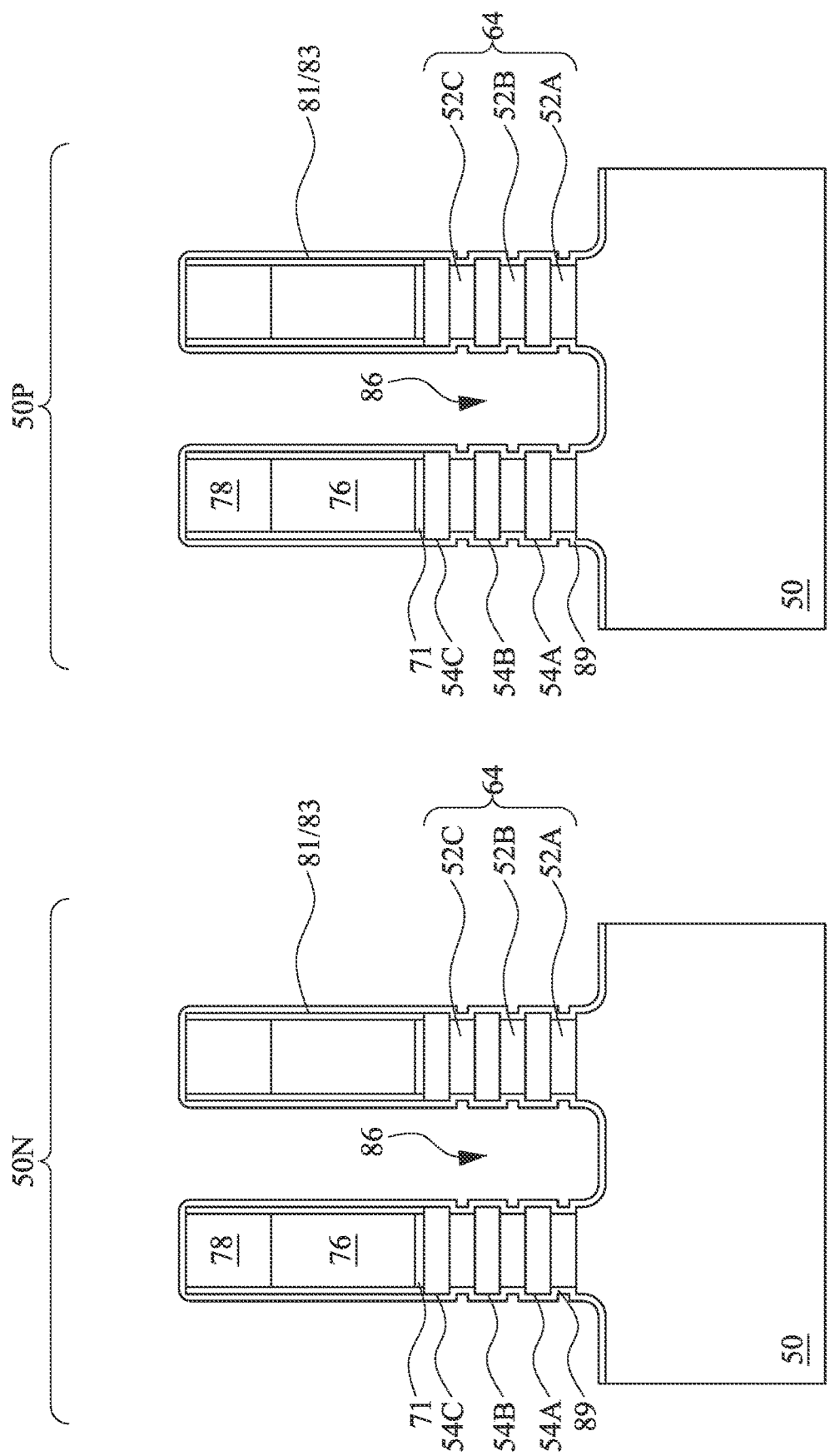
Figure 20D:
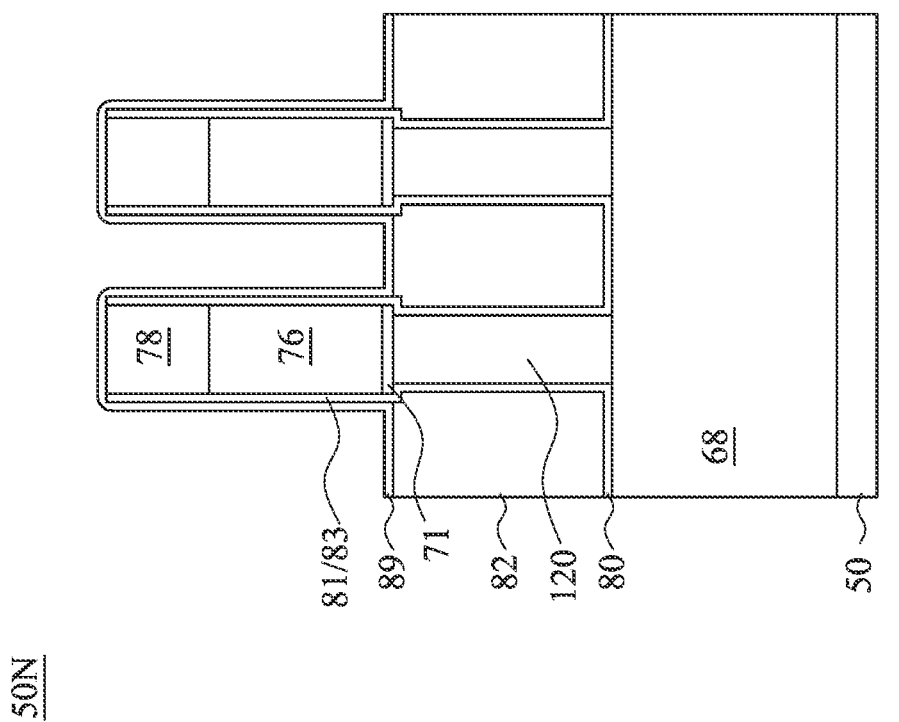

In FIGS. 18A through 18E, second recesses 86 are formed in the fins 66, the nanostructures 55, and the substrate 50, in accordance with some embodiments. Epitaxial source/drain regions will be subsequently formed in the second recesses 86. The second recesses 86 may extend through the first nanostructures 52 and the second nanostructures 54, and into the substrate 50. As illustrated in FIG. 18C, top surfaces of the STI regions 68 may be level with bottom surfaces of the second recesses 86. In various embodiments, the fins 66 may be etched such that bottom surfaces of the second recesses 86 are disposed below the top surfaces of the STI regions 68; or the like. The second recesses 86 may be formed by etching the fins 66, the nanostructures 55, and the substrate 50 using anisotropic etching processes, such as RIE, NBE, or the like. The first spacers 81, the second spacers 83, and the masks 78 may be used to mask portions of the fins 66, the nanostructures 55, and the substrate 50 during the etching processes used to form the second recesses 86. A single etch process or multiple etch processes may be used to etch each layer of the nanostructures 55 and/or the fins 66. Timed etch processes may be used to stop the etching of the second recesses 86 after the second recesses 86 reach a desired depth.

In FIGS. 19A through 19E, portions of sidewalls of the layers of the multi-layer stack 64 formed of the first semiconductor materials (e.g., the first nanostructures 52) exposed by the second recesses 86 are etched to form sidewall recesses 88 in the n-type region 50N, and portions of sidewalls of the layers of the multi-layer stack formed of the second semiconductor materials (e.g., the second nanostructures 54) exposed by the second recesses 86 are etched to form sidewall recesses 88 in the p-type region 50P. Although sidewalls of the first nanostructures 52 and the second nanostructures 54 in recesses 88 are illustrated as being straight in FIG. 19B, the sidewalls may be concave or convex. The sidewalls may be etched using isotropic etching processes, such as wet etching or the like. The p-type region 50P may be protected using a mask (not shown) while etchants selective to the first semiconductor materials are used to etch the first nanostructures 52 such that the second nanostructures 54 and the substrate 50 remain relatively unetched as compared to the first nanostructures 52 in the n-type region 50N. Similarly, the n-type region 50N may be protected using a mask (not shown) while etchants selective to the second semiconductor materials are used to etch the second nanostructures 54 such that the first nanostructures 52 and the substrate 50 remain relatively unetched as compared to the second nanostructures 54 in the p-type region 50P. In an embodiment in which the first nanostructures 52 include, e.g., SiGe, and the second nanostructures 54 include, e.g., Si or SiC, a dry etch process with tetramethylammonium hydroxide (TMAH), ammonium hydroxide (NH$_4$OH), or the like may be used to etch sidewalls of the first nanostructures 52 in the n-type region 50N, and a dry etch process with hydrogen fluoride, another fluorine-based etchant, or the like may be used to etch sidewalls of the second nanostructures 54 in the p-type region 50P.

In FIGS. 20A-20E, an inner spacer layer 89 is formed over the structures illustrated in FIGS. 19A-19E, which will be subsequently used to form first inner spacers 90 (see FIGS. 21A-21E) that may act as isolation features between subsequently formed source/drain regions and a gate structure. The inner spacer layer 89 may be deposited over multiple nanostructures or nanosheets, such as e.g. pairs of multi-layer stacks 64 of first nanostructures 52 and second nanostructures 54. As will be discussed in greater detail below, source/drain regions will be formed in the recesses 86, while the first nanostructures 52 in the n-type region 50N and the second nanostructures 54 in the p-type region 50P will be replaced with corresponding gate structures.

The inner spacer layer 89 may be deposited by a conformal deposition process, such as CVD, ALD, or the like. The inner spacer layer 89 may comprise a material such as silicon nitride, silicon oxynitride, silicon carbon nitride (SiCN), or silicon oxycarbonitride (SiOCN), although any suitable material, such as low-dielectric constant (low-k) materials having a k-value less than about 3.5, may be utilized.

Next in FIGS. 21A through 21E, the inner spacer layer 89 is etched to form the first inner spacers 90. In some embodiments, the etching is performed with a wet etch process such as with HF, $H_2O_2$+$H_2O$+HCl, $H_2O_2$+$H_2O$+HF, $H_2O_2$+$H_2O$+$NH_3$, a high temperature sulfuric peroxide mix ($H_2SO_4$+$H_2O_2$), $H_2SO_4$+$H_2O_2$+$H_2O$, the like, or a combination thereof. In some embodiments, the etching is performed with a dry etch process such as with $CF_4$, $O_2$, Ar, $NF_3$, $CH_3F$, $CHF_3$, the like, or a combination thereof. The dry etch process may be followed by a wet clean. However, any suitable etch process or etchants may be used. In other embodiments, the inner spacer layer may be etched by an anisotropic etching process, such as RIE, NBE, or the like. Although outer sidewalls of the first inner spacers 90 are illustrated as being flush with sidewalls of the second semiconductor layers 54, the outer sidewalls of the first inner spacers 90 may extend beyond or be recessed from sidewalls of the second nanostructures 54, and the outer sidewalls may be flat, concave, convex, or otherwise non-linear.

Figure 29A:
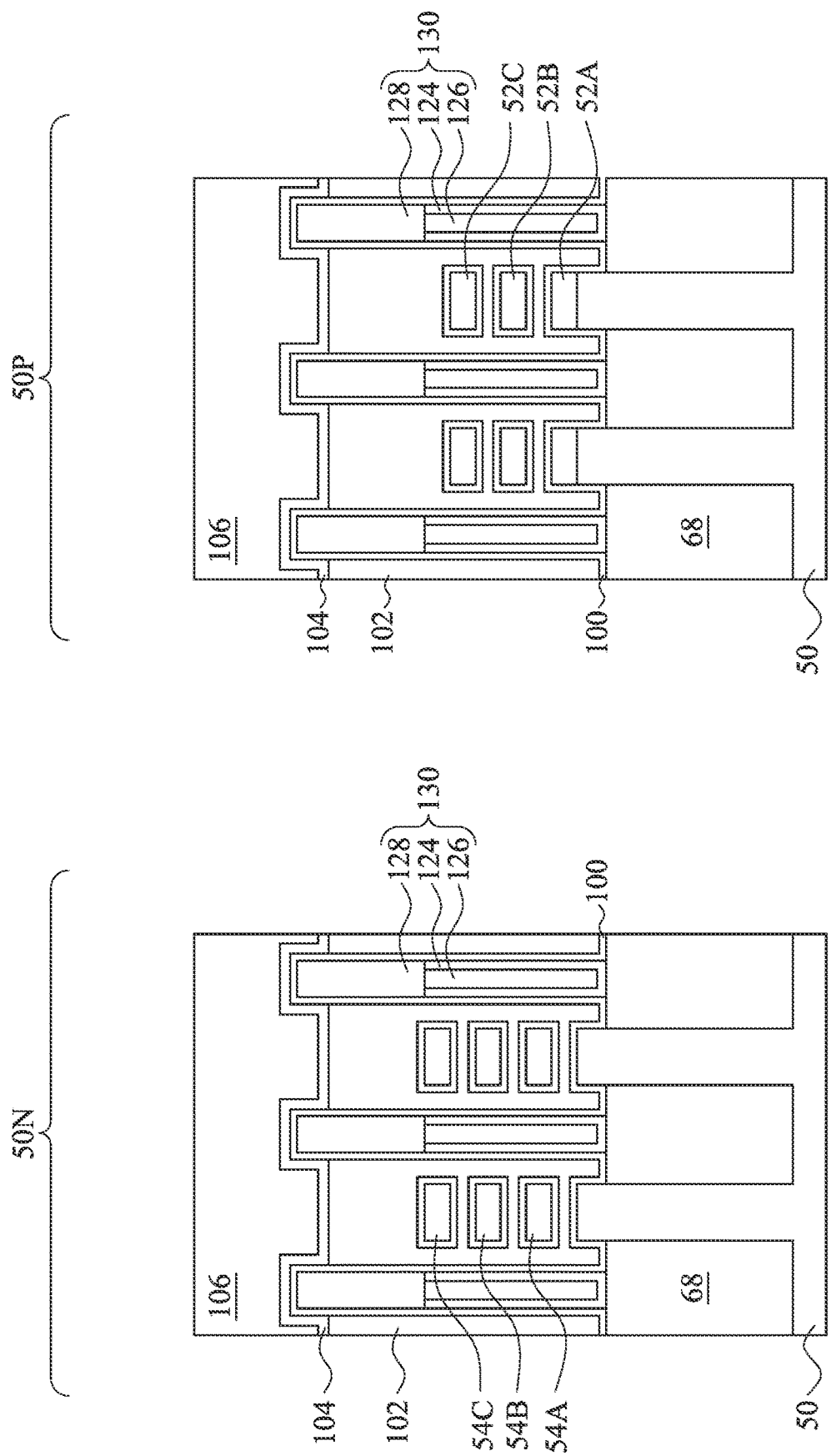
Figure 29D:
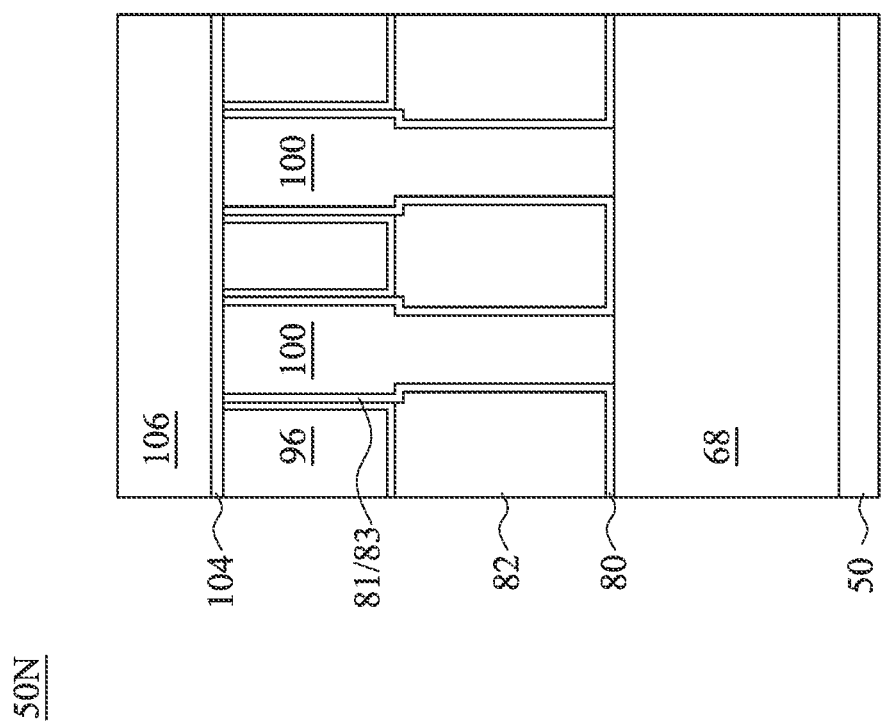

After being etched, the inner spacers 90 may have a first thickness $T_1$ measured along the cross section B-B' in a range of about 3.5 nm to about 5.5 nm, which may be advantageous for insulating subsequently formed source/drain regions (see below, FIGS. 24B-F) from subsequently formed gate electrodes (see below, FIGS. 29A-C). A first thickness $T_1$ less than about 3.5 nm may be disadvantageous because it may lead to the formation of electrical shorts between the subsequently formed source/drain regions and the subsequently formed gate electrodes. A first thickness $T_1$ greater than about 5.5 nm may be disadvantageous because it may reduce critical dimensions of the subsequently formed source/drain regions or the subsequently formed gate electrodes and reduce device performance. Sidewalls of the inner spacers 90 with a first thickness of $T_1$ may be covered by the first spacer layer 80 and second spacer layer 82, which may be useful for reducing electric shorts between the subsequently formed source/drain regions (see below, FIGS. 23B-G) and the subsequently formed gate electrodes.

Figure 21A:
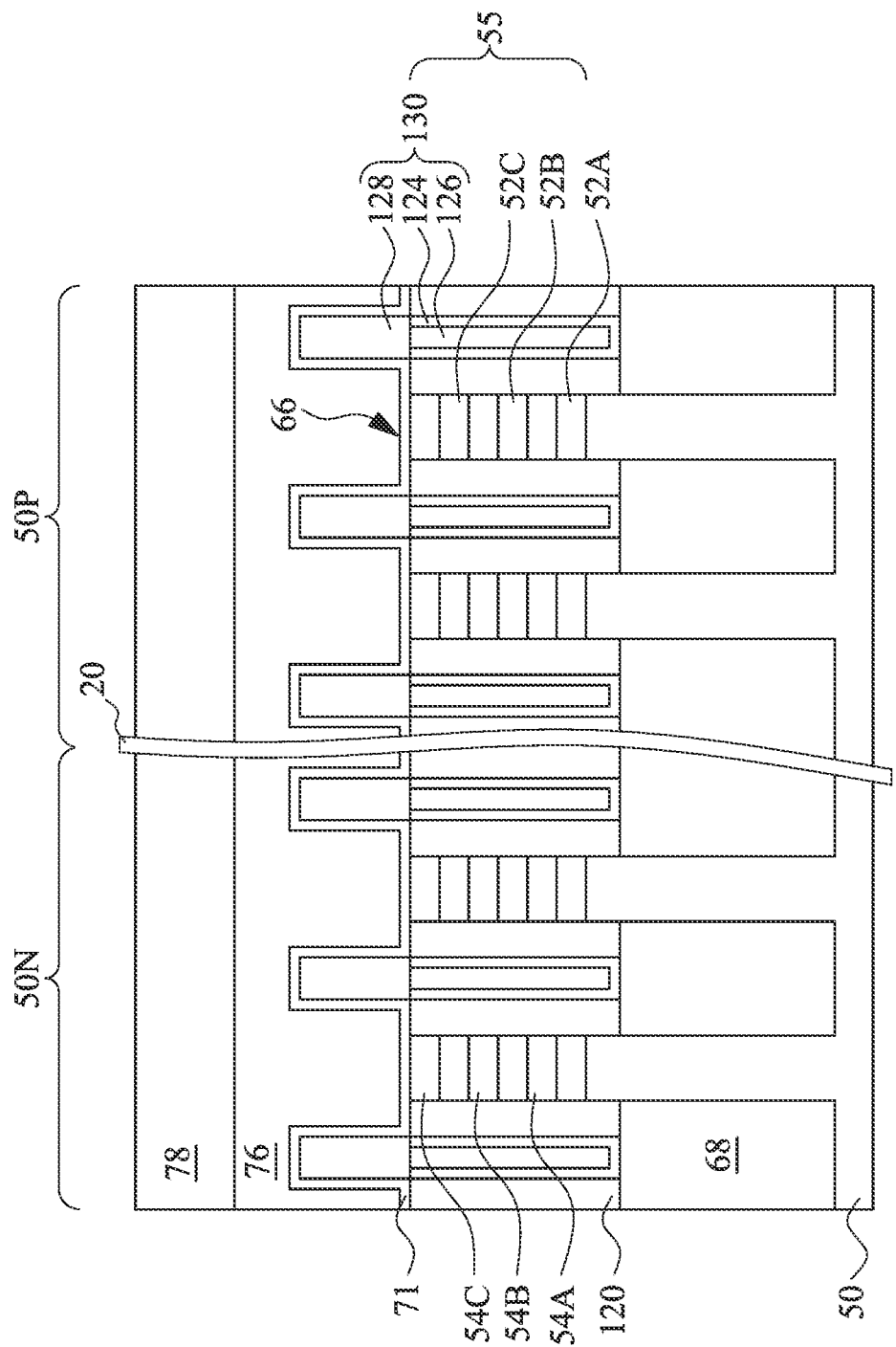
Figure 21B:
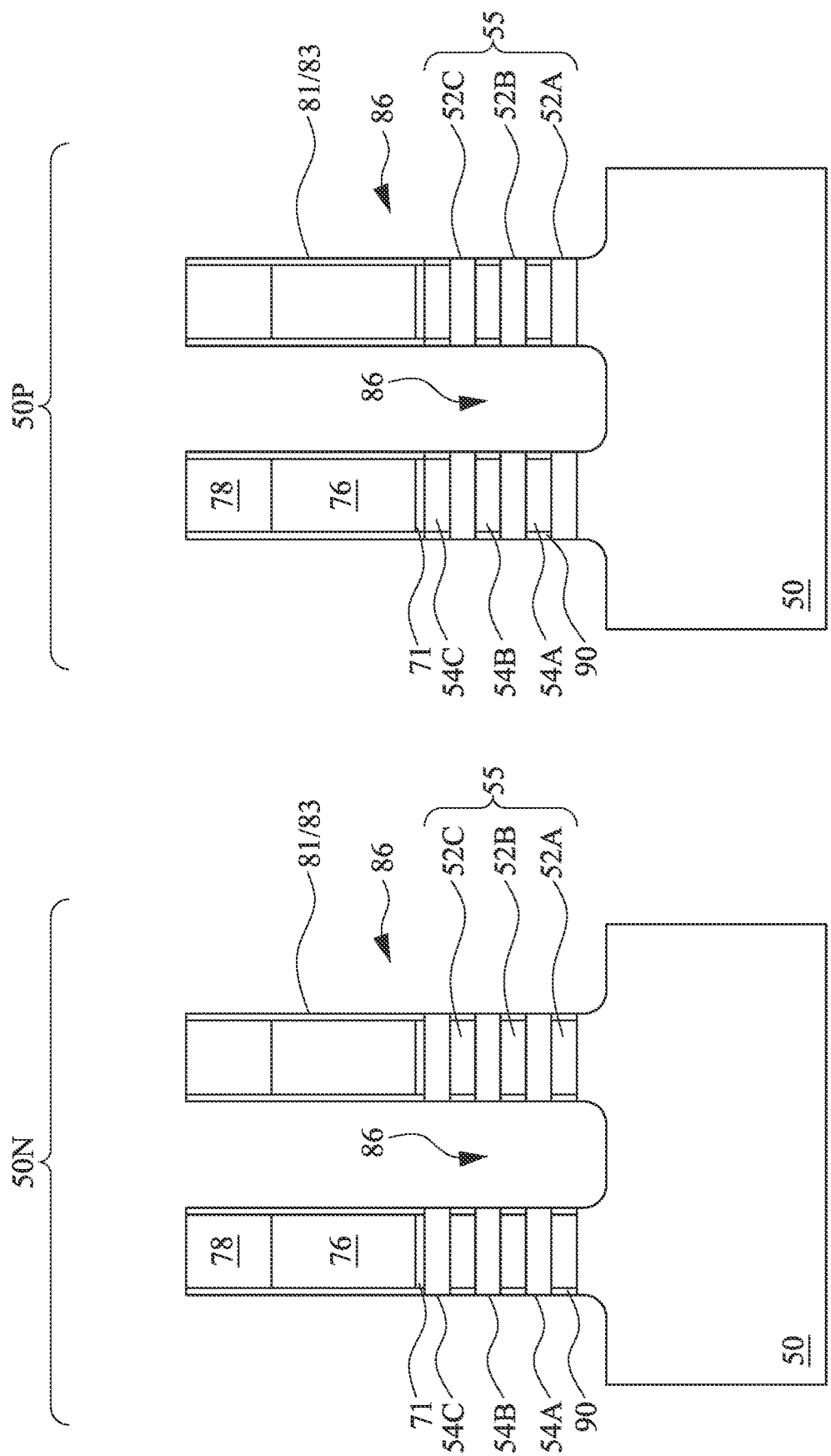
Figure 21C:
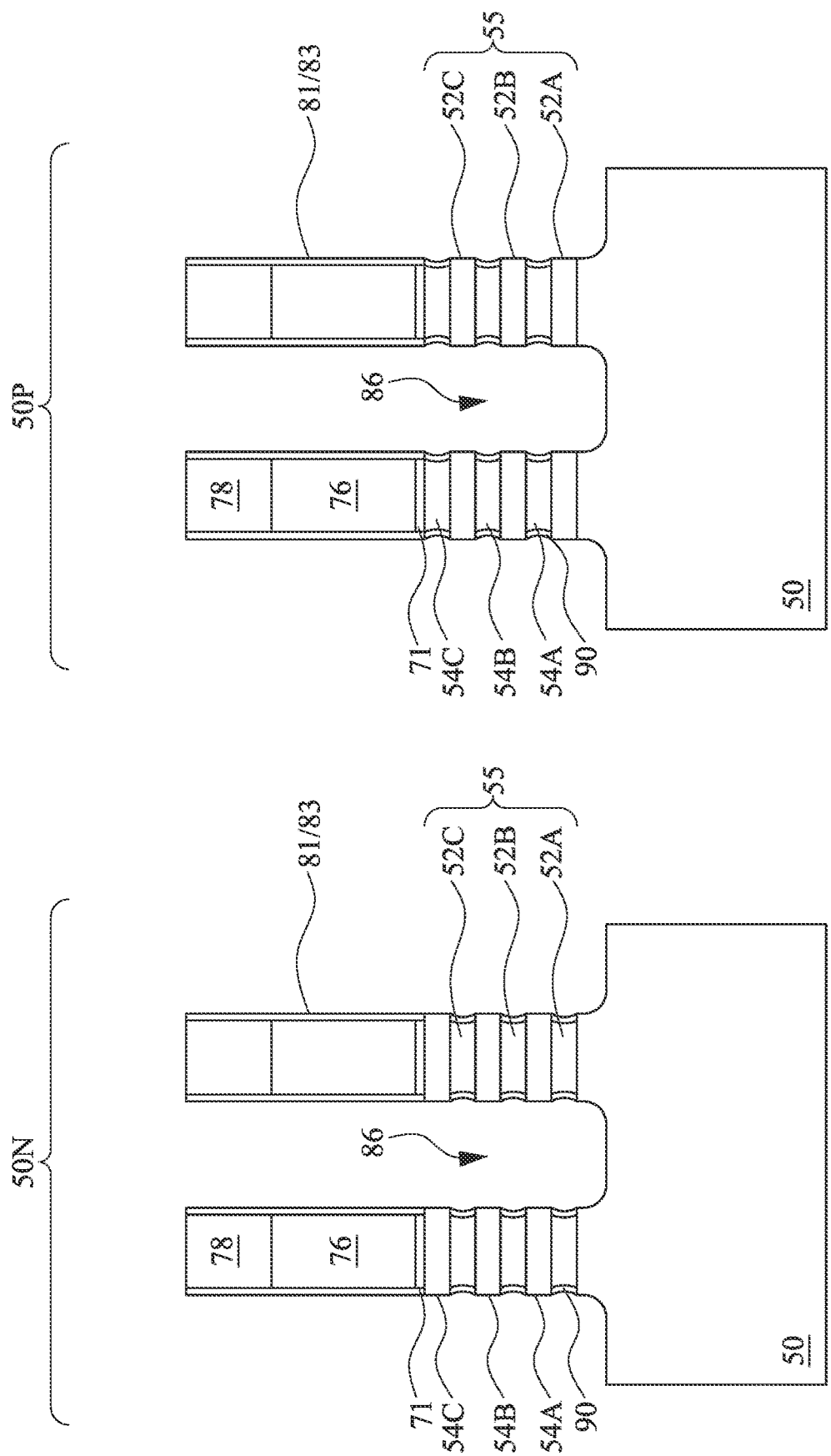
Figure 22A:
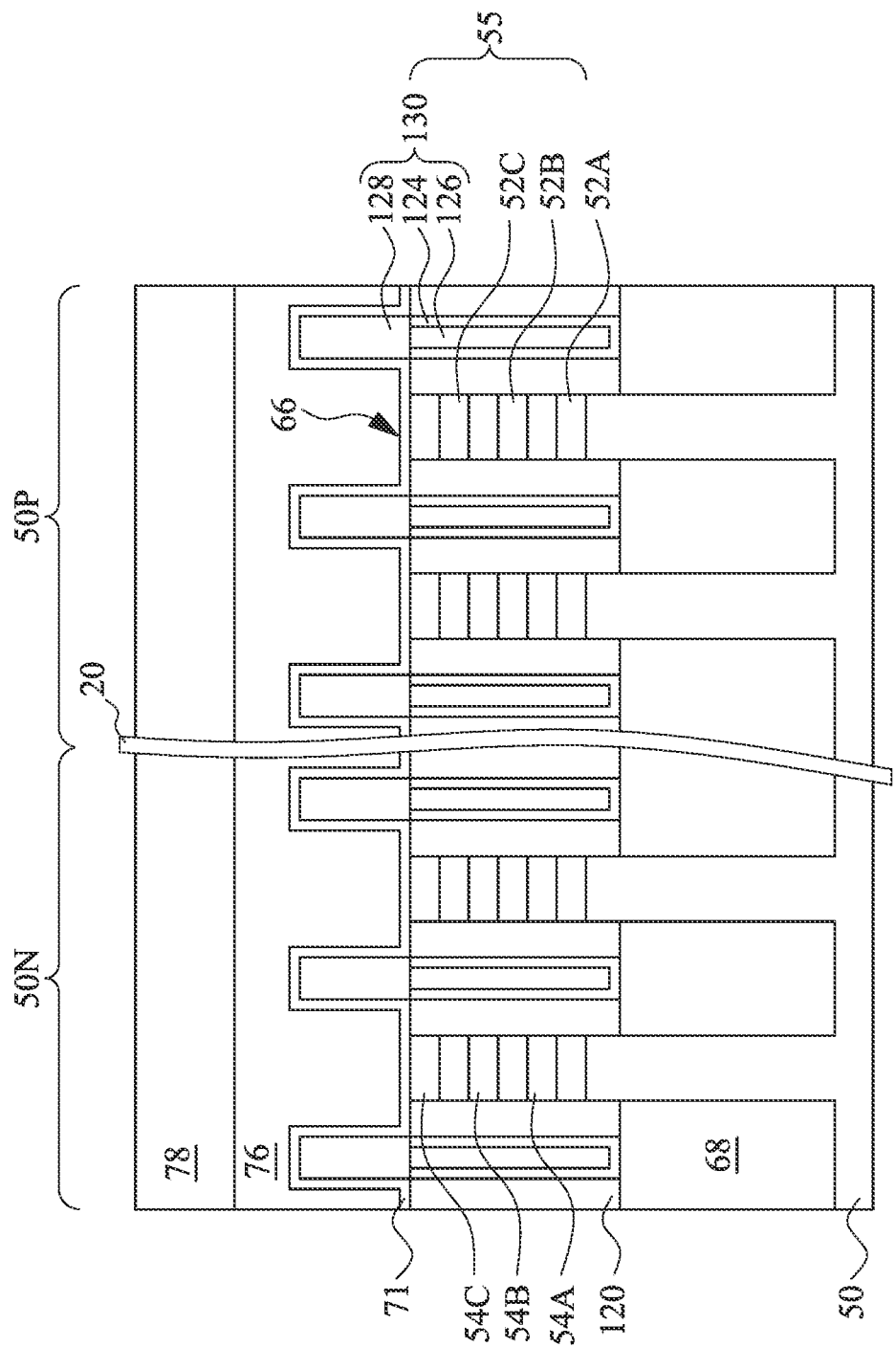
Figure 22B:
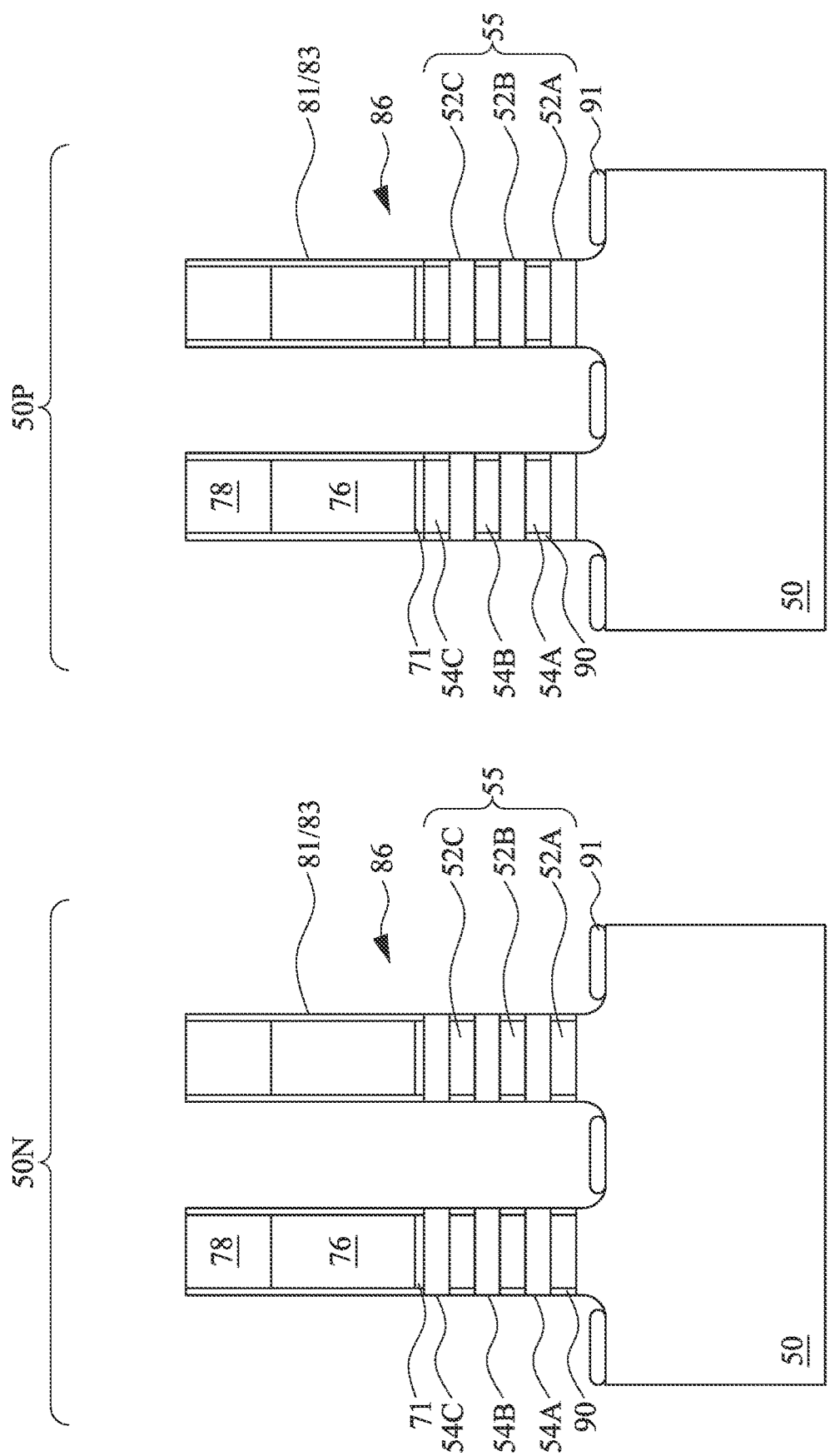
Figure 22D:
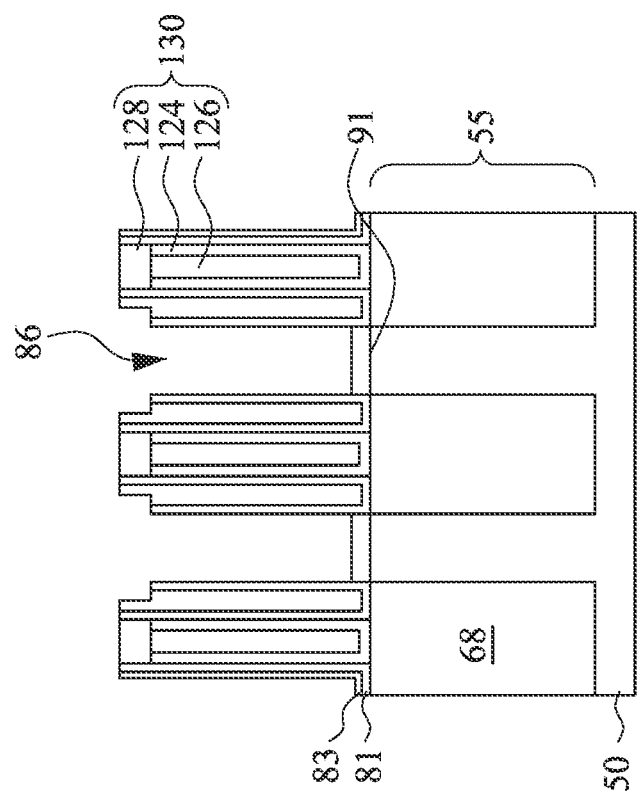
Figure 22E:
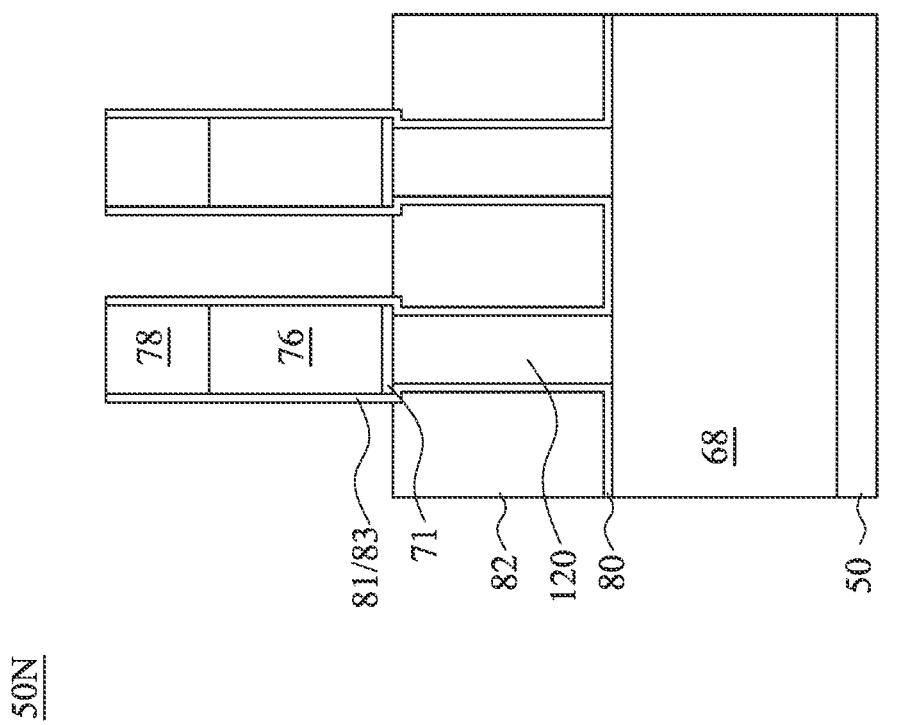

Moreover, although the outer sidewalls of the first inner spacers 90 are illustrated as being straight in FIG. 21B, the outer sidewalls of the first inner spacers 90 may be concave or convex. As an example, FIG. 21C illustrates an embodiment in which sidewalls of the first nanostructures 52 are concave, outer sidewalls of the first inner spacers 90 are concave, and the first inner spacers are recessed from sidewalls of the second nanostructures 54 in the n-type region 50N. Also illustrated are embodiments in which sidewalls of the second nanostructures 54 are concave, outer sidewalls of the first inner spacers 90 are concave, and the first inner spacers are recessed from sidewalls of the first nanostructures 52 in the p-type region 50P. The first inner spacers 90 may be used to prevent damage to subsequently formed source/drain regions (such as the epitaxial source/drain regions 92, discussed below with respect to FIGS. 23A-23F) by subsequent etching processes, such as etching processes used to form gate structures.

In FIGS. 24A-24E, epitaxial regions 91 may be formed on bottom surfaces of the second recesses 86. In some embodiments, the etching of the inner spacer layers 89 to form the inner spacers 90 (see above, FIGS. 21A-F) may result in over-etching of the second recesses 86 below a desired depth. The epitaxial regions 91 may be used to fill the over-etched bottom areas of the second recesses 86 prior to forming epitaxial source/drain regions 92 (see below, FIGS. 23A-F). In some embodiments, the epitaxial regions 91 comprise silicon and may be formed by epitaxially growing silicon in the second recesses 86. at a temperature in a range of about 630° C. to about 700° C. This may lead to faster growth in the 100 crystal plane along the bottom surfaces of the second recesses 86 than in the 110 crystal plane along the sidewalls of the second recesses 86, forming a thicker layer of silicon on the bottom surfaces of the second recesses 86 than along the sidewalls of the second recesses 86. The silicon formed on the sidewalls of the second recesses 86 may be removed by a suitable etching process, leaving the remaining undoped silicon on the bottom surfaces of the second recesses 86 as the epitaxial regions 91.

Figure 23A:
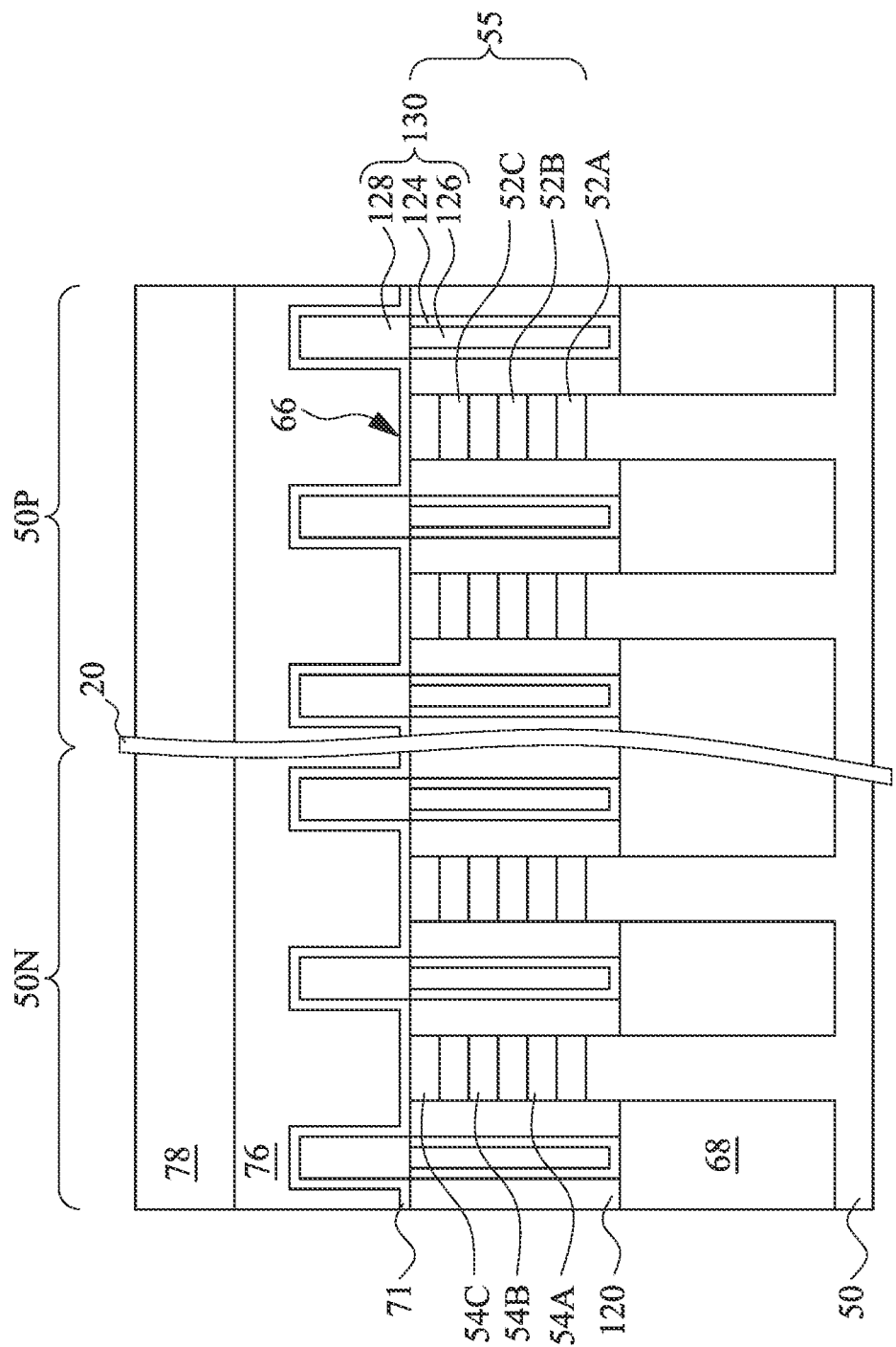
Figure 23B:
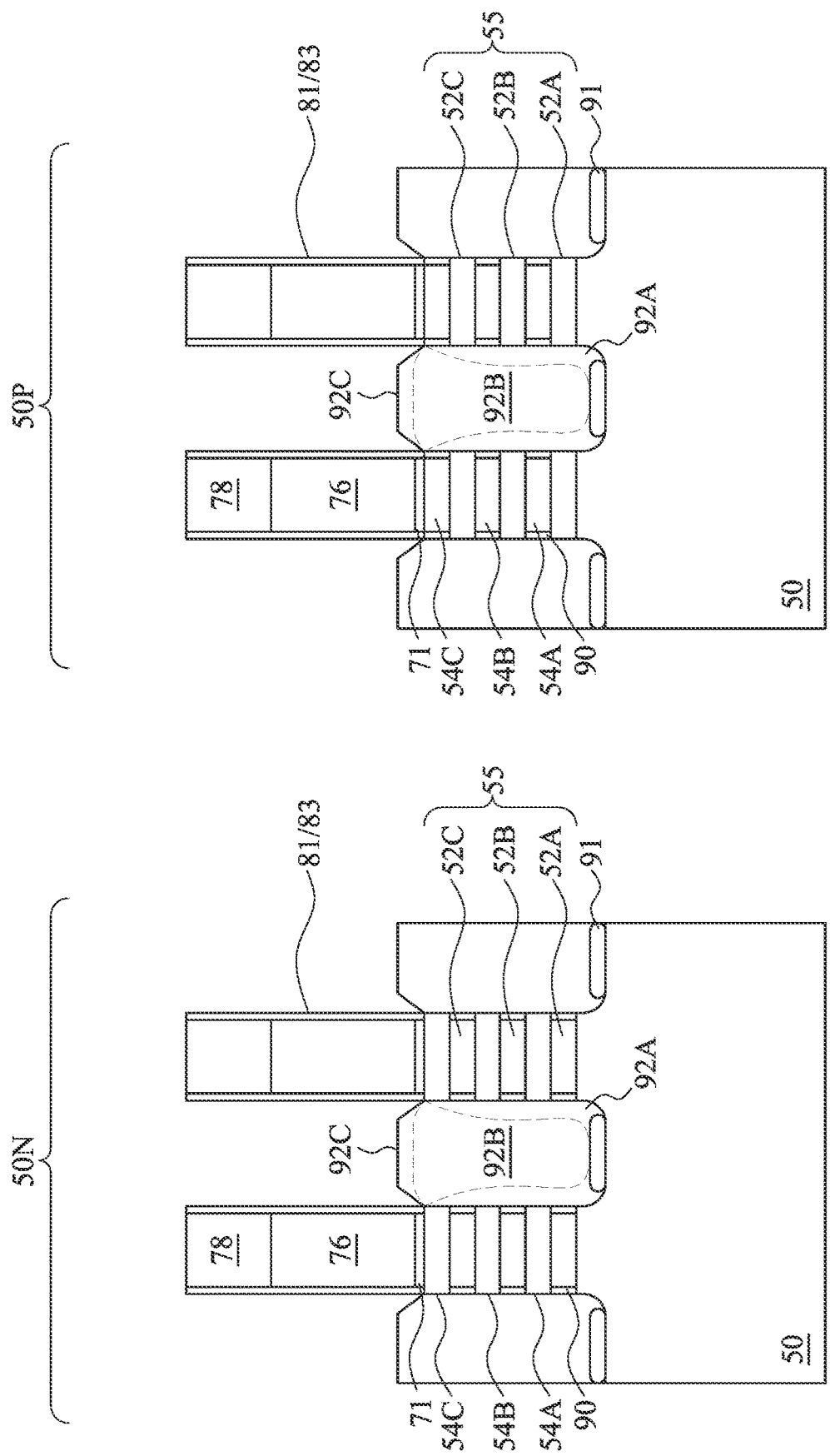

In FIGS. 23A-23F, epitaxial source/drain regions 92 are formed in the second recesses 86, such as on the epitaxial regions 91. In some embodiments, the source/drain regions 92 may exert stress on the second nanostructures 54 in the n-type region 50N and on the first nanostructures 52 in the p-type region 50P, thereby improving performance. As illustrated in FIG. 23B, the epitaxial source/drain regions 92 are formed in the second recesses 86 such that each dummy gate 76 is disposed between respective neighboring pairs of the epitaxial source/drain regions 92. In some embodiments, the first spacers 81 and the second spacers 83 are used to separate the epitaxial source/drain regions 92 from the dummy gates 76 and the first inner spacers 90 are used to separate the epitaxial source/drain regions 92 from the nanostructures 55 by an appropriate lateral distance so that the epitaxial source/drain regions 92 do not short out with subsequently formed gates of the resulting nano-FETs.

The epitaxial source/drain regions 92 in the n-type region 50N, e.g., the NMOS region, may be formed by masking the p-type region 50P, e.g., the PMOS region. Then, the epitaxial source/drain regions 92 are epitaxially grown in the second recesses 86 in the n-type region 50N. The epitaxial source/drain regions 92 may include any acceptable material appropriate for n-type nano-FETs. For example, if the second nanostructures 54 are silicon, the epitaxial source/drain regions 92 may include materials exerting a tensile strain on the second nanostructures 54, such as silicon, silicon carbide, phosphorous doped silicon carbide, silicon phosphide, or the like. The epitaxial source/drain regions 92 may have surfaces raised from respective upper surfaces of the nanostructures 55 and may have facets.

The epitaxial source/drain regions 92 in the p-type region 50P, e.g., the PMOS region, may be formed by masking the n-type region 50N, e.g., the NMOS region. Then, the epitaxial source/drain regions 92 are epitaxially grown in the second recesses 86 in the p-type region 50P. The epitaxial source/drain regions 92 may include any acceptable material appropriate for p-type nano-FETs. For example, if the first nanostructures 52 are silicon germanium, the epitaxial source/drain regions 92 may comprise materials exerting a compressive strain on the first nanostructures 52, such as silicon-germanium, boron doped silicon-germanium, germanium, germanium tin, or the like. The epitaxial source/drain regions 92 may also have surfaces raised from respective surfaces of the multi-layer stack formed of the nanostructures 55 and may have facets.

The epitaxial source/drain regions 92, the first nanostructures 52, the second nanostructures 54, and/or the substrate 50 may be implanted with dopants to form source/drain regions, similar to the process previously discussed for forming lightly-doped source/drain regions, followed by an anneal. The source/drain regions may have an impurity concentration of between about $1\times10^{19}$ atoms/cm$^3$ and about $1\times10^{21}$ atoms/cm$^3$. The n-type and/or p-type impurities for source/drain regions may be any of the impurities previously discussed. In some embodiments, the epitaxial source/drain regions 92 may be in situ doped during growth.

Figure 23C:
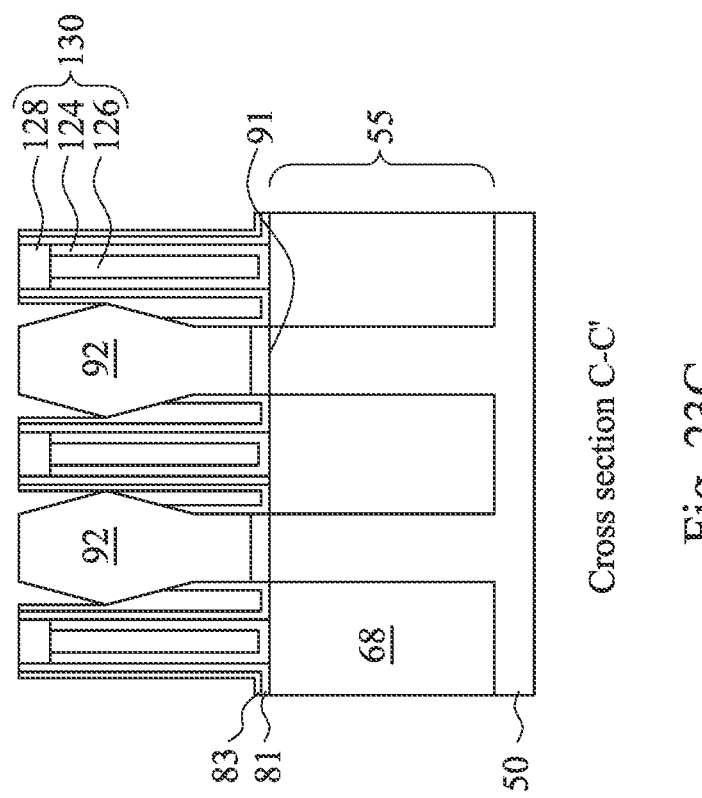
Figure 23D:
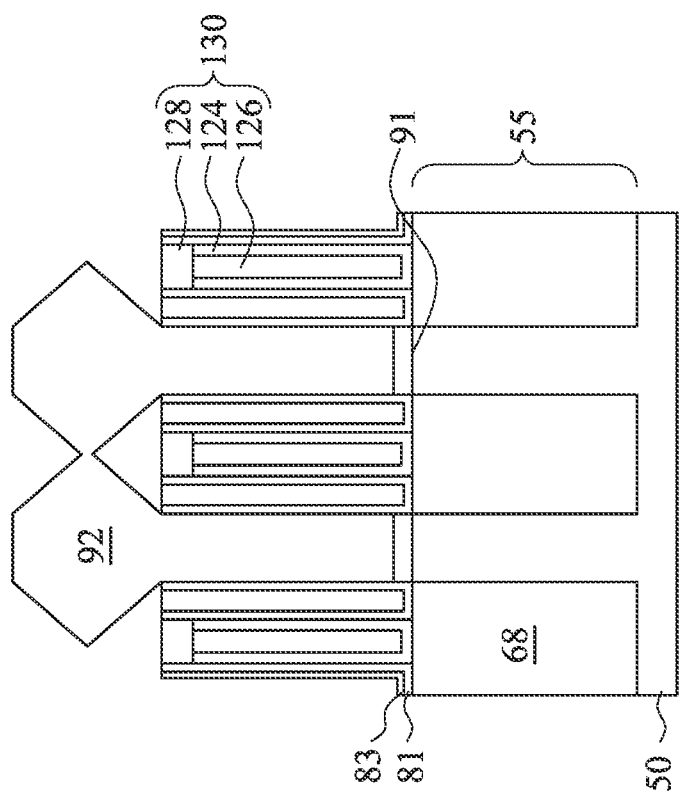

As a result of the epitaxy processes used to form the epitaxial source/drain regions 92 in the n-type region 50N and the p-type region 50P, upper surfaces of the epitaxial source/drain regions 92 have facets which expand laterally outward beyond sidewalls of the nanostructures 55. In some embodiments, adjacent epitaxial source/drain regions 92 remain separated, such as by the insulating fins 130, after the epitaxy process is completed as illustrated by FIG. 23C. In other embodiments, the epitaxy process may continue and these facets may cause adjacent epitaxial source/drain regions 92 to merge as illustrated by FIG. 23D.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

Figure 23E:
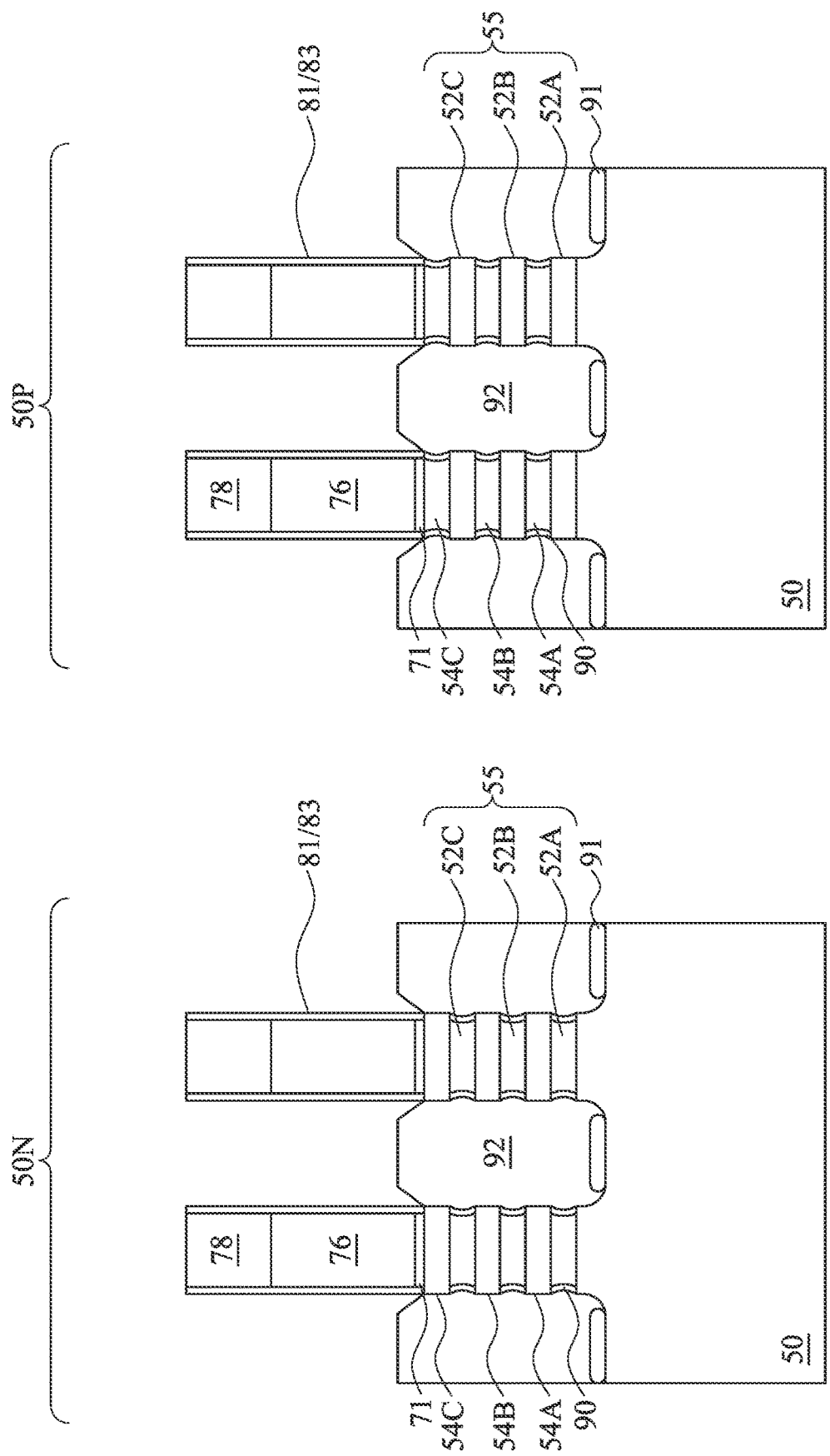
Figure 24A:
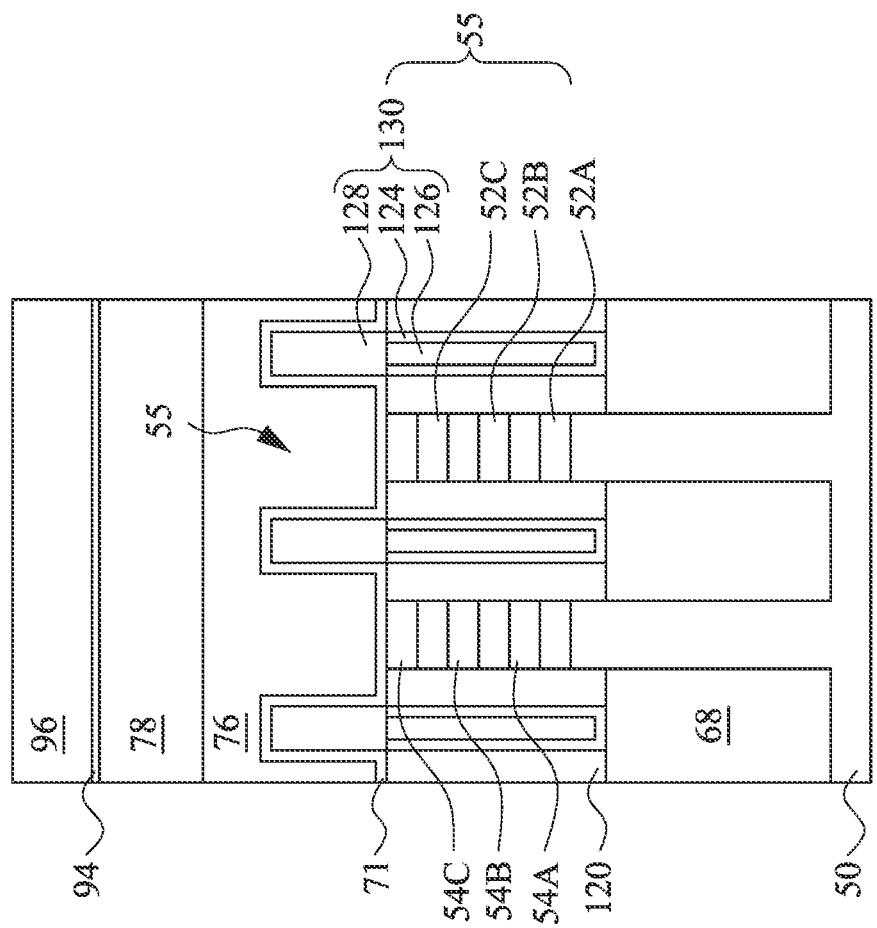
Figure 24B:
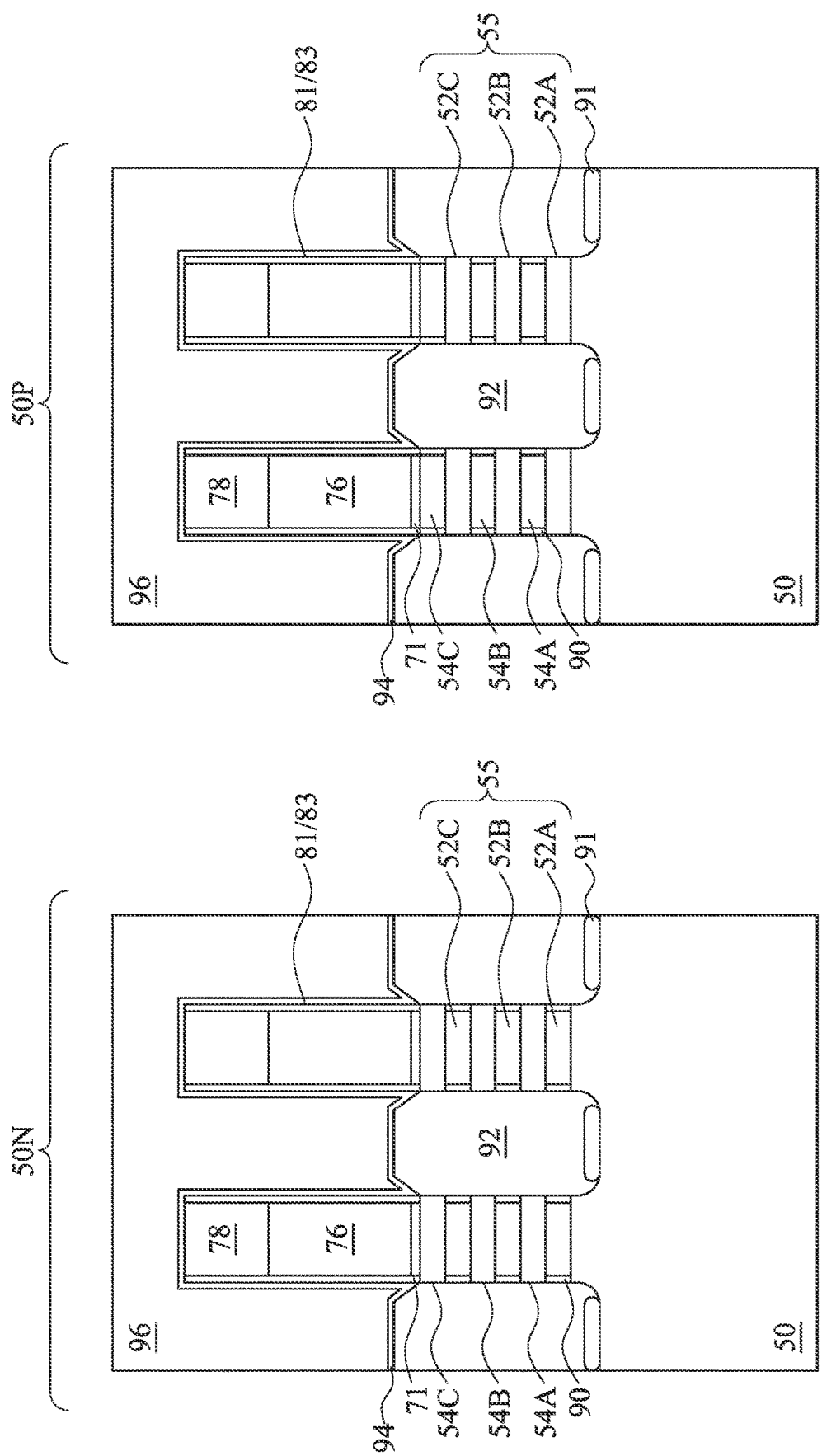
Figure 24C:
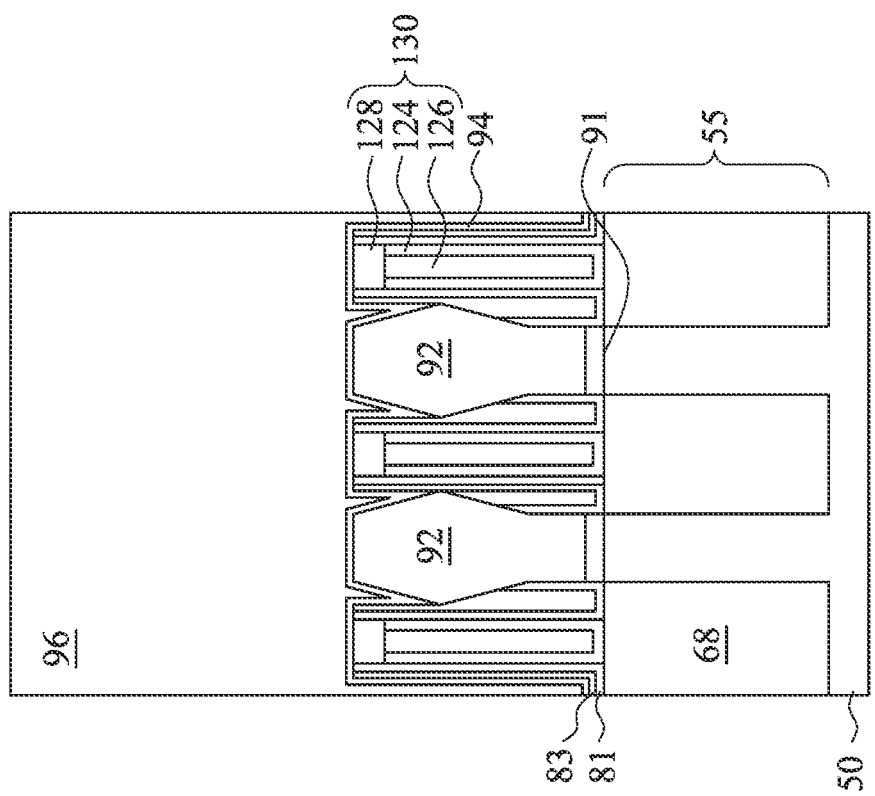
Figure 24D:
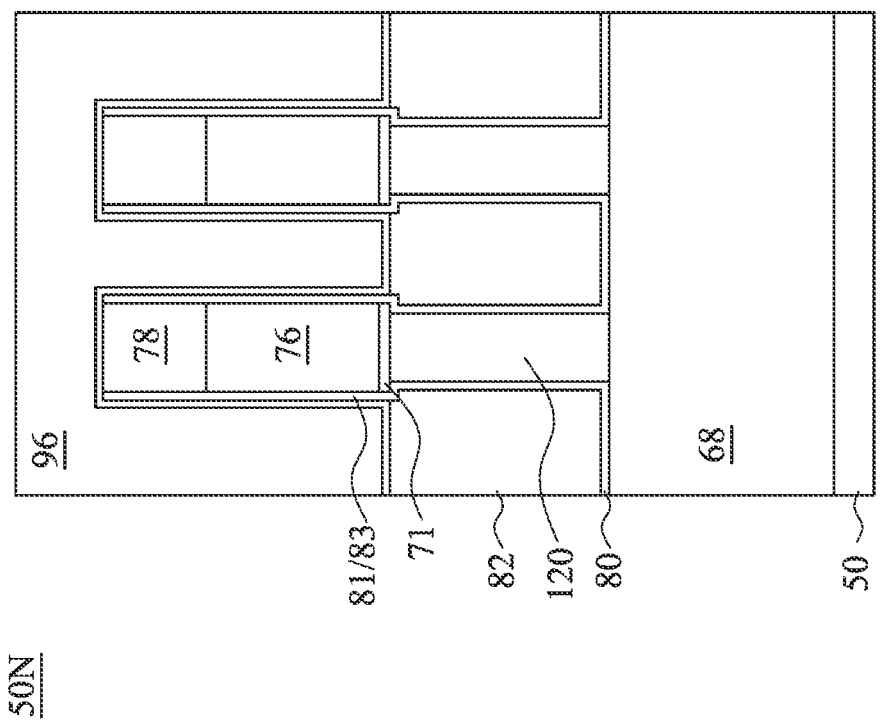

FIG. 23E illustrates an embodiment in which sidewalls of the first nanostructures 52 in the n-type region 50N and sidewalls of the second nanostructures 54 in the p-type region 50P are concave, outer sidewalls of the first inner spacers 90 are concave, and the first inner spacers 90 are recessed from sidewalls of the second nanostructures 54 and the first nanostructures 52, respectively. As illustrated in FIG. 23E, the epitaxial source/drain regions 92 may be formed in contact with the first inner spacers 90 and may extend past sidewalls of the second nanostructures 54 in the n-type region 50N and past sidewalls of the first nanostructures 52 in the p-type region 50P.

In FIGS. 24A-24D, a first interlayer dielectric (ILD) 96 is deposited over the structure illustrated in FIGS. 23A-23C and 23F, respectively. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the masks 74, and the first spacers 81 and second spacers 83. The CESL 94 may comprise a dielectric material, such as, silicon nitride, silicon oxide, silicon oxynitride, or the like, having a different etch rate than the material of the overlying first ILD 96.

Figure 25A:
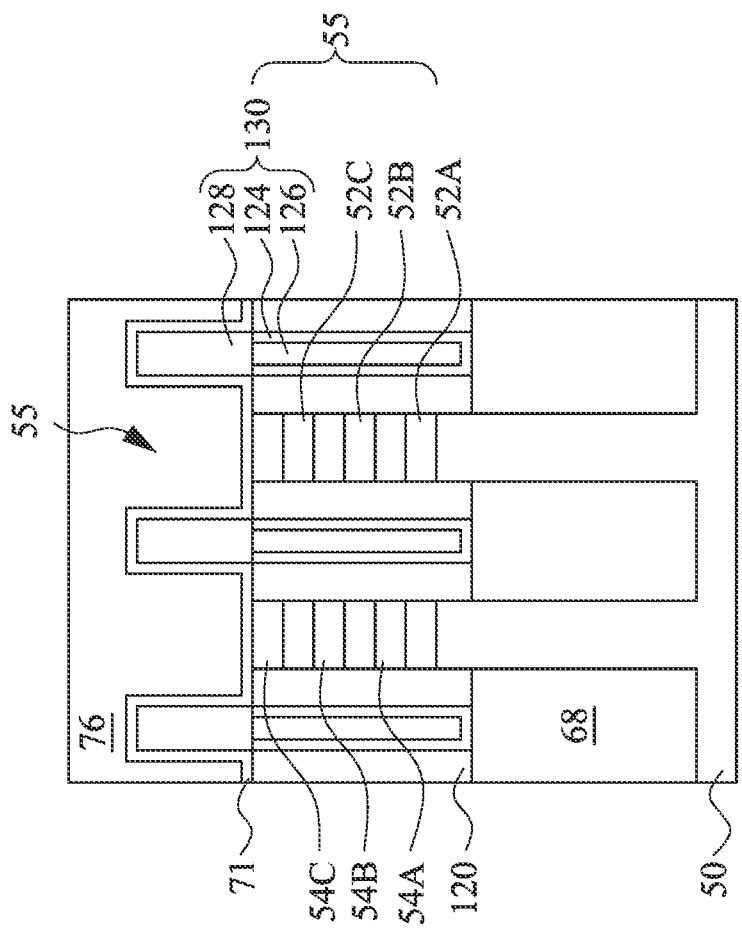
Figure 25B:
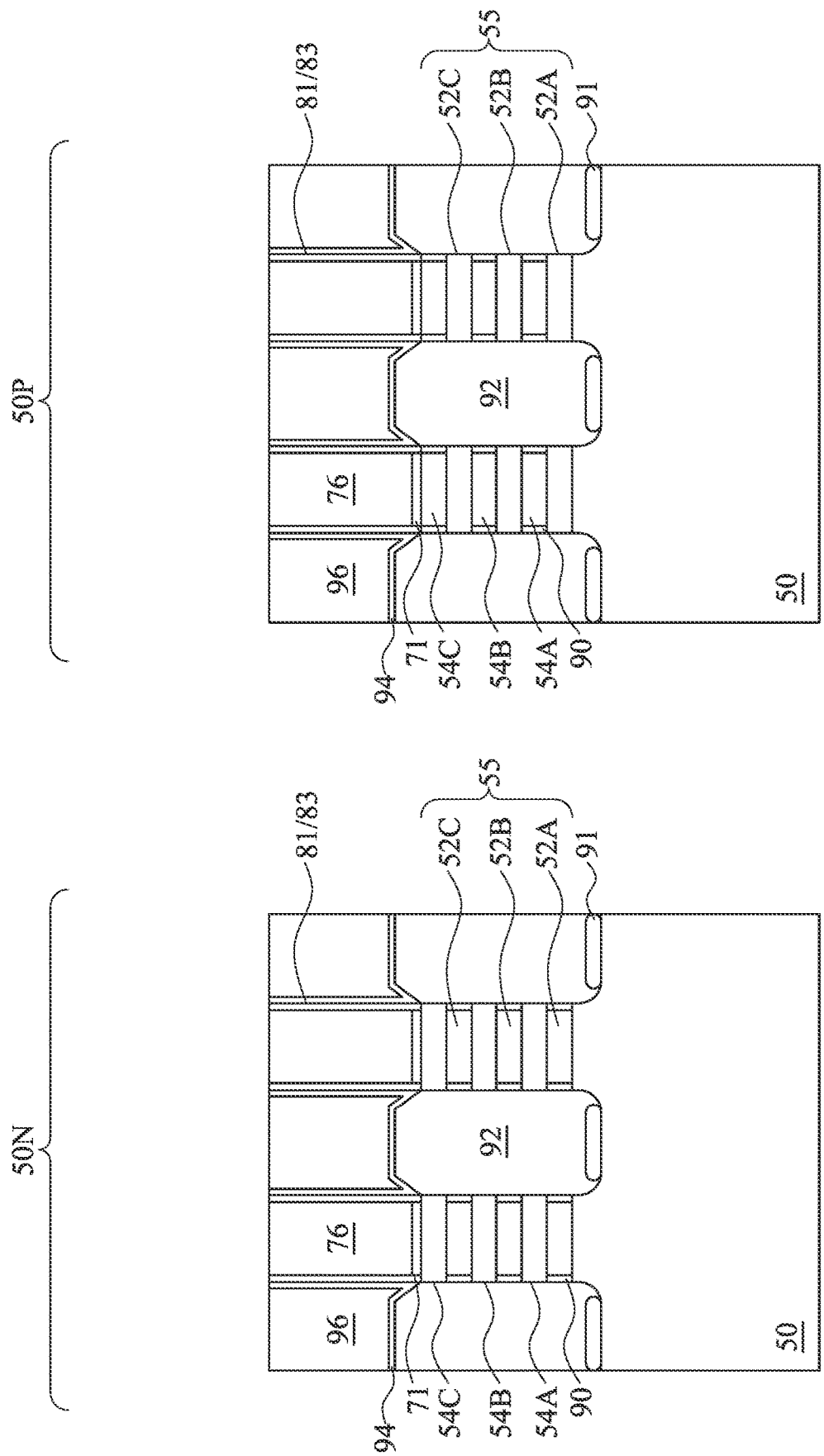

In FIGS. 25A-25C, a planarization process, such as a CMP, may be performed to level the top surface of the first ILD 96 with the top surfaces of the dummy gates 76 or the masks 78. The planarization process may also remove the masks 78 on the dummy gates 76, and portions of the first spacers 81 and second spacers 83 along sidewalls of the masks 78. After the planarization process, top surfaces of the dummy gates 76, the first spacers 81, the second spacers 83, and the first ILD 96 are level within process variations. Accordingly, the top surfaces of the dummy gates 76 are exposed through the first ILD 96. In some embodiments, the masks 78 may remain, in which case the planarization process levels the top surface of the first ILD 96 with top surface of the masks 78, the first spacers 81, and the second spacers 83.

Figure 26A:
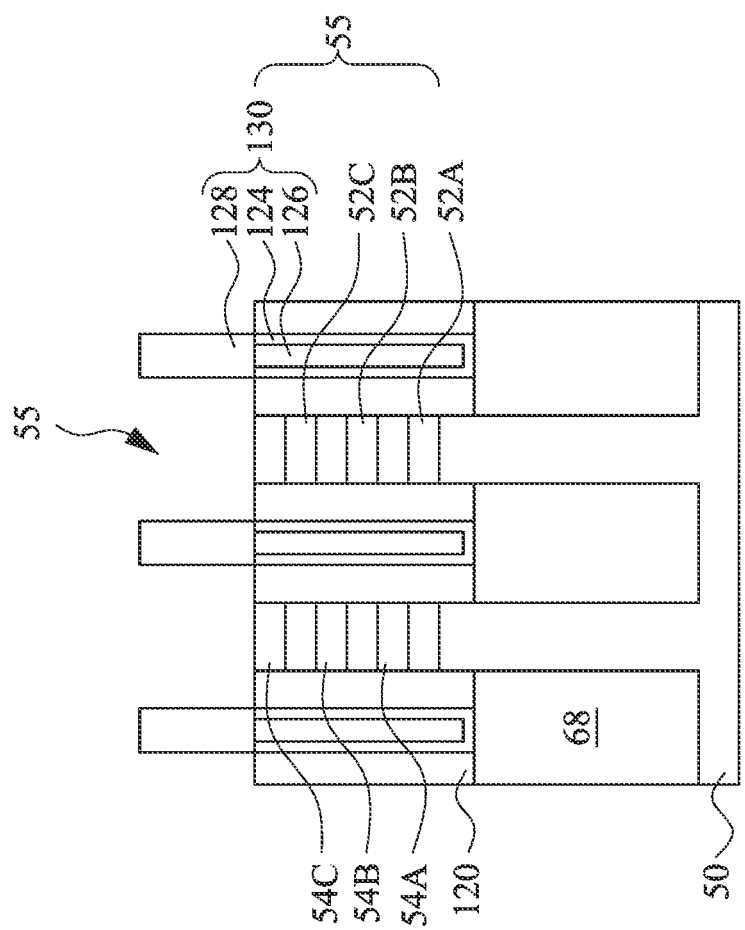

In FIGS. 26A-26C, the dummy gates 76, and the masks 74 if present, are removed in one or more etching steps, so that third recesses 98 are formed. Portions of the dummy gate dielectrics 71 in the third recesses 98 are also removed. In some embodiments, the dummy gates 76 and the dummy gate dielectrics 71 are removed by an anisotropic dry etch process. For example, the etching process may include a dry etch process using reaction gas(es) that selectively etch the dummy gates 76 at a faster rate than the first ILD 96, the insulating fins 130, the first spacers 81, or the second spacers 83. Each third recess 98 exposes and/or overlies portions of nanostructures 55, which act as channel regions in subsequently completed nano-FETs. Portions of the nanostructures 55 which act as the channel regions are disposed between neighboring pairs of the epitaxial source/drain regions 92. During the removal, the dummy gate dielectrics 71 may be used as etch stop layers when the dummy gates 76 are etched. The dummy gate dielectrics 71 may then be removed after the removal of the dummy gates 76.

Figure 27A:
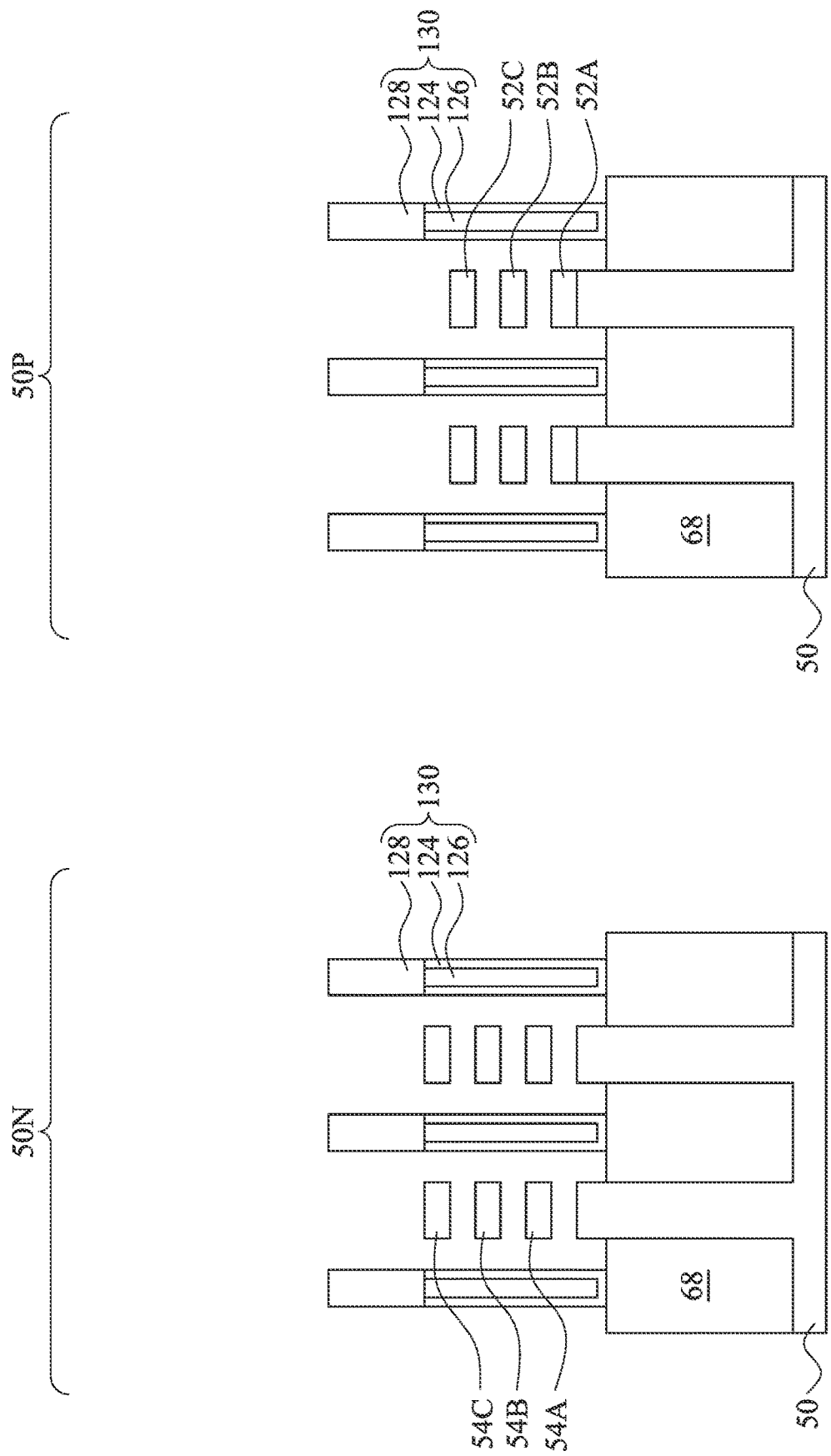
Figure 27B:
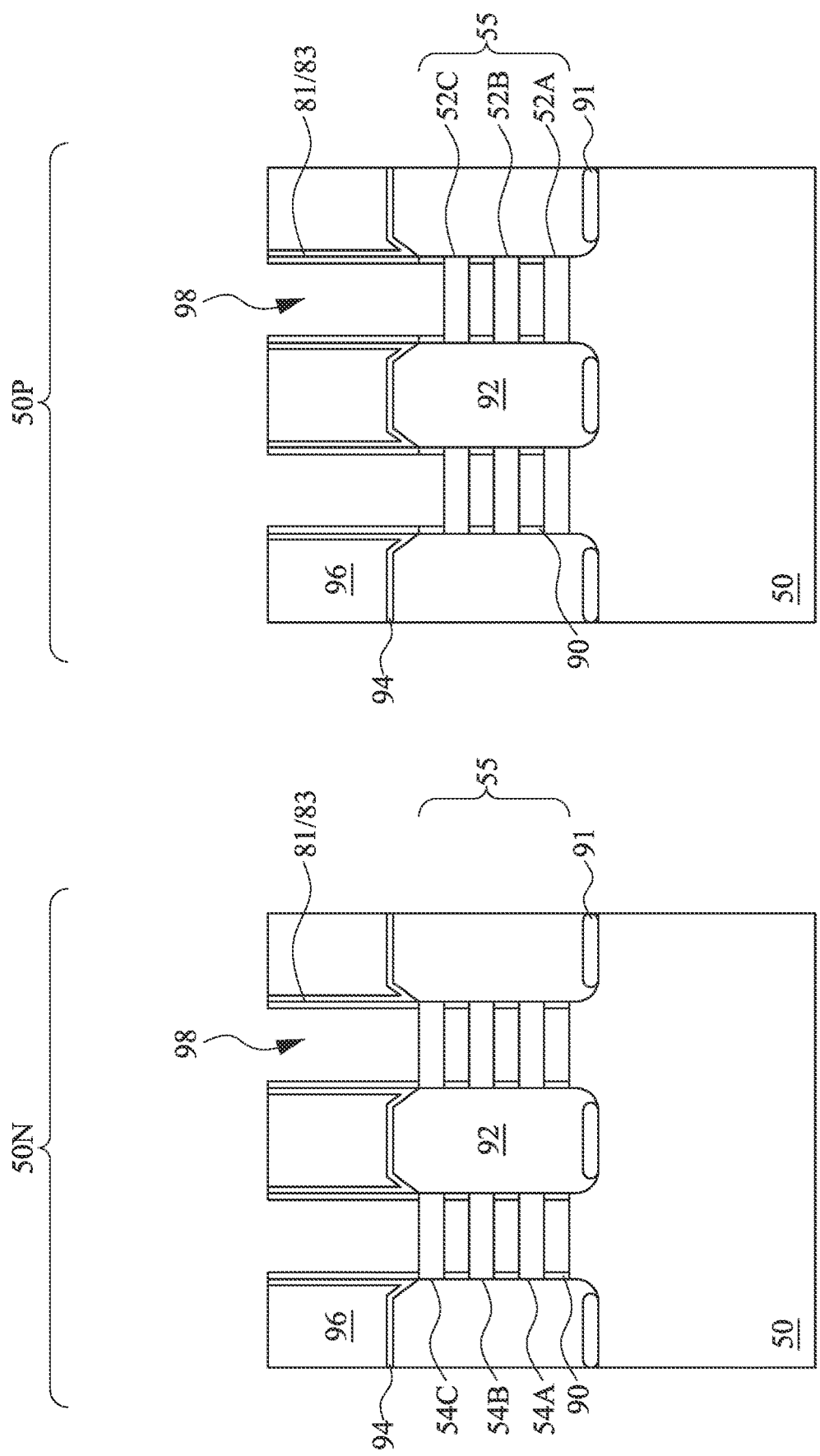
Figure 27D:
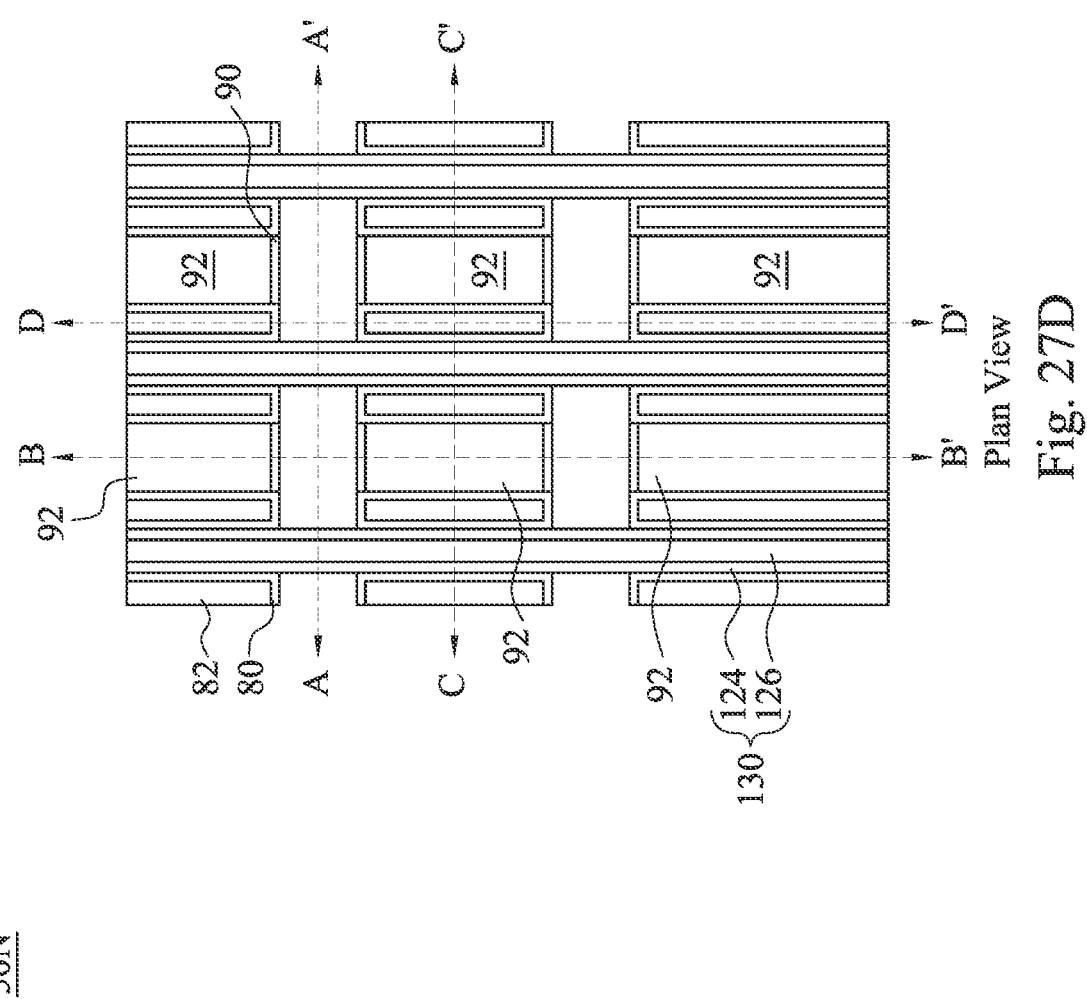

In FIGS. 27A-27C, the first nanostructures 52 in the n-type region 50N and the second nanostructures 54 in the p-type region 50P are removed extending the third recesses 98. Remaining portions of the sacrificial layer 120 may also be removed. The first nanostructures 52 may be removed by forming a mask (not shown) over the p-type region 50P and performing an isotropic etching process such as wet etching or the like using etchants which are selective to the materials of the first nanostructures 52 and the sacrificial layer 120, while the second nanostructures 54, the substrate 50, the STI regions 68 remain relatively unetched as compared to the first nanostructures 52. In embodiments in which the first nanostructures 52 include, e.g., SiGe, and the second nanostructures 54A-54C include, e.g., Si or SiC, tetramethylammonium hydroxide (TMAH), ammonium hydroxide ($NH_4OH$), or the like may be used to remove the first nanostructures 52 in the n-type region 50N.

The second nanostructures 54 in the p-type region 50P may be removed by forming a mask (not shown) over the n-type region 50N and performing an isotropic etching process such as wet etching or the like using etchants which are selective to the materials of the second nanostructures 54 and the sacrificial layer 120, while the first nanostructures 52, the substrate 50, the STI regions 68 remain relatively unetched as compared to the second nanostructures 54. In embodiments in which the second nanostructures 54 include, e.g., SiGe, and the first nanostructures 52 include, e.g., Si or SiC, hydrogen fluoride, another fluorine-based etchant, or the like may be used to remove the second nanostructures 54 in the p-type region 50P.

Figure 32A:
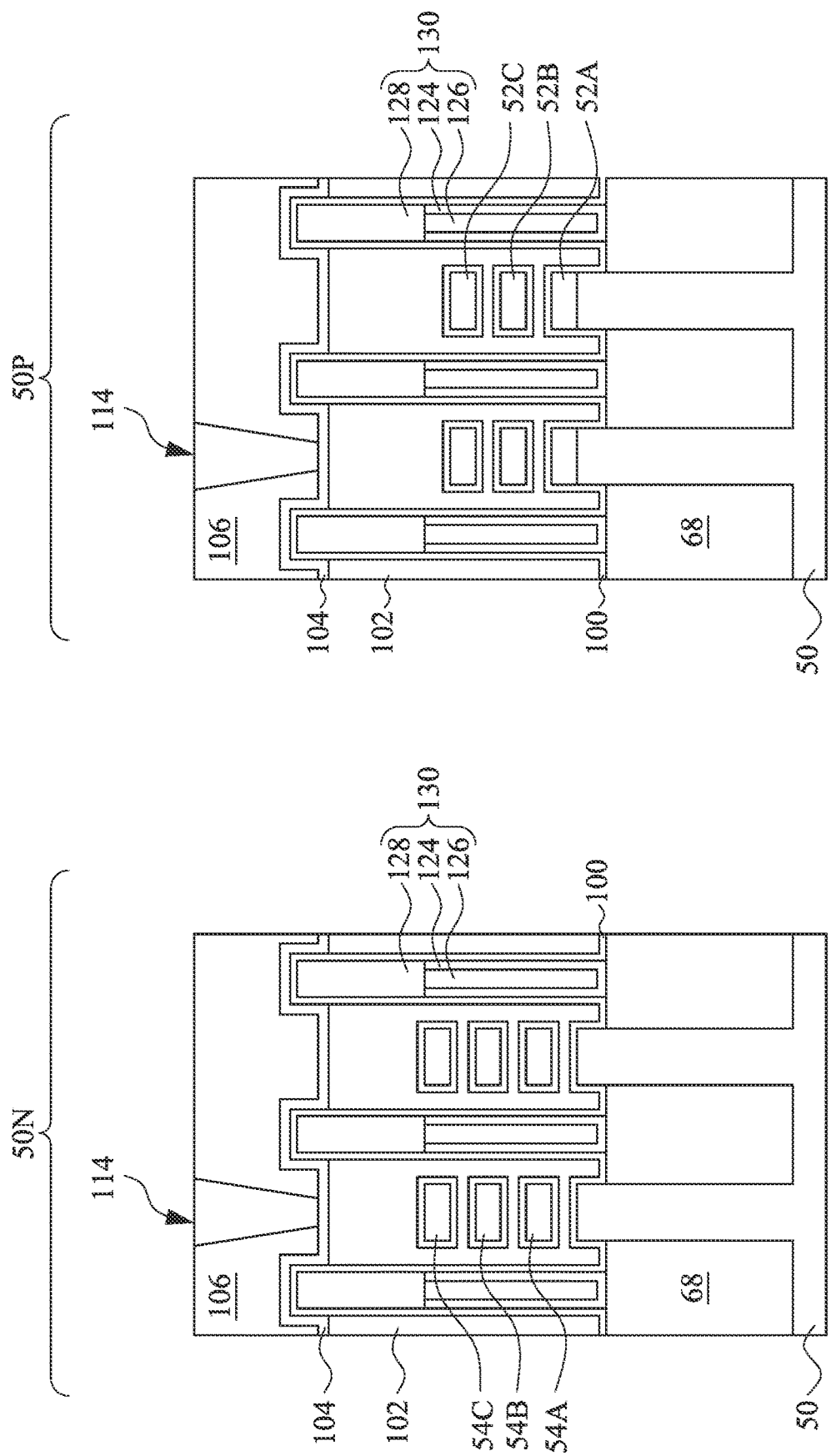
Figure 32B:
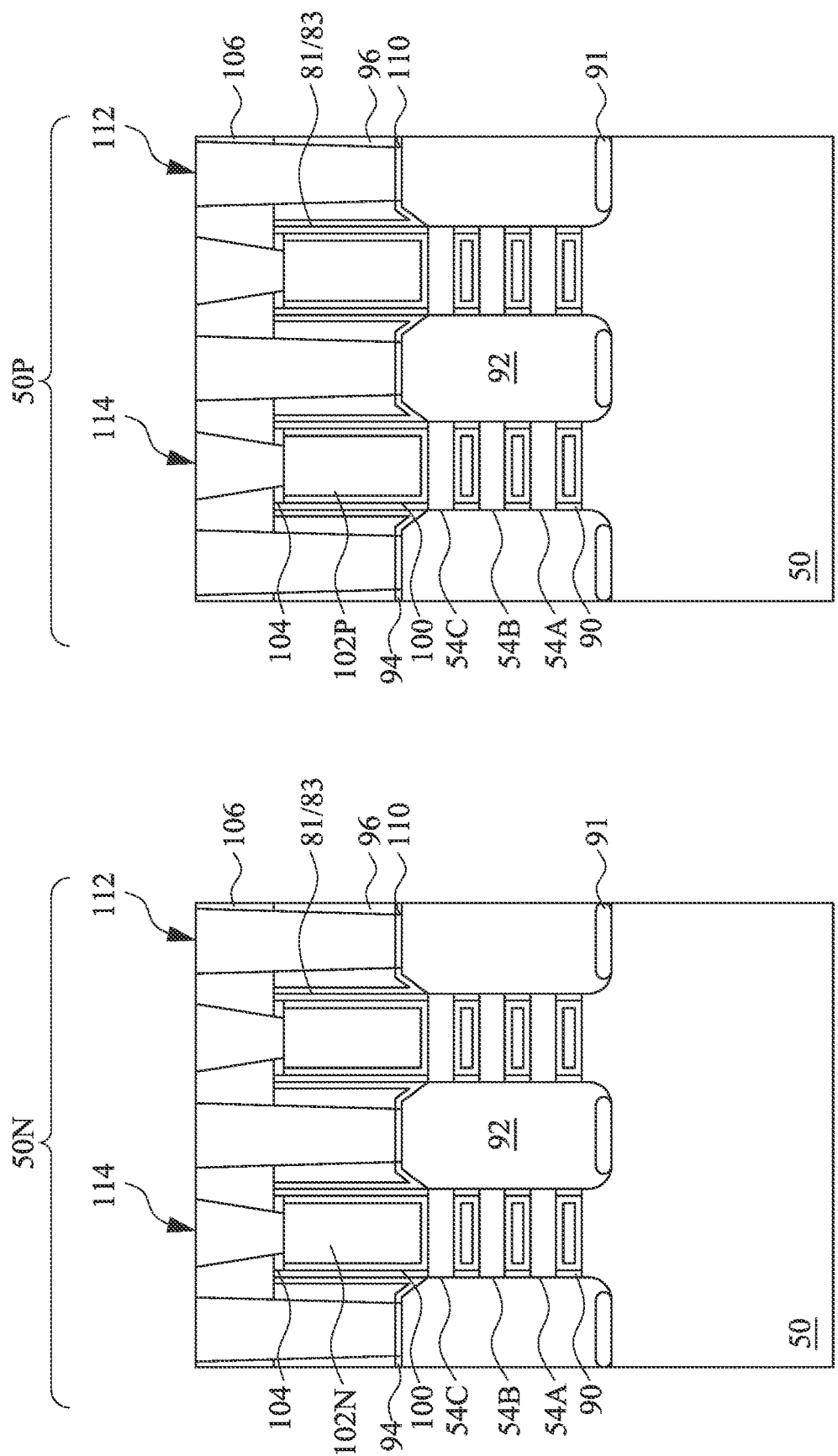

In other embodiments, the channel regions in the n-type region 50N and the p-type region 50P may be formed simultaneously, for example by removing the first nanostructures 52 and remaining portions of the sacrificial layer 120 in both the n-type region 50N and the p-type region 50P or by removing the second nanostructures 54 and remaining portions of the sacrificial layer 120 in both the n-type region 50N and the p-type region 50P. In such embodiments, channel regions of n-type NSFETs and p-type NSFETS may have a same material composition, such as silicon, silicon germanium, or the like. FIGS. 32A, 32B, and 32C illustrate a structure resulting from such embodiments where the channel regions in both the p-type region 50P and the n-type region 50N are provided by the second nanostructures 54 and comprise silicon, for example.

Figure 28A:
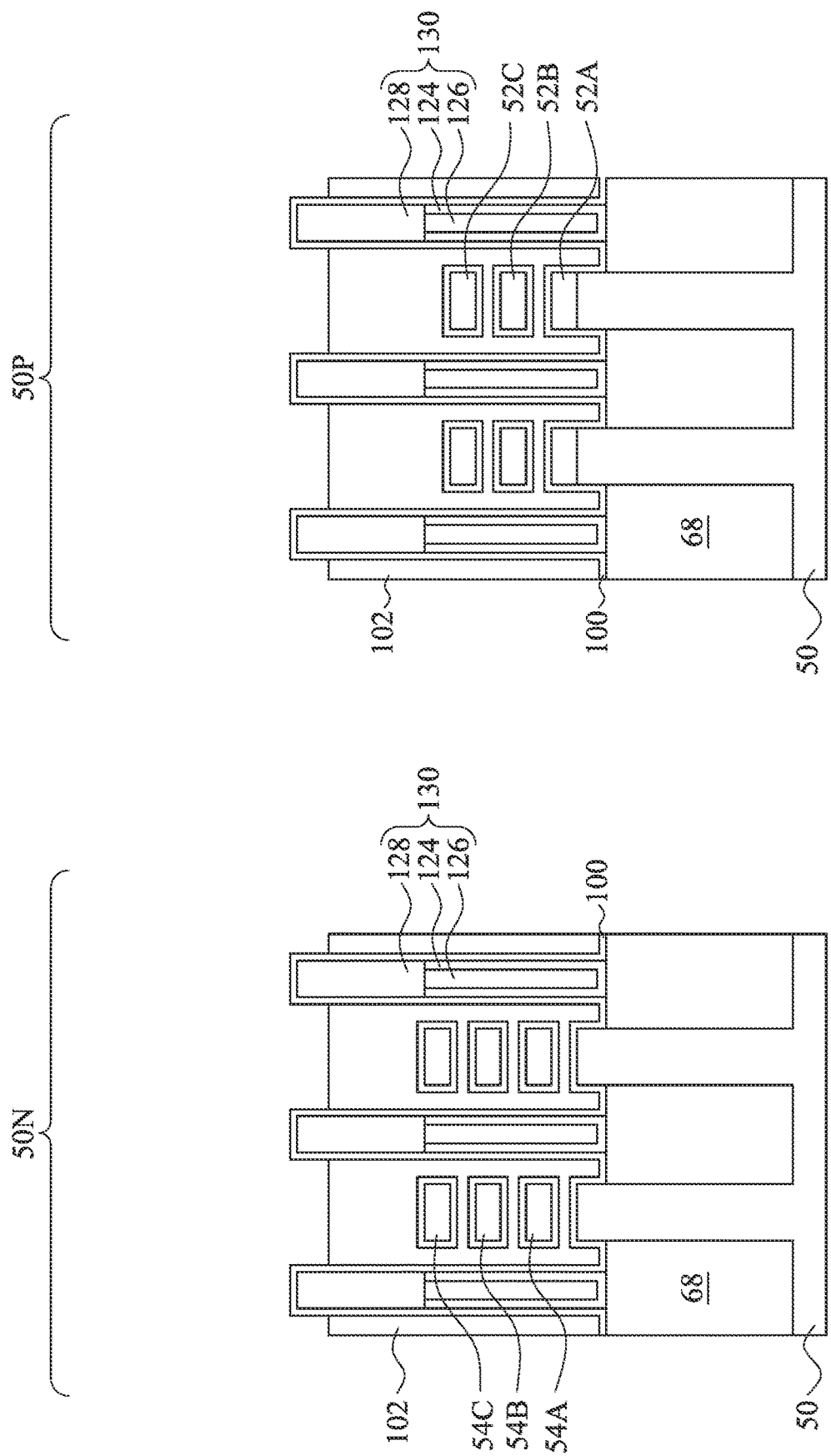
Figure 28B:
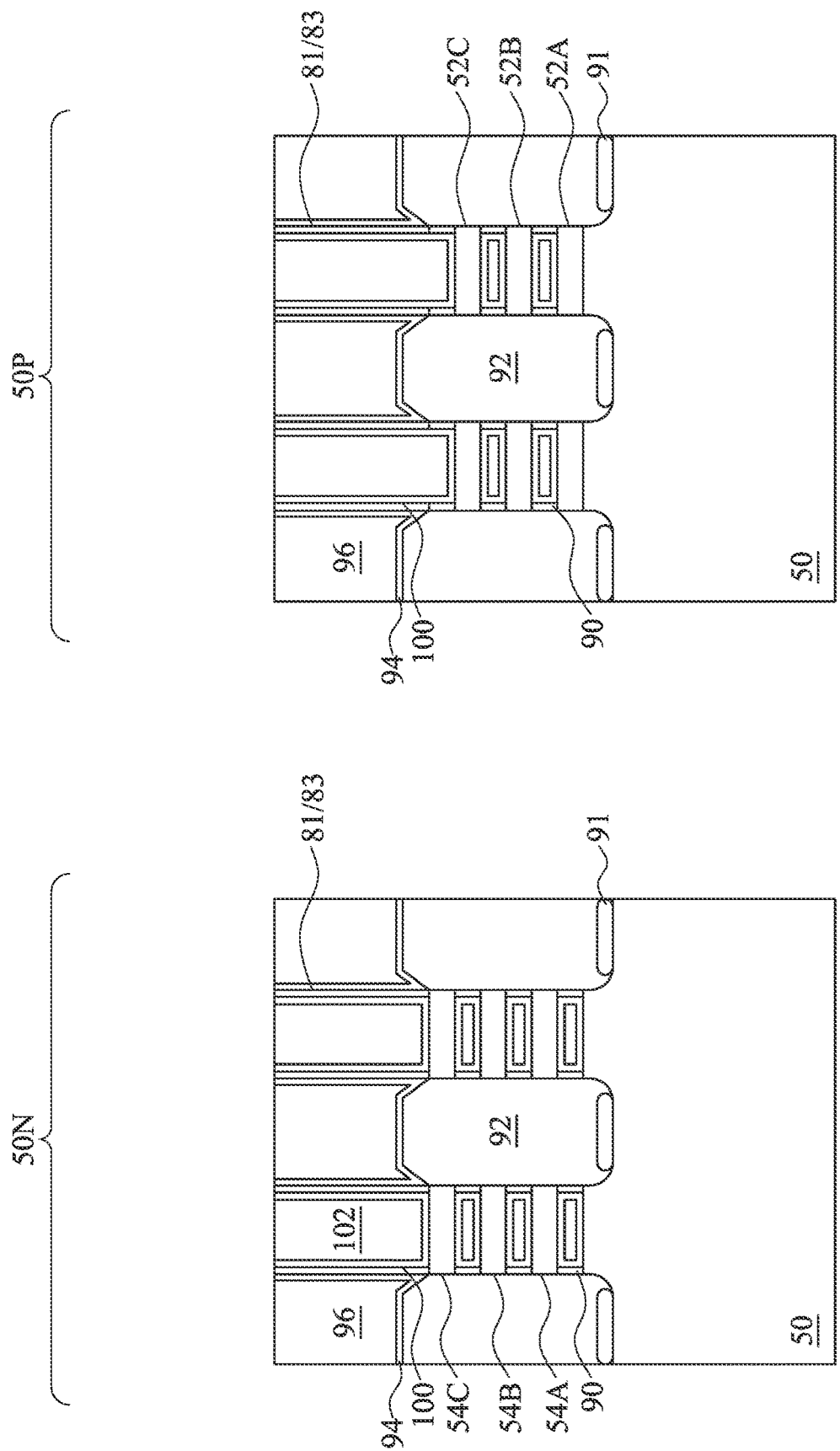

In FIGS. 28A-28C, gate dielectric layers 100 and gate electrodes 102 are formed for replacement gates. The gate dielectric layers 100 are deposited conformally in the third recesses 98. In the n-type region 50N, the gate dielectric layers 100 may be formed on top surfaces and sidewalls of the insulating fins 130, on top surfaces and sidewalls of the substrate 50 and on top surfaces, sidewalls, and bottom surfaces of the second nanostructures 54, and in the p-type region 50P, the gate dielectric layers 100 may be formed on top surfaces and sidewalls of the insulating fins 130, on top surfaces and sidewalls of the substrate 50 and on top surfaces, sidewalls, and bottom surfaces of the first nanostructures 52. The gate dielectric layers 100 may also be deposited on top surfaces of the first ILD 96, the CESL 94, the first spacers 81, the second spacers 83, and the STI regions 68.

In accordance with some embodiments, the gate dielectric layers 100 comprise one or more dielectric layers, such as an oxide, a metal oxide, the like, or combinations thereof. For example, in some embodiments, the gate dielectrics may comprise a silicon oxide layer and a metal oxide layer over the silicon oxide layer. In some embodiments, the gate dielectric layers 100 include a high-k dielectric material, and in these embodiments, the gate dielectric layers 100 may have a k value greater than about 7.0, and may include a metal oxide or a silicate of hafnium, aluminum, zirconium, lanthanum, manganese, barium, titanium, lead, and combinations thereof. The structure of the gate dielectric layers 100 may be the same or different in the n-type region 50N and the p-type region 50P. The formation methods of the gate dielectric layers 100 may include molecular-beam deposition (MBD), ALD, PECVD, and the like.

The gate electrodes 102 are deposited over the gate dielectric layers 100, respectively, and fill the remaining portions of the third recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. For example, although single layer gate electrodes 102 are illustrated in FIGS. 28A-28C, the gate electrodes 102 may comprise any number of liner layers, any number of work function tuning layers, and a fill material. Any combination of the layers which make up the gate electrodes 102 may be deposited in the n-type region 50N between adjacent ones of the second nanostructures 54 and between the second nanostructure 54A and the substrate 50, and may be deposited in the p-type region 50P between adjacent ones of the first nanostructures 52.

The formation of the gate dielectric layers 100 in the n-type region 50N and the p-type region 50P may occur simultaneously such that the gate dielectric layers 100 in each region are formed from the same materials, and the formation of the gate electrodes 102 may occur simultaneously such that the gate electrodes 102 in each region are formed from the same materials. In some embodiments, the gate dielectric layers 100 in each region may be formed by distinct processes, such that the gate dielectric layers 100 may be different materials and/or have a different number of layers, and/or the gate electrodes 102 in each region may be formed by distinct processes, such that the gate electrodes 102 may be different materials and/or have a different number of layers. Various masking steps may be used to mask and expose appropriate regions when using distinct processes.

After the filling of the third recesses 98, a planarization process, such as a CMP, may be performed to remove the excess portions of the gate dielectric layers 100 and the material of the gate electrodes 102, which excess portions are over the top surface of the first ILD 96. A recess process, such as an etch back, may then be performed to recess the top surfaces of the gate electrodes 102 from the top surfaces of the insulating fins 130. The remaining portions of material of the gate electrodes 102 and the gate dielectric layers 100 thus form replacement gate structures of the resulting nano-FETs. The gate electrodes 102 and the gate dielectric layers 100 may be collectively referred to as "gate structures."

In FIGS. 29A-29D, the gate structure (including the gate dielectric layers 100 and the corresponding overlying gate electrodes 102) is recessed, so that a recess is formed directly over the gate structure and between opposing portions of first spacers 81 and second spacers 83. A gate mask 104 comprising one or more layers of dielectric material, such as silicon nitride, silicon oxynitride, or the like, is filled in the recess, followed by a planarization process to remove excess portions of the dielectric material extending over the first ILD 96. Subsequently formed gate contacts (such as the gate contacts 114, discussed below with respect to FIGS. 31A and 31B) penetrate through the gate mask 104 to contact the top surface of the recessed gate electrodes 102.

As further illustrated by FIGS. 29A-29D, a second ILD 106 is deposited over the first ILD 96 and over the gate mask 104. In some embodiments, the second ILD 106 is a flowable film formed by FCVD. In some embodiments, the second ILD 106 is formed of a dielectric material such as PSG, BSG, BPSG, USG, or the like, and may be deposited by any suitable method, such as CVD, PECVD, or the like.

Figure 30A:
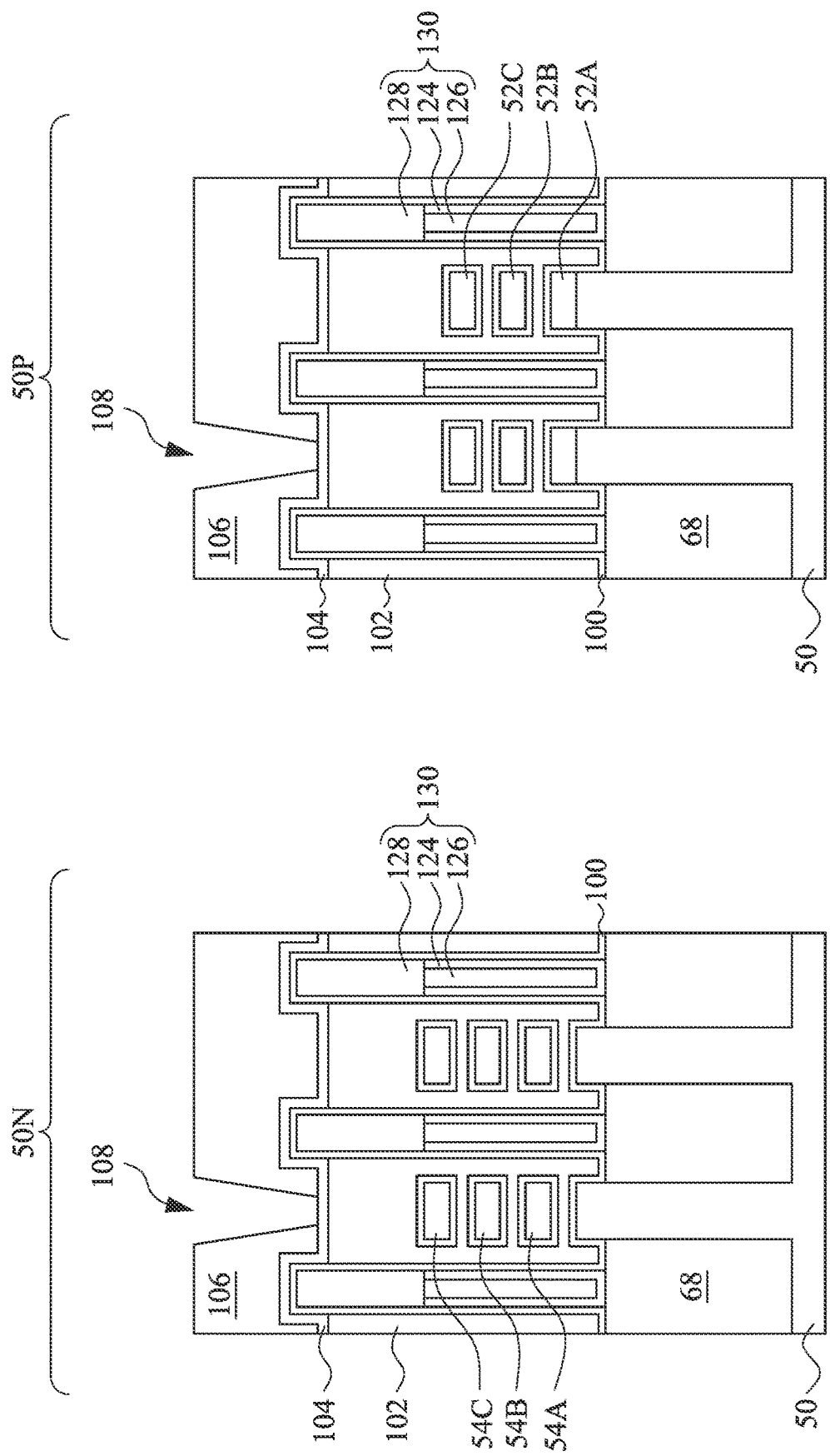
Figure 30C:
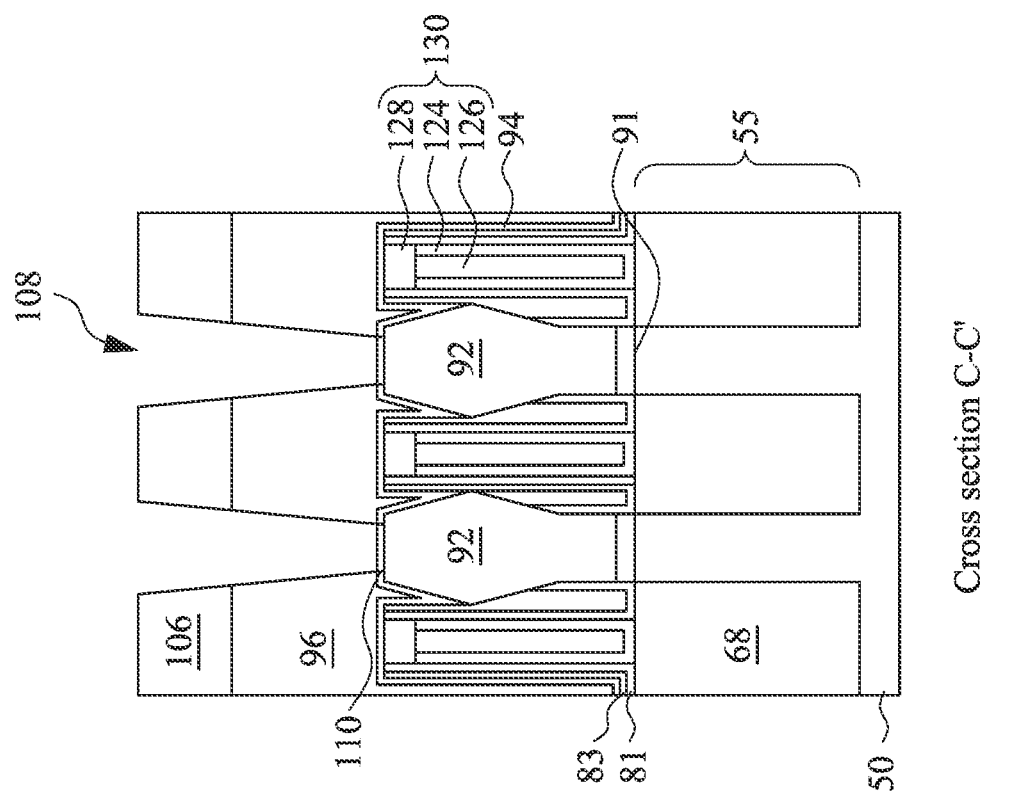
Figure 31A:
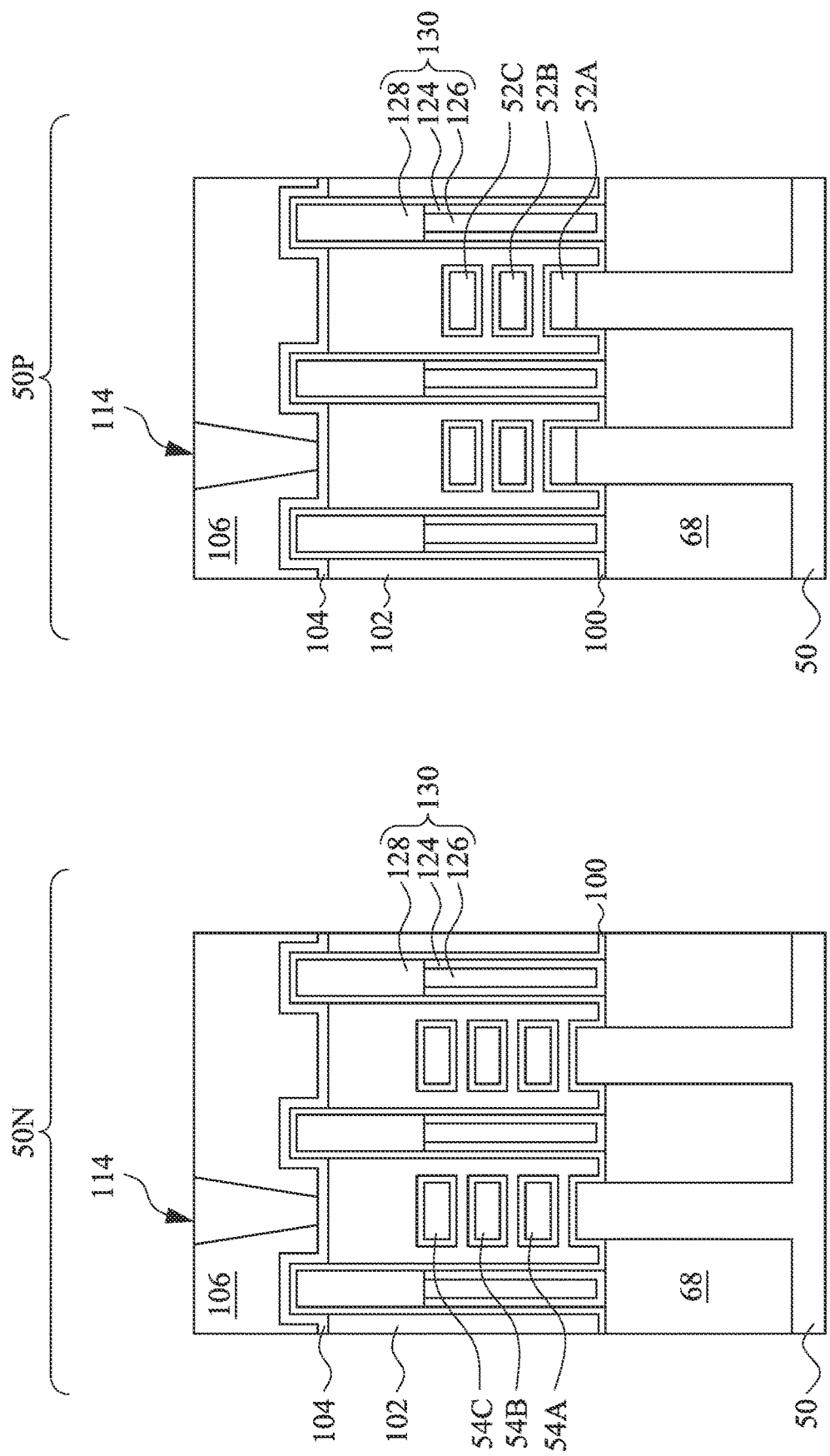
Figure 31C:
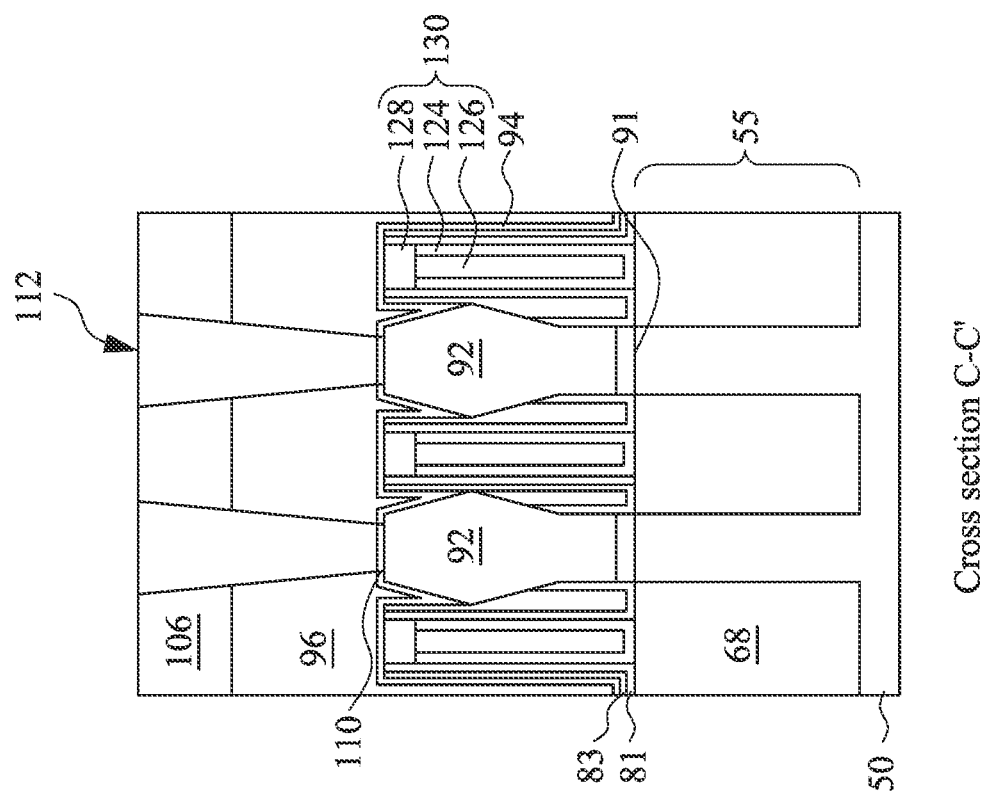
Figure 31D:
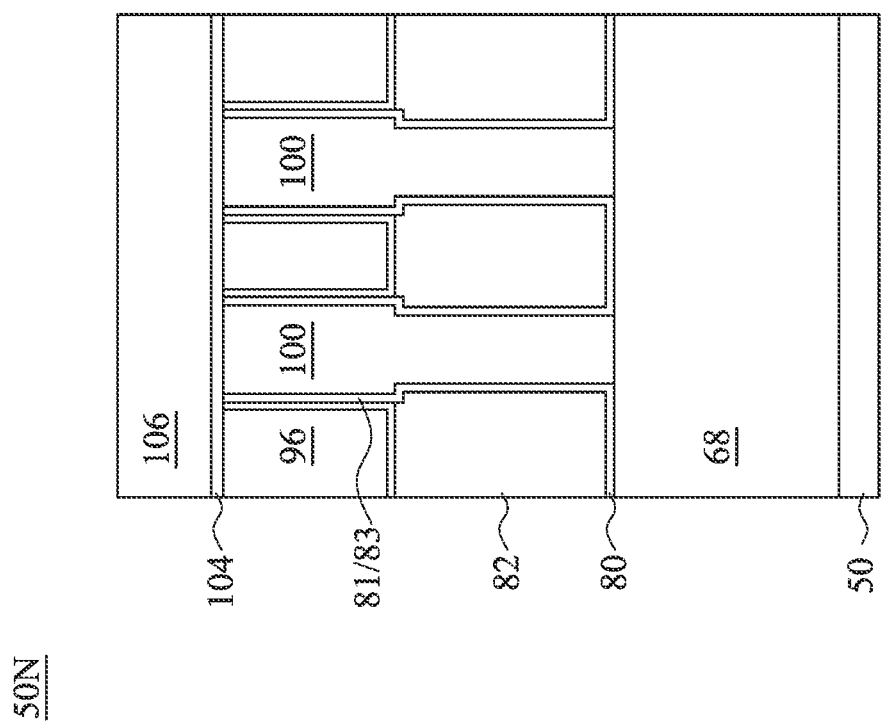

In FIGS. 30A-30D, the second ILD 106, the first ILD 96, the CESL 94, and the gate masks 104 are etched to form third recesses 108 exposing surfaces of the epitaxial source/drain regions 92 and/or the gate structure. The third recesses 108 may be formed by etching using an anisotropic etching process, such as RIE, NBE, or the like. In some embodiments, the third recesses 108 may be etched through the second ILD 106 and the first ILD 96 using a first etching process; may be etched through the gate masks 104 using a second etching process; and may then be etched through the CESL 94 using a third etching process. A mask, such as a photoresist, may be formed and patterned over the second ILD 106 to mask portions of the second ILD 106 from the first etching process and the second etching process. In some embodiments, the etching process may over-etch, and therefore, the third recesses 108 extend into the epitaxial source/drain regions 92 and/or the gate structure, and a bottom of the third recesses 108 may be level with (e.g., at a same level, or having a same distance from the substrate), or lower than (e.g., closer to the substrate) the epitaxial source/drain regions 92 and/or the gate structure. Although FIG. 30B illustrate the third recesses 108 as exposing the epitaxial source/drain regions 92 and the gate structure in a same cross section, in various embodiments, the epitaxial source/drain regions 92 and the gate structure may be exposed in different cross-sections, thereby reducing the risk of shorting subsequently formed contacts. After the third recesses 108 are formed, silicide regions 110 are formed over the epitaxial source/drain regions 92. In some embodiments, the silicide regions 110 are formed by first depositing a metal (not shown) capable of reacting with the semiconductor materials of the underlying epitaxial source/drain regions 92 (e.g., silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 92, then performing a thermal anneal process to form the silicide regions 110. The un-reacted portions of the deposited metal are then removed, e.g., by an etching process. Although silicide regions 110 are referred to as silicide regions, silicide regions 110 may also be germanide regions, or silicon germanide regions (e.g., regions comprising silicide and germanide). In an embodiment, the silicide region 110 comprises TiSi, and has a thickness in a range between about 2 nm and about 10 nm.

Next, in FIGS. 31A-D, contacts 112 and 114 (may also be referred to as contact plugs) are formed in the third recesses 108. The contacts 112 and 114 may each comprise one or more layers, such as barrier layers, diffusion layers, and fill materials. For example, in some embodiments, the contacts 112 and 114 each include a barrier layer and a conductive material, and is electrically coupled to the underlying conductive feature (e.g., gate structure 102 and/or silicide region 110 in the illustrated embodiment). The contacts 114 are electrically coupled to the gate structure 102 and may be referred to as gate contacts, and the contacts 112 are electrically coupled to the silicide regions 110 and may be referred to as source/drain contacts. The barrier layer may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 106.

Figure 32D:
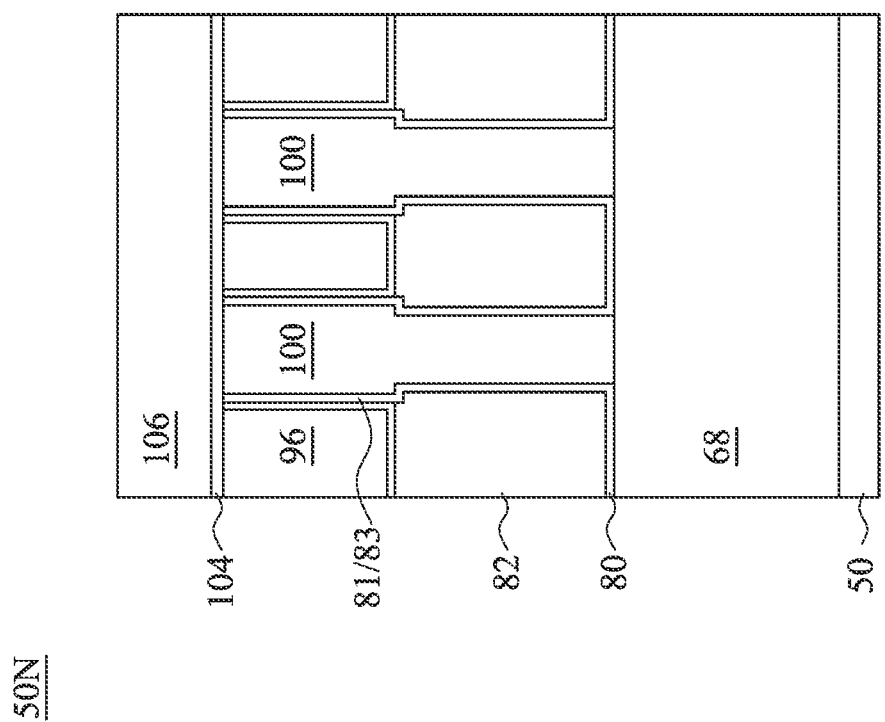

FIGS. 32A-D illustrate cross-sectional and plan views of a device according to some alternative embodiments. FIG. 32A illustrates reference cross-section A-A' illustrated in FIG. 1. FIG. 32B illustrates reference cross-section B-B' illustrated in FIG. 1. FIG. 32C illustrates reference cross-section C-C' illustrated in FIG. 1. FIG. 32D illustrates a plan view illustrated in FIG. 31D. In FIGS. 32A-D, like reference numerals indicate like elements formed by like processes as the structure of FIGS. 31A-D. However, in FIGS. 32A-D, channel regions in the n-type region 50N and the p-type region 50P comprise a same material. For example, the second nanostructures 54, which comprise silicon, provide channel regions for p-type NSFETs in the p-type region 50P and for n-type NSFETs in the n-type region 50N. The structure of FIGS. 32A-D may be formed, for example, by removing the first nanostructures 52 from both the p-type region 50P and the n-type region 50N simultaneously; depositing the gate dielectrics 100 and the gate electrodes 102P (e.g., gate electrode suitable for a p-type NSFET) around the second nanostructures 54 in the p-type region 50P; and depositing the gate dielectrics 100 and the gate electrodes 102N (e.g., a gate electrode suitable for a n-type NSFET) around the second nanostructures 54 in the n-type region 50N. In such embodiments, materials of the epitaxial source/drain regions 92 may be different in the n-type region 50N compared to the p-type region 50P as explained above.

Embodiments may achieve advantages. For example, the formation of electrical shorts between source/drain regions and gate electrodes may be reduced by removing a portion of a sacrificial layer adjacent to a stack of nanostructures prior to forming a spacer layer. A portion of the spacer layer is filled into the recess and may lead to improved device function by providing a stronger barrier between subsequently formed source/drain regions and gate electrodes and reducing electric shorts.

In accordance with an embodiment, a method of forming a semiconductor device includes: forming a sacrificial layer over a first stack of nanostructures and an isolation region, the first stack of nanostructures including alternating first nanostructures and second nanostructures, the first nanostructures being a first semiconductor material, the second nanostructures being a second semiconductor material; forming a dummy gate structure over the first stack of nanostructures and a first portion of the sacrificial layer; removing a second portion of the sacrificial layer to expose a sidewall of the first stack of nanostructures adjacent the dummy gate structure; forming a spacer layer over the dummy gate structure, a first portion of the spacer layer physically contacting a sidewall of the first stack of nanostructures; forming a first source/drain recess through the first stack of nanostructures, sidewalls of the first nanostructures and the second nanostructures being exposed in the first source/drain recess; and forming a first source/drain region in the first source/drain recess, the first source/drain region physically contacting the first portion of the spacer layer. In an embodiment, the method further includes: after forming the first source/drain recess, laterally recessing sidewalls of one of the first nanostructures and second nanostructures to form recessed nanostructures; and forming a plurality of inner spacers, each inner spacer of the plurality of inner spacers physically contacting a respective first sidewall of a respective recessed nanostructure. In an embodiment, the first portion of the spacer layer covers an inner spacer of the plurality of inner spacers. In an embodiment, the method further includes: forming an interlayer dielectric over the dummy gate structure, the first source/drain region, and the first portion of the spacer layer; and removing the dummy gate structure. In an embodiment, the method further includes: removing the recessed nanostructures and the remaining portion of the sacrificial layer; and forming a replacement gate structure over the first stack of nanostructures, the replacement gate structure being interposed between remaining nanostructures of the first stack of nanostructures, the replacement gate structure covering a sidewall of the first portion of the spacer layer. In an embodiment, the replacement gate structure includes a gate electrode and a gate dielectric, the gate dielectric physically contacting the first portion of the spacer layer.

In accordance with another embodiment, a method of forming a semiconductor device includes: forming a multi-layer stack on a semiconductor substrate; patterning the multi-layer stack to form a stack of nanostructures, the stack of nanostructures including alternating first nanostructures and second nanostructures, the first nanostructures being a first semiconductor material, the second nanostructures being a second semiconductor material; forming a sacrificial layer along sidewalls of the stack of nanostructures; forming a dummy gate structure over the stack of nanostructures and the sacrificial layer; removing a portion of the sacrificial layer to form a first recess adjacent the stack of nanostructures, a remaining portion of the sacrificial layer being covered by the dummy gate structure; forming a spacer layer over the dummy gate structure, a first portion of the spacer layer filling the first recess; forming a second recess in the multi-layer stack, the second recess being adjacent the dummy gate structure; forming a source/drain region in the second recess, the source/drain region physically contacting the first portion of the spacer layer; removing the dummy gate structure to form a third recess; removing one of the first nanostructures and the second nanostructures and at least portions of the remaining portion of the sacrificial layer; and forming a gate structure in the third recess. In an embodiment, the sacrificial layer includes SiGe. In an embodiment, the method further includes: laterally recessing sidewalls of one of the first nanostructures and the second nanostructures to form recessed nanostructures, the sidewalls being adjacent to the second recess; and forming respective inner spacers adjacent to the recessed nanostructures, respective first sidewalls of the respective inner spacers being covered by the first portion of the spacer layer. In an embodiment, the spacer layer includes silicon oxide, silicon nitride, or silicon oxynitride. In an embodiment, the first portion of the spacer layer includes a first spacer layer and a second spacer layer, the first spacer layer surrounding the second spacer layer in a plan view. In an embodiment, the first spacer layer is a first material and the second spacer layer is a second material, the second material having a different etch rate than the first material. In an embodiment, the first spacer layer is interposed between the second spacer layer and the semiconductor substrate. In an embodiment, the second spacer layer extends under the first spacer layer. In an embodiment, removing the portion of the sacrificial layer to form the first recess includes over-etching the sacrificial layer, wherein after the over-etching the first recess extends under the dummy gate structure. In an embodiment, forming the gate structure includes forming a gate dielectric over exposed surfaces of remaining nanostructures, wherein the gate dielectric covers respective second sidewalls of respective inner spacers and respective third sidewalls of the first portion of the spacer layer, each respective second sidewall being adjacent to a respective third sidewall.

In accordance with yet another embodiment, a semiconductor device includes: a semiconductor substrate; a first channel region over the semiconductor substrate, the first channel region including a first stack of nanostructures; a first gate stack over the first channel region, the first gate stack including a first gate electrode and a first gate dielectric; a first source/drain region adjacent the first channel region; a first inner spacer being interposed between a first sidewall of the first source/drain region and the first gate dielectric; and a first spacer physically contacting a second sidewall of the first source/drain region, the first spacer covering a sidewall of the first inner spacer. In an embodiment, the first spacer includes a first material and a second material surrounding the first material in a plan view, the second material having a different etch rate from the first material. In an embodiment, the semiconductor device further includes a first insulating fin adjacent to the first channel region and adjacent to the first source/drain region, the first spacer being interposed between the first source/drain region and the first insulating fin. In an embodiment, the first spacer further extends between the first inner spacer and the first insulating fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
   forming a sacrificial layer over a first stack of nanostructures and an isolation region, the sacrificial layer comprising a semiconductor material, the first stack of nanostructures comprising alternating first nanostructures and second nanostructures, the first nanostructures being a first semiconductor material, the second nanostructures being a second semiconductor material;
   after forming the sacrificial layer, forming a dummy gate structure over the first stack of nanostructures and a first portion of the sacrificial layer;
   removing a second portion of the sacrificial layer to expose a sidewall of the first stack of nanostructures adjacent the dummy gate structure;
   forming a spacer layer over the dummy gate structure, a first portion of the spacer layer physically contacting the sidewall of the first stack of nanostructures;
   forming a first source/drain recess through the first stack of nanostructures, sidewalls of the first nanostructures and the second nanostructures being exposed in the first source/drain recess; and
   forming a first source/drain region in the first source/drain recess, the first source/drain region physically contacting the first portion of the spacer layer.

2. The method of claim 1 further comprising:
   after forming the first source/drain recess, laterally recessing sidewalls of one of the first nanostructures and second nanostructures to form recessed nanostructures; and
   forming a plurality of inner spacers, each inner spacer of the plurality of inner spacers physically contacting a respective first sidewall of a respective recessed nanostructure.

3. The method of claim 2, wherein the first portion of the spacer layer covers an inner spacer of the plurality of inner spacers.

4. The method of claim 3 further comprising:
   forming an interlayer dielectric over the dummy gate structure, the first source/drain region, and the first portion of the spacer layer; and
   removing the dummy gate structure.

5. The method of claim 4 further comprising:
   removing the recessed nanostructures and a remaining portion of the sacrificial layer; and
   forming a replacement gate structure over the first stack of nanostructures, the replacement gate structure being interposed between remaining nanostructures of the first stack of nanostructures, the replacement gate structure covering a sidewall of the first portion of the spacer layer.

6. The method of claim 5, wherein the replacement gate structure comprises a gate electrode and a gate dielectric, the gate dielectric physically contacting the first portion of the spacer layer.

7. A method of forming a semiconductor device, the method comprising:
   forming a multi-layer stack on a semiconductor substrate;
   patterning the multi-layer stack to form a stack of nanostructures, the stack of nanostructures comprising alternating first nanostructures and second nanostructures, the first nanostructures being a first semiconductor material, the second nanostructures being a second semiconductor material;
   forming a sacrificial layer along sidewalls of the stack of nanostructures;
   forming a dummy gate structure over the stack of nanostructures and the sacrificial layer;
   removing a portion of the sacrificial layer to form a first recess adjacent the stack of nanostructures, a remaining portion of the sacrificial layer being covered by the dummy gate structure;
   after forming the sacrificial layer, forming a spacer layer over the dummy gate structure, a first portion of the spacer layer filling the first recess;
   forming a second recess in the multi-layer stack, the second recess being adjacent the dummy gate structure;
   forming a source/drain region in the second recess, the source/drain region physically contacting the first portion of the spacer layer;
   removing the dummy gate structure to form a third recess;
   removing one of the first nanostructures and the second nanostructures and at least portions of the remaining portion of the sacrificial layer; and
   forming a gate structure in the third recess.

8. The method of claim 7, wherein the sacrificial layer comprises SiGe.

9. The method of claim 7 further comprising:
   laterally recessing sidewalls of one of the first nanostructures and the second nanostructures to form recessed nanostructures, the sidewalls being adjacent to the second recess; and
   forming respective inner spacers adjacent to the recessed nanostructures, respective first sidewalls of the respective inner spacers being covered by the first portion of the spacer layer.

10. The method of claim 7, wherein the spacer layer comprises silicon oxide, silicon nitride, or silicon oxynitride.

11. The method of claim 7, wherein the first portion of the spacer layer comprises a first spacer layer and a second spacer layer, the first spacer layer surrounding the second spacer layer in a plan view.

12. The method of claim 11, wherein the first spacer layer is a first material and the second spacer layer is a second material, the second material having a different etch rate than the first material.

13. The method of claim 11, wherein the first spacer layer is interposed between the second spacer layer and the semiconductor substrate.

14. The method of claim 11, wherein the second spacer layer extends under the first spacer layer.

15. The method of claim 7, wherein removing the portion of the sacrificial layer to form the first recess comprises over-etching the sacrificial layer, wherein after the over-etching the first recess extends under the dummy gate structure.

16. The method of claim 9, wherein forming the gate structure comprises forming a gate dielectric over exposed surfaces of remaining nanostructures, wherein the gate dielectric covers respective second sidewalls of respective inner spacers and respective third sidewalls of the first portion of the spacer layer, each respective second sidewall being adjacent to the respective third sidewall.

17. A semiconductor device, comprising:
a semiconductor substrate;
an insulating layer over the semiconductor substrate;
a first channel region over the semiconductor substrate, the first channel region comprising a first stack of nanostructures;
a first gate stack over the first channel region, the first gate stack comprising a first gate electrode and a first gate dielectric;
a first source/drain region adjacent the first channel region;
a first inner spacer physically contacting a first sidewall of the first source/drain region, the first inner spacer being interposed between the first sidewall of the first source/drain region and the first gate dielectric; and
a first spacer physically contacting a second sidewall of the first source/drain region, the first spacer covering a sidewall of the first inner spacer, the first spacer extending between a lower surface of the first gate dielectric and an upper surface of the insulating layer along a direction perpendicular to a top surface of the first gate dielectric.

18. The semiconductor device of claim 17, wherein the first spacer comprises a first material and a second material surrounding the first material in a plan view, the second material having a different etch rate from the first material.

19. The semiconductor device of claim 17 further comprising a first insulating fin adjacent to the first channel region and adjacent to the first source/drain region, the first spacer being interposed between the first source/drain region and the first insulating fin.

20. The semiconductor device of claim 19, wherein the first spacer further extends between the first inner spacer and the first insulating fin.

* * * * *